(12) United States Patent
Kimura et al.

(10) Patent No.: US 10,665,604 B2
(45) Date of Patent: May 26, 2020

(54) SEMICONDUCTOR DEVICE, SEMICONDUCTOR WAFER, MEMORY DEVICE, AND ELECTRONIC DEVICE

(71) Applicant: Semiconductor Energy Laboratory Co., Ltd., Atsugi-shi, Kanagawa-ken (JP)

(72) Inventors: Hajime Kimura, Atsugi (JP); Tatsunori Inoue, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 122 days.

(21) Appl. No.: 16/036,282

(22) Filed: Jul. 16, 2018

(65) Prior Publication Data
US 2019/0027493 A1 Jan. 24, 2019

(30) Foreign Application Priority Data
Jul. 21, 2017 (JP) .................. 2017-141515

(51) Int. Cl.
| H01L 27/11582 | (2017.01) |
| H01L 27/11556 | (2017.01) |
| H01L 29/78 | (2006.01) |
| H01L 27/11524 | (2017.01) |
| H01L 27/11529 | (2017.01) |
| H01L 29/66 | (2006.01) |
| H01L 29/24 | (2006.01) |
| H01L 27/1157 | (2017.01) |

(Continued)

(52) U.S. Cl.
CPC .... H01L 27/11582 (2013.01); H01L 27/1157 (2013.01); H01L 27/11524 (2013.01); H01L 27/11529 (2013.01); H01L 27/11556 (2013.01); H01L 29/24 (2013.01); H01L 29/40117 (2019.08); H01L 29/66969 (2013.01); H01L 29/7831 (2013.01); H01L 29/7889 (2013.01); H01L 21/0262 (2013.01); H01L 21/02565 (2013.01); H01L 27/11573 (2013.01)

(58) Field of Classification Search
CPC ........... H01L 29/40117; H01L 29/7889; H01L 29/66969
See application file for complete search history.

(56) References Cited

U.S. PATENT DOCUMENTS

| 5,528,032 A | 6/1996 | Uchiyama |
| 6,727,544 B2 | 4/2004 | Endoh et al. |

(Continued)

*Primary Examiner* — Jose R Diaz
(74) *Attorney, Agent, or Firm* — Robinson Intellectual Property Law Office; Eric J. Robinson

(57) ABSTRACT

An object is to provide a semiconductor device with large memory capacity. The semiconductor device includes first to seventh insulators, a first conductor, and a first semiconductor. The first conductor is positioned on a first top surface of the first insulator and a first bottom surface of the second insulator. The third insulator is positioned in a region including a side surface and a second top surface of the first insulator, a side surface of the first conductor, and a second bottom surface and a side surface of the second insulator. The fourth insulator, the fifth insulator, and the first semiconductor are sequentially stacked on the third insulator. The sixth insulator is in contact with the fifth insulator in a region overlapping the first conductor. The seventh insulator is positioned in a region including the first semiconductor and the sixth insulator.

36 Claims, 64 Drawing Sheets

(51) Int. Cl.
  *H01L 29/788* (2006.01)
  *H01L 21/28* (2006.01)
  *H01L 27/11573* (2017.01)
  *H01L 21/02* (2006.01)

(56) References Cited

U.S. PATENT DOCUMENTS

| | | |
|---|---|---|
| 8,187,936 B2 | 5/2012 | Alsmeier et al. |
| 8,193,054 B2 | 6/2012 | Alsmeier |
| 8,198,672 B2 | 6/2012 | Alsmeier |
| 8,238,152 B2 | 8/2012 | Asami et al. |
| 8,283,228 B2 | 10/2012 | Alsmeier |
| 8,319,267 B2 | 11/2012 | Kato et al. |
| 8,330,208 B2 | 12/2012 | Alsmeier et al. |
| 8,349,681 B2 | 1/2013 | Alsmeier et al. |
| 8,372,720 B2 | 2/2013 | Fukuzumi et al. |
| 8,409,977 B2 | 4/2013 | Shim et al. |
| 8,421,068 B2 | 4/2013 | Yamazaki et al. |
| 8,421,069 B2 | 4/2013 | Yamazaki et al. |
| 8,450,791 B2 | 5/2013 | Alsmeier |
| 8,461,000 B2 | 6/2013 | Alsmeier et al. |
| 8,461,641 B2 | 6/2013 | Alsmeier et al. |
| 8,580,639 B2 | 11/2013 | Alsmeier et al. |
| 8,729,624 B2 | 5/2014 | Fukuzumi et al. |
| 8,765,543 B2 | 7/2014 | Alsmeier et al. |
| 8,803,142 B2 | 8/2014 | Yamazaki et al. |
| 8,829,591 B2 | 9/2014 | Alsmeier |
| 8,860,108 B2 | 10/2014 | Yamazaki et al. |
| 8,896,049 B2 | 11/2014 | Isobe et al. |
| 8,902,663 B1 | 12/2014 | Or-Bach et al. |
| 8,928,061 B2 | 1/2015 | Chien et al. |
| 8,946,810 B2 | 2/2015 | Alsmeier |
| 9,035,374 B2 | 5/2015 | Fukuzumi et al. |
| 9,117,749 B1 | 8/2015 | Or-Bach et al. |
| 9,117,923 B2 | 8/2015 | Shim et al. |
| 9,159,739 B2 | 10/2015 | Makala et al. |
| 9,165,940 B2 | 10/2015 | Chien et al. |
| 9,230,976 B2 | 1/2016 | Alsmeier |
| 9,257,082 B2 | 2/2016 | Kimura et al. |
| 9,356,042 B2 | 5/2016 | Fukuzumi et al. |
| 9,362,302 B1 * | 6/2016 | Lai .................. H01L 27/11582 |
| 9,406,694 B1 | 8/2016 | Ikeno et al. |
| 9,634,097 B2 | 4/2017 | Rabkin et al. |
| 9,793,124 B2 * | 10/2017 | Hopkins ........... H01L 29/66825 |
| 10,090,318 B2 * | 10/2018 | Zhu .................. H01L 27/11582 |
| 2007/0133358 A1 | 6/2007 | Kubo et al. |
| 2008/0149913 A1 | 6/2008 | Tanaka et al. |
| 2008/0239799 A1 | 10/2008 | Watanabe |
| 2009/0027955 A1 | 1/2009 | Koh et al. |
| 2009/0034123 A1 | 2/2009 | Aoki et al. |
| 2010/0052042 A1 | 3/2010 | Tanaka et al. |
| 2010/0142091 A1 | 6/2010 | Tsukamoto et al. |
| 2010/0142261 A1 | 6/2010 | Kubo et al. |
| 2010/0142262 A1 | 6/2010 | Tsukamoto et al. |
| 2010/0182828 A1 | 7/2010 | Shima et al. |
| 2010/0259960 A1 | 10/2010 | Samachisa |
| 2010/0296338 A1 | 11/2010 | Park et al. |
| 2011/0006277 A1 | 1/2011 | Kubo et al. |
| 2011/0026294 A1 | 2/2011 | Tsukamoto et al. |
| 2011/0031467 A1 | 2/2011 | Kubo et al. |
| 2011/0065270 A1 | 3/2011 | Sim et al. |
| 2011/0068319 A1 | 3/2011 | Tsukamoto et al. |
| 2011/0089417 A1 | 4/2011 | Yamazaki et al. |
| 2011/0090204 A1 | 4/2011 | Yamazaki et al. |
| 2011/0101332 A1 | 5/2011 | Yamazaki et al. |
| 2011/0101334 A1 | 5/2011 | Yamazaki et al. |
| 2011/0101351 A1 | 5/2011 | Yamazaki |
| 2011/0122676 A1 | 5/2011 | Murooka et al. |
| 2011/0140070 A1 | 6/2011 | Kim |
| 2011/0216575 A1 | 9/2011 | Yamaguchi et al. |
| 2011/0216582 A1 | 9/2011 | Tsukamoto et al. |
| 2011/0233648 A1 | 9/2011 | Seol et al. |
| 2011/0235408 A1 | 9/2011 | Minemura et al. |
| 2011/0273927 A1 | 11/2011 | Hanzawa et al. |
| 2012/0001243 A1 | 1/2012 | Kato |
| 2012/0008369 A1 | 1/2012 | Shimuta et al. |
| 2012/0087178 A1 | 4/2012 | Watanabe et al. |
| 2012/0119287 A1 | 5/2012 | Park et al. |
| 2012/0261722 A1 | 10/2012 | Tang et al. |
| 2012/0268980 A1 | 10/2012 | Awaya et al. |
| 2012/0287697 A1 | 11/2012 | Hanzawa et al. |
| 2012/0319114 A1 | 12/2012 | Yamazaki et al. |
| 2013/0075684 A1 | 3/2013 | Kinoshita et al. |
| 2013/0128651 A1 | 5/2013 | Kubo |
| 2013/0141968 A1 | 6/2013 | Sasago et al. |
| 2013/0221356 A1 | 8/2013 | Yamazaki et al. |
| 2013/0228739 A1 | 9/2013 | Sasago et al. |
| 2013/0258752 A1 | 10/2013 | Park |
| 2013/0292671 A1 | 11/2013 | Yamazaki et al. |
| 2013/0334593 A1 | 12/2013 | Seol et al. |
| 2014/0038400 A1 | 2/2014 | Parks et al. |
| 2014/0097484 A1 | 4/2014 | Seol et al. |
| 2014/0187029 A1 | 7/2014 | Seol et al. |
| 2014/0225181 A1 | 8/2014 | Makala et al. |
| 2014/0268996 A1 | 9/2014 | Park |
| 2014/0301128 A1 | 10/2014 | Park |
| 2014/0321193 A1 | 10/2014 | Park |
| 2015/0054058 A1 | 2/2015 | Seol et al. |
| 2015/0179662 A1 | 6/2015 | Makala et al. |
| 2015/0255485 A1 | 9/2015 | Kameoka et al. |
| 2015/0311301 A1 | 10/2015 | Seol et al. |
| 2015/0325586 A1 | 11/2015 | Seol et al. |
| 2016/0071879 A1 | 3/2016 | Seol et al. |
| 2016/0104720 A1 | 4/2016 | Alsmeier |
| 2016/0104721 A1 | 4/2016 | Seol et al. |
| 2016/0247818 A1 | 8/2016 | Seol et al. |
| 2016/0247927 A1 | 8/2016 | Nomura et al. |
| 2016/0343434 A1 | 11/2016 | Lee et al. |
| 2017/0040416 A1 | 2/2017 | Ota et al. |
| 2017/0236872 A1 | 8/2017 | Kanemura et al. |

\* cited by examiner

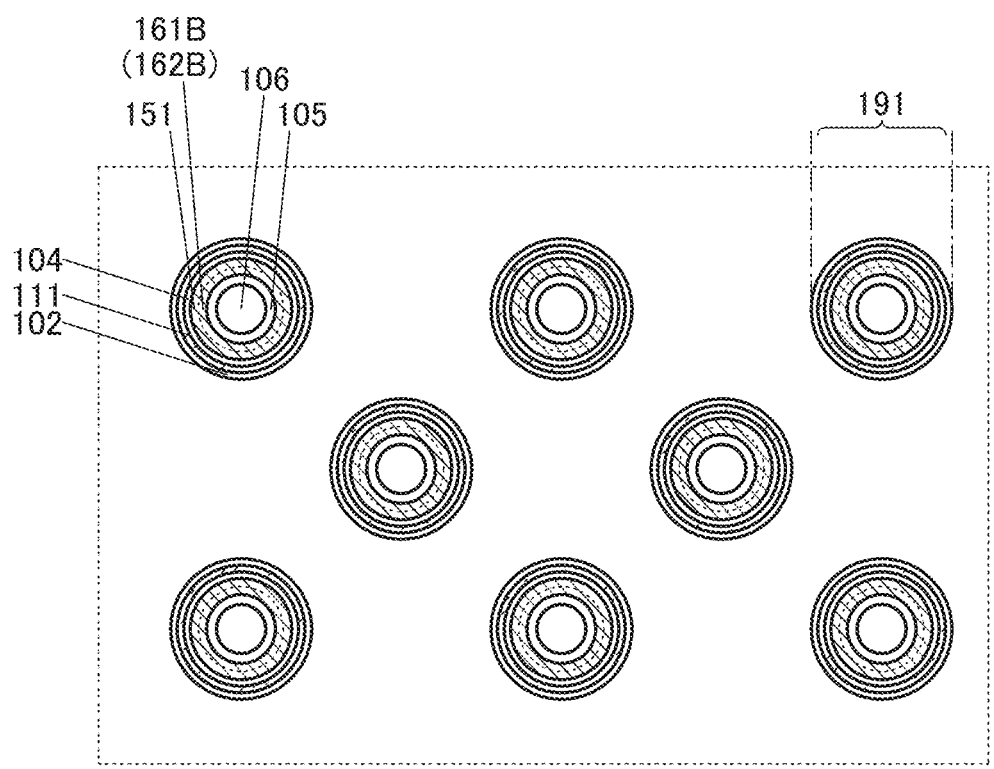

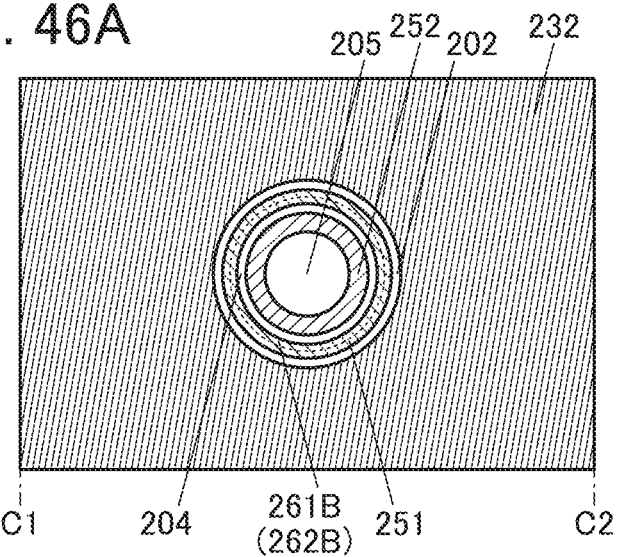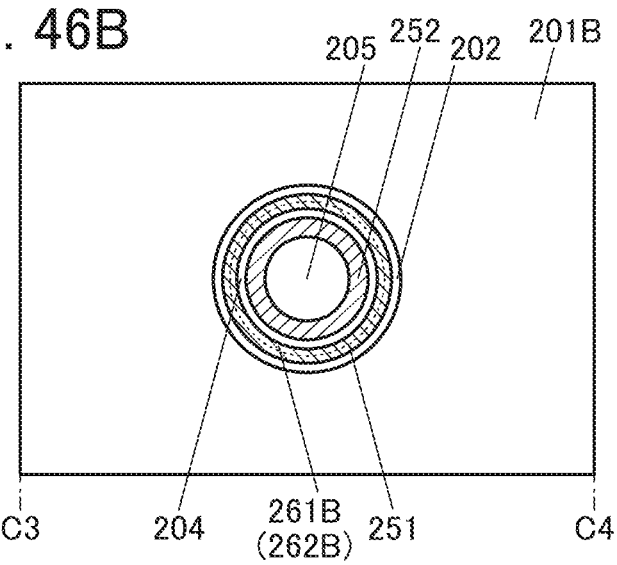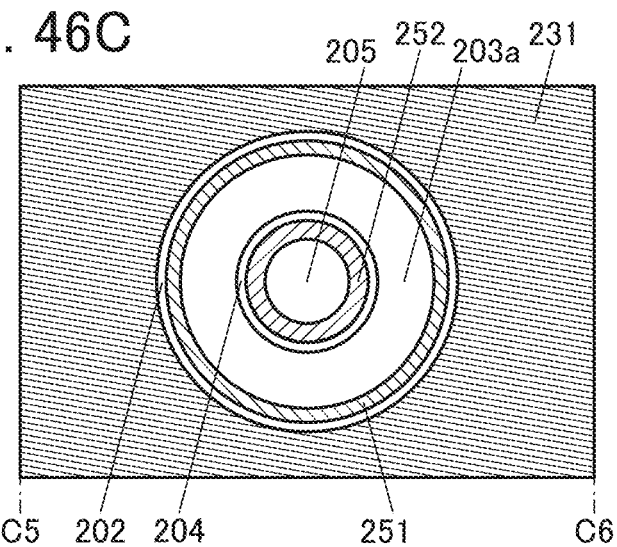

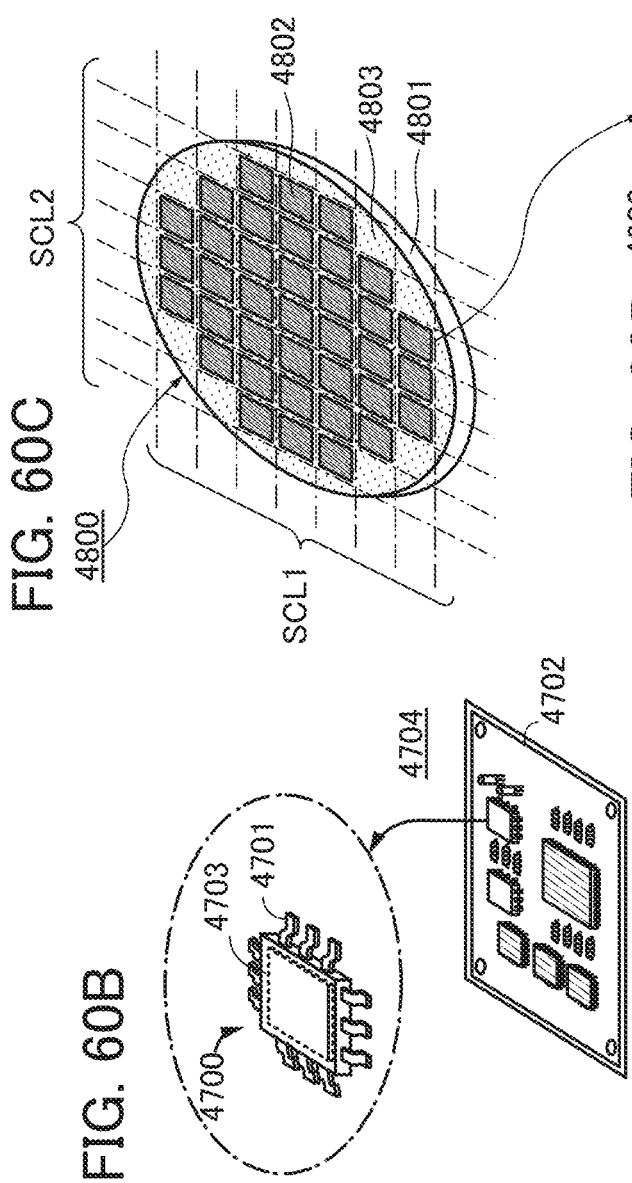
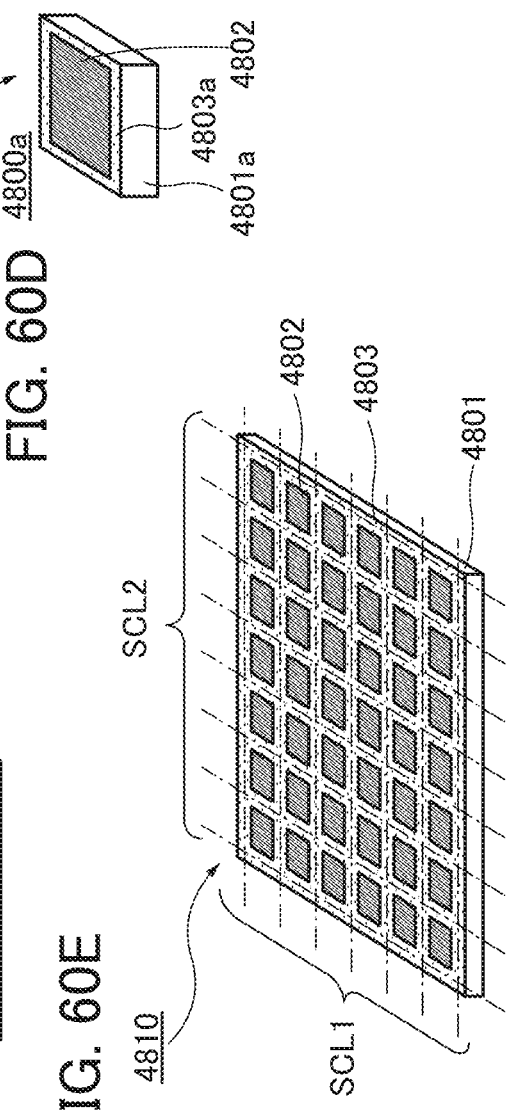
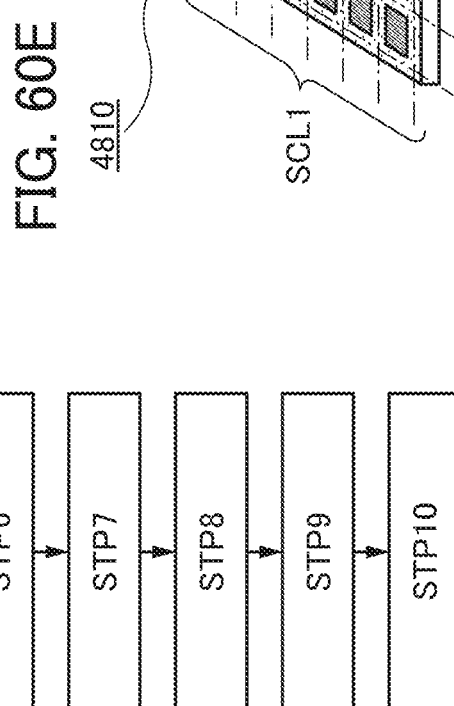

SEMICONDUCTOR DEVICE, SEMICONDUCTOR WAFER, MEMORY DEVICE, AND ELECTRONIC DEVICE

BACKGROUND OF THE INVENTION

1. Field of the Invention

One embodiment of the present invention relates to a semiconductor device, a semiconductor wafer, a memory device, and an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specific examples of the technical field of one embodiment of the present invention disclosed in this specification include a semiconductor device, a display device, a liquid crystal display device, a light-emitting device, a power storage device, an imaging device, a memory device, a processor, an electronic device, a method for driving any of them, a method for manufacturing any of them, a method for testing any of them, and a system including at least one of them.

2. Description of the Related Art

In recent years, electronic components such as central processing units (CPUs), graphics processing units (GPUs), memory devices, and sensors have been used in various electronic devices such as personal computers, smart phones, and digital cameras. The electronic components have been improved to achieve miniaturization, lower power consumption, and other various objectives.

Memory devices with large memory capacity are required because the amount of data handled in the aforementioned electronic devices and the like has increased. As an example of a way to increase the memory capacity, Patent Document 1 discloses a three-dimensional NAND memory element using a metal oxide for a channel formation region.

PATENT DOCUMENT

Patent Document 1: U.S. Pat. No. 9,634,097

SUMMARY OF THE INVENTION

A semiconductor layer used in a three-dimensional NAND memory element is divided into a channel formation region and a low-resistance region. Particularly when a metal oxide is used for the semiconductor layer, how to form the low-resistance region of the metal oxide is important. In a transistor including a semiconductor layer of a metal oxide, a low carrier concentration (sometimes also referred to as intrinsic or substantially intrinsic in this specification and the like) region serves as a channel formation region, and a high carrier concentration region serves as a low-resistance region. Accordingly, a challenge in fabricating a three-dimensional NAND memory element using a metal oxide for a semiconductor layer is separate formation of a channel formation region and a low-resistance region.

An object of one embodiment of the present invention is to provide a novel semiconductor device including a semiconductor layer in which a channel formation region and a low-resistance region are formed separately. Another object of one embodiment of the present invention is to provide a memory device including the semiconductor device. Another object of one embodiment of the present invention is to provide an electronic device using the memory device including the semiconductor device. Another object of one embodiment of the present invention is to provide a memory device with large data capacity. Another object of one embodiment of the present invention is to provide a highly reliable memory device.

Note that the objects of one embodiment of the present invention are not limited to the objects mentioned above. The objects described above do not preclude the existence of other objects. The other objects are the ones that are not described above and will be described below. The other objects that are not described above will be apparent from and can be derived from the description of the specification, the drawings, and the like by those skilled in the art. One embodiment of the present invention achieves at least one of the above objects and the other objects. One embodiment of the present invention does not necessarily achieve all the above objects and the other objects.

(1) One embodiment of the present invention is a semiconductor device including first to seventh insulators, a first conductor, and a first semiconductor. The first conductor is positioned on a first top surface of the first insulator. The first conductor is positioned on a first bottom surface of the second insulator. The third insulator is positioned in a region including a side surface of the first insulator, a second top surface of the first insulator, a side surface of the first conductor, a second bottom surface of the second insulator, and a side surface of the second insulator. The fourth insulator is in contact with the third insulator. The fifth insulator is in contact with the fourth insulator. The first semiconductor is in contact with the fifth insulator. The sixth insulator is in contact with the first semiconductor in a region overlapping the first conductor with the third to fifth insulators positioned between the first semiconductor and the first conductor. The seventh insulator is positioned in a region including the first semiconductor in a region overlapping the first insulator and in a region overlapping the second insulator, and the sixth insulator.

(2) One embodiment of the present invention is a semiconductor device including first to seventh insulators, a first conductor, and a first semiconductor. The first conductor is positioned on a first top surface of the first insulator. The first conductor is positioned on a first bottom surface of the second insulator. The third insulator is positioned in a region including a second top surface of the first insulator, a side surface of the first conductor, and a second bottom surface of the second insulator. The fourth insulator is in contact with the third insulator in a region including a region overlapping the first conductor, a region overlapping the second top surface of the first insulator, and a region overlapping the second bottom surface of the second insulator. The fifth insulator is positioned in a region including the fourth insulator, a region overlapping a side surface of the first insulator, and a region overlapping a side surface of the second insulator. The first semiconductor is in contact with the fifth insulator. The sixth insulator is in contact with the first semiconductor in a region overlapping the first conductor with the third to fifth insulators positioned between the first semiconductor and the first conductor. The seventh insulator is positioned in a region including the first semiconductor in a region overlapping the first insulator and in a region overlapping the second insulator, and the sixth insulator.

(3) One embodiment of the present invention is a semiconductor device including first to seventh insulators, a first conductor, a first semiconductor, and a second semiconductor. The first conductor is positioned on a first top surface of the first insulator. The first conductor is positioned on a first bottom surface of the second insulator. The second semiconductor is positioned on a side surface of the first conductor. The third insulator is positioned in a region including a second top surface of the first insulator, a side surface of the second semiconductor, and a second bottom surface of the second insulator. The fourth insulator is in contact with the third insulator in a region including a region overlapping the first conductor, a region overlapping the second top surface of the first insulator, and a region overlapping the second bottom surface of the second insulator. The fifth insulator is positioned in a region including the fourth insulator, a region overlapping the second top surface of the first insulator, and a region overlapping the second bottom surface of the second insulator. The first semiconductor is positioned in a region including the fifth insulator, a region overlapping a side surface of the first insulator, and a region overlapping a side surface of the second insulator. The sixth insulator is in contact with the first semiconductor in a region overlapping the first conductor with the second semiconductor and the third to fifth insulators positioned between the first semiconductor and the first conductor. The seventh insulator is positioned in a region including the first semiconductor in a region overlapping the first insulator and in a region overlapping the second insulator, and the sixth insulator.

(4) One embodiment of the present invention is a semiconductor device according to any of (1) to (3), in which the fourth insulator has a function of accumulating charge, and charge included in the first semiconductor is accumulated in the fourth insulator by supply of a potential to the first conductor.

(5) One embodiment of the present invention is a semiconductor device including first to third insulators, fifth to seventh insulators, a first conductor, a second conductor, and a first semiconductor. The first conductor is positioned on a first top surface of the first insulator. The first conductor is positioned on a first bottom surface of the second insulator. The third insulator is positioned in a region including a second top surface of the first insulator, a side surface of the first conductor, and a second bottom surface of the second insulator. The second conductor is in contact with the third insulator in a region overlapping the first conductor. The fifth insulator is positioned in a region including the third insulator in a region overlapping the second top surface of the first insulator and in a region overlapping the second bottom surface of the second insulator, and the second conductor. The first semiconductor is positioned in a region including the fifth insulator, a region overlapping a side surface of the first insulator, and a region overlapping a side surface of the second insulator. The sixth insulator is in contact with the first semiconductor in a region overlapping the first conductor with the third insulator, the second conductor, and the fifth insulator positioned between the first semiconductor and the first conductor. The seventh insulator is positioned in a region including the first semiconductor in a region overlapping the first insulator and in a region overlapping the second insulator, and the sixth insulator.

(6) One embodiment of the present invention is a semiconductor device according to (5), in which the second conductor has a function of accumulating charge, and charge included in the first semiconductor is accumulated in the second conductor by supply of a potential to the first conductor.

(7) One embodiment of the present invention is a semiconductor device according to any of (1) to (6), further including a third conductor in contact with the seventh insulator.

(8) One embodiment of the present invention is a semiconductor device according to any of (1) to (7), in which the first semiconductor includes a low-resistance region at and around an interface with the seventh insulator, and the first semiconductor includes a channel formation region in a region overlapping the first conductor.

(9) One embodiment of the present invention is a semiconductor device according to (8), in which the first semiconductor contains a metal oxide, the low-resistance region contains a conductive compound, and the conductive compound contains a component included in the metal oxide and a component included in the seventh insulator.

(10) One embodiment of the present invention is a semiconductor device according to (8), in which the first semiconductor contains a metal oxide, the low-resistance region contains a conductive compound, and the conductive compound contains a component included in the metal oxide, and a metal element.

(11) One embodiment of the present invention is a semiconductor device including first to seventh insulators, a first conductor, a second conductor, a first semiconductor, and a second semiconductor. The first conductor is positioned on a first top surface of the first insulator. The first conductor is positioned on a first bottom surface of the second insulator. The second conductor is positioned on a top surface of the second insulator. The second conductor is positioned on a bottom surface of the third insulator. The fourth insulator is positioned in a region including a side surface of the first insulator, a second top surface of the first insulator, a side surface of the first conductor, a second bottom surface of the second insulator, a side surface of the second insulator, a side surface of the second conductor, and a side surface of the third insulator. The first semiconductor is in contact with the fourth insulator. The fifth insulator is in contact with the first semiconductor in a region overlapping the first conductor with the fourth insulator positioned between the first semiconductor and the first conductor. The sixth insulator is positioned in a region including the first semiconductor in a region overlapping the first insulator, in a region overlapping the second insulator, in a region overlapping the second conductor, and in a region overlapping the third insulator; and the fifth insulator. The second semiconductor is in contact with the sixth insulator. The seventh insulator is in contact with the second semiconductor.

(12) One embodiment of the present invention is a semiconductor device including first to seventh insulators, a first conductor, a second conductor, and first to third semiconductors. The first conductor is positioned on a first top surface of the first insulator. The first conductor is positioned on a first bottom surface of the second insulator. The second conductor is positioned on a top surface of the second insulator. The second conductor is positioned on a bottom surface of the third insulator. The third semiconductor is positioned on a side surface of the first conductor. The fourth insulator is positioned in a region including a side surface of the first insulator, a second top surface of the first insulator, the third semiconductor, a second bottom surface of the second insulator, a side surface of the second insulator, a side surface of the second conductor, and a side surface of the third insulator. The first semiconductor is in contact with the fourth insulator. The fifth insulator is in contact with the first semiconductor in a region overlapping the first conductor with the fourth insulator and the third semiconductor positioned between the first semiconductor and the first conductor. The sixth insulator is positioned in a region including the first semiconductor in a region overlapping the first insulator, in a region overlapping the second insulator, in a region overlapping the second conductor, and in a region overlapping the third insulator; and the fifth insulator. The second semiconductor is in contact with the sixth insulator. The seventh insulator is in contact with the second semiconductor.

(13) One embodiment of the present invention is a semiconductor device according to (11) or (12), further including a third conductor in contact with the seventh insulator.

(14) One embodiment of the present invention is a semiconductor device according to any of (11) to (13), in which the first semiconductor includes a low-resistance region at and around an interface with the sixth insulator, and the first semiconductor includes a channel formation region in a region overlapping the first conductor.

(15) One embodiment of the present invention is a semiconductor device according to (14), in which the first semiconductor contains a metal oxide, the low-resistance region contains a conductive compound, and the compound contains a component included in the metal oxide and a component included in the sixth insulator.

(16) One embodiment of the present invention is a semiconductor device according to (14), in which the first semiconductor contains a metal oxide, the low-resistance region contains a compound, and the compound contains a component included in the metal oxide, and a metal element.

(17) One embodiment of the present invention is a semiconductor wafer including a plurality of semiconductor devices according to any one of (1) to (16) and a region to be subjected to dicing.

(18) One embodiment of the present invention is a memory device including the semiconductor device according to any one of (1) to (16) and a peripheral circuit.

(19) One embodiment of the present invention is an electronic device including the memory device according to (18) and a housing.

One embodiment of the present invention can provide a novel semiconductor device including a semiconductor layer in which a channel formation region and a low-resistance region are formed separately. One embodiment of the present invention can provide a memory device including the semiconductor device. One embodiment of the present invention can provide an electronic device using the memory device including the semiconductor device. One embodiment of the present invention can provide a memory device with large data capacity. One embodiment of the present invention can provide a highly reliable memory device.

Note that the effects of one embodiment of the present invention are not limited to the effects mentioned above. The effects described above do not preclude the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the above effects in some cases.

BRIEF DESCRIPTION OF THE DRAWINGS

In the accompanying drawings:
FIG. 16 is a top view illustrating an example of manufacturing a semiconductor device.

FIGS. 46A to 46C are top views illustrating an example of manufacturing a semiconductor device;

FIG. 60A is a flow chart showing an example of manufacturing an electronic component, FIG. 60B is a perspective view of an electronic component, and FIGS. 60C to 60E show perspective views of semiconductor wafers;

DETAILED DESCRIPTION OF THE INVENTION

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. That is, a metal oxide included in a channel formation region of a transistor that has at least one of an amplifying function, a rectifying function, and a switching function can be referred to as a metal oxide semiconductor or shortly as an OS. An OS FET refers to a transistor containing a metal oxide or an oxide semiconductor.

In this specification and the like, a transistor containing silicon in its channel formation region is sometimes referred to as a Si transistor.

In this specification and the like, a metal oxide including nitrogen is also called a metal oxide in some cases. Moreover, a metal oxide including nitrogen may be called a metal oxynitride.

Embodiment 1

This embodiment will show a circuit configuration, an operating method, and a manufacturing method of a semiconductor device according to one embodiment of the disclosed invention. In the following description, for example, [x,y] refers to an element in the x-th row and in the y-th column, and [z] refers to an element in the z-th row or in the z-th column. Such notations are omitted when there is no need to specify a column and a row.

<Circuit Configuration Example 1>

Figure 1A:
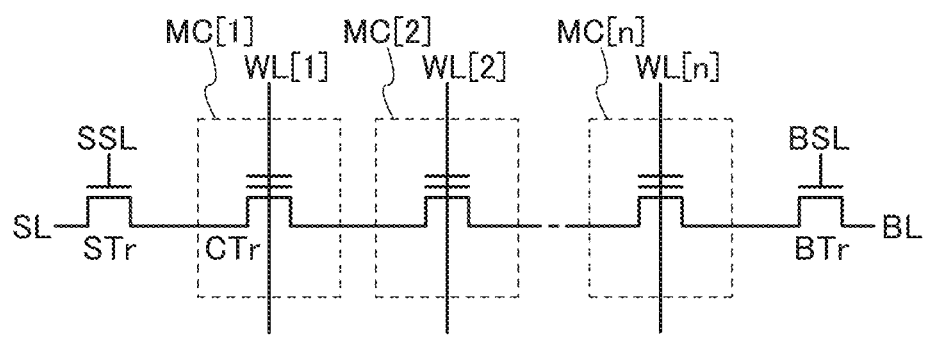
FIGS. 1A and 1B are circuit diagrams each illustrating a configuration example of a semiconductor device.

First, a circuit configuration of a NAND memory element that is an example of a semiconductor device will be described with reference to FIG. 1A. FIG. 1A is a circuit diagram of a one-page NAND memory element. The one-page NAND memory element includes n memory cells MC[1] to MC [n] (n is an integer of 1 or more), wirings WL[1] to WL[n] for controlling the memory cells, a wiring BL, a wiring SL, a transistor STr and a transistor BTr for selecting the page, a wiring SSL for controlling the transistor STr, and a wiring BSL for controlling the transistor BTr. The wiring WL functions as a wiring for supplying a potential to a control gate (sometimes simply referred to as a gate in this specification and the like) of an after-mentioned cell transistor in the memory cell MC. The wiring SL and the wiring BL each function as a wiring for supplying a potential to a first terminal and/or a second terminal of the cell transistor in the memory cell MC.

Each of the memory cells MC includes a cell transistor CTr. In general, a cell transistor is a normally-on transistor and includes a control gate and a charge accumulation layer. The charge accumulation layer is positioned in a region overlapping a channel formation region with a tunnel insulating film therebetween. The control gate is positioned in a region overlapping the charge accumulation layer with a blocking film therebetween. In the cell transistor, a tunnel current occurs when a write potential is supplied to the control gate and a predetermined potential is supplied to a first terminal or a second terminal; hence, electrons are injected from the channel formation region into the charge accumulation layer. Thus, the threshold voltage of the cell transistor in which electrons are injected into the charge accumulation layer is increased. As the charge accumulation layer, an insulator or a conductor (a floating gate) can be used. Note that the detailed operating principle of the semiconductor device in FIG. 1A will be described later.

The first terminal of the cell transistor CTr is electrically connected in series with the second terminal of the cell transistor CTr in the adjacent memory cell MC. That is, in the circuit configuration in FIG. 1A, the n cell transistors CTr are electrically connected in series. The second terminal of the cell transistor CTr in the memory cell MC[1] is electrically connected to a first terminal of the transistor STr. The first terminal of the cell transistor CTr in the memory cell MC[n] is electrically connected to a first terminal of the transistor BTr. The control gates of the cell transistors CTr in the memory cells MC[1] to MC[n] are electrically connected to the respective wirings WL[1] to WL[n]. A second terminal of the transistor STr is electrically connected to the wiring SL. A gate of the transistor STr is electrically connected to the wiring SSL. A second terminal of the transistor BTr is electrically connected to the wiring BL. A gate of the transistor BTr is electrically connected to the wiring BSL.

A channel formation region of the cell transistor CTr preferably contains silicon or a metal oxide that will be described in Embodiment 4. Particularly when the channel formation region contains a metal oxide containing at least one of indium, an element M (e.g., aluminum, gallium, yttrium, or tin), and zinc, the metal oxide functions as a wide gap semiconductor; thus, the cell transistor containing the metal oxide in its channel formation region has ultralow off-state current characteristics. That is, the leakage current of the cell transistor CTr in the off state can be reduced, so that power consumption of the semiconductor device in one embodiment of the present invention can be reduced. Moreover, channel formation regions of the transistor STr and the transistor BTr can also contain the above metal oxide.

Alternatively, the channel formation region of the transistor STr and/or the transistor BTr can have a composition different from that of the cell transistor CTr. For example, it is possible to use a material containing the aforementioned metal oxide for the channel formation region of the cell transistor CTr and use a material containing silicon for the channel formation region of the transistor STr and/or the transistor BTr.

Figure 1B:
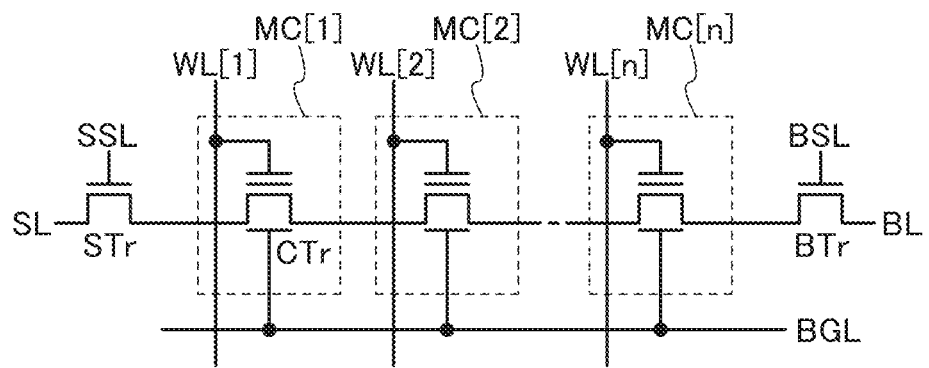

Note that one embodiment of the present invention is not limited to the semiconductor device illustrated in FIG. 1A. One embodiment of the present invention can have a circuit configuration obtained by appropriately changing the circuit configuration of the semiconductor device in FIG. 1A. For example, one embodiment of the present invention may be a semiconductor device in which the cell transistor CTr has a backgate as illustrated in FIG. 1B. In the semiconductor device of FIG. 1B including the components of the semiconductor device shown in FIG. 1A, the cell transistors CTr in the memory cells MC[1] to MC[n] are provided with backgates to which a wiring BGL is electrically connected. Instead of including one wiring BGL electrically connected to the backgates of the cell transistors CTr in the memory cells MC[1] to MC[n], the semiconductor device in FIG. 1B may include wirings BGL that are electrically connected to the respective backgates independently to supply different potentials to the backgates. Note that an operation example of the semiconductor device in FIG. 1B will be described later.

Figure 2:
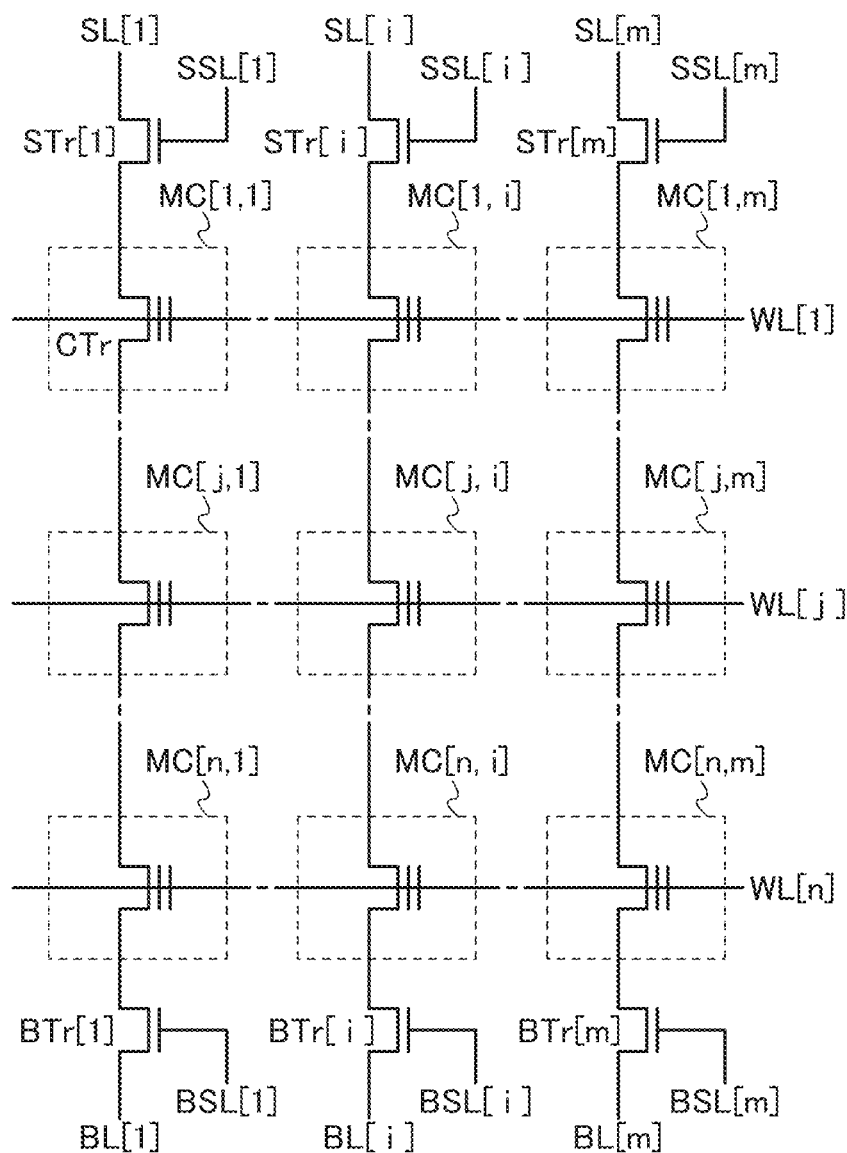
FIG. 2 is a circuit diagram illustrating a configuration example of a semiconductor device.

To further increase the memory capacity of the semiconductor devices in FIGS. 1A and 1B, the memory cells MC shown in FIGS. 1A and 1B are arranged in a matrix. For example, a circuit configuration illustrated in FIG. 2 is obtained when the memory cells MC in FIG. 1A are arranged in a matrix. Note that in this specification and the like, a NAND memory element with multiple pages illustrated in FIG. 2 is referred to as a one-block NAND memory element.

In the semiconductor device illustrated in FIG. 2, the semiconductor device (the one-page NAND memory element) in FIG. 1A is arranged in m columns (m is an integer of 1 or more), and the wiring WL is electrically connected to and shared between the memory cells MC in the same row. That is, the semiconductor device in FIG. 2 has a matrix of n rows and m columns and includes memory cells MC[1,1] to MC[n,m]. Accordingly, in the semiconductor device in FIG. 2, electrical connection is established through the wirings WL[1] to WL[n], wirings BL[1] to BL[m], wirings BSL[1] to BSL[m], wirings SL[1] to SL[m], and wirings SSL[1] to SSL[m]. Specifically, the control gate of the cell transistor CTr in the memory cell MC[j,i] (j is an integer of 1 to n, and i is an integer of 1 to m) is electrically connected to the wiring WL[j]. The wiring SL[i] is electrically connected to the second terminal of the transistor STr[i]. The wiring BL[i] is electrically connected to the second terminal of the transistor BTr[i].

FIG. 2 only illustrates the memory cell MC[1,1], the memory cell MC[1,i], the memory cell MC[1,m], the memory cell MC[j,1], the memory cell MC[j,i], the memory cell MC[j,m], the memory cell MC[n,1], the memory cell MC[n,i], the memory cell MC[n,m], the wiring WL[1], the wiring WL[F], the wiring WL[n], the wiring BL[1], the wiring BL[i], the wiring BL[m], the wiring BSL[1], the wiring BSL[i], the wiring BSL[m], the wiring SL[1], the wiring SL[i], the wiring SL[m], the wiring SSL[1], the wiring SSL[i], the wiring SSL[m], the cell transistors CTr, the transistor BTr[1], the transistor BTr[i], the transistor BTr[m], the transistor STr[1], the transistor STr[i], and the transistor STr[m] and omit the other wirings, elements, symbols, and reference numerals.

Figure 3:
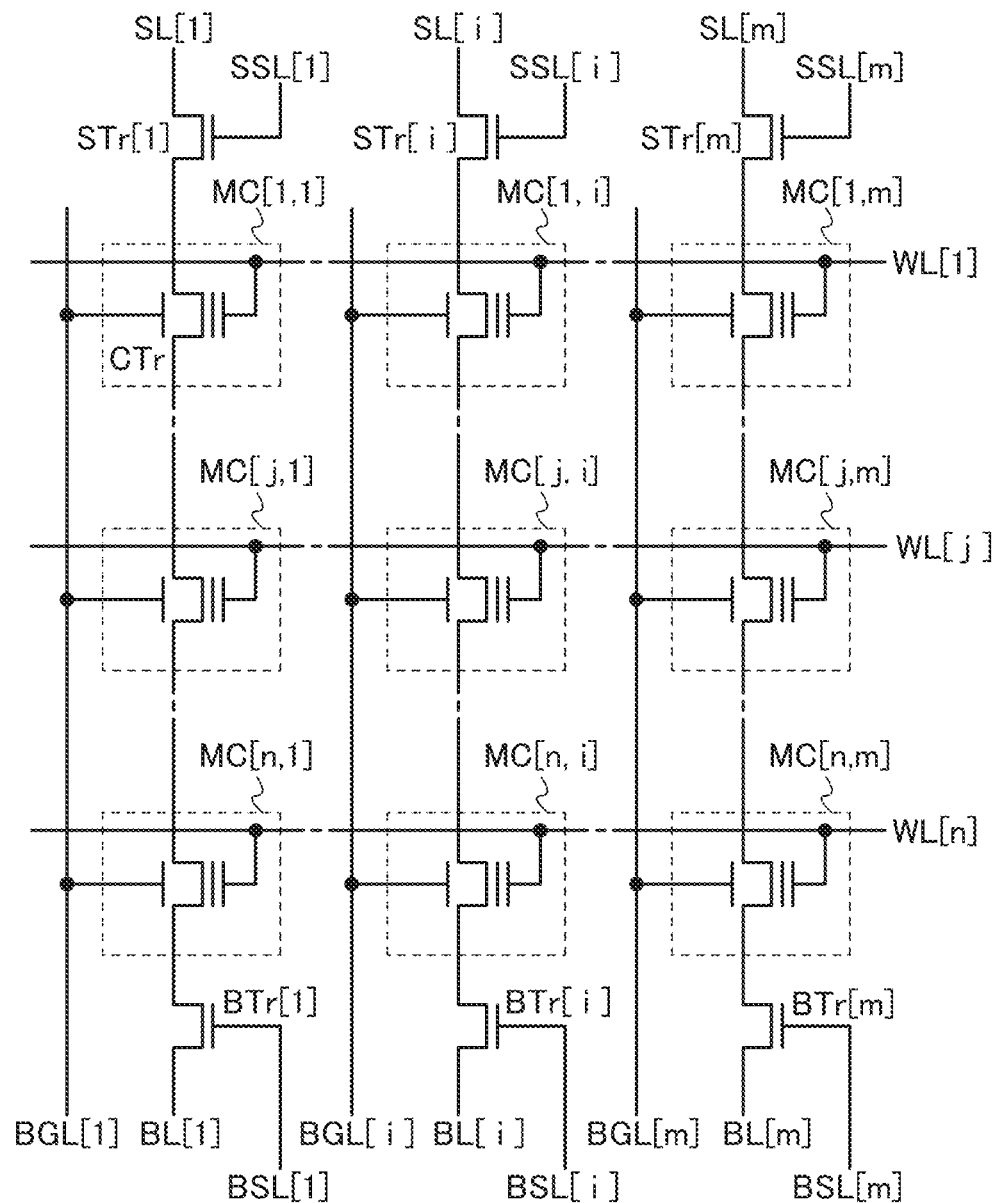
FIG. 3 is a circuit diagram illustrating a configuration example of a semiconductor device.

In FIG. 3, the semiconductor device in FIG. 1B is arranged in m columns (m is an integer of 1 or more). In the semiconductor device in FIG. 3, all the transistors included in the memory cells MC have a backgate; hence, the semiconductor device in FIG. 3 includes wirings BGL[1] to BGL[m] electrically connected to the corresponding backgates. Note that the description of the semiconductor device in FIG. 2 is referred to for the semiconductor device in FIG. 3.

One embodiment of the present invention is not limited to the configurations of the semiconductor devices in FIG. 2 and FIG. 3 in which the semiconductor device in FIG. 1A or FIG. 1B is arranged in a matrix. One embodiment of the present invention can have a circuit configuration obtained by appropriately changing the circuit configuration of the semiconductor device in FIG. 2 or FIG. 3. For example, FIG. 2 and FIG. 3 show the wirings BSL[1] to BSL[m] as the wirings for controlling the respective transistors BTr[1] to BTr[m]; alternatively, one wiring may be electrically connected to the gates of the transistors BTr[1] to BTr[m]. Similarly, as the wiring for controlling the transistors STr[1] to STr[m], one wiring instead of the wirings SSL[1] to SSL[m] may be electrically connected to the gates of the transistors STr[1] to STr[m].

<Operation Method Example 1>

Next, an example of a method for operating the semiconductor device in FIG. 1A or FIG. 1B will be described with reference to FIGS. 4A and 4B and FIGS. 5A and 5B. Note that in the following description, a low-level potential and a high-level potential do not represent any fixed potentials, and specific potentials may vary depending on wirings. For example, a low-level potential and a high-level potential supplied to the wiring BSL may be different from a low-level potential and a high-level potential supplied to the wiring BL.

A potential VPGM enables electron injection into a charge accumulation layer of the cell transistor CTr when being supplied to the control gate of the cell transistor CTr. A potential $V_{PS}$ enables the cell transistor CTr to be turned on when being supplied to the control gate of the cell transistor CTr. The wiring SL is supplied with an appropriate potential.

In this operation method example, the wiring BGL illustrated in FIG. 1B has previously been supplied with a potential in a range where the cell transistor CTr operates normally, unless otherwise specified. Accordingly, the operations of the semiconductor devices in FIGS. 1A and 1B can be considered the same.

<<Write Operation>>

Figure 4A:
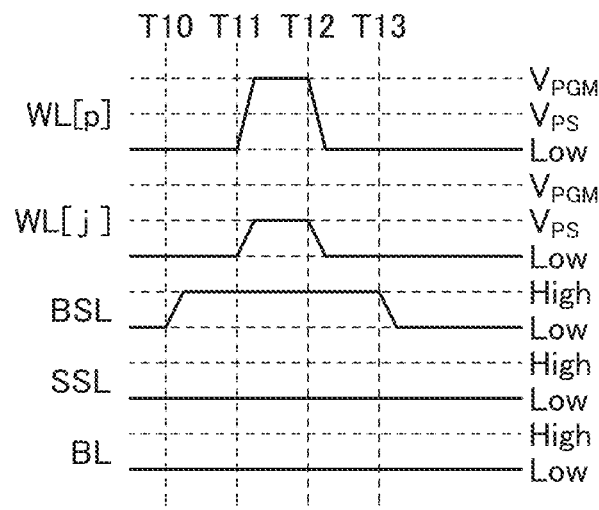
FIGS. 4A and 4B are timing charts showing an operation example of a semiconductor device.

FIG. 4A is a timing chart showing an operation example for writing data into the semiconductor device. The timing chart in FIG. 4A shows changes in potential level of the wiring WL[p] (p is an integer of 1 to n), the wiring WL[j] (here, j is an integer of 1 to n except p), the wiring BSL, the wiring SSL, and the wiring BL. Note that the timing chart in FIG. 4A shows an operation example for writing data into the memory cell MC [p].

Before time T10, a low-level potential is supplied to the wiring BL.

Between time T10 and time T13, a low-level potential is constantly supplied to the wiring SSL. Thus, the low-level potential is supplied to the gate of the transistor STr, so that the transistor STr is turned off.

Between time T10 and time T11, a high-level potential starts to be supplied to the wiring BSL. Thus, the gate potential of the transistor BTr reaches the high-level potential between time T10 and time T11, whereby the transistor BTr is turned on. When the transistor BTr is turned on, the low-level potential supplied from the wiring BL is applied to the first terminal of the cell transistor CTr in the memory cell MC[n].

Between time T11 and time T12, the potential $V_{PS}$ starts to be supplied to the wiring WL[j]. Hence, the potential of the control gate of the cell transistor CTr in the memory cell MC[j] reaches the potential $V_{PS}$ between time T11 and time T12. At this time, the cell transistor CTr in the memory cell MC[n] is turned on because the low-level potential supplied from the wiring BL is supplied to the first terminal of the cell transistor CTr in the memory cell MC[n]. Consequently, the low-level potential supplied from the wiring BL is applied to the first terminal of the cell transistor CTr in the memory cell MC[n−1]. In other words, the cell transistor CTr in the memory cell MC[j] is turned on in sequence.

Moreover, between time T11 and time T12, the potential VPGM starts to be supplied to the wiring WL[p]. Hence, the potential of the control gate of the cell transistor CTr in the memory cell MC[p] reaches the potential VPGM between time T11 and time T12. Since the low-level potential supplied from the wiring BL is supplied to the first terminal of the cell transistor CTr in the memory cell MC[p] according to the aforementioned operation, electrons are injected into the charge accumulation layer from the channel formation region of the cell transistor CTr in the memory cell MC [p]. Thus, data is written into the memory cell MC[p]. Note that the threshold voltage of the cell transistor CTr is increased by electron injection into the charge accumulation layer from the channel formation region of the cell transistor CTr in the memory cell MC[p].

The low-level potential supplied from the wiring BL is assumed to be supplied up to the first terminal of the transistor STr by time T12. Between time T12 and time T13, a low-level potential starts to be supplied to the wiring WL[j] and the wiring WL[p], and the potentials of the wiring WL[j] and the wiring WL[p] become the low-level potential between time T12 and time T13.

After time T13, a low-level potential starts to be supplied to the wiring BSL. Thus, the gate potential of the transistor BTr becomes the low-level potential after time T13, so that the transistor BTr is turned off. Alternatively, although not shown in the timing chart in FIG. 4A, the transistor BTr can be turned off at that time by setting the potential of the wiring BL to a high-level potential and not supplying a low-level potential to the wiring BSL.

Through the above operation, data can be written into the semiconductor device in FIG. 1A or FIG. 1B.

<<Read Operation>>

Figure 4B:
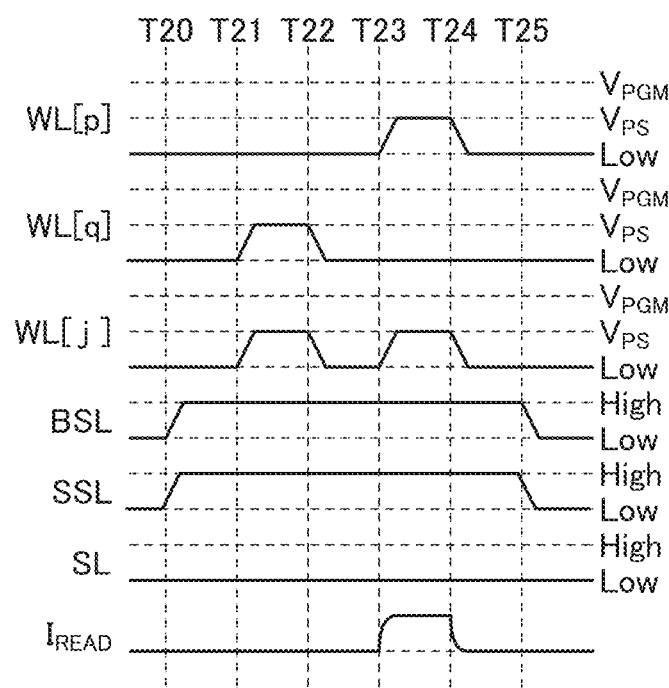

FIG. 4B is a timing chart showing an operation example for reading data from the semiconductor device. The timing chart in FIG. 4B shows changes in potential level of the wiring WL[p], the wiring WL[q] (q is an integer of 1 to n except p), the wiring WL[j] (here, j is an integer of 1 to n except p and q), the wiring BSL, the wiring SSL, and the wiring SL, and also shows a change in the amount of $I_{READ}$ as a current flowing between the wiring SL and the wiring BL. Note that the timing chart in FIG. 4B shows an operation example for reading data from the memory cell MC[p] and the memory cell MC[q], assuming that electrons have been injected into the charge accumulation layer of the cell transistor CTr in the memory cell MC[p] but not into the charge accumulation layer of the cell transistor CTr in the memory cell MC[q].

Before time T20, a low-level potential is supplied to the wiring SL.

Between time T20 and time T21, a high-level potential starts to be supplied to the wiring BSL and the wiring SSL. Thus, the gate potentials of the transistor BTr and the transistor STr reach the high-level potential between time T20 and time T21, whereby the transistor BTr and the transistor STr are turned on. When the transistor STr is turned on, the low-level potential supplied from the wiring SL is applied to the second terminal of the cell transistor CTr in the memory cell MC[1].

Between time T21 and time T22, the potential $V_{PS}$ starts to be supplied to the wiring WL[q] and the wiring WL[F]. Hence, the potentials of the control gates of the cell transistors CTr in the memory cell MC[q] and the memory cell MC[j] reach the potential $V^{PS}$ between time T21 and time T22. At this time, when the low-level potential supplied from the wiring SL is supplied to the second terminals of the cell transistors CTr in the memory cell MC[q] and the memory cell MC[j], these cell transistors CTr are turned on.

Meanwhile, between time T21 and time T22, a low-level potential is supplied to the wiring WL[p]. Hence, the potential of the control gate of the cell transistor CTr in the memory cell MC[p] becomes the low-level potential between time T21 and time T22. The threshold voltage of the cell transistor CTr in the memory cell MC[p] has been increased because of electrons injected into the charge accumulation layer of the cell transistor CTr in the memory cell MC[p]. For these reasons, the cell transistor CTr in the memory cell MC[p] is turned off, and a current does not flow between the wiring SL and the wiring BL. In other words, measuring the amount of current flowing through the wiring BL at this time to show a current does not flow between the wiring SL and the wiring BL proves that electrons have been injected into the charge accumulation layer of the cell transistor CTr in the memory cell MC[p].

Between time T22 and time T23, a low-level potential starts to be supplied to the wiring WL[p], the wiring WL[q], and the wiring WL[j]. Hence, the potentials of the control gates of the cell transistors CTr in the memory cells MC[1] to MC[n] become the low-level potential between time T22 and time T23.

Between time T23 and time T24, the potential $V_{PS}$ starts to be supplied to the wiring WL[j]. Thus, the potential of the control gate of the cell transistor CTr in the memory cell MC[j] reaches the potential $V_{PS}$ between time T23 and time T24. At this time, when the low-level potential supplied from the wiring SL is supplied to the first terminal of the cell transistor CTr in the memory cell MC[j], the cell transistor CTr is turned on.

Furthermore, between time T23 and time T24, the potential $V_{PS}$ starts to be supplied to the wiring WL[p]. Thus, the potential of the control gate of the cell transistor CTr in the memory cell MC[p] reaches the potential $V_{PS}$ between time T23 and time T24. Note that the threshold voltage of the cell transistor CTr in the memory cell MC[p] has been increased by electron injection into the charge accumulation layer of the cell transistor CTr in the memory cell MC[p]; in this operation example, it is assumed that the cell transistor CTr is substantially turned on because the potential $V_{PS}$ is supplied to the control gate of the cell transistor CTr.

Moreover, between time T23 and time T24, a low-level potential is supplied to the wiring WL[q]. Hence, the potential of the control gate of the cell transistor CTr in the memory cell MC[q] becomes the low-level potential between time T23 and time T24. Note that the cell transistor CTr in the memory cell MC exhibits normally-on characteristics; accordingly, the cell transistor CTr in the memory cell MC[q] is turned on even when the low-level potential is supplied from the wiring SL to the first terminal of the cell transistor CTr in the memory cell MC[q].

That is, the cell transistors CTr in the memory cells MC[1] to MC[n] are on, so that a current flows between the source and the drain of each of the cell transistors CTr. In other words, measuring the amount of current flowing through the wiring BL at this time to show a current flows between the wiring SL and the wiring BL demonstrates that electrons have not been injected into the charge accumulation layer of the cell transistor CTr in the memory cell MC[q].

Between time T24 and time T25, a low-level potential starts to be supplied to the wiring WL[p], the wiring WL[q], and the wiring WL[j]. Thus, the potentials of the control gates of the cell transistors CTr in the memory cells MC[1] to MC[n] become the low-level potential between time T24 and time T25.

After time T25, a low-level potential starts to be supplied to the wiring BSL and the wiring SSL. Thus, the gate potentials of the transistor BTr and the transistor STr become the low-level potential between time T25 and time T26, whereby the transistor BTr and the transistor STr are turned off.

That is, to read data from a given memory cell MC, a low-level potential is supplied to the control gate of the cell transistor CTr in the given memory cell MC and a high-level potential is supplied to the control gates of the cell transistors CTr in the other memory cells MC, and then the amount of current flowing between the wiring SL and the wiring BL is measured, whereby data retained in the given memory cell MC can be read out.

With the above operations, data can be written into and read from the semiconductor device in FIG. 1A or FIG. 1B.

<<Erase Operation>>

Figure 5A:
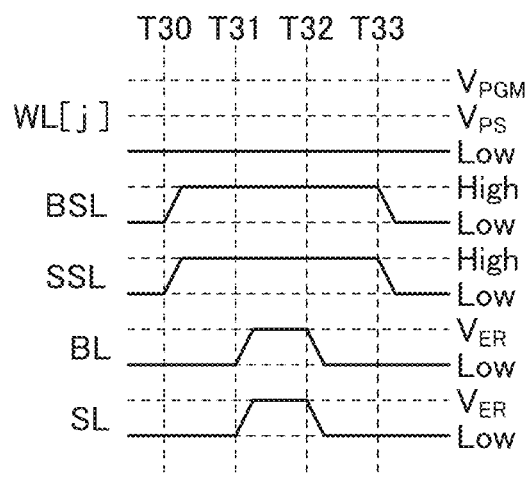
FIGS. 5A and 5B are timing charts showing an operation example of a semiconductor device.

FIG. 5A is a timing chart showing an operation example for erasing data stored in the semiconductor device. The timing chart in FIG. 5A shows changes in potential level of the wiring WL[j] (here, j is an integer of 1 to n), the wiring BSL, the wiring SSL, the wiring BL, and the wiring SL. Note that the erase operation for the NAND memory element is performed on a page-by-page basis.

Before time T30, a low-level potential is supplied to the wiring BL and the wiring SL.

Between time T30 and time T33, a low-level potential is constantly supplied to the wiring WL[j].

Between time T30 and time T31, a high-level potential starts to be supplied to the wiring BSL and the wiring SSL. Thus, the gate potentials of the transistor BTr and the transistor STr reach the high-level potential between time T30 and time T31, whereby the transistor BTr and the transistor STr are turned on. When the transistor BTr and the transistor STr are turned on, the low-level potential supplied from the wiring SL is supplied to the second terminal of the cell transistor CTr in the memory cell MC[1], and the low-level potential supplied from the wiring BL is supplied to the first terminal of the cell transistor CTr in the memory cell MC [n].

Between time T31 and time T32, a potential VER starts to be supplied to the wiring BL and the wiring SL. Note that the potential VER is higher than the high-level potential flowing through the wiring BL and the wiring SL. Accordingly, between time T31 and time T32, the potentials of the channel formation regions of all the cell transistors CTr in the memory cells MC[1] to MC[n] increase; hence, electrons injected into the charge accumulation layer of each of the cell transistors CTr are extracted and moved to the channel formation region.

Between time T32 and time T33, a low-level potential starts to be supplied to the wiring BL and the wiring SL.

After time T33, a low-level potential starts to be supplied to the wiring BSL and the wiring SSL. Thus, the gate potentials of the transistor BTr and the transistor STr become the low-level potential between time T33 and time T34, whereby the transistor BTr and the transistor STr are turned off.

Through the above operation, data can be erased from the semiconductor device in FIG. 1A or FIG. 1B.

Figure 5B:
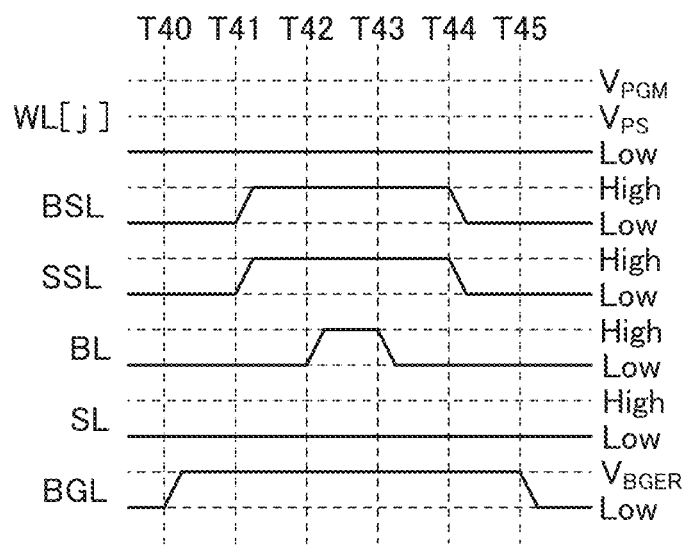

In the semiconductor device in FIG. 1B, the erase operation different from the above can be performed by using the wiring BGL. FIG. 5B shows an example of the operation.

Before time T40, a low-level potential is supplied to the wiring BL and the wiring SL.

Between time T40 and time T45, a low-level potential is constantly supplied to the wiring WL[j].

Between time T40 and time T41, a low-level potential starts to be supplied to the wiring BSL and the wiring SSL. Thus, the gate potentials of the transistor BTr and the transistor STr become the low-level potential between time T40 and time T41, whereby the transistor BTr and the transistor STr are turned off. Consequently, the portion between the first terminal of the transistor STr and the first terminal of the transistor BTr becomes floating.

Moreover, between time T40 and time T41, a potential VBGER starts to be supplied to the wiring BGL. Note that the potential VBGER is extremely high. The portion between the first terminal of the transistor STr and the first terminal of the transistor BTr is floating, and the potential of the wiring BGL becomes VBGER between time T40 and time T41, whereby the potentials of the channel formation regions of all the cell transistors CTr in the memory cells MC[1] to MC[n] are raised by capacitive coupling. Thus, electrons injected into the charge accumulation layer of each of the cell transistors CTr are extracted and moved to the channel formation region.

Between time T41 and time T42, a high-level potential starts to be supplied to the wiring BSL and the wiring SSL. Hence, the gate potentials of the transistor BTr and the transistor STr reach the high-level potential between time T41 and time T42, whereby the transistor BTr and the transistor STr are turned on.

Between time T42 and time T43, a high-level potential starts to be supplied to the wiring BL. Thus, the electrons that are extracted from the charge accumulation layer of the cell transistor CTr can flow through the wiring BL between time T42 and time T43.

Between time T43 and time T44, a low-level potential starts to be supplied to the wiring BL. Then, at time T44, a low-level potential starts to be supplied to the wiring BSL and the wiring SSL. Thus, the gate potentials of the transistor BTr and the transistor STr become the low-level potential, so that the transistor BTr and the transistor STr are turned off. Finally, after time T45, a low-level potential is supplied to the wiring BGL.

As shown in the above operation, data can be erased from the semiconductor device in FIG. 1B also by using the wiring BGL.

<Structure Example and Manufacturing Method Example 1>

For easy understanding of the structure of the semiconductor device having the circuit configuration in any of FIGS. 1A and 1B, FIG. 2, and FIG. 3 described above, a method for manufacturing the semiconductor device will be described below.

Figure 6A:
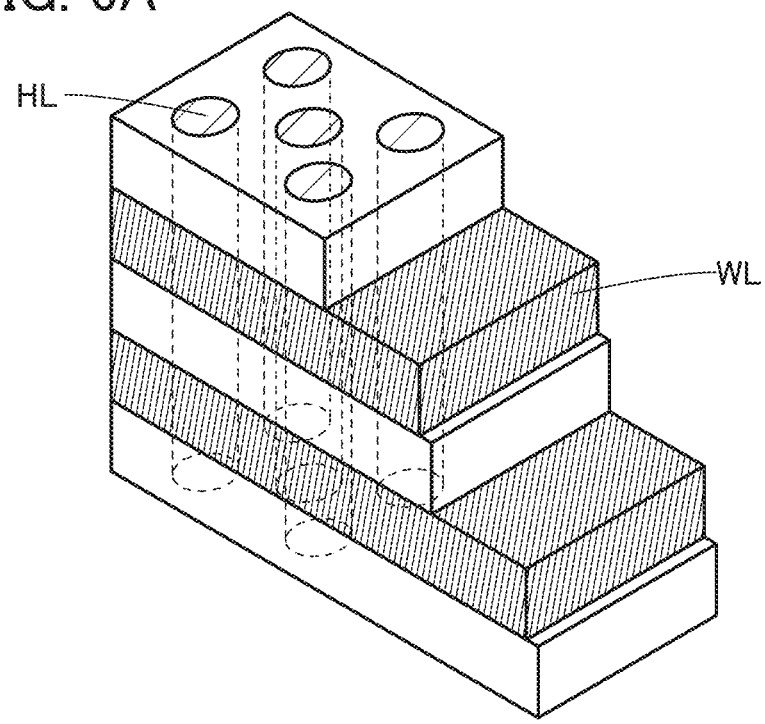
FIGS. 6A to 6C are a schematic view, a top view, and a cross-sectional view for illustrating a structure example of a semiconductor device.
Figure 6B:
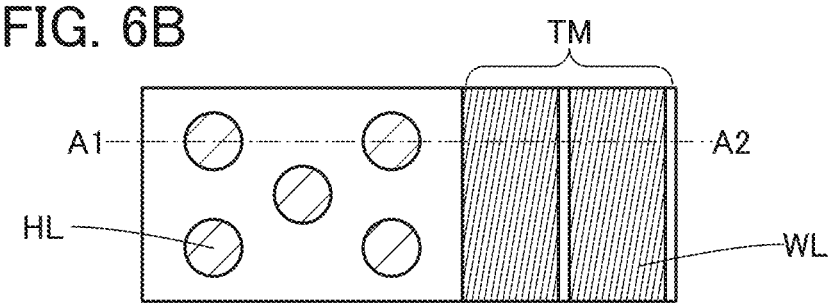
Figure 6C:
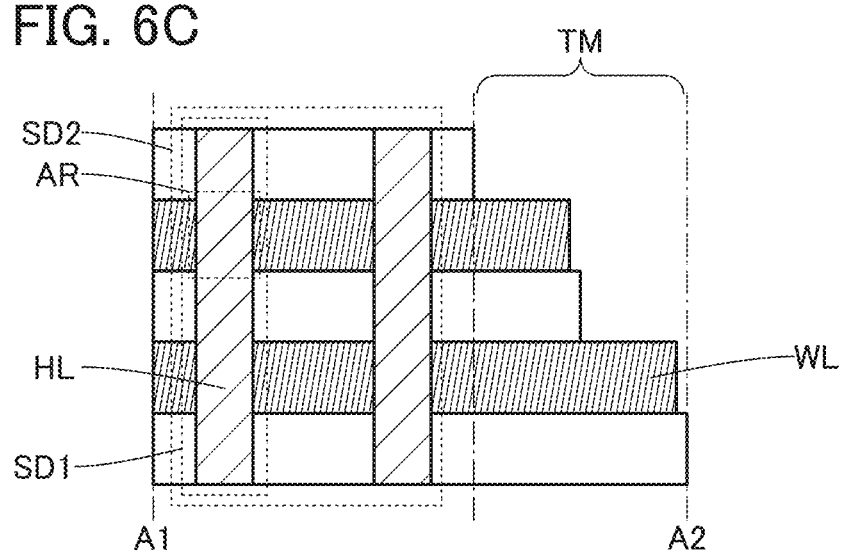

FIGS. 6A to 6C show a schematic example of the semiconductor device shown in FIG. 2 or FIG. 3. FIG. 6A is a perspective view of the semiconductor device. FIG. 6B is a top view of FIG. 6A. FIG. 6C is a cross-sectional view along the dashed-dotted line A1-A2 in FIG. 6B.

The semiconductor device includes a structure body in which the wirings WL and insulators (regions without a hatching pattern in FIGS. 6A to 6C) are stacked.

An opening is formed in the structure body to penetrate the insulators and the wirings WL altogether. To provide the memory cell MC in a region AR that penetrates the wirings WL, an insulator, a conductor, and a semiconductor are formed in the opening. The conductor functions as a source electrode or a drain electrode of the cell transistor CTr in the memory cell MC. The semiconductor functions as a channel formation region of the cell transistor CTr. Alternatively, without formation of the conductor, a channel formation region and a low-resistance region may be formed in the semiconductor and the low-resistance region may serve as the source electrode or the drain electrode of the cell transistor CTr. The region where the insulator, the conductor, and the semiconductor are formed in the opening is shown as a region HL in FIGS. 6A to 6C. In FIG. 6A, the region HL included inside the structure body is indicated by a dashed line. Note that when the transistor included in the memory cell MC has a backgate, the conductor included in the region HL may function as the wiring BGL electrically connected to the backgate.

In other words, FIGS. 6A to 6C illustrate that the semiconductor device shown in FIG. 1A or FIG. 1B is formed in a region SD1, and the semiconductor device shown in FIG. 2 or FIG. 3 is formed in a region SD2.

A region TM where the wiring WL is exposed functions as a connection terminal for supplying a potential to the wiring WL. That is, connecting a wiring to the region TM enables a potential to be supplied to the gate of the cell transistor CTr.

Figure 7A:
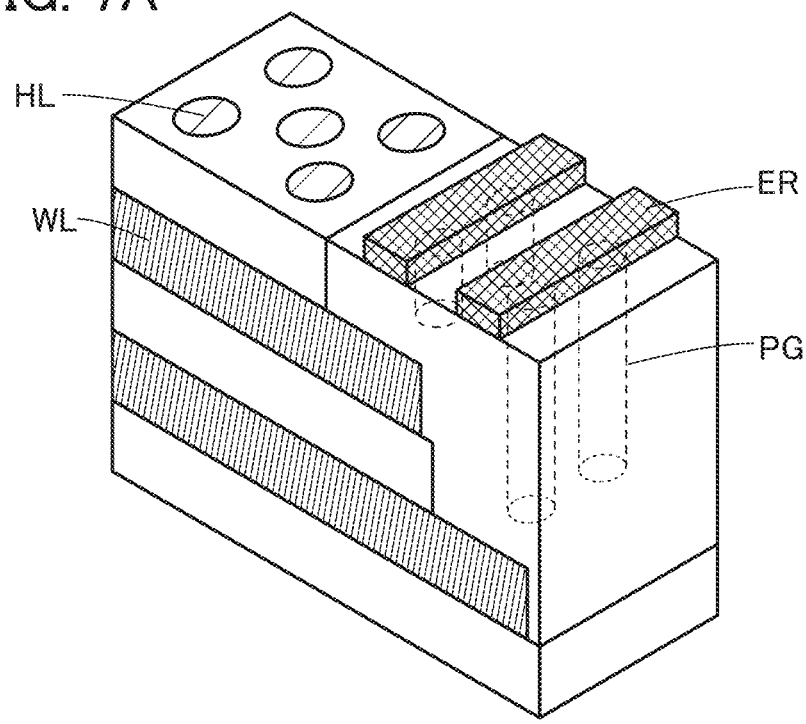
FIGS. 7A to 7C are a schematic view, a top view, and a cross-sectional view for illustrating a structure example of a semiconductor device.
Figure 7B:
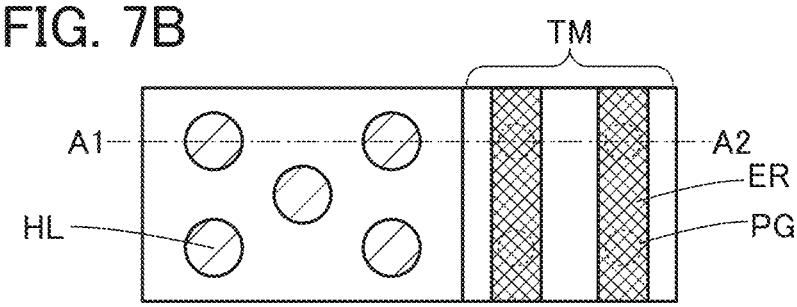
Figure 7C:
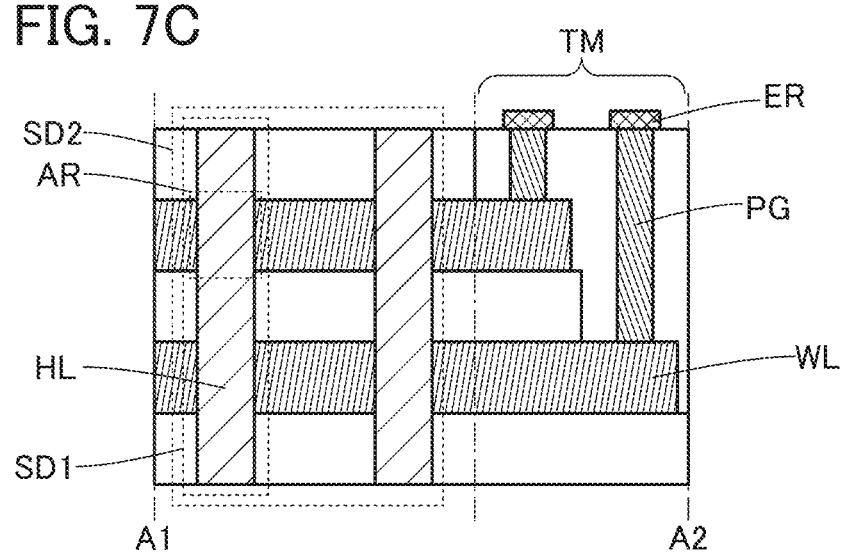

Note that the shape of the region TM is not limited to that in the structure example shown in FIGS. 6A to 6C. The semiconductor device of one embodiment of the present invention may be configured, for example, such that an insulator is formed over the region TM in FIGS. 6A to 6C, an opening is provided in the insulator, and a conductor PG is formed to fill the opening (FIGS. 7A to 7C). A wiring ER is formed over the conductor PG, whereby the wiring ER and the wiring WL are electrically connected to each other. In FIG. 7A, the conductor PG included inside the structure body is indicated by a dashed line, and the dashed line representing the region HL is omitted.

In the following Manufacturing method example 1, a method for forming the memory cell MC illustrated in any of FIGS. 1A and 1B, FIG. 2, and FIG. 3 in the region AR will be described.

<<Manufacturing Method Example 1>>

FIGS. 8A to 14B are cross-sectional views for illustrating an example of manufacturing the semiconductor device in FIG. 1A, and are specifically cross-sectional views of the cell transistor CTr in the channel length direction. In the cross-sectional views of FIGS. 8A to 14B, some components are not illustrated for simplification.

Figure 8A:
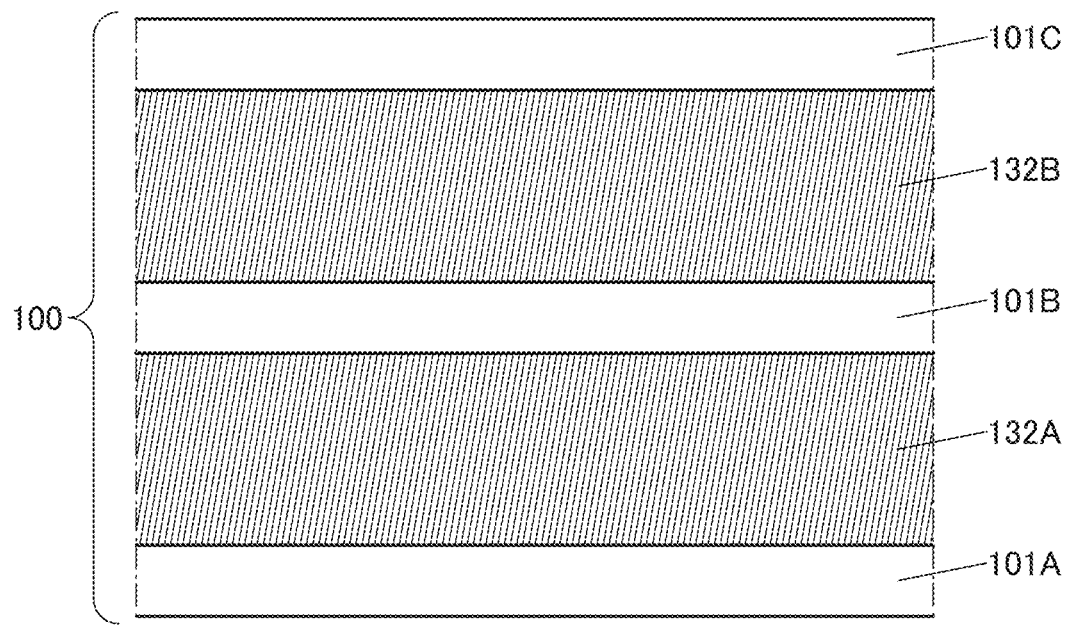
FIGS. 8A and 8B are cross-sectional views illustrating an example of manufacturing a semiconductor device.

As illustrated in FIG. 8A, the semiconductor device in FIG. 1A includes an insulator 101A over a substrate (not shown), a conductor 132A over the insulator 101A, an insulator 101B over the conductor 132A, a conductor 132B over the insulator 101B, and an insulator 101C over the conductor 132B. Note that a stack including these conductors and insulators (sometimes also including an insulator, a conductor, and the like other than the above depending on subsequent steps) is hereinafter referred to as a stack 100.

As the substrate, an insulator substrate, a semiconductor substrate, or a conductor substrate can be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like and a compound semiconductor substrate of silicon carbide, silicon germanium, gallium arsenide, indium phosphide, zinc oxide, or gallium oxide.

Another example is a silicon on insulator (SOI) substrate in which an insulator region is provided in the above semiconductor substrate. Examples of the conductor substrate include a graphite substrate, a metal substrate, an alloy substrate, and a conductive resin substrate. Other examples are a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, any of these substrates over which an element is provided may be used. Examples of the element provided over the substrate include a capacitor, a resistor, a switching element, a light-emitting element, and a memory element.

Alternatively, a flexible substrate may be used as the substrate. As a method for providing a transistor over a flexible substrate, there is a method in which the transistor is formed over a non-flexible substrate and then the transistor is separated and transferred to the flexible substrate. In that case, a separation layer is preferably provided between the non-flexible substrate and the transistor. As the substrate, a sheet, a film, or a foil containing a fiber may be used. The substrate may have elasticity. The substrate may have a property of returning to its original shape when bending or pulling is stopped; alternatively, the substrate may have a property of not returning to its original shape. The substrate has a region with a thickness of, for example, greater than or equal to 5 µm and less than or equal to 700 µm, preferably greater than or equal to 10 µm and less than or equal to 500 µm, more preferably greater than or equal to 15 µm and less than or equal to 300 µm. When the substrate has a small thickness, the weight of the semiconductor device including the transistor can be reduced. Moreover, when the substrate has a small thickness, even in the case of using glass or the like, the substrate may have elasticity or a property of returning to its original shape when bending or pulling is stopped. Thus, an impact applied to the semiconductor device over the substrate due to dropping or the like can be reduced. That is, a robust semiconductor device can be provided.

For the flexible substrate, a metal, an alloy, a resin, glass, or a fiber thereof can be used, for example. The flexible substrate preferably has a lower coefficient of linear expansion, in which case deformation due to an environment is suppressed. The flexible substrate is formed using, for example, a material with a coefficient of linear expansion of lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon and aramid), polyimide, polycarbonate, and acrylic. In particular, aramid is preferably used for the flexible substrate because of its low coefficient of linear expansion.

In the manufacture example described in this embodiment, heat treatment is performed in the process; therefore, a material having high heat resistance and a low coefficient of thermal expansion is preferably used for the substrate.

The conductor 132A (the conductor 132B) functions as the wiring WL in FIG. 1A.

For the conductors 132A and 132B, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and ruthenium can be used, for example. Alternatively, a semiconductor having high electric conductivity, typified by polycrystalline silicon including an impurity element such as phosphorus, or silicide such as nickel silicide may be used.

For the conductors 132A and 132B, a conductive material containing oxygen and a metal element included in a metal oxide usable for a semiconductor 151 (described later) may be used. A conductive material containing the metal element mentioned above and nitrogen may be used. For example, a conductive material containing nitrogen, such as titanium nitride or tantalum nitride, may be used. As another example, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. As another example, indium gallium zinc oxide containing nitrogen may be used. Using such a material sometimes allows capture of hydrogen or water entering from an insulator or the like around the conductor.

For the conductors 132A and 132B, it is preferable to use a conductive material having a function of preventing the passage of impurities such as water or hydrogen. For example, tantalum, tantalum nitride, titanium, titanium nitride, ruthenium, ruthenium oxide, or the like is preferably used, and a single layer or stacked layers can be used.

A stack including a plurality of conductors formed with any of the above materials may be used. For example, it is possible to employ a layered structure using a combination of a material including any of the above metal elements and a conductive material including oxygen; or a layered structure using a combination of a material including any of the above metal elements and a conductive material including nitrogen. As another example, it is possible to employ a layered structure using a combination of a material including any of the above metal elements, a conductive material including oxygen, and a conductive material including nitrogen. When an insulator including an excess-oxygen region is used as the insulator in contact with the conductor, oxygen sometimes diffuses into a region of the conductor in contact with the insulator, which may result in a layered structure using a combination of a material including the metal element and a conductive material including oxygen. Similarly, when an insulator including an excess-nitrogen region is used as the insulator in contact with the conductor, nitrogen sometimes diffuses into a region of the conductor in contact with the insulator, which may result in a layered structure using a combination of a material including the metal element and a conductive material including nitrogen.

The conductors 132A and 132B may be the same material or different materials. That is, materials for the conductors 132A and 132B included in the semiconductor device of one embodiment of the present invention can be selected as appropriate.

There is no particular limitation on a method for forming the conductors 132A and 132B. The conductors 132A and 132B can be formed by a sputtering method, a CVD method (including a thermal CVD method, an MOCVD method, a PECVD method, or the like), a molecular beam epitaxy (MBE) method, an atomic layer deposition (ALD) method, or a pulsed laser deposition (PLD) method, for example.

Each of the insulators 101A to 101C is preferably a material with a low concentration of impurities such as water or hydrogen, for example. The amount of hydrogen released from the insulators 101A to 101C, which is converted into hydrogen molecules per area of one of the insulators 101A to 101C, is less than or equal to $2\times10^{15}$ molecules/cm$^2$, preferably less than or equal to $1\times10^{15}$ molecules/cm$^2$, further preferably less than or equal to $5\times10^{14}$ molecules/cm$^2$ in thermal desorption spectroscopy (TDS) with a temperature of the film surface of the insulator ranging from 50° C. to 500° C., for example. The insulators 101A to 101C may be formed using an insulator from which oxygen is released by heating.

Each of the insulators 101A to 101C can have a single-layer structure or a layered structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum, for instance. For example, a material containing silicon oxide or silicon oxynitride can be used.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

There is no particular limitation on a method for forming the insulators 101A to 101C. The insulators 101A to 101C can be formed by a sputtering method, a CVD method (including a thermal CVD method, an MOCVD method, a PECVD method, or the like), an MBE method, an ALD method, or a PLD method, for example.

Figure 8B:
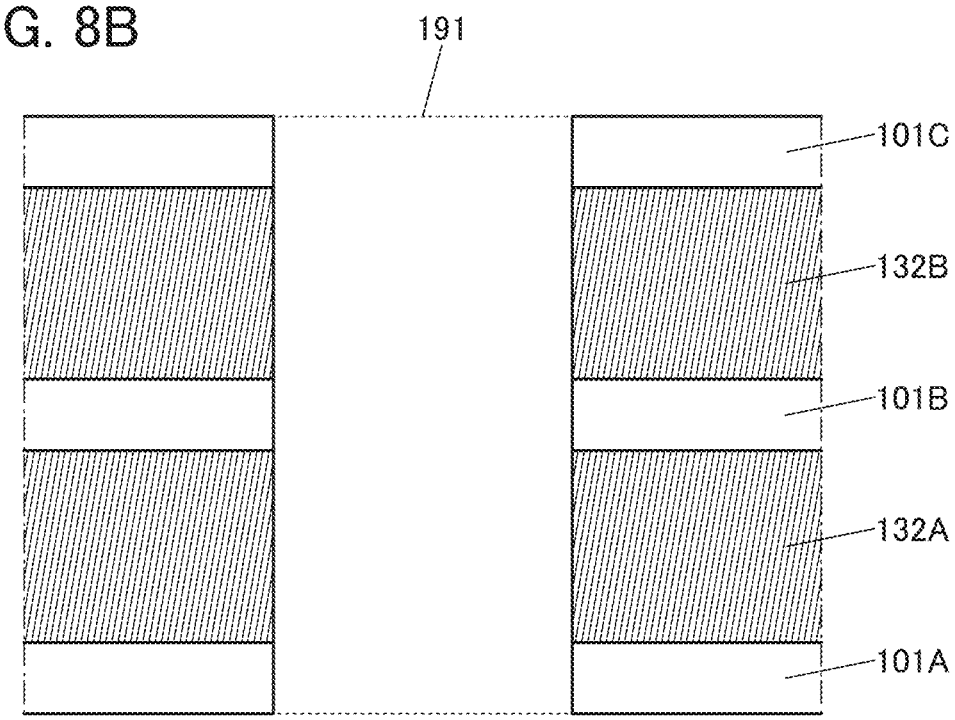

In the next step, as illustrated in FIG. 8B, an opening 191 is formed in the stack 100 shown in FIG. 8A through resist mask formation and etching treatment or the like.

The resist mask can be formed, for example, by a lithography method, a printing method, or an inkjet method as appropriate. Formation of the resist mask by an inkjet method needs no photomask; thus, manufacturing cost can be reduced. For the etching treatment, either a dry etching method or a wet etching method or both of them may be used.

Figure 9A:
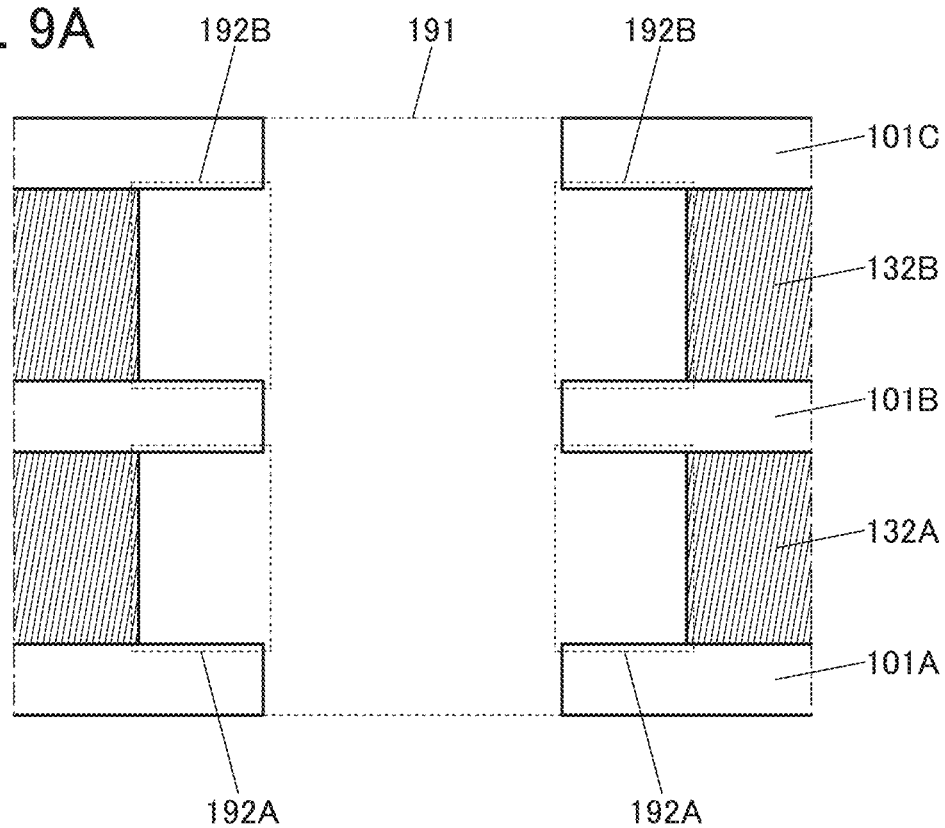
FIGS. 9A and 9B are cross-sectional views illustrating an example of manufacturing a semiconductor device.

Then, as illustrated in FIG. 9A, the conductors 132A and 132B positioned on a side surface of the opening 191 are partly removed by etching treatment or the like, and a recess portion 192A and a recess portion 192B are formed on the side surface. Here, a material for the conductors 132A and 132B is selected such that the conductors 132A and 132B are selectively removed in the stack 100 (e.g., a material with a higher etching rate than the insulators 101A to 101C is used).

Figure 9B:
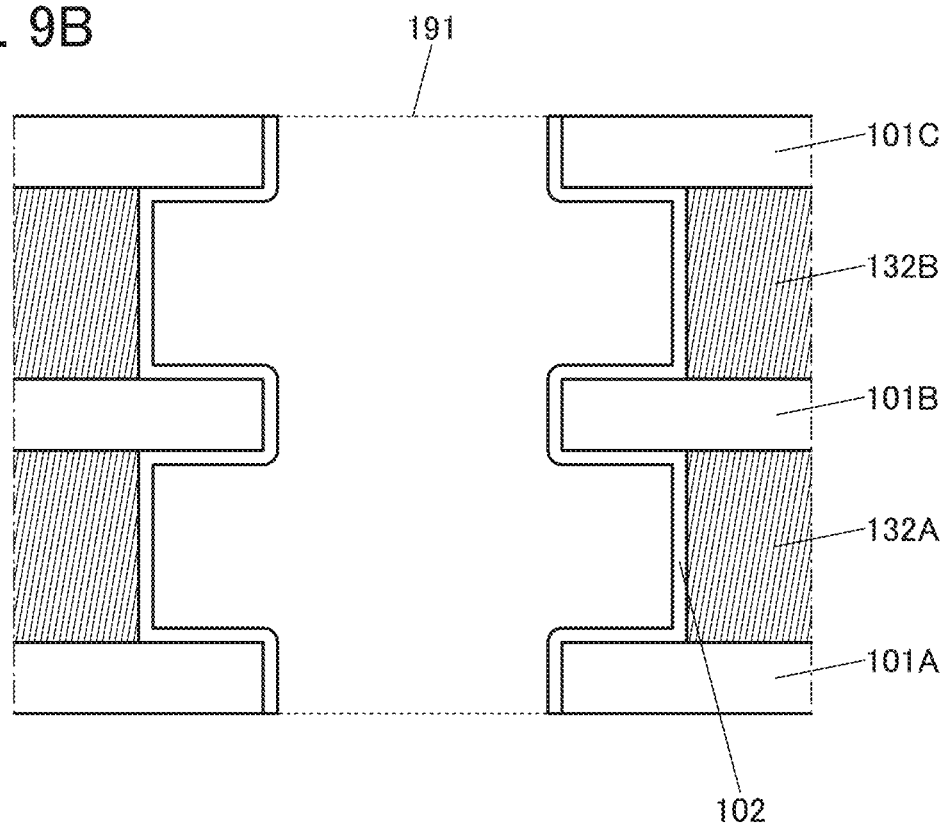

In the subsequent step, as illustrated in FIG. 9B, an insulator 102 is deposited in the recess portions 192A and 192B and on the side surface of the opening 191 shown in FIG. 9A.

The insulator 102 functions as a gate insulating film of the cell transistor CTr.

For the insulator 102, silicon oxide or silicon oxynitride is preferably used, for example. Alternatively, for the insulator 102, aluminum oxide, hafnium oxide, or an oxide containing aluminum and hafnium can be used, for example. The insulator 102 may be a stack including any of the above.

To form the insulator 102, a deposition method achieving high step coverage is preferably employed. As the deposition method achieving high step coverage, an ALD method is preferably used, and a CVD method (e.g., a low-pressure CVD (LPCVD) method or a plasma CVD (PCVD) method) may alternatively be used, for example. As another deposition method, a sputtering method can sometimes be used, for instance.

Figure 10A:
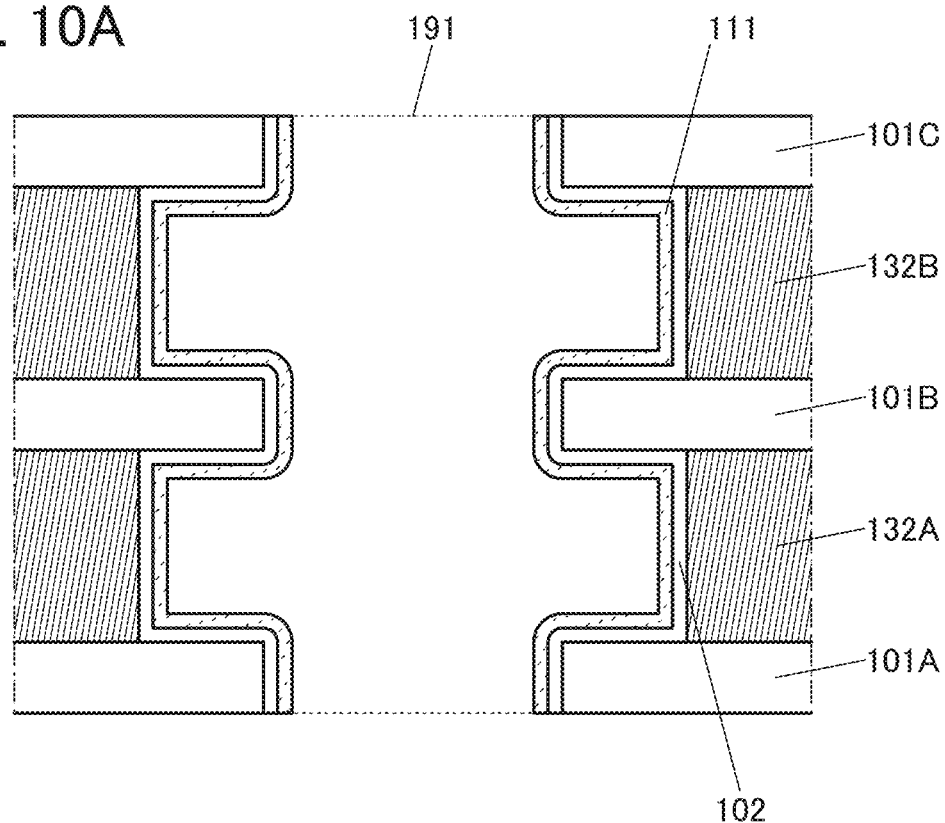
FIGS. 10A and 10B are cross-sectional views illustrating an example of manufacturing a semiconductor device.

In the next step, as illustrated in FIG. 10A, an insulator 111 is deposited in the recess portions and on the side surface of the opening 191 shown in FIG. 9B. That is, the insulator 111 is formed in contact with the insulator 102.

A region of the insulator 111 that is overlapped by an after-mentioned region 151a of the semiconductor 151 with an after-mentioned insulator 104 therebetween functions as the charge accumulation layer of the cell transistor CTr.

For the insulator 111, silicon nitride or silicon nitride oxide is preferably used, for example.

The description on the method for forming the insulator 102 is referred to for a method for forming the insulator 111.

Figure 10B:
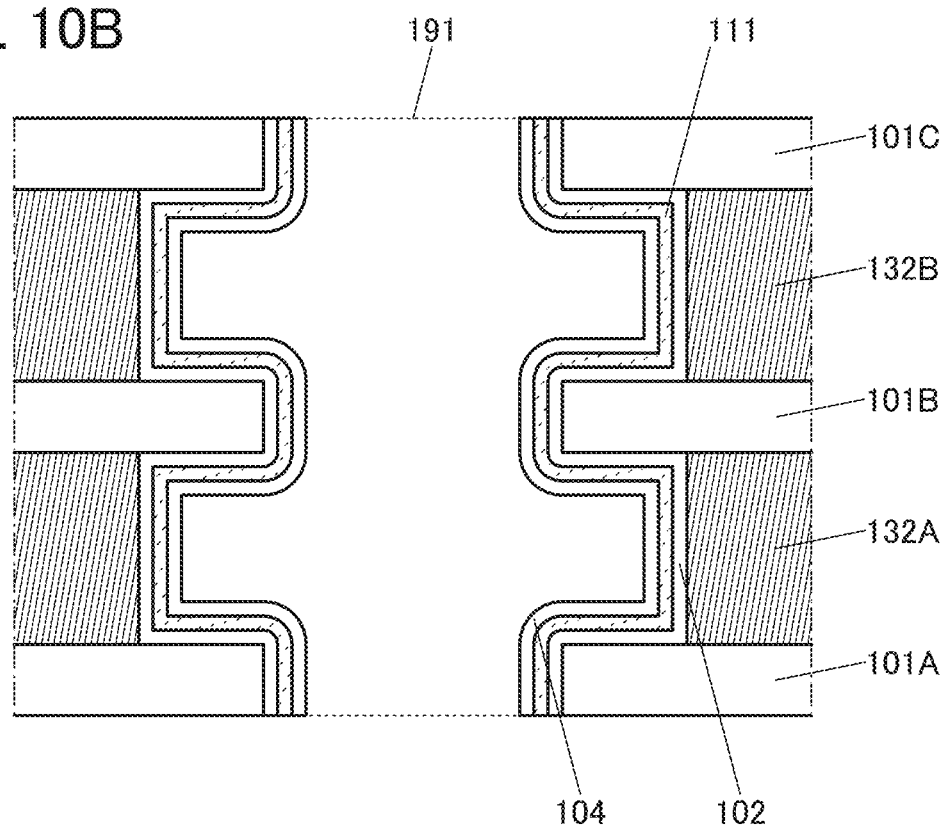

In the next step, as illustrated in FIG. 10B, an insulator 104 is deposited in the recess portions and on the side surface of the opening 191 shown in FIG. 10A. That is, the insulator 104 is formed in contact with the insulator 111.

The insulator 104 functions as a tunnel insulating film of the cell transistor CTr.

For the insulator 104, silicon oxide or silicon oxynitride is preferably used, for example. Alternatively, for the insulator 104, aluminum oxide, hafnium oxide, or an oxide containing aluminum and hafnium may be used, for example. The insulator 104 may be a stack including any of the above. The insulator 104 is preferably thinner than the insulator 102. When the insulator 104 is thinner than the insulator 102, charge can be moved by the tunnel effect from the semiconductor 151 (described later) to the insulator 111 through the insulator 104.

The description on the method for forming the insulator 102 is referred to for a method for forming the insulator 104.

Figure 11A:
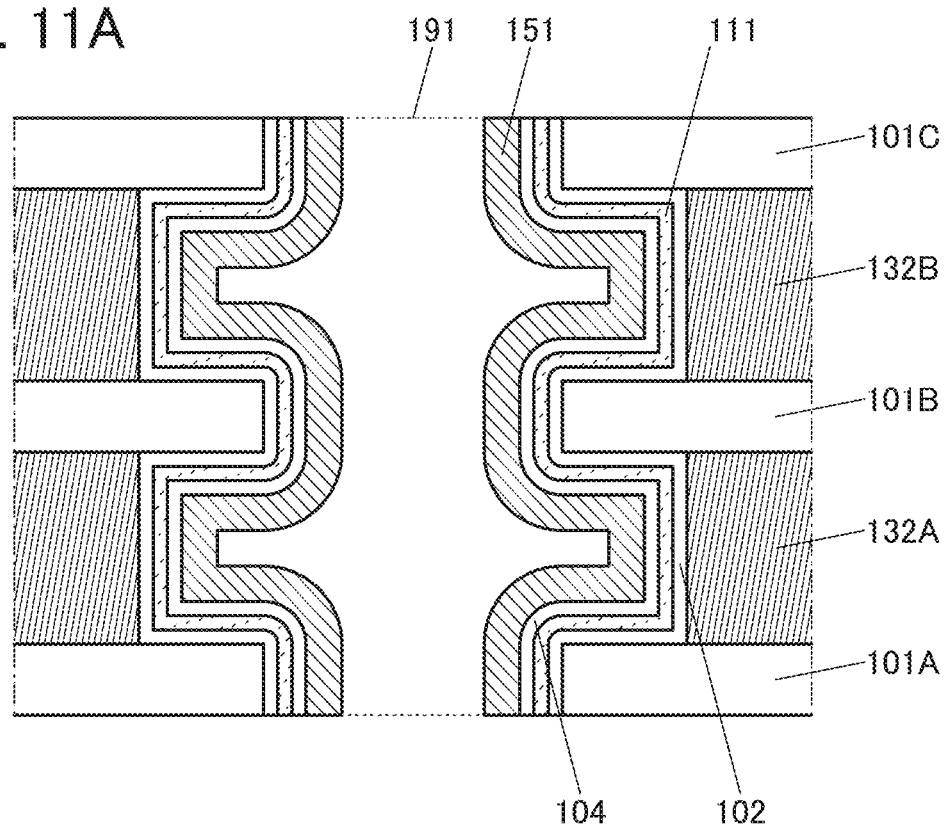
FIGS. 11A and 11B are cross-sectional views illustrating an example of manufacturing a semiconductor device.

Then, as illustrated in FIG. 11A, the semiconductor 151 is deposited in the recess portions and on the side surface of the opening 191 shown in FIG. 10B. That is, the semiconductor 151 is formed in contact with the insulator 104.

For the semiconductor 151, a material containing a metal oxide described in Embodiment 4 can be used, for example. Alternatively, a material containing silicon (preferably polycrystalline silicon) can be used, for instance.

When the semiconductor 151 contains a metal oxide, an insulating material having a function of inhibiting the passage of impurities such as water or hydrogen in addition to oxygen is preferably used for the insulator 104 in contact with the semiconductor 151. The formation of such an insulator 104 can sometimes prevent impurities such as water or hydrogen from entering the semiconductor 151 through the insulator 104 and becoming water by reaction with oxygen included in the semiconductor 151. If water is produced in the semiconductor 151, an oxygen vacancy may be formed in the semiconductor 151. When impurities such as hydrogen enter the oxygen vacancy, an electron serving as a carrier may be generated. Consequently, if the semiconductor 151 has a region containing a large amount of hydrogen, a transistor including the region in its channel formation region is likely to have normally-on characteristics. To prevent this, the insulator 104 is preferably formed using an insulating material with a function of inhibiting the passage of impurities such as water or hydrogen as well as oxygen.

Figure 11B:
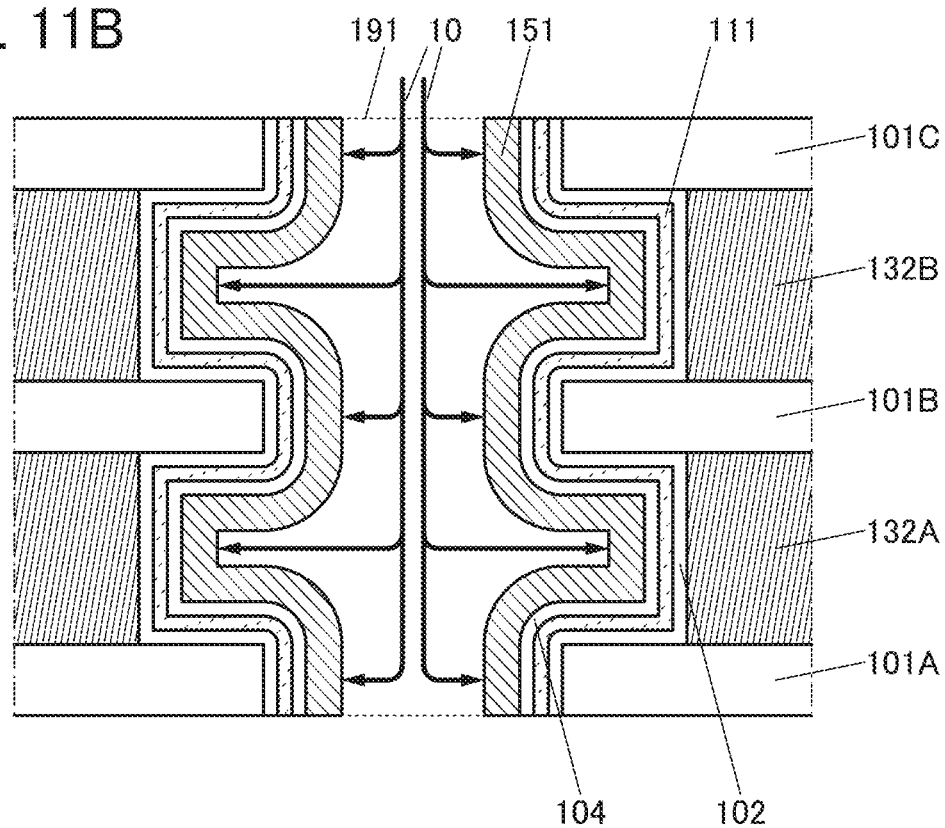

Next, a step illustrated in FIG. 11B is described.

When a material containing a metal oxide is used for the semiconductor 151, treatment for supplying oxygen may be performed on the exposed surface of the semiconductor 151 positioned on the side surface of the opening 191. In that case, supply treatment 10 illustrated in FIG. 11B is considered as a step for supplying oxygen. Examples of treatment for supplying oxygen include plasma treatment using oxygen in a reduced pressure and heat treatment in an oxygen atmosphere. Specifically, plasma treatment using oxygen is preferably performed with an apparatus including a power source for generating high-density plasma using microwaves, for instance. Note that the supply treatment 10 described here is not necessarily performed in some cases.

Meanwhile, when a material containing silicon is used for the semiconductor 151, treatment for supplying an impurity may be performed on the exposed surface of the semiconductor 151 positioned on the side surface of the opening 191. In that case, the supply treatment 10 in FIG. 11B is considered as a step for supplying an impurity. Note that heat treatment is preferably performed on the semiconductor device during the supply treatment 10. For example, as the impurity, a p-type impurity (acceptor) such as boron, aluminum, or gallium can be used. As another example, as the impurity, an n-type impurity (donor) such as phosphorus or arsenic can be used. Note that the supply treatment 10 described here is not necessarily performed in some cases.

To form the semiconductor 151, a deposition method achieving high step coverage is preferably employed. As the deposition method achieving high step coverage, an ALD method is preferably used, and a CVD method may alternatively be used, for example. As another deposition method, a sputtering method, a sol-gel method, an electrophoretic method, or a spray method can sometimes be used, for instance.

Figure 12A:
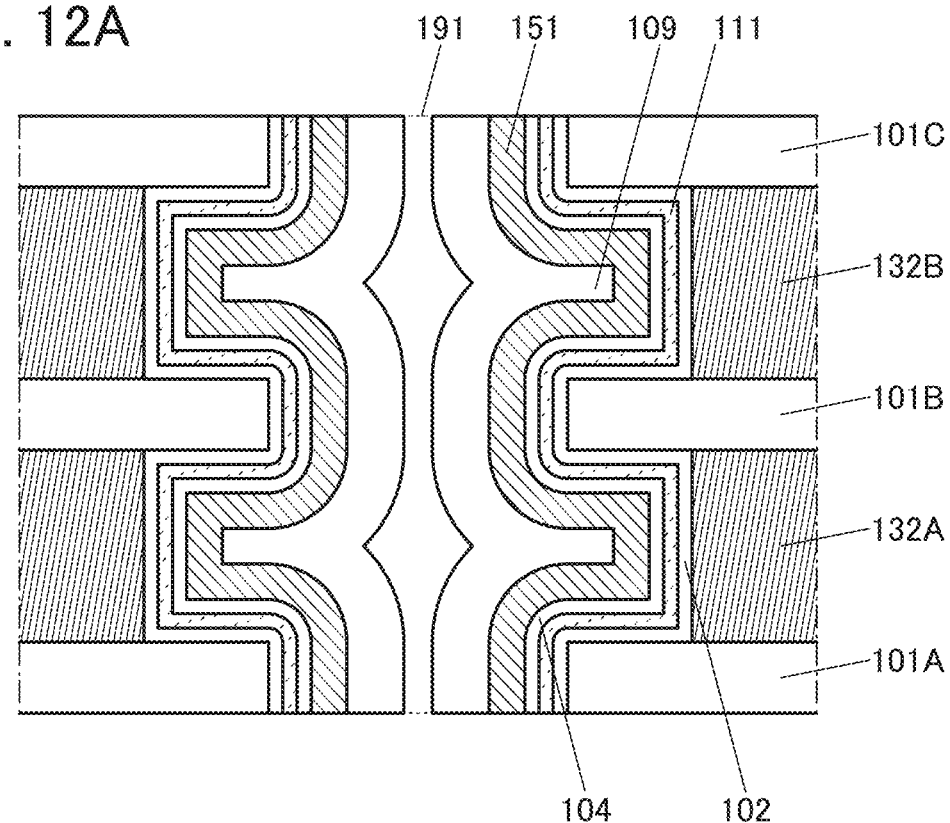
FIGS. 12A and 12B are cross-sectional views illustrating an example of manufacturing a semiconductor device.

In the next step, as illustrated in FIG. 12A, an insulator 109 is deposited in the recess portions and on the side surface of the opening 191 shown in FIG. 11B. That is, the insulator 109 is formed in contact with the semiconductor 151.

Preferably, a component contained in the insulator 109 is not a component that would form a compound with a component contained in the previously formed semiconductor 151 at or around the interface between the insulator 109 and the semiconductor 151. If the compound is formed, the compound is preferably an insulator or a compound that does not serve as a carrier in the semiconductor 151.

Silicon oxide can be used for the insulator 109, for example.

The description on the method for forming the insulator 102 is referred to for a method for forming the insulator 109.

Figure 12B:
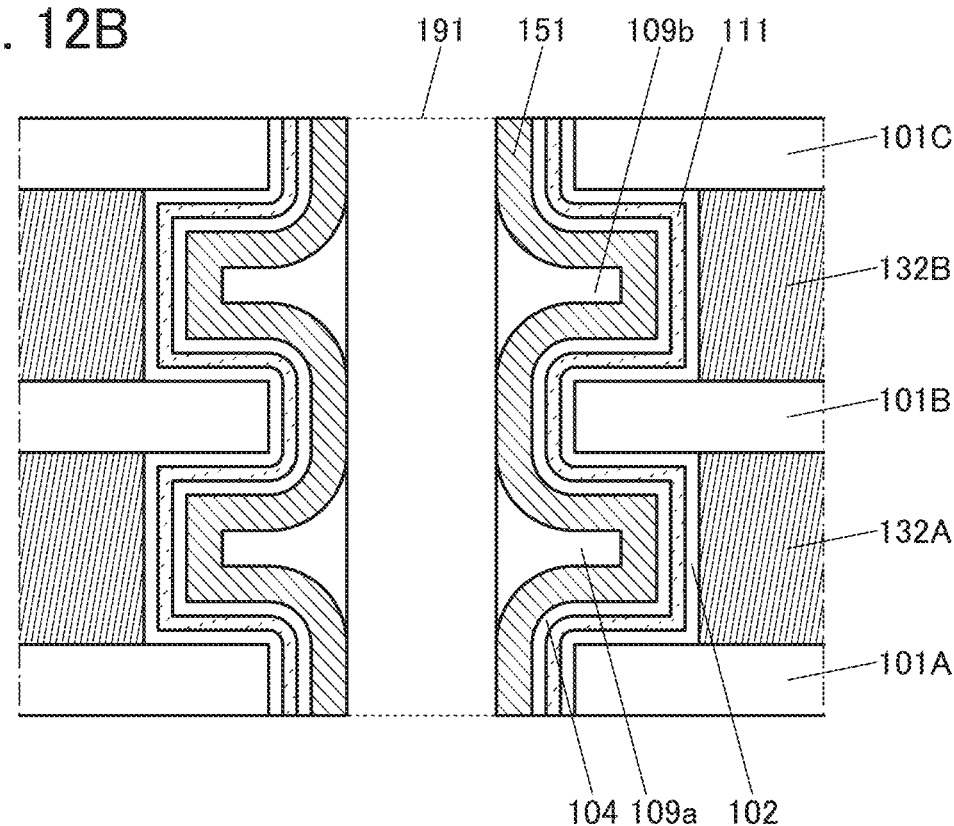

In the subsequent step, as illustrated in FIG. 12B, part of the insulator 109 positioned in the opening 191 is removed by resist mask formation and etching treatment or the like so that only the insulator 109 in the recess portions remains. Thus, an insulator 109a and an insulator 109b are formed. Note that at this time, part of the semiconductor 151 may be removed as long as the insulator 104 is not exposed at the opening 191.

Note that the description of FIG. 8B is referred to for the resist mask formation and the etching treatment.

Figure 13:
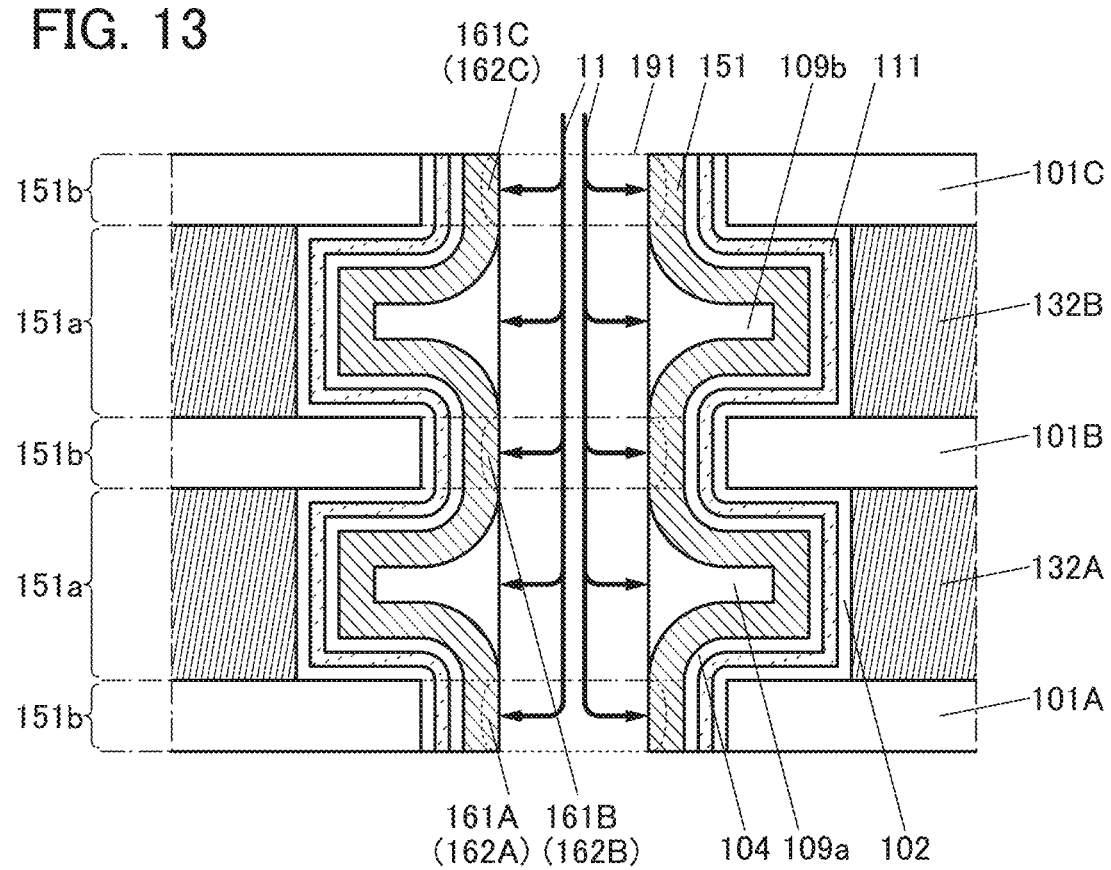
FIG. 13 is a cross-sectional view illustrating an example of manufacturing a semiconductor device.

When a material containing a metal oxide is used for the semiconductor 151, treatment for supplying impurities such as hydrogen may be performed on the side surface of the opening 191. In that case, supply treatment 11 illustrated in FIG. 13 is considered as a step (treatment) for supplying impurities such as hydrogen. The supply treatment 11 in FIG. 13 is performed on the insulator 109a, the insulator 109b, and a region 151b of the semiconductor 151. In FIG. 13, a compound 161A (a compound 161B, a compound 161C) is shown as a compound that contains the component of the semiconductor 151 and the impurities supplied by the supply treatment 11. By this step, the resistance of the region 151b of the semiconductor 151 can be lowered. Note that the supply treatment 11 described here is not necessarily performed in some cases.

Meanwhile, when a material containing silicon is used for the semiconductor 151, treatment for supplying an impurity may be performed on the side surface of the opening 191. In that case, the supply treatment 11 illustrated in FIG. 13 is considered as a step (treatment) for supplying an impurity. The supply treatment 11 in FIG. 13 is performed on the insulator 109a, the insulator 109b, and the region 151b of the semiconductor 151. Note that heat treatment is preferably performed on the stack 100 during the supply treatment 11. As the impurity, an n-type impurity (donor) such as phosphorus or arsenic can be used, for example. As another example, as the impurity, a p-type impurity (acceptor) such as boron, aluminum, or gallium can be used. Performing this step enables an impurity region 162A (an impurity region 162B, an impurity region 162C) to be formed on or around a surface of the region 151b of the semiconductor 151, thereby lowering the resistance of the region 151b of the semiconductor 151. Note that the supply treatment 11 described here is not always necessary when the aforementioned supply treatment 10 in FIG. 11B has been performed.

When a material containing one of silicon and a metal oxide is used for the semiconductor 151, impurities are not supplied to the region 151a of the semiconductor 151 because the insulators 109a and 109b function as masks for blocking impurities in the region 151a where the insulators 109a and 109b are formed in contact with the semiconductor 151.

Figure 14A:
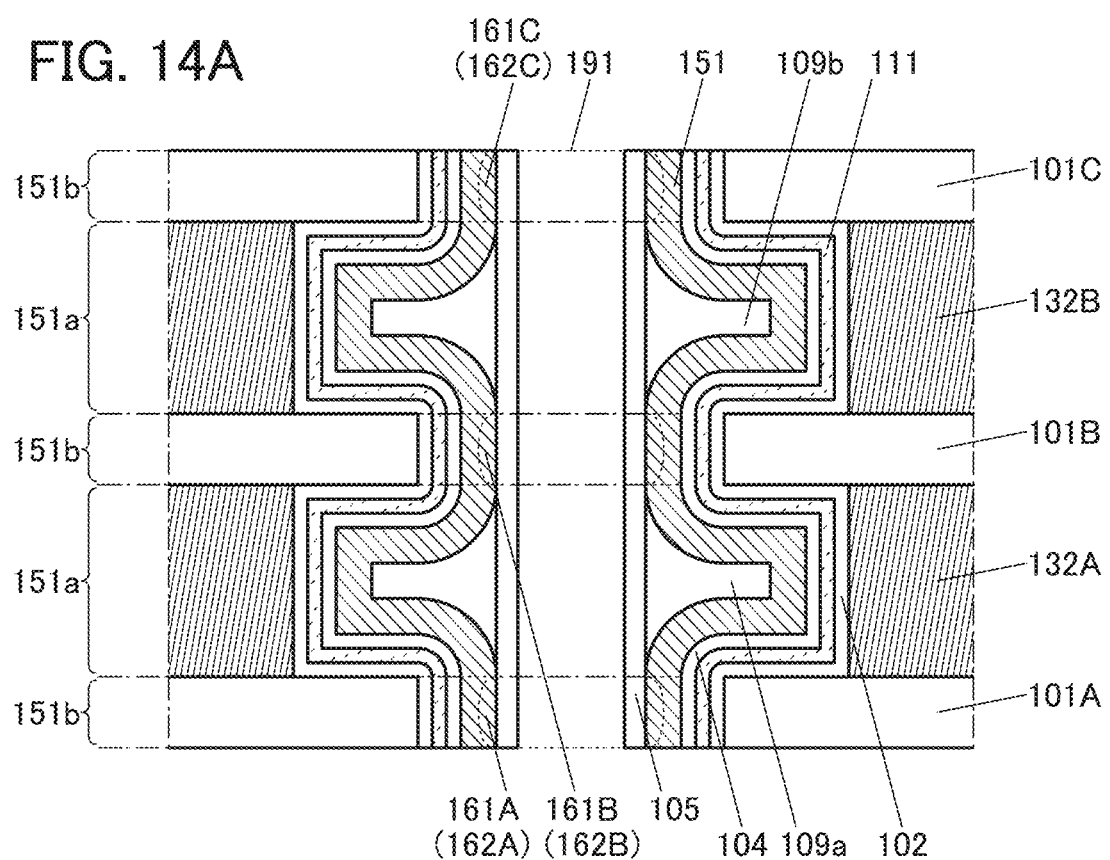
FIGS. 14A and 14B are cross-sectional views illustrating an example of manufacturing a semiconductor device.

In the subsequent step, as illustrated in FIG. 14A, an insulator 105 is deposited on the side surface of the opening 191 shown in FIG. 13.

When the semiconductor 151 is a material containing a metal oxide, the insulator 105 preferably contains silicon nitride, for example. When the semiconductor 151 is in contact with the insulator 105, nitrogen, nitride, and other components included in the insulator 105 may diffuse into the semiconductor 151. At this time, heat treatment may or may not be performed on the stack 100. When nitrogen, nitride, and other components in the insulator 105 diffuse into the semiconductor 151, in FIG. 14A, the compound 161A (the compound 161B, the compound 161C) may be formed in the semiconductor 151 at and around the interface with the insulator 105 by nitrogen, nitride, and other components diffused from the insulator 105. In that case, the resistance of the region 151b of the semiconductor 151 is lowered. In other words, the resistance of the adjacent cell transistors CTr electrically connected to each other can sometimes be lowered.

Meanwhile, when the semiconductor 151 is a material containing silicon, the insulator 105 preferably contains an impurity (an element or an ion) to be diffused into the semiconductor 151, for example. As the impurity, an n-type impurity (donor) such as phosphorus or arsenic can be used, for example. As another example, as the impurity, a p-type impurity (acceptor) such as boron, aluminum, or gallium can be used.

When the semiconductor 151 is in contact with the insulator 105, an impurity (an element or an ion) contained in the insulator 105 may diffuse into the semiconductor 151. At this time, heat treatment may or may not be performed on the stack 100. When such an impurity diffuses into the semiconductor 151, the impurity region 162A (the impurity region 162B, the impurity region 162C) may be formed in the semiconductor 151 at or around the interface with the insulator 105, and the resistance of the region 151b of the semiconductor 151 may be lowered as a result.

The description on the method for forming the insulator 102 is referred to for a method for forming the insulator 105.

FIG. 13 and FIG. 14A each show the step for lowering the resistance of the region 151b of the semiconductor 151. That is, FIG. 13 and FIG. 14A each illustrate the step for forming the compound 161A (the compound 161B, the compound 161C) or the impurity region 162A (the impurity region 162B, the impurity region 162C) in the region 151b of the semiconductor 151. Therefore, only one of the steps in FIG. 13 and FIG. 14A needs to be performed in the process for manufacturing the semiconductor device; alternatively, both these steps may be performed in some cases.

Figure 14B:
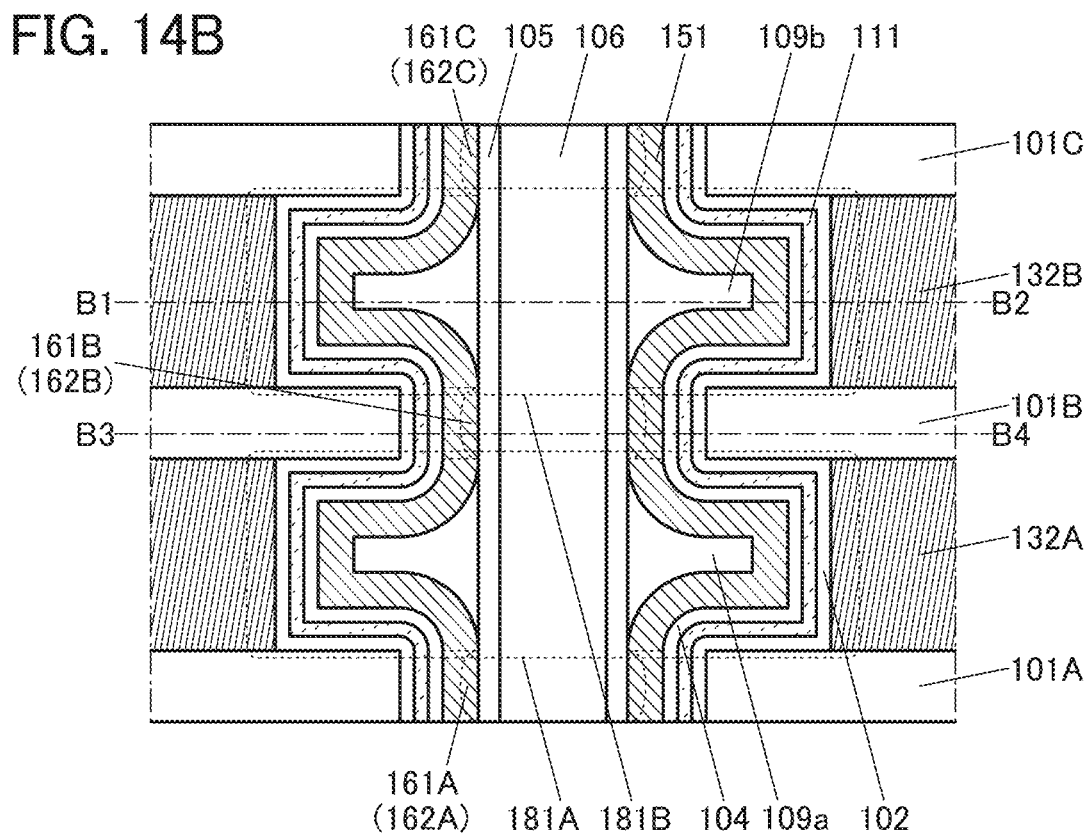

In the next step, as illustrated in FIG. 14B, an insulator 106 is deposited on the insulator 105 to fill the remaining opening 191.

For the insulator 106, an insulating material having a function of inhibiting the passage of impurities such as water and hydrogen and the like is preferably used, and aluminum oxide can be used, for example. Note that a material usable for the insulator 106 is not limited to the above. For example, for the insulator 106, any of the materials usable for the insulators 101A to 101C can be used to form a film with a low concentration of impurities such as water and hydrogen.

As another example, for the insulator 106, an insulating material having a function of inhibiting the passage of oxygen, such as silicon nitride, silicon nitride oxide, silicon oxynitride, aluminum nitride, or aluminum nitride oxide, is preferably used. When the semiconductor 151 contains a material containing a metal oxide, the formation of such an insulator 106 can sometimes prevent oxygen included in the semiconductor 151 from releasing and diffusing into the insulator 106 through the insulator 105 and/or the insulator 109a (the insulator 109b). Consequently, the reduction in oxygen concentration of the semiconductor 151 can be prevented in some cases.

As another example, for the insulator 106, an insulating material having a function of passing oxygen is preferably used. For example, the insulator 106 may be doped with oxygen so that oxygen may diffuse through the insulator 105 and/or the insulator 109a (the insulator 109b), whereby oxygen can sometimes be supplied to the semiconductor 151. Thus, the oxygen concentration of the semiconductor 151 can be increased in some cases.

For the insulator 106, aluminum oxide can be used, for instance. When aluminum oxide is deposited by a sputtering method, oxygen is supplied to the insulator 105 and/or the insulator 109a (the insulator 109b). Oxygen supplied to the insulator 105 and/or the insulator 109a (the insulator 109b) is supplied to the semiconductor 151. As a result, the oxygen concentration of the semiconductor 151 can sometimes be increased.

The description on the method for forming the insulator 102 is referred to for a method for forming the insulator 106.

Note that the conductor 132A (the conductor 132B) functions as the gate electrode of the cell transistor CTr and the wiring WL illustrated in FIGS. 1A and 1B. That is, the cell transistor CTr is formed in a region 181A (a region 181B) in FIG. 14B.

As described above, the semiconductor device illustrated in FIG. 1A can be manufactured through the steps from FIG. 8A to FIG. 14B.

Figure 15A:
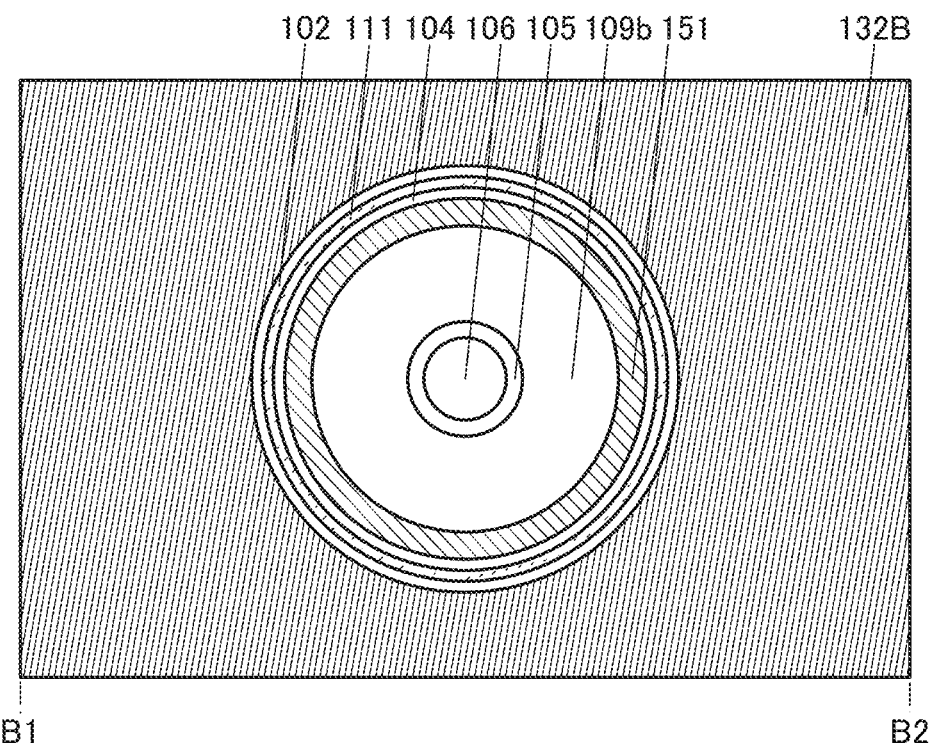
FIGS. 15A and 15B are top views illustrating an example of manufacturing a semiconductor device.
Figure 15B:
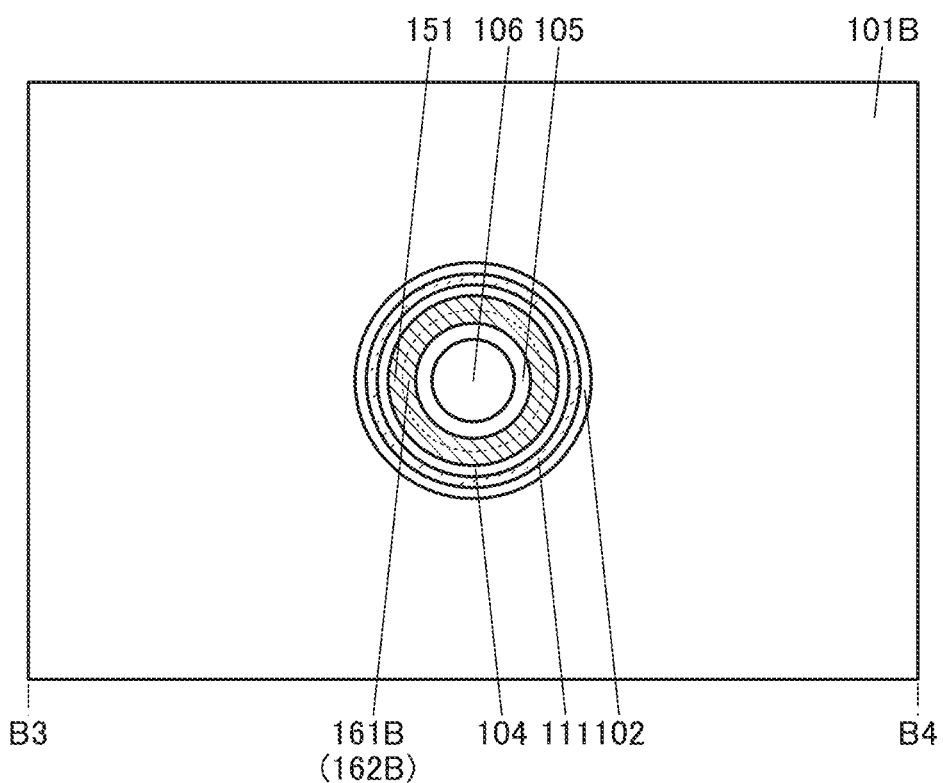

FIGS. 15A and 15B are top views of the semiconductor device along the dashed-dotted lines B1-B2 and B3-B4, respectively, in FIG. 14B. FIG. 16 is a top view of a semiconductor device including a plurality of openings 191 as in the structure example shown in FIGS. 6A to 6C. Note that FIG. 16 shows that the semiconductor device is provided with a plurality of openings 191 in the top view along the dashed-dotted line B1-B2 in FIG. 14B. Note also that the positions of the openings 191 are not limited to those shown in FIG. 16 and may be determined freely during circuit design.

One embodiment of the present invention is not limited to the structure example of the semiconductor device illustrated in FIG. 14B. In one embodiment of the present invention, the structure of the semiconductor device in FIG. 14B can be changed as appropriate.

For example, in the semiconductor device of one embodiment of the present invention, the cell transistor may be provided with a backgate. To provide the cell transistor with a backgate, a conductor 134 instead of the insulator 106 is deposited in FIG. 14B so as to fill the opening 191. Changing the step in this manner enables fabrication of a semiconductor device illustrated in FIG. 17.

Here, the conductor 134 functions as the wiring BGL illustrated in FIG. 1B and FIG. 3.

For the conductor 134, any of the materials usable for the aforementioned conductor 132A (conductor 132B) can be used.

To form the conductor 134, a deposition method achieving high step coverage is preferably employed. As the deposition method achieving high step coverage, an ALD method is preferably used, and a CVD method may alternatively be used, for example. As another deposition method, a sputtering method, a sol-gel method, an electrophoretic method, or a spray method can sometimes be used, for instance.

Figure 17:
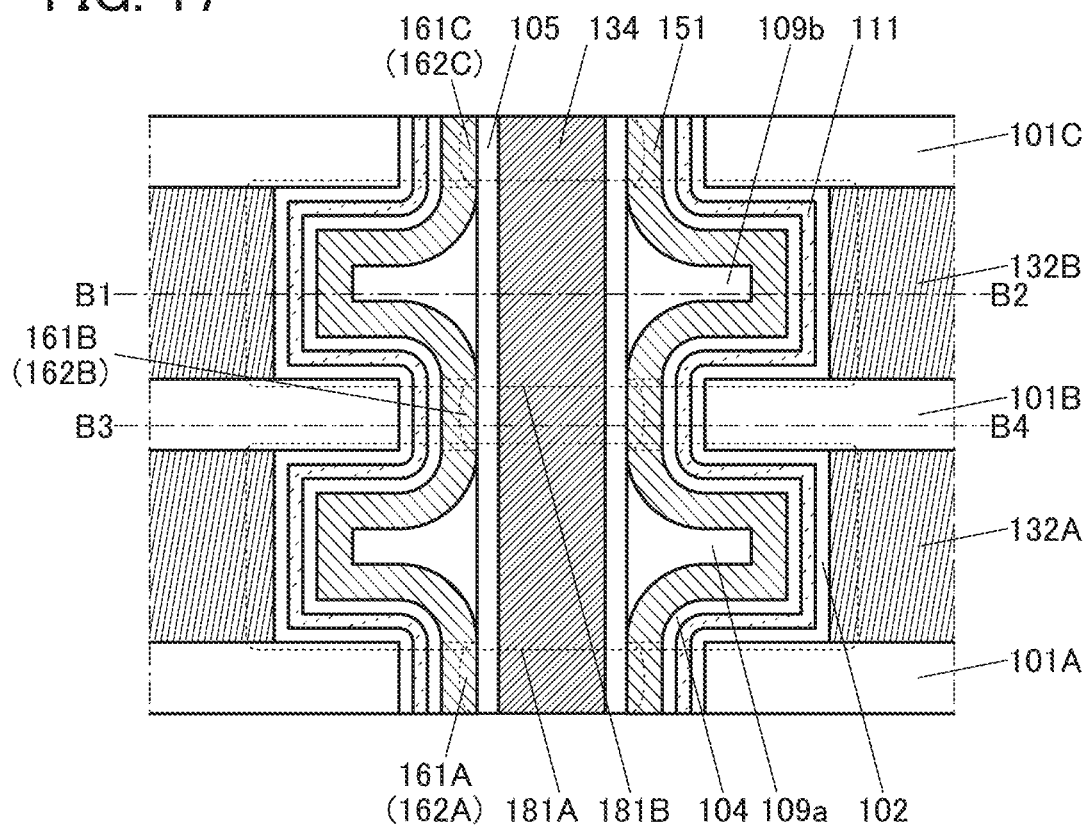
FIG. 17 is a cross-sectional view illustrating an example of manufacturing a semiconductor device.
Figure 18A:
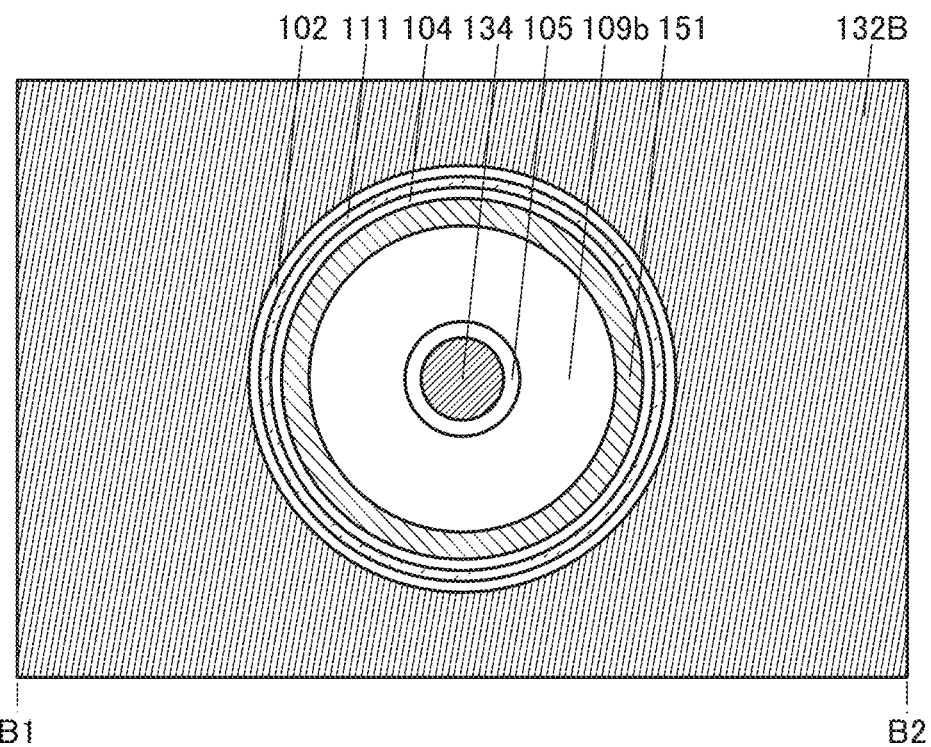
FIGS. 18A and 18B are top views illustrating an example of manufacturing a semiconductor device.
Figure 18B:
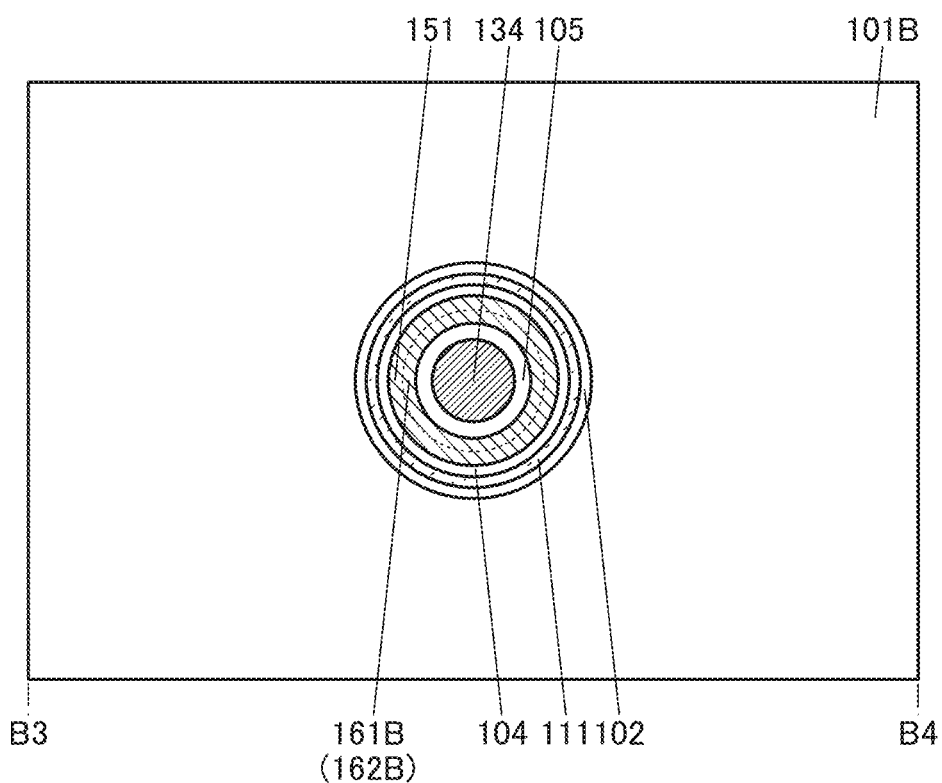

FIGS. 18A and 18B are top views of the semiconductor device along the dashed-dotted lines B1-B2 and B3-B4 in FIG. 17. Since the semiconductor device in FIG. 17 includes the conductor 134, the conductor 134 instead of the insulator 106 in FIGS. 15A and 15B is provided in the top views of FIGS. 18A and 18B.

Note that the insulator 105 illustrated in FIG. 17 may be a stack including a plurality of insulators, for example, a stack including the insulator 105 and the insulator 106 mentioned in the description of FIG. 14B (not illustrated here).

Figure 19A:
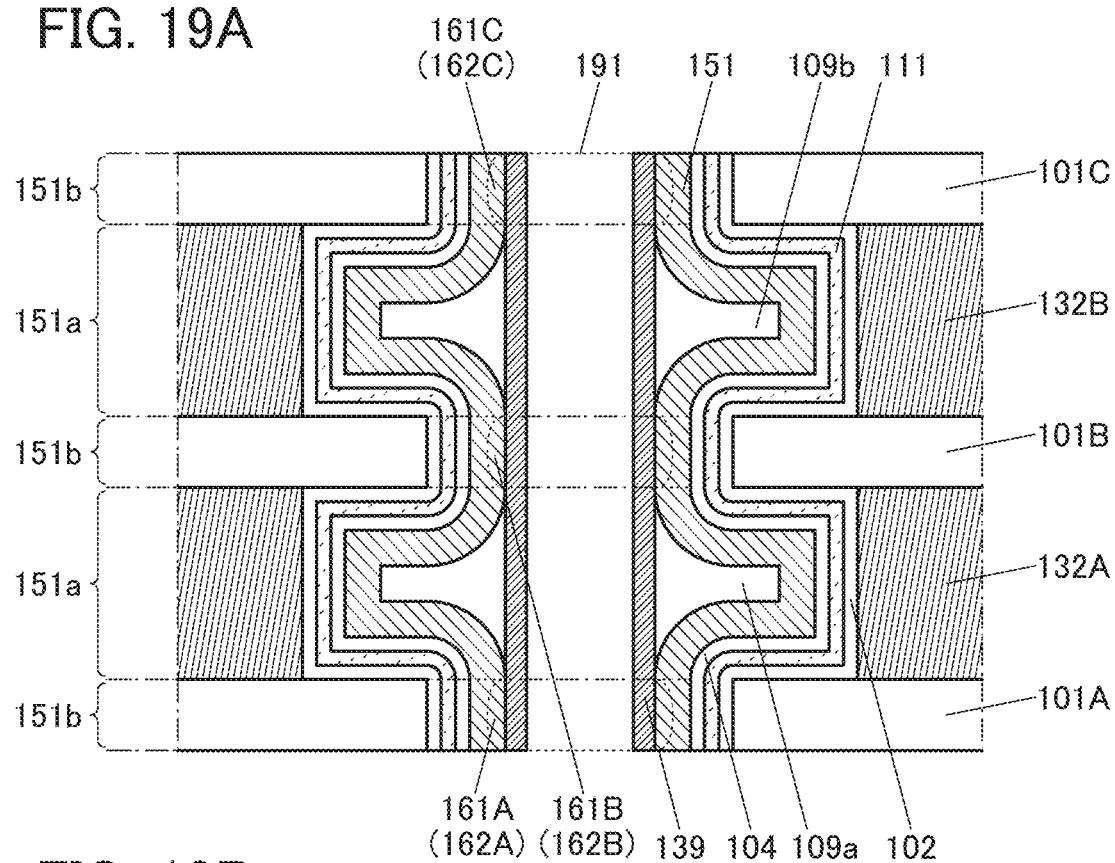
FIGS. 19A and 19B are cross-sectional views illustrating an example of manufacturing a semiconductor device.
Figure 19B:
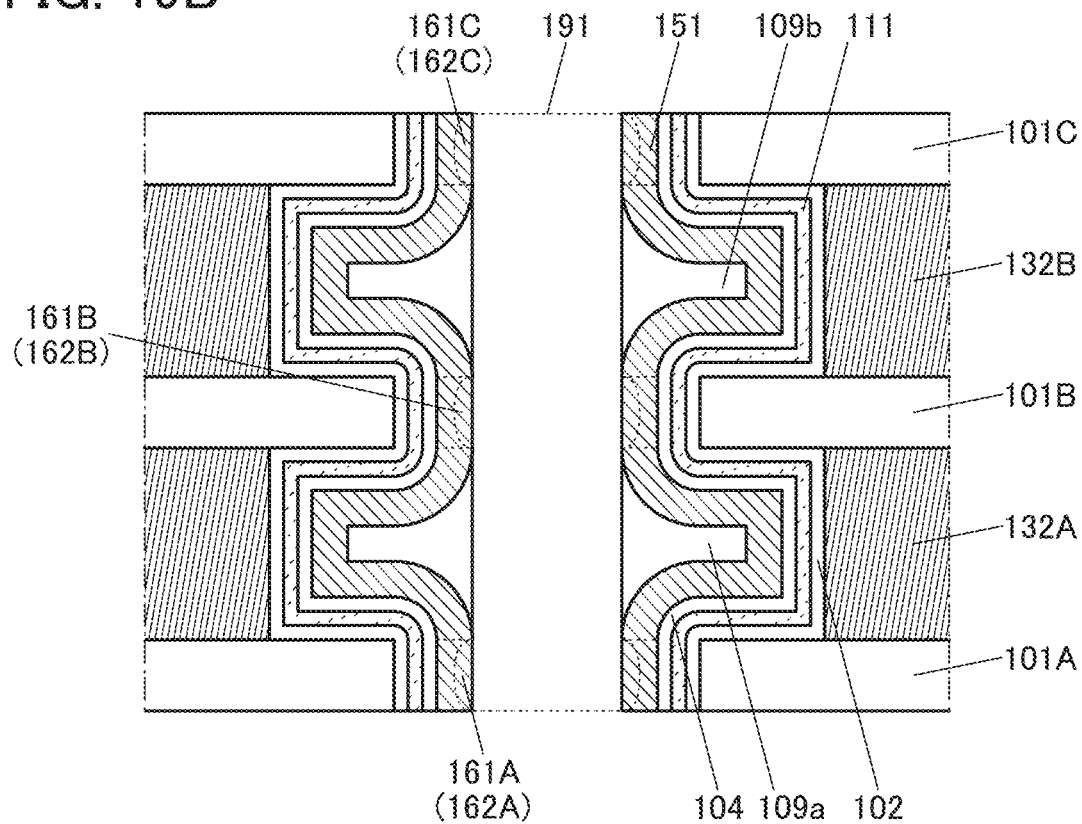
Figure 20:
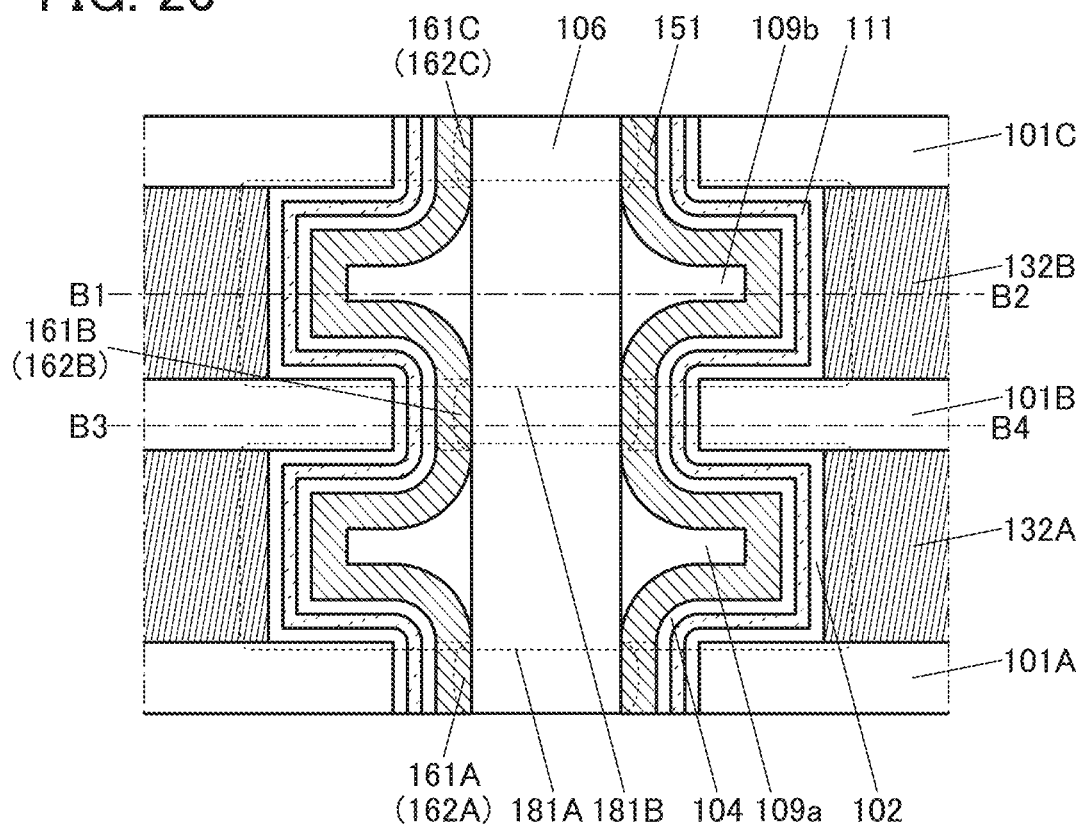
FIG. 20 is a cross-sectional view illustrating an example of manufacturing a semiconductor device.

For example, part of the process for manufacturing the semiconductor device of one embodiment of the present invention may be changed. FIGS. 19A and 19B and FIG. 20 illustrate steps for forming a low-resistance region in the region 151b of the semiconductor 151 in a manner different from that in FIG. 13. FIG. 19A shows a step for forming a conductor 139 on the side surface of the opening 191 after the step in FIG. 12B. Specifically, the conductor 139 is formed in contact with the insulator 109a (the insulator 109b) and the region 151b of the semiconductor 151.

When the semiconductor 151 contains a material containing a metal oxide, the conductor 139 is preferably, for example, a material having a function of lowering the resistance of the region 151b, which is part of the semiconductor 151 and in contact with the conductor 139. For the conductor 139, a metal with a resistance of $2.4 \times 10^3$ [Ω/sq] or less, preferably $1.0 \times 10^3$ [Ω/sq] or less, a nitride containing a metal element, or an oxide containing a metal element is used. For the conductor 139, it is possible to use, for example, a metal film of aluminum, ruthenium, titanium, tantalum, tungsten, or chromium, a nitride film containing a metal element (e.g., a film of Al—Ti nitride or titanium nitride), or an oxide film containing a metal element (e.g., a film of indium tin oxide or In—Ga—Zn oxide).

When the semiconductor 151 including a material containing a metal oxide is in contact with the conductor 139, the compound 161A (the compound 161B, the compound 161C) may be formed from the component of the conductor 139 and the component of the semiconductor 151 by heat treatment, and thus the resistance of the region 151b of the semiconductor 151 may be lowered. Note that the resistance of at least the semiconductor 151 at and around the interface with the conductor 139 should be lowered. The resistance of the region 151b is lowered probably because part of oxygen in the semiconductor 151 at or around the interface with the conductor 139 is absorbed into the conductor 139 and oxygen vacancies are generated in the semiconductor 151.

In addition to the above, heat treatment may be performed in an atmosphere containing nitrogen while the semiconductor 151 and the conductor 139 are in contact with each other. With the heat treatment, the metal element, which is the component of the conductor 139, may be diffused into the semiconductor 151 or the metal element, which is the component of the semiconductor 151, may be diffused into the conductor 139, and the semiconductor 151 and the conductor 139 may form a metal compound. Note that at this time, the metal element of the semiconductor 151 and the metal element of the conductor 139 may be alloyed, in which case the metal elements become comparatively stable, leading to a highly reliable semiconductor device.

Hydrogen included in the semiconductor 151 becomes comparatively stable when entering an oxygen vacancy in the region 151b of the semiconductor 151. Hydrogen in an oxygen vacancy in the region 151a becomes comparatively stable when being released from the oxygen vacancy by heat treatment at 250° C. or higher, diffusing into the region 151b, and entering an oxygen vacancy in the region 151b. Accordingly, heat treatment further lowers the resistance of the region 151b, and highly purifies the region 151 (reduces impurities such as water and hydrogen therein) and further increases the resistance of the region 151a.

When the semiconductor 151 is a material containing silicon, it is preferred, for example, that the conductor 139 be any of the materials usable for the conductor 132A (the conductor 132B) and also contain an impurity (an element or an ion) to be diffused into the semiconductor 151. As the impurity, an n-type impurity (donor) such as phosphorus or arsenic can be used, for example. As another example, as the impurity, a p-type impurity (acceptor) such as boron, aluminum, or gallium can be used. At this time, heat treatment may be performed on the stack 100, as determined by circumstances. When the semiconductor 151 is in contact with the conductor 139 containing the impurity, the impurity is diffused into the semiconductor 151 at and around the interface with the conductor 139, and the impurity region 162A (the impurity region 162B, the impurity region 162C) is formed.

When the impurity contained in the conductor 139 is an n-type impurity (donor), an n-type impurity region may be formed in the region 151b of the semiconductor 151 or in the semiconductor 151 around the interface with the conductor 139. On the other hand, when the impurity contained in the conductor 139 is a p-type impurity (acceptor), a p-type impurity region may be formed in the region 151b of the semiconductor 151 or in the semiconductor 151 around the interface with the conductor 139. Consequently, carriers may be generated in the region 151b of the semiconductor 151 or in the semiconductor 151 around the interface with the conductor 139, resulting in lower resistance of the region 151b in some cases.

The conductor 139 may be a material capable of forming a metal silicide with a combination of silicon contained in the semiconductor 151, such as nickel, cobalt, molybdenum, tungsten, or titanium. Alternatively, the conductor 139 may be a material with high conductivity, such as aluminum, copper, or silver. Further alternatively, the conductor 139 may be a material with high heat resistance, such as titanium, molybdenum, tungsten, or tantalum.

When heat treatment is performed at this time, a metal silicide is sometimes formed in the semiconductor 151 around the interface with the conductor 139 from the conductive material of the conductor 139 and the component of the semiconductor 151. The metal silicide formed in this case is shown as the compound 161A (the compound 161B, the compound 161C) in FIG. 19A. Moreover, the impurity region 162A (the impurity region 162B, the impurity region 162C) is sometimes formed in the semiconductor 151 around the interface with the compound 161A (the compound 161B, the compound 161C).

That is, by the above manufacturing method, the region 151b of the semiconductor 151 can be formed as a low-resistance region and the region 151a of the semiconductor 151 can be formed as a channel formation region. Note that the region 151b serving as the low-resistance region corresponds to the first terminal and/or the second terminal of the cell transistor CTr; hence, the electric resistance between the cell transistors, which are electrically connected in series with each other, can be lowered by the above manufacturing method.

To form the conductor 139, a deposition method achieving high step coverage is preferably employed. As the deposition method achieving high step coverage, an ALD method is preferably used, and a CVD method may alternatively be used, for example. As another deposition method, a sputtering method, a sol-gel method, an electrophoretic method, or a spray method can sometimes be used, for instance.

In the step in FIG. 19B, the conductor 139 on the side surface of the opening 191 is removed using etching treatment or the like. At this time, the insulator 109a (the insulator 109b) at and around the interface with the conductor 139 may be partly removed as well.

Then, as shown in the step in FIG. 20, the insulator 106 is deposited so as to fill the remaining opening 191 in FIG. 19B. The semiconductor device in which the low-resistance region is formed in the region 151b of the semiconductor 151 can be manufactured through the above manufacturing steps, which are different from the step shown in FIG. 13.

Figure 21A:
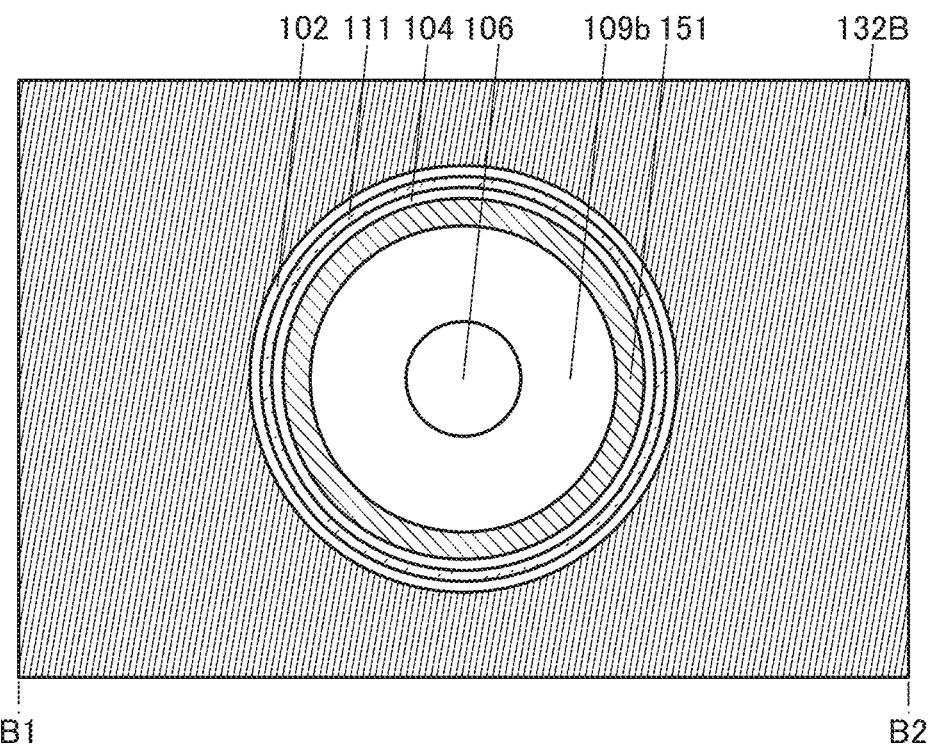
FIGS. 21A and 21B are top views illustrating an example of manufacturing a semiconductor device.
Figure 21B:
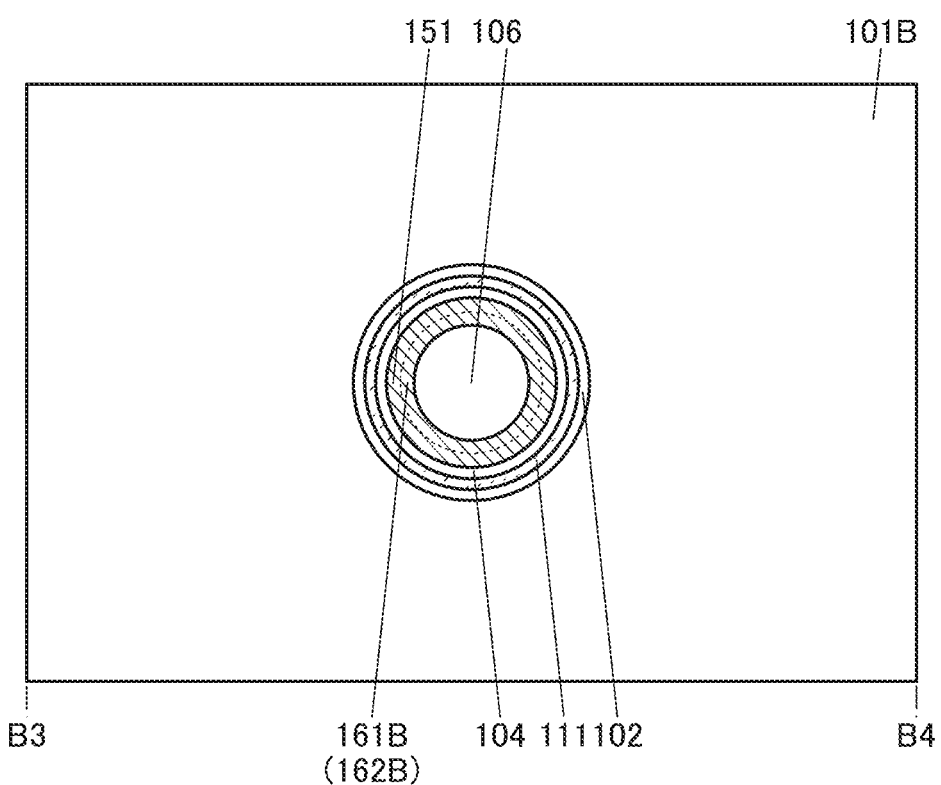

FIGS. 21A and 21B are top views of the semiconductor device along the dashed-dotted lines B1-B2 and B3-B4 in FIG. 20. As an example, the formation of the insulator 105 is omitted in the semiconductor device of FIG. 20; hence, the top views of FIGS. 21A and 21B show a structure where the insulator 105 is omitted from FIGS. 15A and 15B.

Figure 22:
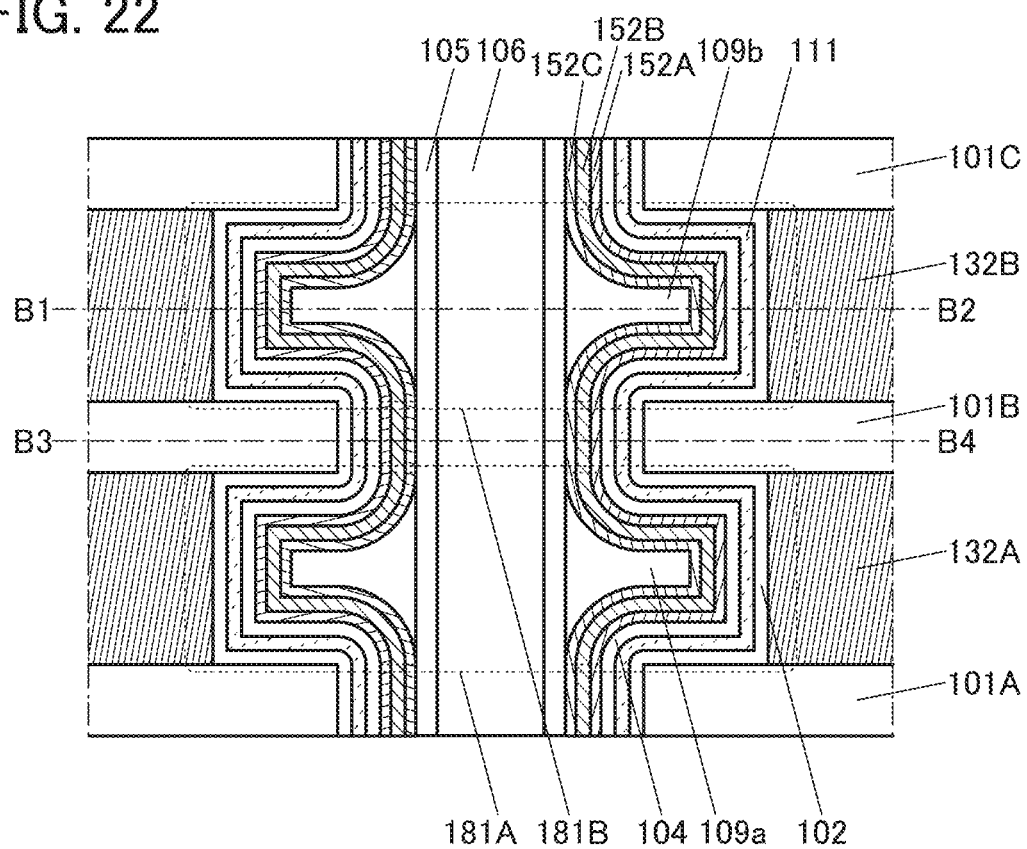
FIG. 22 is a cross-sectional view illustrating an example of manufacturing a semiconductor device.

As another example, when the semiconductor 151 is a material containing a metal oxide in one embodiment of the present invention, the semiconductor 151 can have a three-layer structure as in a semiconductor device illustrated in FIG. 22. In the semiconductor device in FIG. 22, the three-layer structure of the semiconductor 151 can be constituted such that a semiconductor 152A, a semiconductor 152B, and a semiconductor 152C are sequentially formed as the semiconductor 151 by the step shown in FIG. 11A in the process of manufacturing the semiconductor device in FIG. 1A.

Figure 23A:
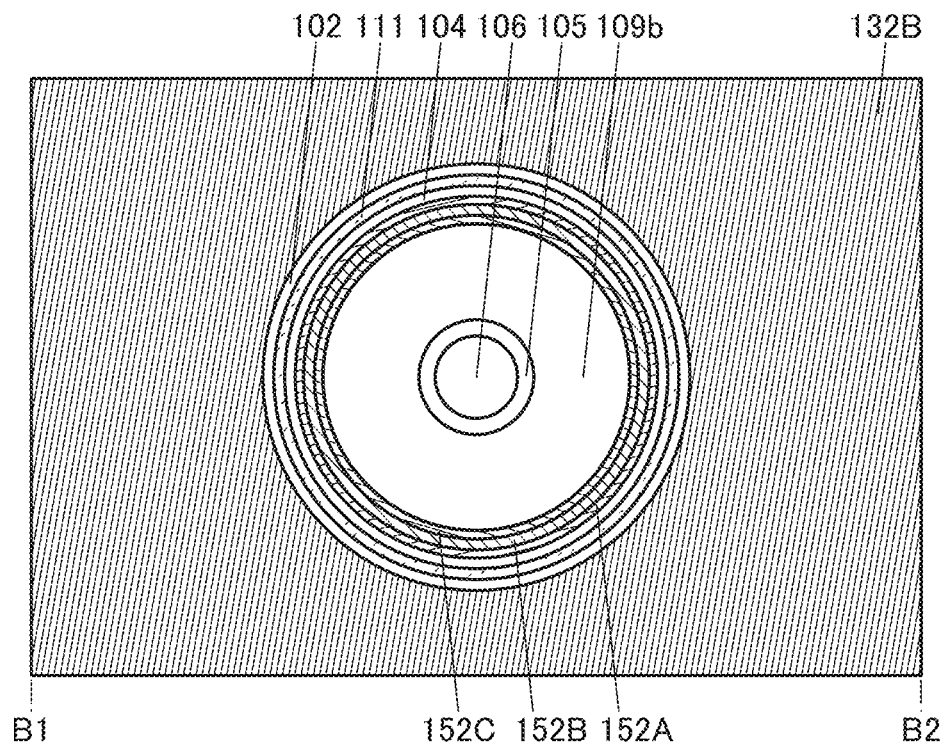
FIGS. 23A and 23B are top views illustrating an example of manufacturing a semiconductor device.
Figure 23B:
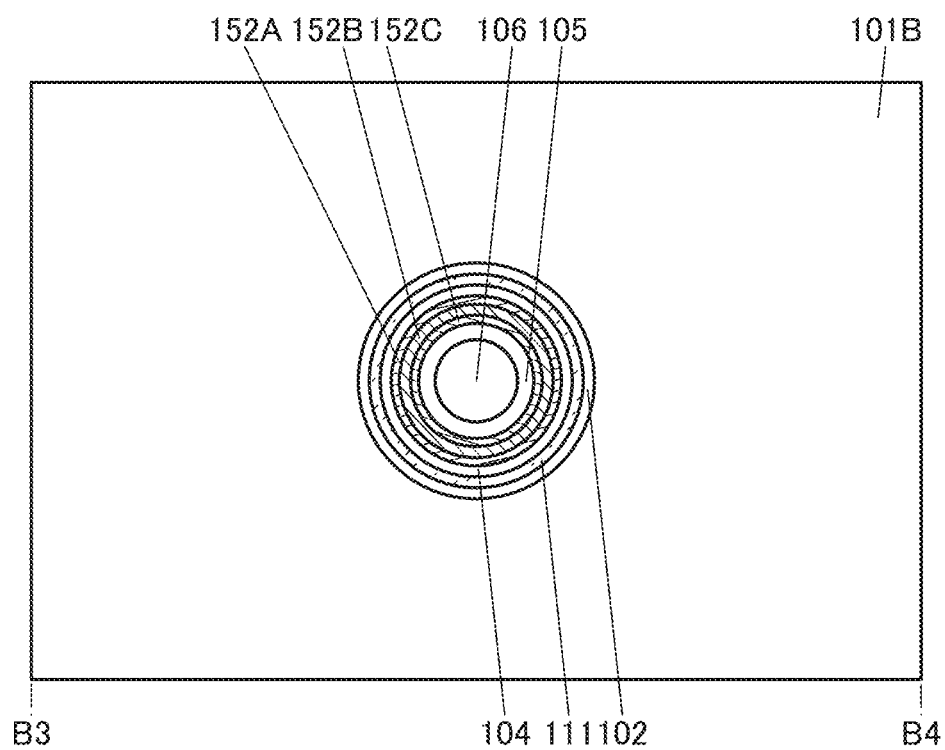

FIGS. 23A and 23B are top views of the semiconductor device along the dashed-dotted lines B1-B2 and B3-B4 in FIG. 22. In the semiconductor device in FIG. 22, the semiconductor layer has a three-layer structure obtained by sequential deposition of the semiconductors 152A, 152B, and 152C from the outer side (the side closer to the insulator 104); therefore, the top views in FIGS. 23A and 23B show that the semiconductor 151 in FIGS. 15A and 15B employs the three-layer structure.

Preferably, the semiconductor 152A is provided in contact with the insulator 104, and the semiconductor 152C is provided in contact with the insulator 105 and the insulator 109a. At this time, for the semiconductors 152A and 152C, an oxide with a relatively wide energy gap compared to that of the semiconductor 152B is preferably used. Here, an oxide with a wide energy gap and an oxide with a narrow energy gap are sometimes referred to as a wide gap oxide and a narrow gap oxide, respectively.

When a narrow gap oxide is used for the semiconductors 152A and 152C and a wide gap oxide is used for the semiconductor 152B, the conduction band minimum energy of the semiconductors 152A and 152C is preferably higher than that of the semiconductor 152B. That is, the electron affinity of the semiconductors 152A and 152C is preferably less than that of the semiconductor 152B.

For the semiconductors 152A to 152C, a combination of materials containing metal elements with different atomic ratios is preferably used. Specifically, the atomic ratio of the element M to the other constituent elements in the metal oxide used for the semiconductors 152A and 152C is preferably higher than that in the metal oxide used for the semiconductor 152B. Moreover, the atomic ratio of the element M to In in the metal oxide used for the semiconductors 152A and 152C is preferably higher than that in the metal oxide used for the semiconductor 152B. Furthermore, the atomic ratio of In to the element M in the metal oxide used for the semiconductor 152B is preferably higher than that in the metal oxide used for the semiconductors 152A and 152C.

For the semiconductors 152A and 152C, a metal oxide with a composition of or close to In:Ga:Zn=1:3:4, 1:3:2, or 1:1:1 can be used, for example. For the semiconductor 152B, a metal oxide with a composition of or close to In:Ga:Zn=4:2:3 to 4:2:4.1, 1:1:1, or 5:1:6 can be used, for example. Such metal oxides for the semiconductors 152A to 152C are preferably used in combination to satisfy the above relation of the atomic ratios. For example, it is preferred that a metal oxide with a composition of or close to In:Ga:Zn=1:3:4 be used for the semiconductors 152A and 152C and a metal oxide with a composition of or close to In:Ga:Zn=4:2:3 to 4:2:4.1 be used for the semiconductor 152B. Here, the term "composition" refers to the atomic ratio of an oxide formed over a substrate or the atomic ratio of a sputtering target.

In addition, a CAAC-OS is preferably used for the semiconductors 152A and 152C; the CAAC-OS will be described in Embodiment 4. When the CAAC-OS is used for the semiconductors 152A and 152C, the c-axis is preferably aligned perpendicularly to the top surfaces of the semiconductors 152A and 152C in FIG. 22.

Here, the conduction band minimum energy varies gradually at a junction portion of the semiconductor 152A (the semiconductor 152C) and the semiconductor 152B. In other words, the conduction band minimum at the junction portion of the semiconductor 152A (the semiconductor 152C) and the semiconductor 152B varies continuously or is continuously connected. To vary the energy level gradually, the density of defect states in a mixed layer formed at an interface between the semiconductor 152A (the semiconductor 152C) and the semiconductor 152B is preferably made low.

Specifically, when the semiconductor 152A (the semiconductor 152C) and the semiconductor 152B contain the same element (as a main component) in addition to oxygen, a mixed layer with a low density of defect states can be formed. For example, when the semiconductor 152B is an In—Ga—Zn oxide, it is preferable to use an In—Ga—Zn oxide, a Ga—Zn oxide, gallium oxide, or the like for the semiconductor 152A (the semiconductor 152C), in which case the density of defect states at the interface between the semiconductor 152A (the semiconductor 152C) and the semiconductor 152B can be reduced. Thus, the influence of interface scattering on carrier conduction is small, and the cell transistor can have a high on-state current in some cases.

In the semiconductor device of FIG. 22, the semiconductor 151 in FIG. 14B has the three-layer structure; alternatively, the semiconductor may have a two-layer structure or a structure including four or more layers.

Figure 24A:
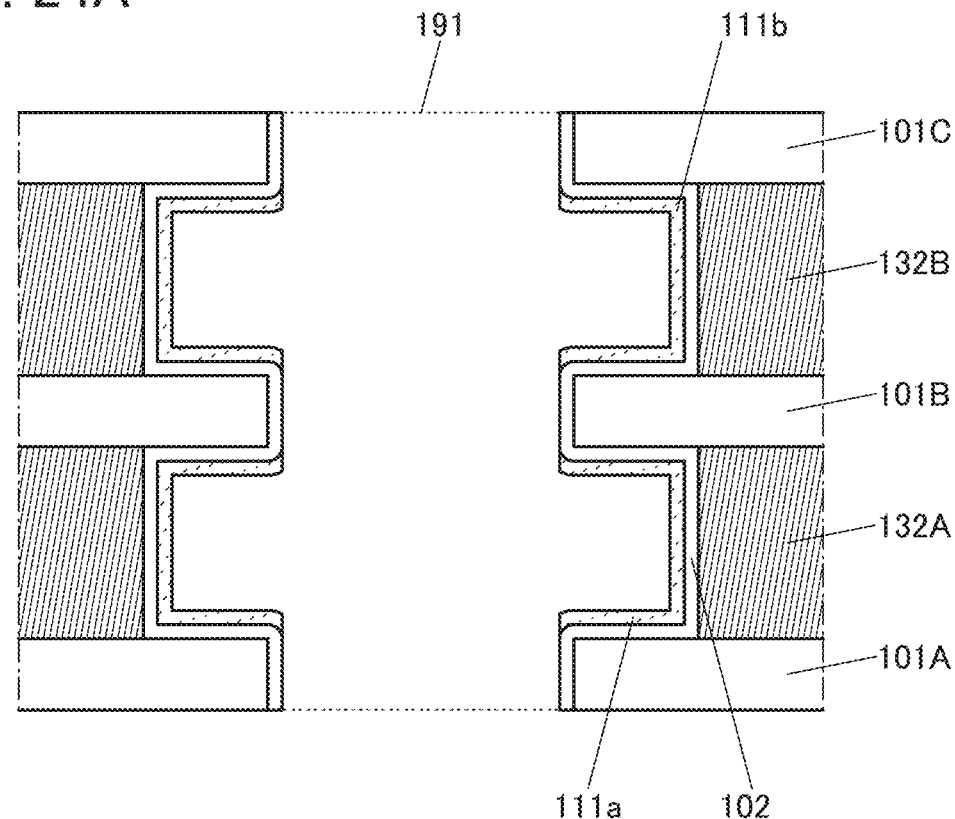
FIGS. 24A and 24B are cross-sectional views illustrating an example of manufacturing a semiconductor device.
Figure 24B:
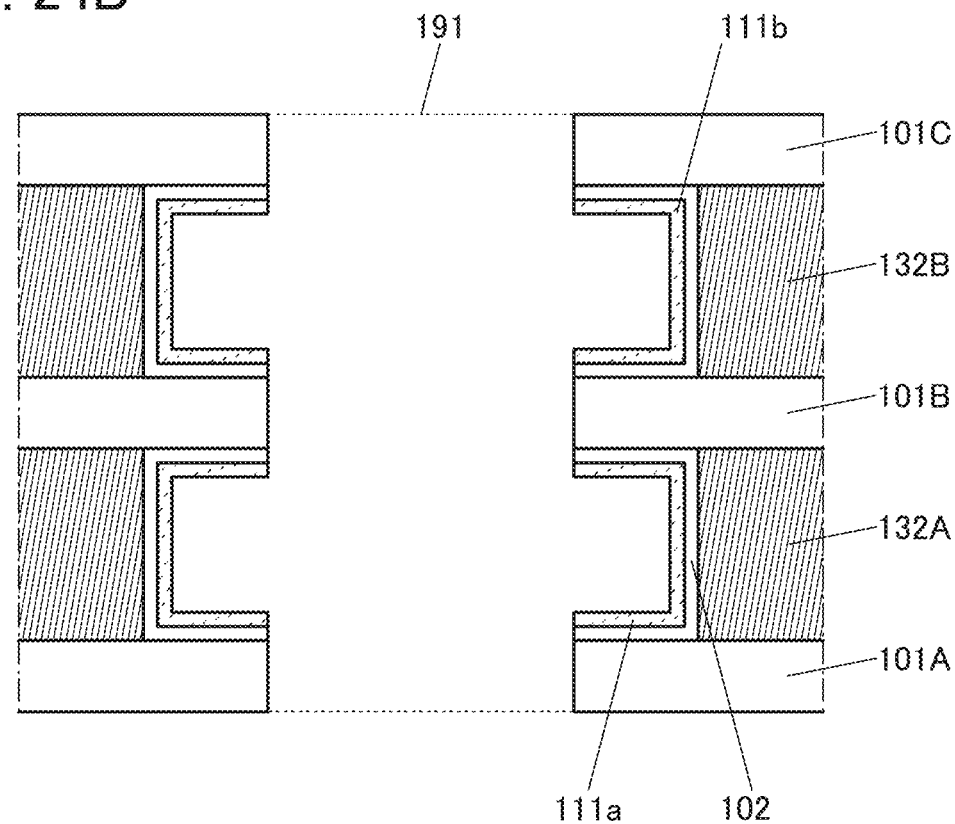

In the semiconductor device of FIG. 14B, the insulator 111 is positioned on the entire insulator 102 as an example; alternatively, in one embodiment of the present invention, the insulator 111 can be divided into the charge accumulation layers included in each of the cell transistors CTr. FIG. 24A illustrates a step of removing the insulator 111 in the opening 191 by resist mask formation and etching treatment or the like after the step in FIG. 10A so that the insulator 111 remains only on the insulator 102 in the recess portions 192A and 192B. Thus, an insulator 111a and an insulator 111b are formed in contact with the insulator 102 positioned in the recess portion 192A and the recess portion 192B, respectively. Alternatively, in the step of removing the insulator 111 in the opening 191, the insulator 102 positioned in the opening 191 may also be removed so that the insulator 101A (the insulator 101B, the insulator 101C) is exposed as illustrated in FIG. 24B. Subsequent to the step in FIG. 24A, steps similar to those in FIGS. 10B to 14B are performed, thereby constituting a semiconductor device illustrated in FIG. 25.

Figure 25:
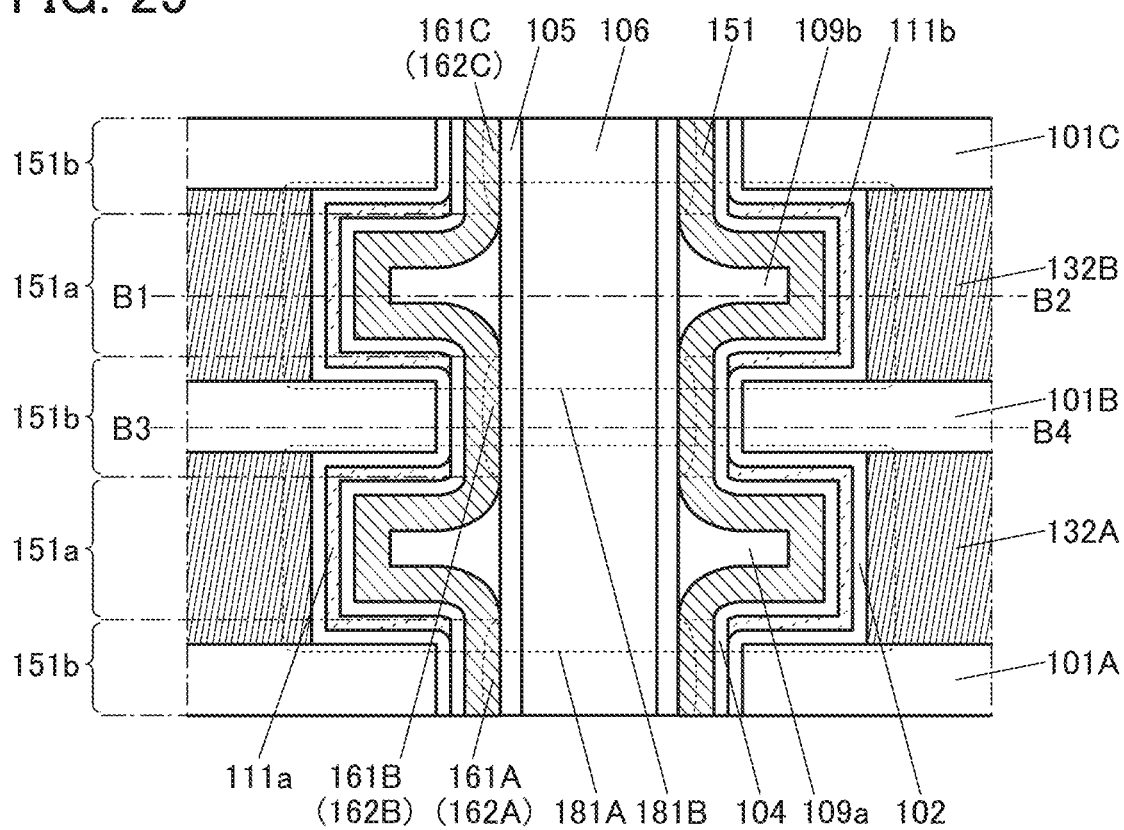
FIG. 25 is a cross-sectional view illustrating an example of manufacturing a semiconductor device.
Figure 26:
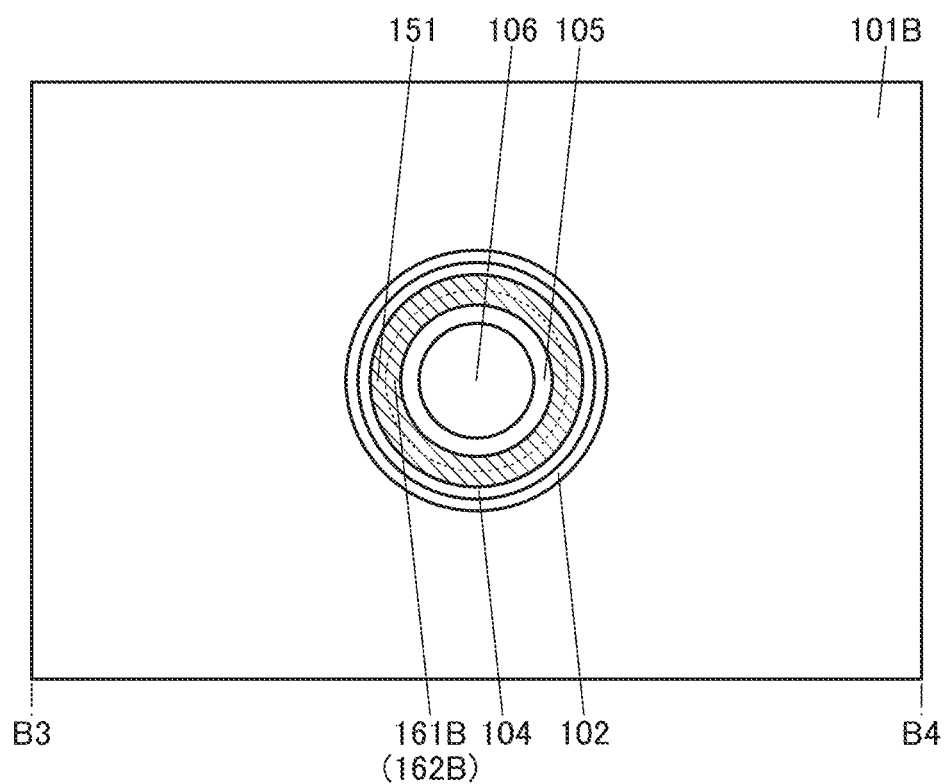
FIG. 26 is a top view illustrating an example of manufacturing a semiconductor device.

FIG. 26 is a top view of the semiconductor device along the dashed-dotted line B3-B4 in FIG. 25. In the semiconductor device in FIG. 25, the insulator 111 in a region that overlaps the insulator 101A (the insulator 101B, the insulator 101C) with the insulator 102 therebetween has been removed; hence, the top view of FIG. 26 shows a structure without the insulator 111 between the insulator 102 and the insulator 104 in the top view of FIG. 15B. Note that a top view along the dashed-dotted line B1-B2 in FIG. 25 is approximately the same as that in FIG. 15A in some cases.

As another example, in one embodiment of the present invention, the structure of the gate electrode of the cell transistor CTr may be changed from that in FIG. 14B in order to improve the reliability of the cell transistor CTr. FIGS. 27A and 27B and FIGS. 28A and 28B illustrate an example of a method for manufacturing such a semiconductor device.

Figure 27A:
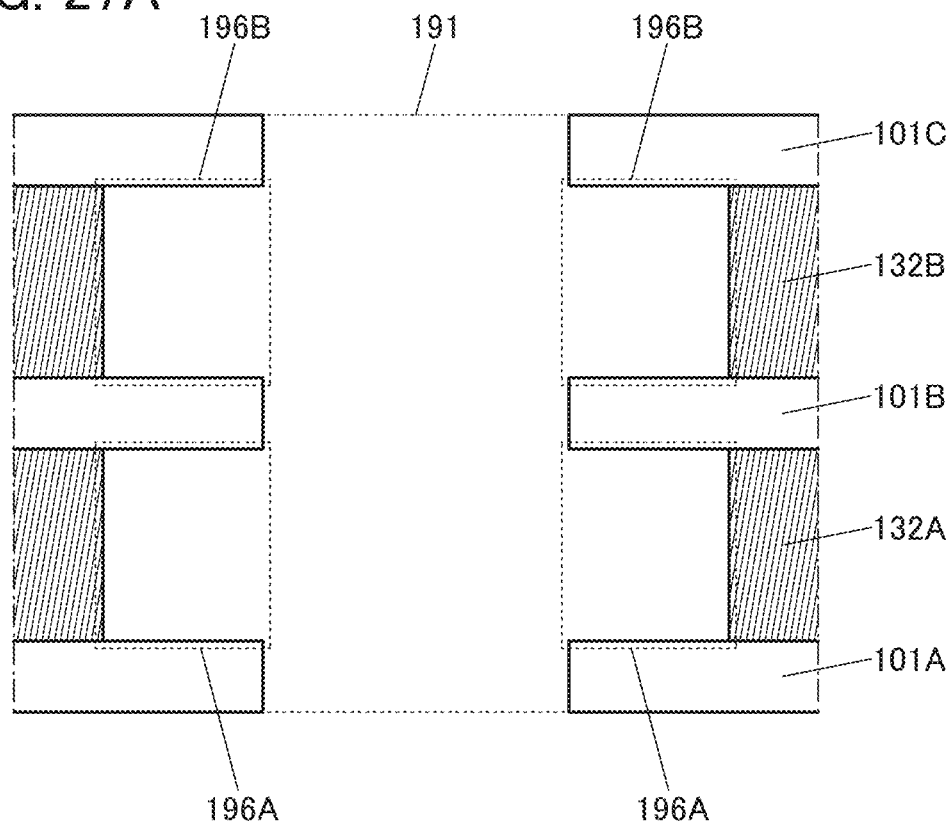
FIGS. 27A and 27B are cross-sectional views illustrating an example of manufacturing a semiconductor device.

In a step illustrated in FIG. 27A, the conductors 132A and 132B positioned on the side surface of the opening 191 are partly removed by etching treatment or the like in FIG. 8B, and a recess portion 196A and a recess portion 196B are formed on the side surface. Note that the recess portions 196A and 196B may be formed deeper than the recess portions 192A and 192B shown in FIG. 9A.

Figure 27B:
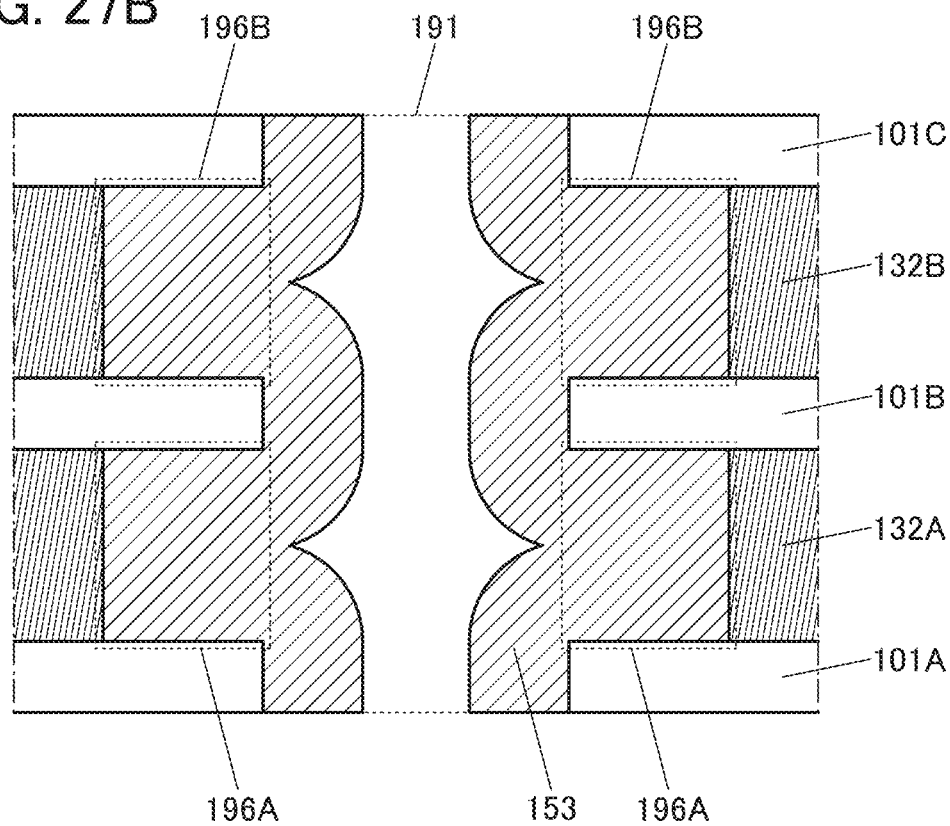

In the subsequent step in FIG. 27B, a semiconductor 153 is deposited on the side surface of the opening 191 and in the recess portions 196A and 196B in FIG. 27A.

For the semiconductor 153, a material containing a metal oxide described in Embodiment 4 is used, for example. Note that a material usable for the semiconductor 153 is not limited to the above. For example, a material other than a metal oxide can be used for the semiconductor 153 in some cases. Alternatively, the semiconductor 153 can sometimes be replaced with a conductor or an insulator, for instance.

To form the semiconductor 153, a deposition method achieving high step coverage is preferably employed. As the deposition method achieving high step coverage, an ALD method is preferably used, and a CVD method may alternatively be used, for example. As another deposition method, a sputtering method, a sol-gel method, an electrophoretic method, or a spray method can sometimes be used, for instance.

Figure 28A:
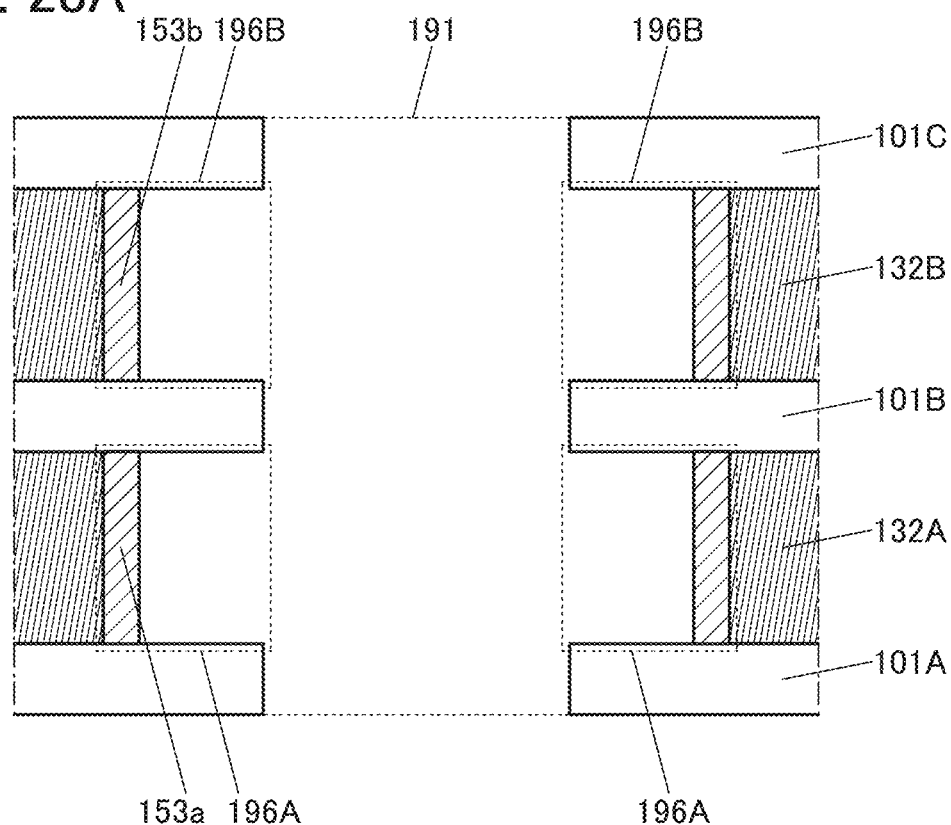
FIGS. 28A and 28B are cross-sectional views illustrating an example of manufacturing a semiconductor device.

In the next step, as illustrated in FIG. 28A, part of the remaining semiconductor 153 in the recess portions 196A and 196B and the semiconductor 153 positioned on the side surface of the opening 191 are removed by resist mask formation and etching treatment or the like so that the semiconductor 153 remains in part of the recess portions 196A and 196B. Thus, a semiconductor 153a and a semiconductor 153b are formed.

Subsequently, steps similar to those in FIGS. 9B to 14B are performed, thereby constituting a semiconductor device illustrated in FIG. 28B.

Figure 28B:
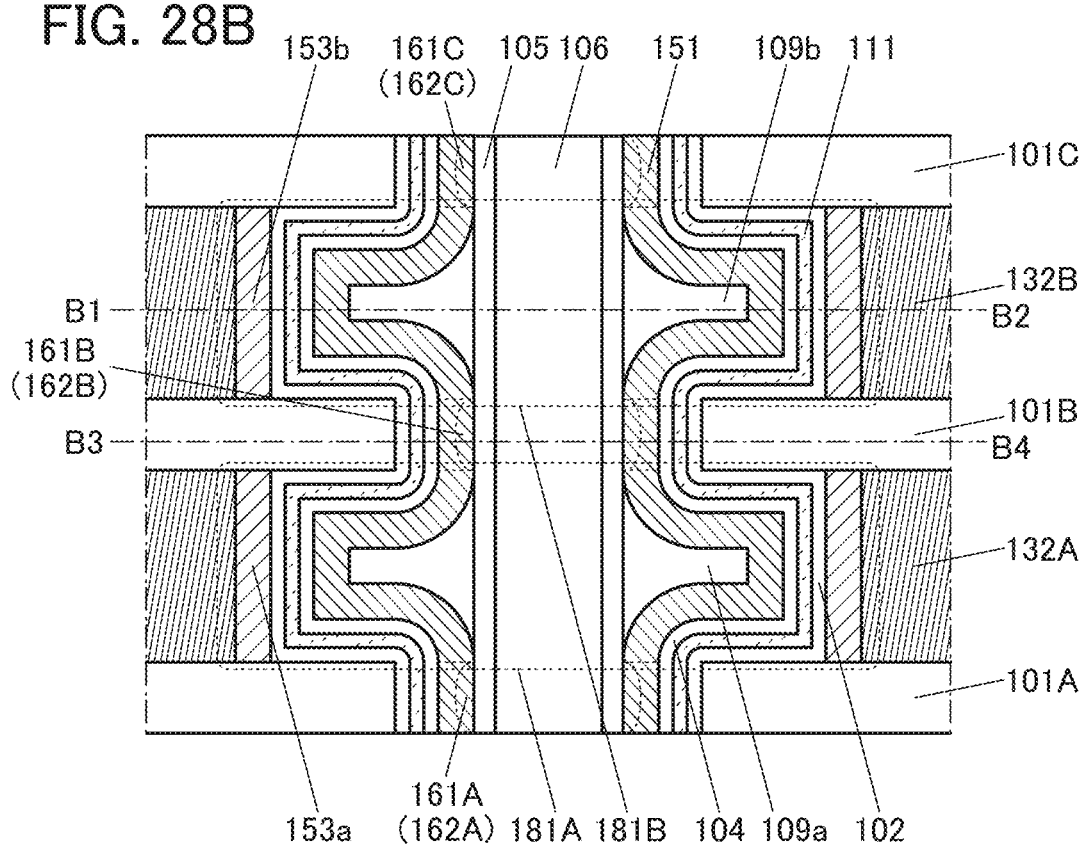
Figure 29:
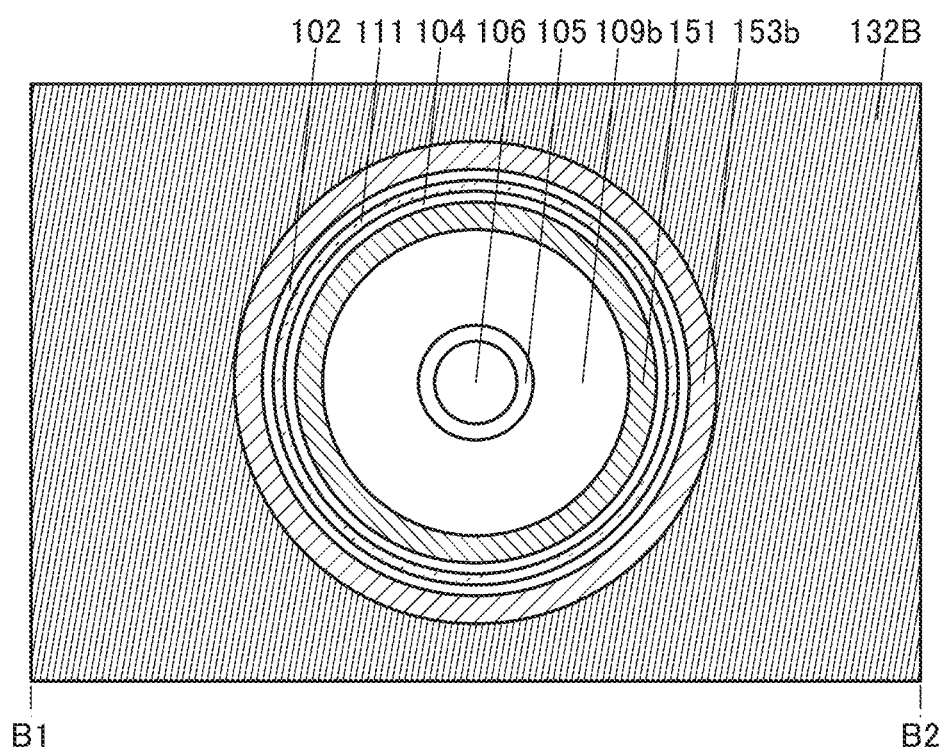
FIG. 29 is a top view illustrating an example of manufacturing a semiconductor device.

FIG. 29 is a top view of the semiconductor device along the dashed-dotted line B1-B2 in FIG. 28B. In the semiconductor device in FIG. 28B, the semiconductor 153a (the semiconductor 153b) is included between the conductor 132A (the conductor 132B) and the insulator 102 in the region 151a, which is different from the semiconductor device in FIG. 14B. Accordingly, the top view in FIG. 29 shows a structure where the semiconductor 153b is included between the conductor 132B and the insulator 102. Note that a top view along the dashed-dotted line B3-B4 in FIG. 28B is approximately the same as that in FIG. 15B in some cases.

Since the semiconductor 153a (the semiconductor 153b) is in contact with the insulator 102, impurities such as hydrogen and water included in the insulator 102 are sometimes diffused into the semiconductor 153a (the semiconductor 153b), or impurities such as hydrogen and water included in a region where the insulator 111 and the insulator 104 overlap are sometimes diffused into the semiconductor 153a (the semiconductor 153b) through the insulator 102. Since the semiconductor 153a (the semiconductor 153b) is in contact with the conductor 132A (the conductor 132B), impurities such as hydrogen and water included in the conductor 132A (the conductor 132B) are sometimes diffused into the semiconductor 153a (the semiconductor 153b). That is, the semiconductor 153a (the semiconductor 153b) has a function of capturing impurities such as hydrogen and water. Thus, the resistance of the semiconductor 153a (the semiconductor 153b) is lowered, and the semiconductor 153a (the semiconductor 153b) can function as the gate electrode of the cell transistor CTr. In other words, in the semiconductor device of FIG. 28B, the semiconductor 153a (the semiconductor 153b) captures surrounding impurities such as hydrogen and water, whereby the reliability of the cell transistor CTr can be increased.

Figure 30A:
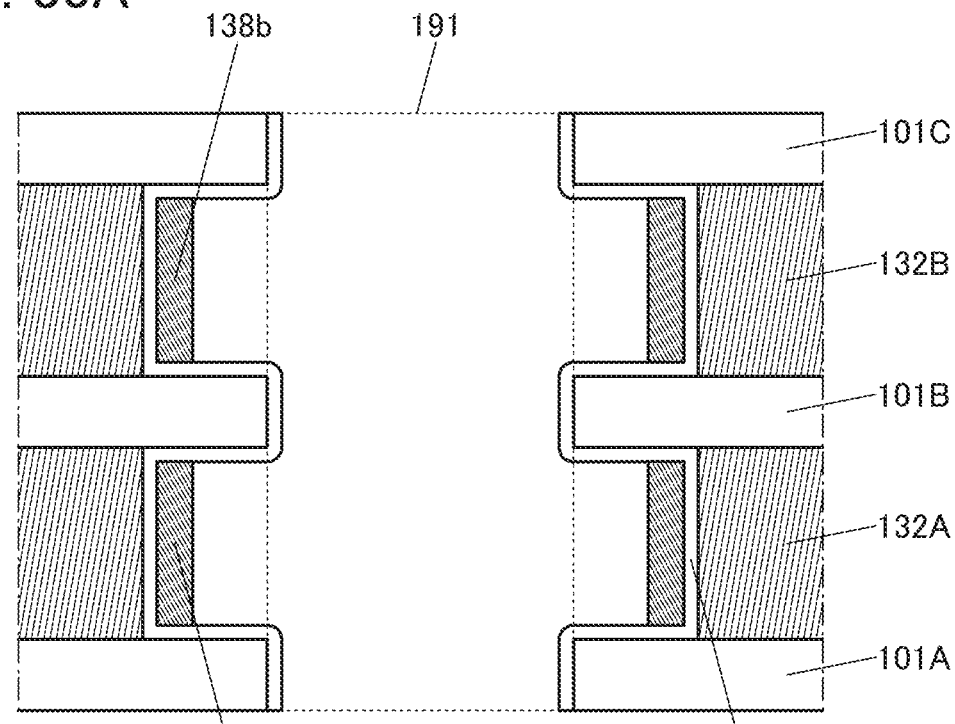
FIGS. 30A and 30B are cross-sectional views illustrating an example of manufacturing a semiconductor device.
Figure 30B:
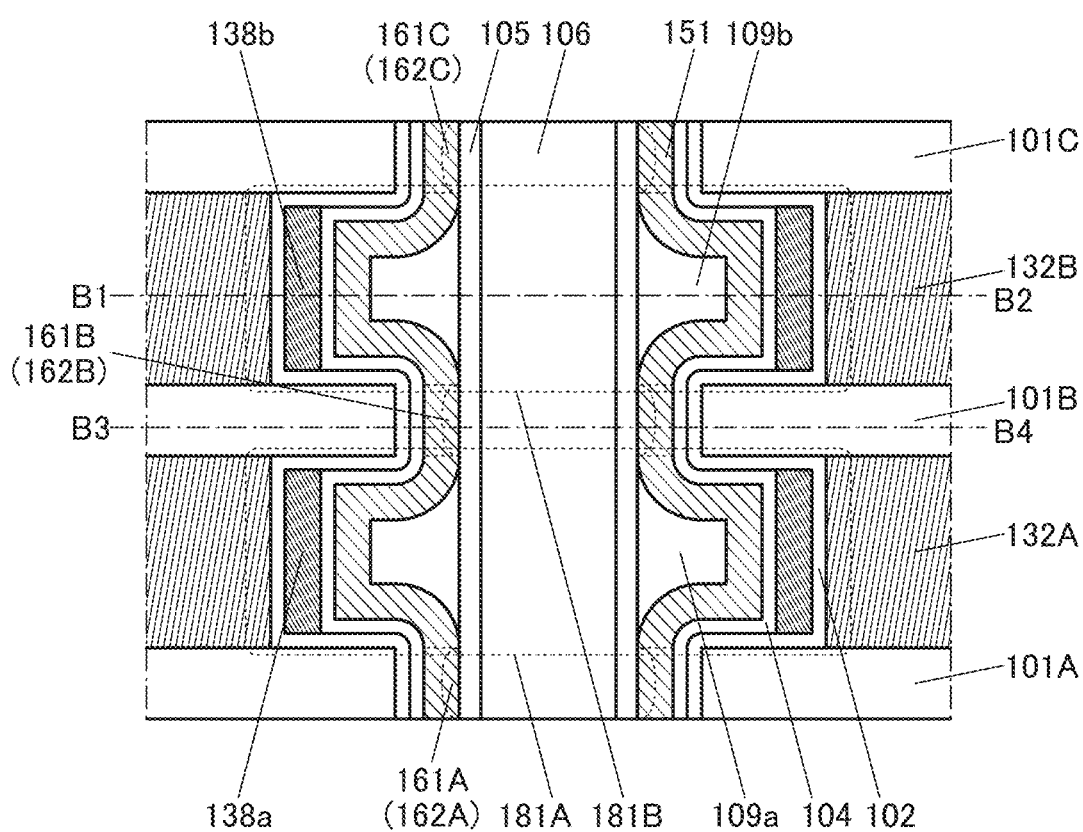

As another example, in one embodiment of the present invention, a conductor may be provided instead of the insulator 111 used for the charge accumulation layer. FIGS. 30A and 30B illustrate an example of a method for manufacturing such a semiconductor device. FIG. 30A shows that a conductor 138a and a conductor 138b are formed in part of the recess portion 192A and part of the recess portion 192B, respectively, in FIG. 9B. The conductors 138a and 138b are formed as follows: a conductive material to be the conductors 138a and 138b is deposited in the opening 191 and the recess portions 192A and 192B and then is removed by resist mask formation and etching treatment or the like so that the conductor 138a and the conductor 138b remain in part of the recess portion 192A and part of the recess portion 192B, respectively. After that, steps from the step of depositing the insulator 104 in FIG. 10B to the step of depositing the insulator 106 in FIG. 14B are similarly performed, thereby constituting the semiconductor device shown in FIG. 30B.

To form the conductors 138a and 138b, a deposition method achieving high step coverage is preferably employed. As the deposition method achieving high step coverage, an ALD method is preferably used, and a CVD method may alternatively be used, for example. As another deposition method, a sputtering method, a sol-gel method, an electrophoretic method, or a spray method can sometimes be used, for instance.

Figure 31:
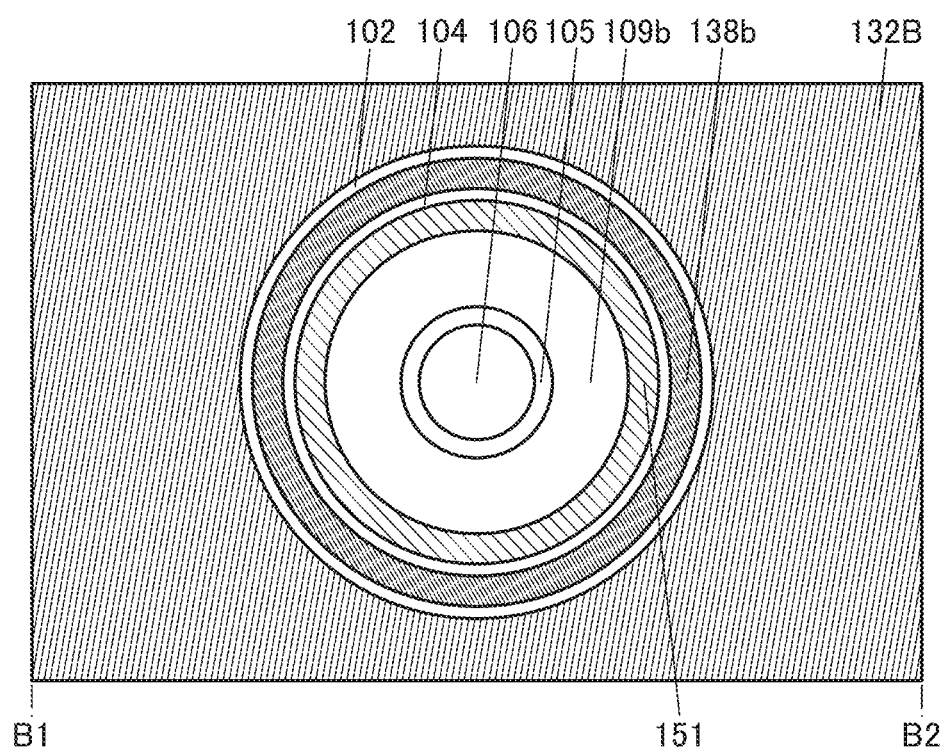
FIG. 31 is a top view illustrating an example of manufacturing a semiconductor device.

FIG. 31 is a top view of the semiconductor device along the dashed-dotted line B1-B2 in FIG. 30B. In the semiconductor device of FIG. 30B, the conductor 138a (the conductor 138b) is included between the insulator 102 and the insulator 104 in a region overlapping the region 151a of the semiconductor 151; hence, the top view in FIG. 31 shows a structure including the conductor 138b between the insulator 102 and the insulator 104. Note that a top view along the dashed-dotted line B3-B4 in FIG. 30B is approximately the same as that in FIG. 26 in some cases.

For the conductors 138a and 138b, any of the materials usable for the conductor 132A (the conductor 132B) can be used, for example. Note that a material usable for the conductors 138a and 138b is not limited to the above. The conductors 138a and 138b can sometimes be replaced with an insulator, a semiconductor, or the like.

<Circuit Configuration Example 2>

Figure 32A:
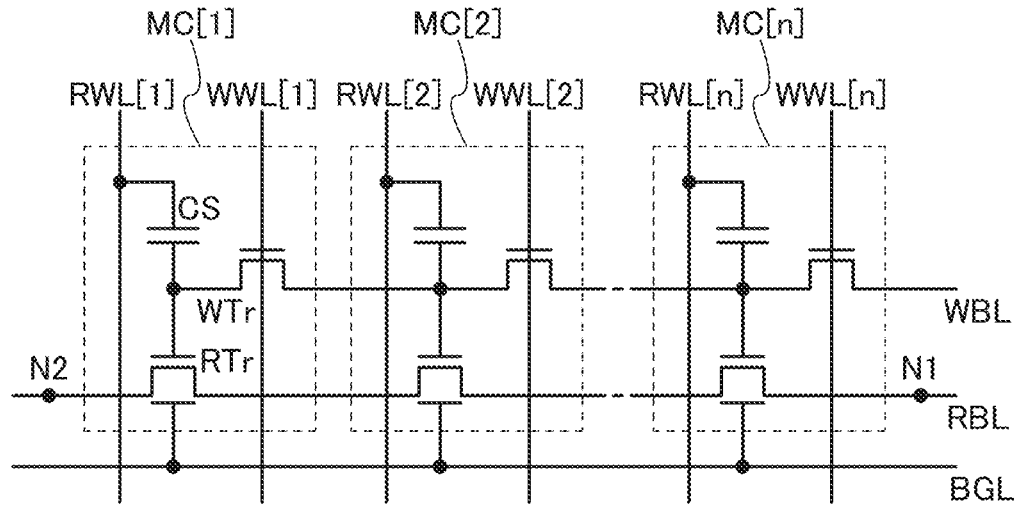
FIGS. 32A to 32C are circuit diagrams each illustrating a configuration example of a semiconductor device.

Next, a configuration of a semiconductor device that is different from the semiconductor devices shown in Circuit configuration example 1 will be described with reference to FIG. 32A. FIG. 32A is a circuit diagram of n memory cells (n is an integer of 1 or more). Specifically, the circuit illustrated in FIG. 32A includes the memory cells MC[1] to MC[n] and wirings WWL[1] to WWL[n], wirings RWL[1] to RWL[n], a wiring WBL, and a wiring RBL for controlling the memory cells. The wiring WWL functions as a write word line, the wiring RWL functions as a read word line, the wiring WBL functions as a write bit line, and the wiring RBL functions as a read bit line.

Each of the memory cells MC includes a transistor WTr, a transistor RTr, and a capacitor CS. The transistor RTr in FIG. 32A has a backgate; application of a potential to the backgate can change the threshold voltage of the transistor RTr. The wiring BGL in FIG. 32A is electrically connected to the backgates of the transistors RTr in the memory cells MC[1] to MC[n]. Instead of including one wiring BGL electrically connected to the backgates of the transistor RTr in the memory cells MC[1] to MC[n], the semiconductor device in FIG. 32A may include wirings BGL that are electrically connected to the respective backgates independently to supply different potentials to the backgates.

For example, a channel formation region of the transistor WTr preferably contains a metal oxide described in Embodiment 4. Specifically, a metal oxide that contains at least one of indium, an element M (e.g., aluminum, gallium, yttrium, or tin), and zinc functions as a wide gap semiconductor; thus, a transistor containing the metal oxide in its channel formation region has ultralow off-state current characteristics. When a transistor with such characteristics is used as the transistor WTr for retaining data, the memory cell MC can retain data for a long time. As a result, the number of refreshing retained data can be reduced, leading to lower power consumption of the semiconductor device.

For a channel formation region of the transistor RTr, a material achieving high field-effect mobility of the transistor is preferably used. Using such a transistor allows the semiconductor device to operate faster. Examples of the material contained in the channel formation region of the transistor RTr include semiconductor materials such as silicon and the metal oxide described in Embodiment 4.

The transistor WTr functions as a write transistor, and the transistor RTr functions as a read transistor. The on/off state of the transistor WTr is switched by a potential supplied to the wiring WWL. The potential of one electrode of the capacitor CS is controlled with the wiring RWL. The other electrode of the capacitor CS is electrically connected to a gate of the transistor RTr. The other electrode of the capacitor CS can be referred to as a memory node. In each of the memory cells MC, the memory node is electrically connected to a first terminal of the transistor WTr.

A second terminal of the transistor WTr is electrically connected in series with the first terminal of the transistor WTr in the adjacent memory cell MC. Similarly, a first terminal of the transistor RTr is electrically connected in series with a second terminal of the transistor RTr in the adjacent memory cell MC. The second terminal of the transistor WTr in the memory cell MC[n] is electrically connected to the wiring WBL. The second terminal of the transistor RTr in the memory cell MC[n] is electrically connected to the wiring RBL. In this embodiment, a connection point of the second terminal of the transistor RTr in the memory cell MC[n] and the wiring RBL is referred to as a node N1, and the first terminal of the transistor RTr in the memory cell MC[1] is referred to as a node N2. Note that a selection transistor may be connected in series with the transistor RTr in order to control electrical continuity between the node N1 and the wiring RBL. Similarly, a selection transistor may be connected in series with the transistor RTr in order to control electrical continuity between the node N2 and a wiring connected to the node N2.

Figure 32B:
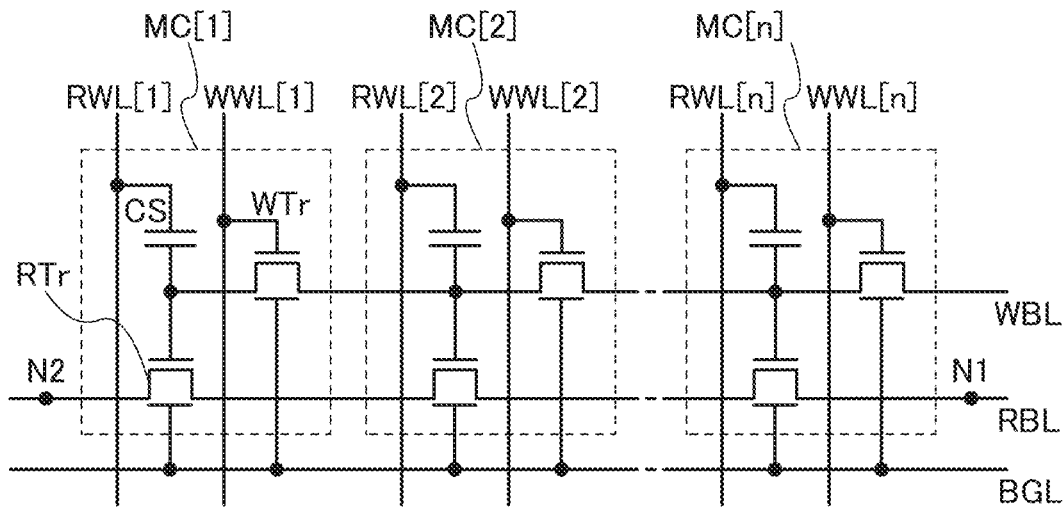

Note that one embodiment of the present invention is not limited to the semiconductor device illustrated in FIG. 32A. One embodiment of the present invention can have a circuit configuration obtained by appropriately changing the circuit configuration of the semiconductor device in FIG. 32A. For example, one embodiment of the present invention may be a semiconductor device in which the transistor WTr also has a backgate as illustrated in FIG. 32B. In the semiconductor device of FIG. 32B including the components of the semiconductor device shown in FIG. 32A, the transistors WTr in the memory cells MC[1] to MC[n] are provided with backgates to which the wiring BGL is electrically connected. As another example, one embodiment of the present invention may be a semiconductor device in which the transistor RTr and the transistor WTr have no backgate as illustrated in FIG. 32C.

Figure 32C:
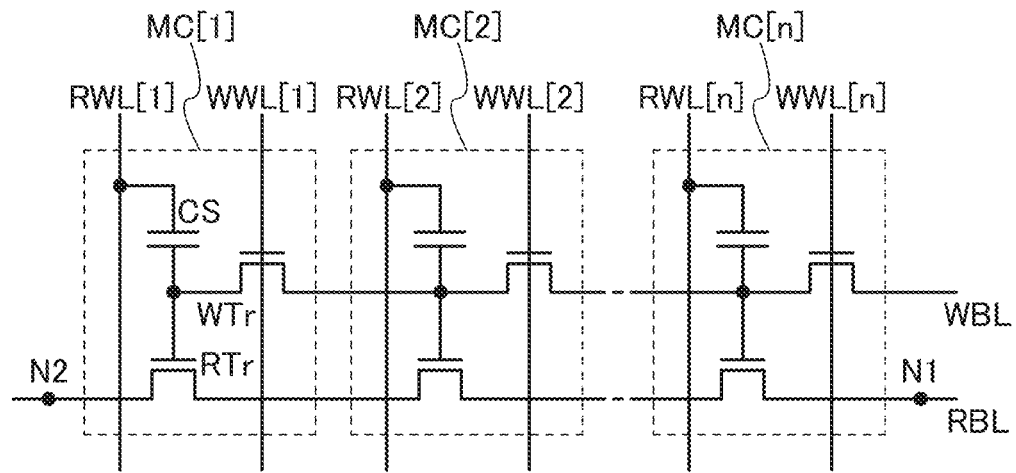

To further increase the memory capacity of the semiconductor devices in FIGS. 32A to 32C, the semiconductor device shown in any of FIGS. 32A to 32C is arranged in a matrix. For example, a circuit configuration illustrated in FIG. 33 is obtained when the semiconductor device in FIG. 32B is arranged in a matrix.

Figure 33:
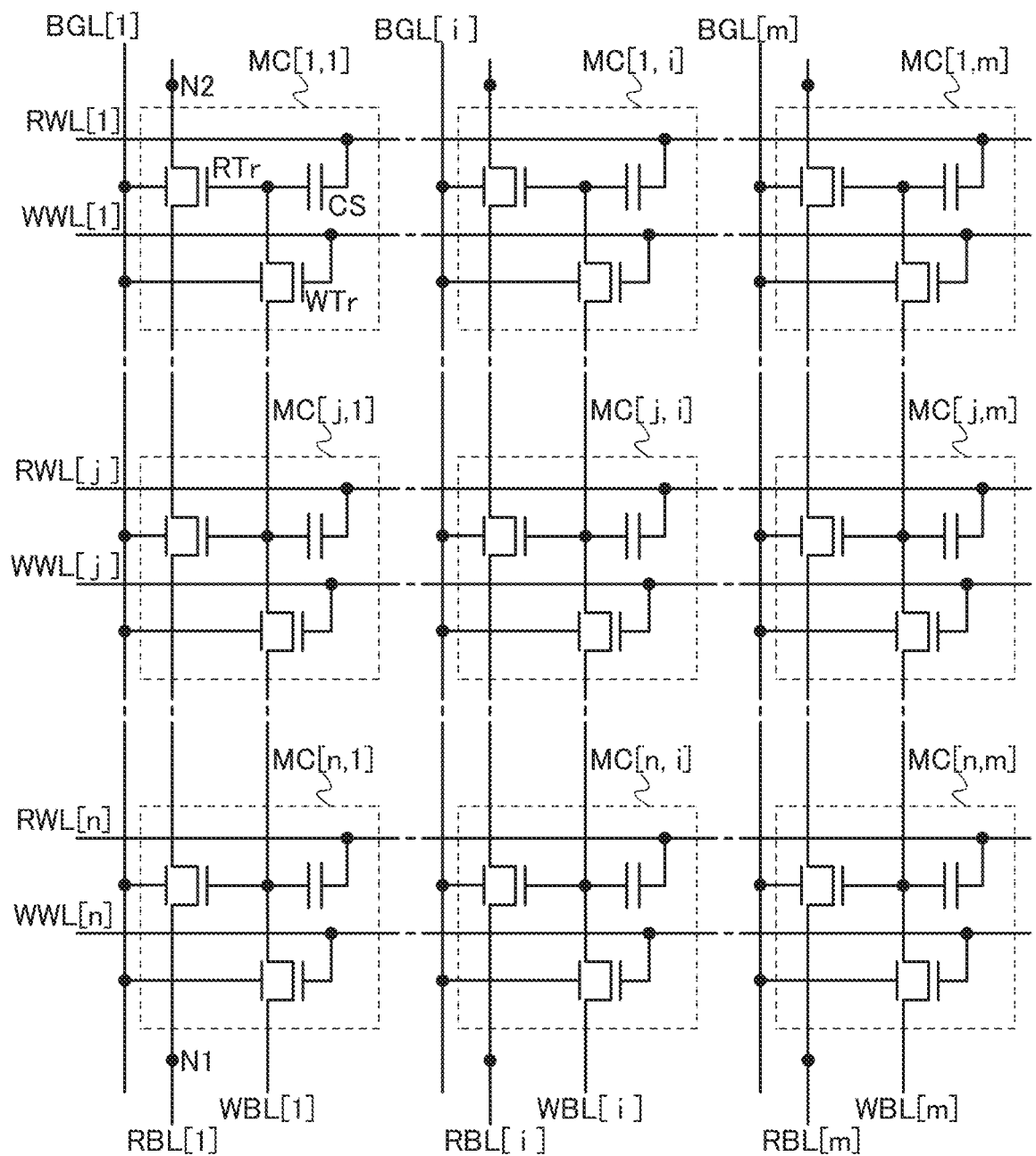
FIG. 33 is a circuit diagram illustrating a configuration example of a semiconductor device.

In the semiconductor device illustrated in FIG. 33, the semiconductor device in FIG. 32B is arranged in m columns (m is an integer of 1 or more), and the wiring RWL and the wiring WWL are electrically connected to and shared between the memory cells MC in the same row. That is, the semiconductor device in FIG. 33 has a matrix of n rows and m columns and includes the memory cells MC[1,1] to MC[n,m]. Accordingly, in the semiconductor device in FIG. 33, electrical connection is established through the wirings RWL[1] to RWL[n], the wirings WWL[1] to WWL[n], wirings RBL[1] to RBL[m], wirings WBL[1] to WBL[m], and the wirings BGL[1] to BGL[m]. Specifically, one electrode of the capacitor CS in the memory cell MC[j,i] (j is an integer of 1 to n, and i is an integer of 1 to m) is electrically connected to the wiring RWL[j]. The gate of the transistor WTr in the memory cell MC[j,i] is electrically connected to the wiring WWL[j]. The wiring WBL[i] is electrically connected to the second terminal of the transistor WTr in the memory cell MC[n,i]. The wiring RBL[i] is electrically connected to the second terminal of the transistor RTr in the memory cell MC[n,i].

FIG. 33 only illustrates the memory cell MC[1,1], the memory cell MC[1,i], the memory cell MC[1,m], the memory cell MC[j,1], the memory cell MC[j,i], the memory cell MC[j,m], the memory cell MC[n,1], the memory cell MC[n,i], the memory cell MC[n,m], the wiring RWL[1], the wiring RWL[j], the wiring RWL[n], the wiring WWL[1], the wiring WWL[j], the wiring WWL[n], the wiring RBL[1], the wiring RBL[i], the wiring RBL[m], the wiring WBL[1], the wiring WBL[i], the wiring WBL[m], the wiring BGL[1], the wiring BGL[i], the wiring BGL[m], the capacitor CS, the transistor WTr, the transistor RTr, the node N1, and the node N2 and omit the other wirings, elements, symbols, and reference numerals.

Figure 34:
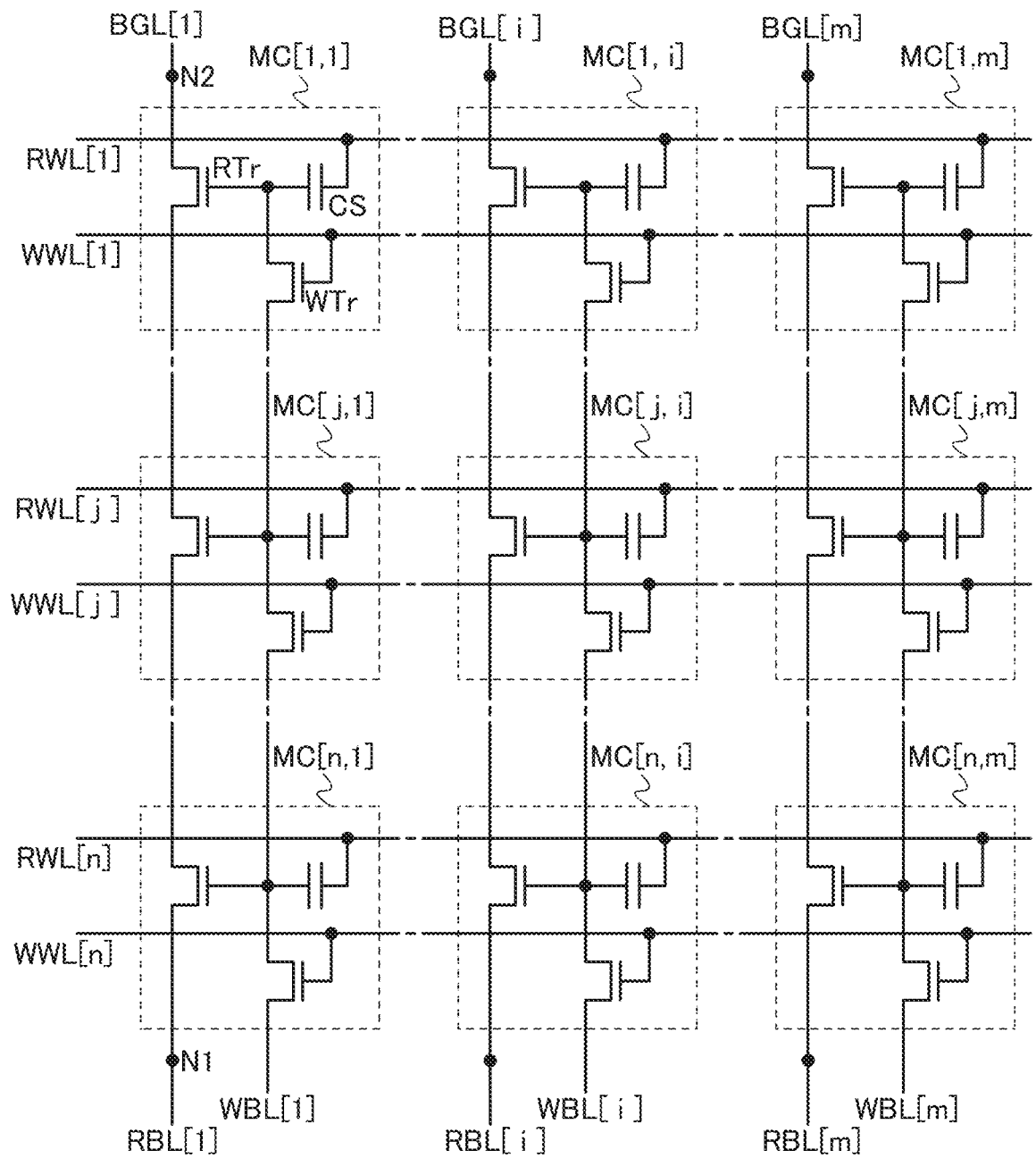
FIG. 34 is a circuit diagram illustrating a configuration example of a semiconductor device.

In FIG. 34, the semiconductor device in FIG. 32C is arranged in m columns (m is an integer of 1 or more). In the semiconductor device of FIG. 34, the transistors in all the memory cells MC do not have a backgate; hence, the semiconductor device in FIG. 34 does not include the wiring BGL. Note that the description of the semiconductor device in FIG. 33 is referred to for the semiconductor device in FIG. 34.

<Operation Method Example 2>

Next, an example of a method for operating the semiconductor device in any of FIGS. 32A to 32C will be described. Note that in the following description, a low-level potential and a high-level potential do not represent any fixed potentials, and specific potentials may vary depending on wirings. For example, a low-level potential and a high-level potential supplied to the wiring WWL may be different from a low-level potential and a high-level potential supplied to the wiring RWL.

In this operation method example, the wiring BGL in FIGS. 32A and 32B has previously been supplied with a potential in a range where the transistor RTr and/or the transistor WTr operate normally. Accordingly, the operations of the semiconductor devices in FIGS. 32A to 32C can be considered the same.

Figure 35A:
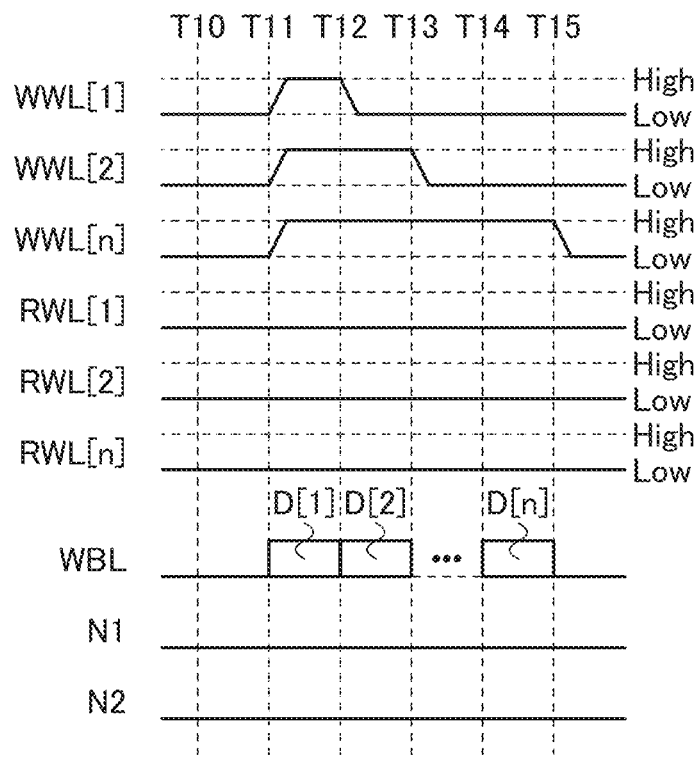
FIGS. 35A and 35B are timing charts showing an operation example of a semiconductor device.
Figure 35B:
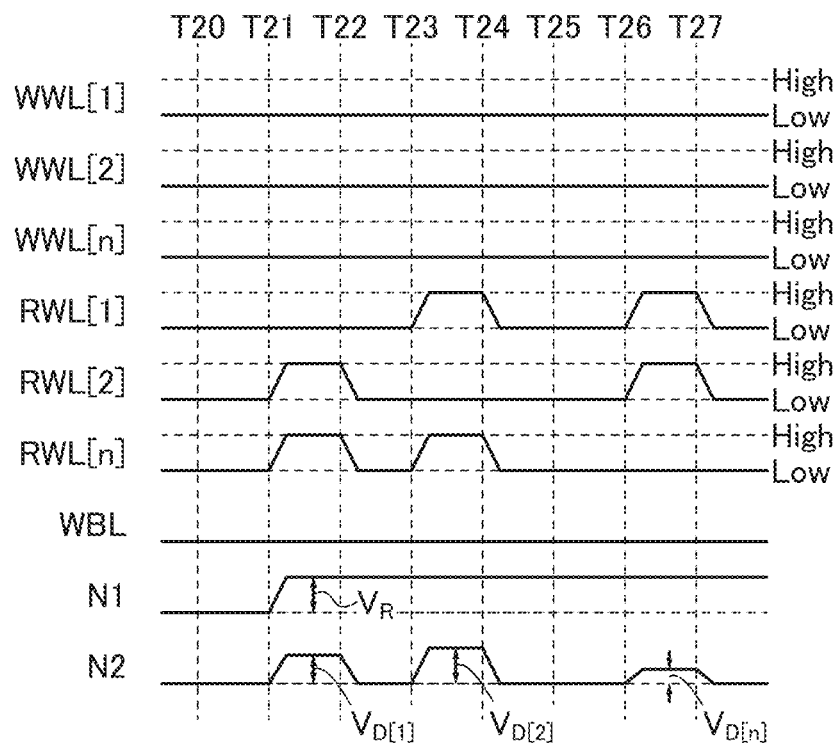

FIG. 35A is a timing chart showing an operation example for writing data into the semiconductor device. FIG. 35B is a timing chart showing an operation example for reading data from the semiconductor device. The timing charts in FIGS. 35A and 35B each show changes in potential level of the wiring WWL[1], the wiring WWL[2], the wiring WWL[n], the wiring RWL[1], the wiring RWL[2], the wiring RWL[n], the node N1, and the node N2. As for the wiring WBL, data supplied to the wiring WBL is shown.

FIG. 35A shows an example of writing data D[1] to data D[n] into the respective memory cells MC[1] to MC[n]. Note that the data D[1] to the data D[n] can be binary data, multilevel data, analog data, or the like. The data D[1] to the data D[n] are supplied from the wirings WBL. That is, in the circuit configuration of the semiconductor device in any of FIGS. 32A to 32C, data is written into the memory cells MC sequentially from the memory cell MC[1] to the memory cell MC[n].

If data is to be written into the memory cell MC[1] after data is written into the memory cell MC[2], the data stored in the memory cell MC[2] is lost during data writing into the memory cell MC[1] unless the data written into the memory cell MC[2] is read out in advance and saved in another place.

When data is written into the memory cell MC[i] (here, i is an integer of 2 to n) in the circuit configuration of the semiconductor device in any of FIGS. 32A to 32C, in order to prevent rewriting of data retained in the memory cells MC[1] to MC[i−−1], a low-level potential is supplied to the wirings WWL[1] to WWL[i−1] so that the transistors WTr in the memory cells MC[1] to MC[i−1] are turned off. Thus, the data held in each of the memory cells MC[1] to MC[i−1] can be protected.

Moreover, when data is written into the memory cell MC[i], since the data is supplied from the wiring WBL, a high-level potential is supplied to the wirings WWL[i] to WWL[n] so that the transistors WTr in the memory cells MC[i] to MC[n] are sufficiently turned on. Consequently, the data can be retained in the memory node of the memory cell MC[i].

When data is written into the semiconductor device having the circuit configuration in any of FIGS. 32A to 32C, the wiring RBL can be controlled independently of the other wirings; therefore, the wiring RBL does not need to be set to a specific potential but can be set to a low-level potential, for example. That is, the potential of the node N1 can be set to a low-level potential. The potential of the node N2 can also be set to a low-level potential.

In light of the above, the operation example shown in the timing chart of FIG. 35A is described. At time T10, the wirings WWL[1] to WWL[n], the wirings RWL[1] to RWL[n], the wiring WBL, the node N1, and the node N2 have a low-level potential.

At time T11, supply of a high-level potential to the wirings WWL[1] to WWL[n] starts. Thus, the transistors WTr in the memory cells MC[1] to MC[n] are sufficiently turned on between time T11 and time T12. The data D[1] is supplied to the wiring WBL. Since the transistors WTr in the memory cells MC[1] to MC[n] are sufficiently turned on, the data D[1] reaches and is written into the memory node of the memory cell MC[1].

At time T12, supply of a low-level potential to the wiring WWL[1] starts, and the high-level potential is continuously supplied to the wirings WWL[2] to WWL[n]. Thus, between time T12 and time T13, the transistor WTr in the memory cell MC[1] is turned off and the transistors WTr in the memory cells MC[2] to MC[n] remain in a sufficient on state. The data D[2] is supplied to the wiring WBL. Since the transistors WTr in the memory cells MC[2] to MC[n] are sufficiently turned on, the data D[2] reaches and is written into the memory node of the memory cell MC[2]. The data D[1] stored in the memory cell MC[1] is not lost by the write operation between time T12 and time T13 because the transistor WTr in the memory cell MC[1] is turned off.

Between time T13 and time T14, the data D[3] to the data D[n−1] are sequentially written into the memory cells MC[3] to MC[n−1] in the same manner as the operation of writing the data D[1] into the memory cell MC[1] between time T11 and time T12 and the operation of writing the data D[2] into the memory cell MC[2] between time T12 and time T13. Specifically, the transistors WTr in the memory cells MC[1] to MC[j−−1] into which the data has been written (here, j is an integer of 3 to n−1) are turned off, the transistors WTr in the memory cells MC[j] to MC[n] into which the data has not been written yet are sufficiently turned on, and the data D[j] is supplied from the wiring WBL and written into the memory node of the memory cell MC[j]. Then, when writing of the data D[j] into the memory cell MC[j] ends, the transistor WTr in the memory cell MC[j] is turned off, and the data D[j+1] is supplied from the wiring WBL and written into the memory node of the memory cell MC[j+1]. Note that the write operation for j=n−1 refers to the following operation between time T14 and time T15.

At time T14, a low-level potential is supplied to the wirings WWL[1] to WWL[n−1] starts, and the high-level potential is continuously supplied to the wiring WWL[n]. Thus, between time T14 and time T15, the transistors WTr in the memory cells MC[1] to MC[n−1] are turned off and the transistor WTr in the memory cell MC[n] remains in a sufficient on state. The data D[n] is supplied to the wiring WBL. Since the transistor WTr in the memory cell MC[n] is sufficiently turned on, the data D[n] reaches and is written into the memory node of the memory cell MC[n]. The data D[1] to the data D[n−1] stored in the respective memory cells MC[1] to MC[n−1] are not lost by the write operation between time T14 and time T15 because the transistors WTr in the memory cells MC[1] to MC[n−1] are turned off.

With the above operation, data can be written into the memory cells MC included in the semiconductor device shown in any of FIGS. 32A to 32C.

FIG. 35B shows an example of a timing chart for reading the data D[1] to the data D[n] from the respective memory cells MC[1] to MC[n]. Here, the transistors WTr need to be off to maintain the data stored in the memory cells MC. For that reason, the wirings WWL[1] to WWL[n] are set to a low-level potential during the operation of reading the data from the memory cells MC[1] to MC[n].

To read data in a specific memory cell MC in the semiconductor device having the circuit configuration in any of FIGS. 32A to 32C, the transistor RTr in the specific memory cell MC is made to operate in the saturation region after the transistors RTr in the other memory cells MC are sufficiently turned on. That is, a current flowing between the source and the drain of the transistor RTr in the specific memory cell MC is determined based on the source-drain voltage and data retained in the specific memory cell MC.

For example, to read data retained in the memory cell MC[k] (here, k is an integer of 1 to n), a high-level potential is supplied to the wirings RWL[1] to RWL[n] except the wiring RWL[k] so that the transistors RTr in the memory cells MC[1] to MC[n] except the memory cell MC[k] are sufficiently turned on.

Meanwhile, in order to set the transistor RTr in the memory cell MC[k] to an on state corresponding to the retained data, the wiring RWL[k] needs to have the same potential as the wiring RWL[k] at the time of writing the data into the memory cell MC[k]. Here, the potential of the wiring RWL[k] in the write operation and the read operation is considered as a low-level potential.

For example, a potential of +3 V is supplied to the node N1, and a potential of 0 V is supplied to the node N2. Then, the node N2 is made floating, and the potential of the node N2 is measured subsequently. When the wirings RWL[1] to RWL[n] except the wiring RWL[k] are set to a high-level potential, the transistors RTr in the memory cells MC[1] to MC[n] except the memory cell MC[k] are sufficiently turned on. Meanwhile, the voltage between the first terminal and the second terminal of the transistor RTr in the memory cell MC[k] depends on the gate potential of the transistor RTr and the potential of the node N1; hence, the potential of the node N2 is determined based on the data retained in the memory node of the memory cell MC[k].

In the above manner, the data stored in the memory cell MC[k] can be read out.

In light of the above, the operation example shown in the timing chart of FIG. 35B is described. At time T20, the wirings WWL[1] to WWL[n], the wirings RWL[1] to RWL[n], the wiring WBL, the node N1, and the node N2 have a low-level potential. Specifically, the node N2 is floating. The data D[1] to the data D[n] are retained in the memory nodes of the respective memory cells MC[1] to MC[n].

Between time T21 and time T22, a low-level potential starts to be supplied to the wiring RWL[1], and a high-level potential starts to be supplied to the wirings RWL[2] to RWL[n]. Thus, the transistors RTr in the memory cells MC[2] to MC[n] are sufficiently turned on between time T21 and time T22. The transistor RTr in the memory cell MC[1] becomes an on state corresponding to the data D[1] retained in the memory node of the memory cell MC[1]. Moreover, a potential $V_R$ is supplied to the wiring RBL. Consequently, the potential of the node N1 becomes $V_R$, and the potential of the node N2 is determined based on the potential $V_R$ of the node N1 and the data retained in the memory node of the memory cell MC[1]. Here, the potential of the node N2 is denoted by $V_{D[n]}$. By measurement of the potential $V_{D[1]}$ of the node N2, the data D[1] retained in the memory node of the memory cell MC[1] can be read out.

Between time T22 and time T23, a low-level potential starts to be supplied to the wirings RWL[1] to RWL[n]. A low-level potential is supplied to the node N2, and then the node N2 becomes floating. That is, the potentials of the wirings RWL[1] to RWL[n] and the node N2 between time T22 and time T23 become the same as those between time T20 and time T21. Note that the wiring RBL may be continuously supplied with the potential $V_R$ or may be supplied with a low-level potential. In this operation example, the wiring RBL is continuously supplied with the potential $V_R$ after time T21.

Between time T23 and time T24, a low-level potential is supplied to the wiring RWL[2], and a high-level potential starts to be supplied to the wiring RWL[1] and the wirings RWL[3] to RWL[n]. Hence, the transistors RTr in the memory cell MC[1] and the memory cells MC[3] to MC[n] are sufficiently turned on between time T23 and time T24. The transistor RTr in the memory cell MC[2] becomes an on state corresponding to the data D[2] retained in the memory node of the memory cell MC[2]. The potential $V_R$ is continuously supplied to the wiring RBL. Consequently, the potential of the node N2 is determined based on the potential $V_R$ of the node N1 and the data retained in the memory node of the memory cell MC[2]. Here, the potential of the node N2 is denoted by $V_{D[2]}$. By measurement of the potential $V_{D[2]}$ of the node N2, the data D[2] retained in the memory node of the memory cell MC[2] can be read out.

Between time T24 and time T25, the data D[3] to the data D[n−1] are sequentially read from the memory cells MC[3] to MC[n−1] in the same manner as the operation of reading the data D[1] from the memory cell MC[1] between time T20 and time T22 and the operation of reading the data D[2] from the memory cell MC[2] between time T22 and time T24. Specifically, to read the data D[j] from the memory cell MC[j] (here, j is an integer of 3 to n−1), the node N2 is set to a low-level potential and is made floating, and then a high-level potential is supplied to the wirings RWL[1] to RWL[n] except the wiring RWL[j] so that the transistors RTr in the memory cells MC[1] to MC[n] except the memory cell MC[j] are sufficiently turned on and the transistor RTr in the memory cell MC[j] is set to an on state corresponding to the data D[j]. Next, the potential of the node N1 is set to $V_R$, whereby the potential of the node N2 becomes a potential corresponding to the data D[j]; by measurement of this potential, the data D[j] can be read out. After the data D[j] stored in the memory cell MC[j] is read out, as preparation for the next read operation, a low-level potential starts to be supplied to the wirings RWL[1] to RWL[n] to set the node N2 to a low-level potential, and then the node N2 is made floating. Note that this preparation for j=n−1 refers to the operation between time T25 and time T26.

Between time T25 and time T26, a low-level potential starts to be supplied to the wirings RWL[1] to RWL[n]. A low-level potential starts to be supplied to the node N2; the node N2 becomes floating after the potential of the node N2 becomes the low-level potential. That is, the potentials of the wirings RWL[1] to RWL[n] and the node N2 between time T25 and time T26 become the same as those between time T20 and time T21. Note that the wiring RBL may be continuously supplied with the potential $V_R$ or may be supplied with a low-level potential. In this operation example, the potential $V_R$ starts to be supplied to the wiring RBL at time T21 and is continuously supplied to the wiring RBL at and after time T22.

At time T26, a low-level potential is supplied to the wiring RWL[n], and a high-level potential is supplied to the wirings RWL[1] to RWL[n−1]. Thus, the transistors RTr in the memory cells MC[1] to MC[n−1] are sufficiently turned on between time T26 and time T27. The transistor RTr in the memory cell MC[n] becomes an on state corresponding to the data D[n] retained in the memory node of the memory cell MC[n]. The potential $V_R$ is continuously supplied to the wiring RBL. Accordingly, the potential of the node N2 is determined based on the potential $V_R$ of the node N1 and the data retained in the memory node of the memory cell MC[n]. Here, the potential of the node N2 is denoted by $V_{D[n]}$. By measurement of the potential $V_{D[n]}$ of the node N2, the data D[n] held in the memory node of the memory cell MC[n] can be read out.

With the above operation, data can be read from each of the memory cells MC in the semiconductor device shown in any of FIGS. 32A to 32C.

<Structure Example and Manufacturing Method Example 2>

For easy understanding of the structure of the semiconductor device having the circuit configuration in any of FIGS. 32A to 32C, FIG. 33, and FIG. 34 described above, a method for manufacturing the semiconductor device will be described below.

Figure 36A:
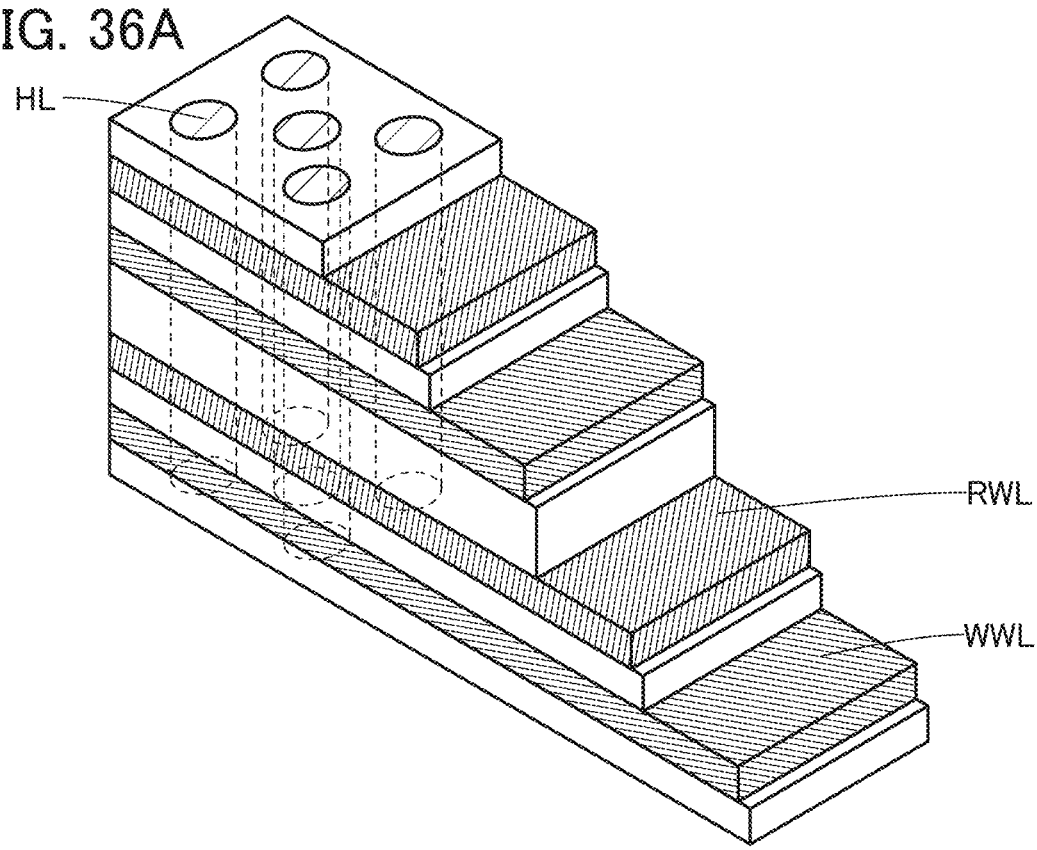
FIGS. 36A to 36C are a schematic view, a top view, and a cross-sectional view for illustrating a structure example of a semiconductor device.
Figure 36B:
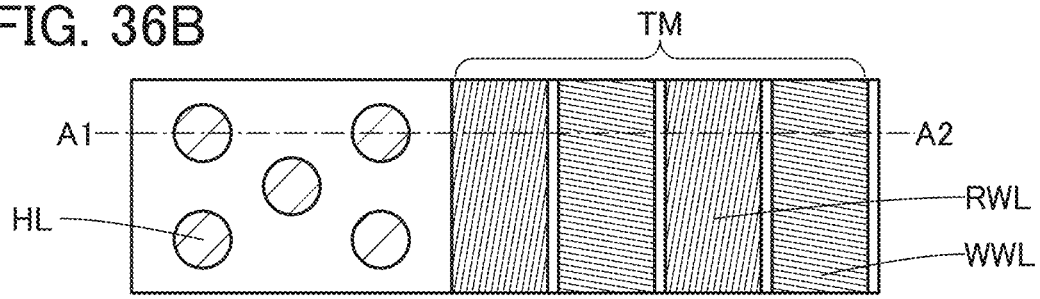
Figure 36C:
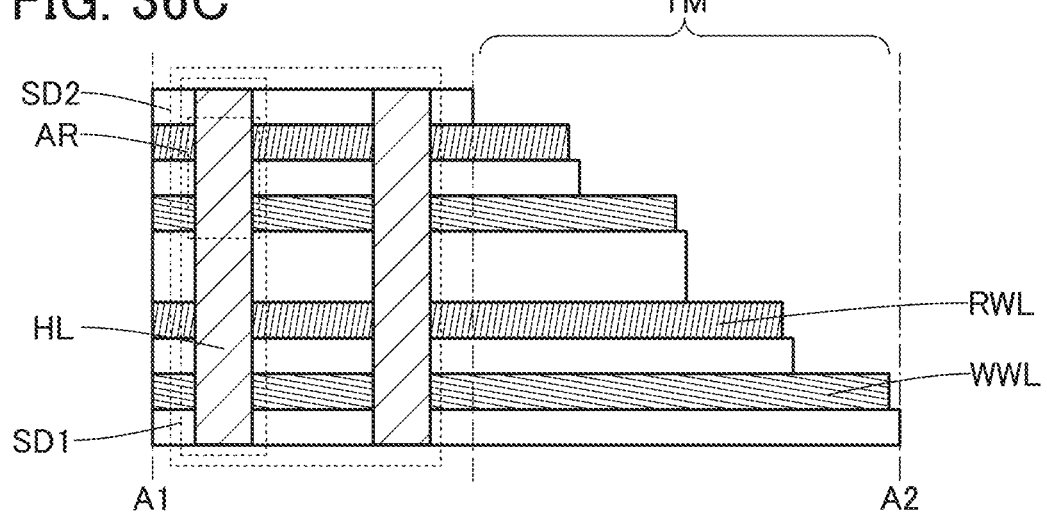

FIGS. 36A to 36C show a schematic example of the semiconductor device shown in FIG. 33 or FIG. 34. FIG. 36A is a perspective view of the semiconductor device. FIG. 36B is a top view of FIG. 36A. FIG. 36C is a cross-sectional view along the dashed-dotted line A1-A2 in FIG. 36B.

The semiconductor device includes a structure body in which the wirings RWL, the wirings WWL, and insulators (regions without a hatching pattern in FIGS. 36A to 36C) are stacked.

An opening is formed in the structure body to penetrate the insulators, the wirings RWL, and the wirings WWL altogether. To provide the memory cell MC in the region AR that penetrates the wirings RWL and the wirings WWL, an insulator, a conductor, and a semiconductor are formed in the opening. The conductor functions as the source electrode or the drain electrode of the transistor WTr and/or the transistor RTr in the memory cell MC. The semiconductor functions as a channel formation region of the transistor WTr and/or the transistor RTr. Alternatively, without formation of the conductor, a channel formation region and a low-resistance region may be formed in the semiconductor and the low-resistance region may serve as the source electrode or the drain electrode of the transistor WTr and/or the transistor RTr. The region where the insulator, the conductor, and the semiconductor are formed in the opening is shown as the region HL in FIGS. 36A to 36C. In FIG. 36A, the region HL included inside the structure body is indicated by a dashed line. Note that when the transistor included in the memory cell MC has a backgate, the conductor included in the region HL may function as the wiring BGL electrically connected to the backgate.

In other words, FIGS. 36A to 36C illustrate that the semiconductor device shown in any of FIGS. 32A to 32C is formed in the region SD1, and the semiconductor device shown in FIG. 33 or FIG. 34 is formed in the region SD2.

The region TM where the wiring RWL and the wiring WWL are exposed functions as a connection terminal for supplying a potential to the wiring RWL and the wiring WWL. That is, connecting wirings to the region TM enables a potential to be supplied to the gates of the transistor WTr and the transistor RTr.

Figure 37A:
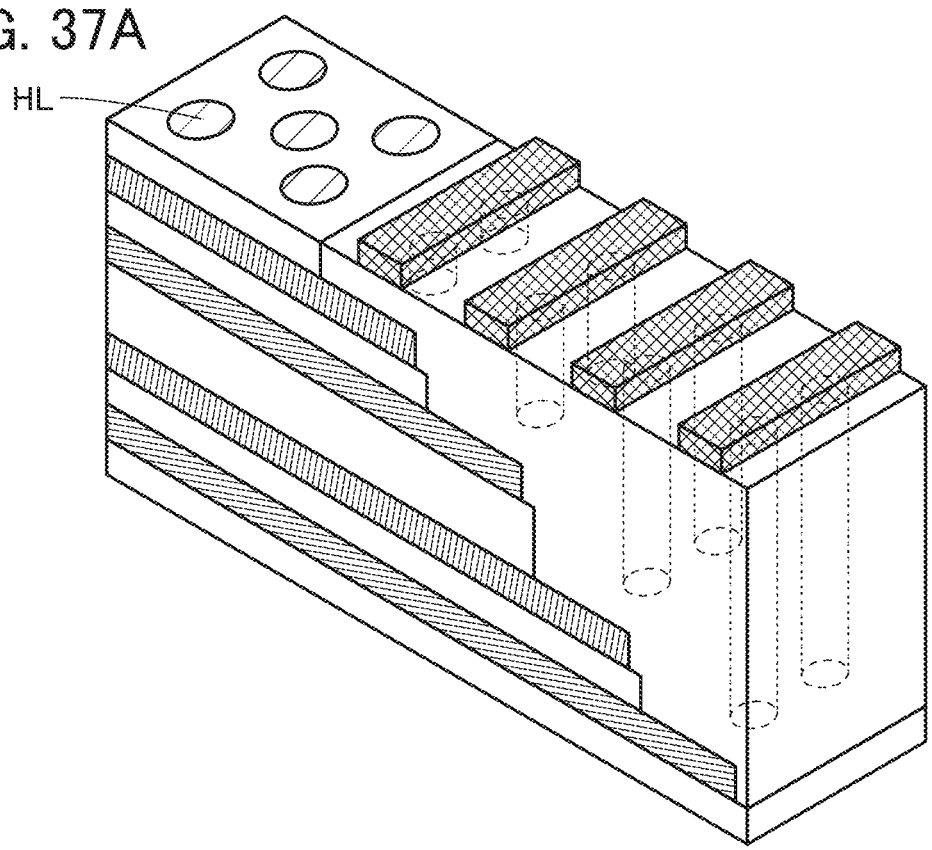
FIGS. 37A to 37C are a schematic view, a top view, and a cross-sectional view for illustrating a structure example of a semiconductor device.
Figure 37B:
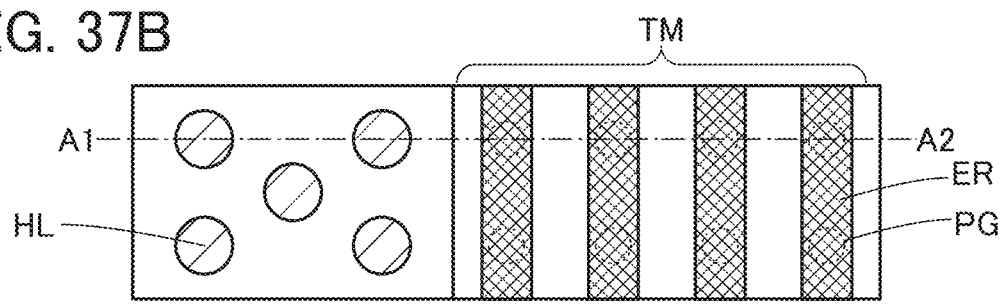
Figure 37C:
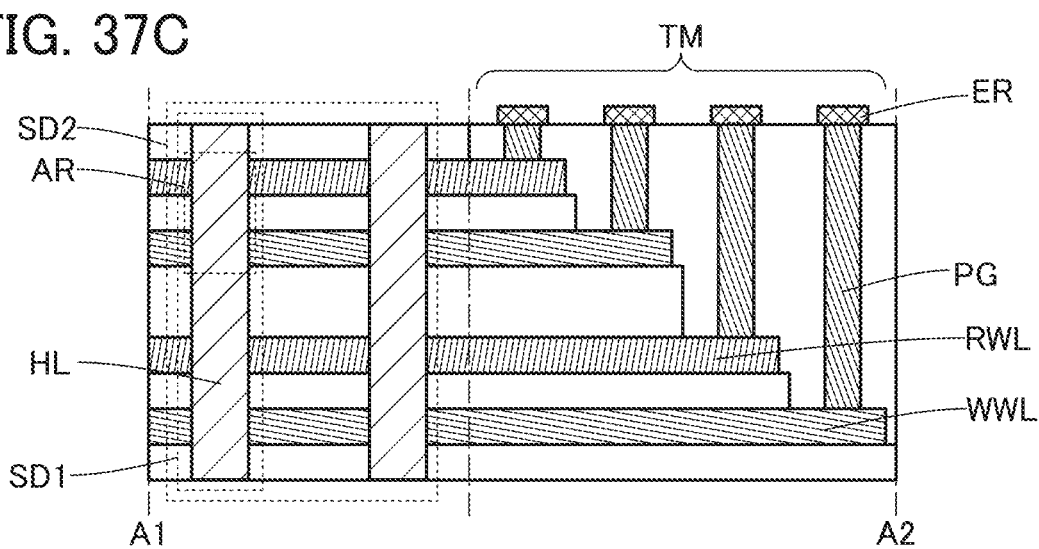

Note that the shape of the region TM is not limited to that in the structure example shown in FIGS. 36A to 36C. The semiconductor device of one embodiment of the present invention may be configured, for example, such that an insulator is formed over the region TM in FIGS. 36A to 36C, an opening is provided in the insulator, and the conductor PG is formed to fill the opening (FIGS. 37A to 37C). The wiring ER is formed over the conductor PG, whereby the wiring ER is electrically connected to the wiring RWL or the wiring WWL. In FIG. 37A, the conductor PG included inside the structure body is indicated by a dashed line, and the dashed line representing the region HL is omitted.

In the following Manufacturing method example 2, a method for forming the memory cell MC illustrated in any of FIGS. 32A to 34 in the region AR will be described.

<<Manufacturing Method Example 2>>

FIGS. 38A to 42B and FIG. 43 are cross-sectional views for illustrating an example of manufacturing the semiconductor device in FIG. 32A, and are specifically cross-sectional views of the transistor WTr and the transistor RTr in the channel length direction. In the cross-sectional views of FIGS. 38A to 43, some components are not illustrated for simplification.

Figure 38A:
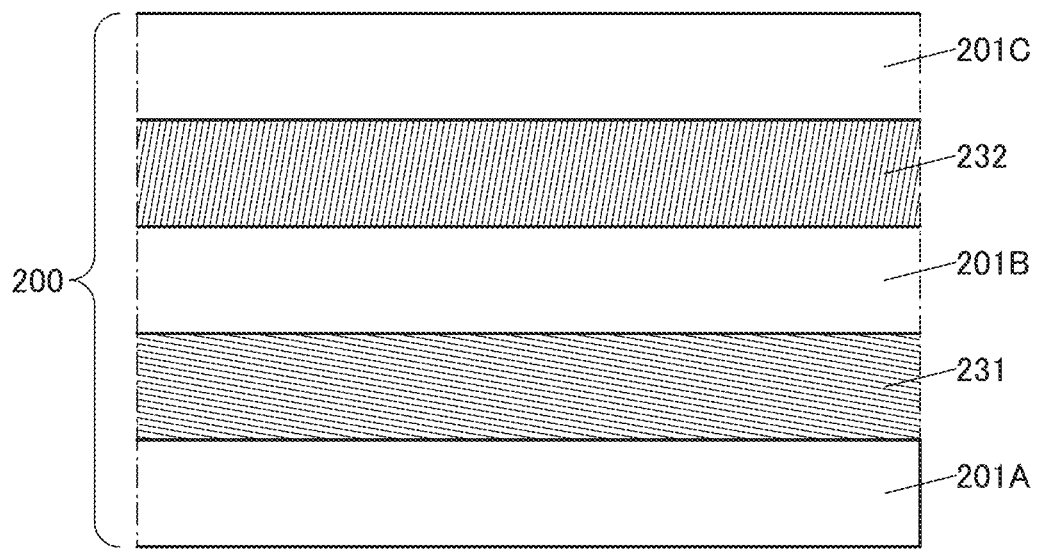
FIGS. 38A and 38B are cross-sectional views illustrating an example of manufacturing a semiconductor device.

As illustrated in FIG. 38A, the semiconductor device in FIG. 32A includes an insulator 201A over a substrate (not shown), a conductor 231 over the insulator 201A, an insulator 201B over the conductor 231, a conductor 232 over the insulator 201B, and an insulator 201C over the conductor 232. Note that a stack including these conductors and insulators (sometimes also including an insulator, a conductor, and the like other than the above depending on subsequent steps) is hereinafter referred to as a stack 200.

For the substrate, any of the substrates described in Manufacturing method example 1 can be used, for example.

The conductor 231 functions as the wiring WWL in FIG. 32A, and the conductor 232 functions as the wiring RWL in FIG. 32A.

For the conductor 231 and the conductor 232, any of the materials usable for the conductors 132A and 132B shown in Manufacturing method example 1 can be used, for example. Moreover, each of the conductors 231 and 232 may have a layered structure using a combination of at least two of these materials. The conductor 231 and the conductor 232 can be formed by any of the methods for forming the conductors 132A and 132B in Manufacturing method example 1.

For the insulators 201A to 201C, any of the materials usable for the insulators 101A to 101C shown in Manufacturing method example 1 can be used, for example. Moreover, each of the insulators 201A to 201C may have a layered structure using a combination of at least two of these materials. The insulators 201A to 201C can be formed by any of the methods for forming the insulators 101A to 101C in Manufacturing method example 1.

Figure 38B:
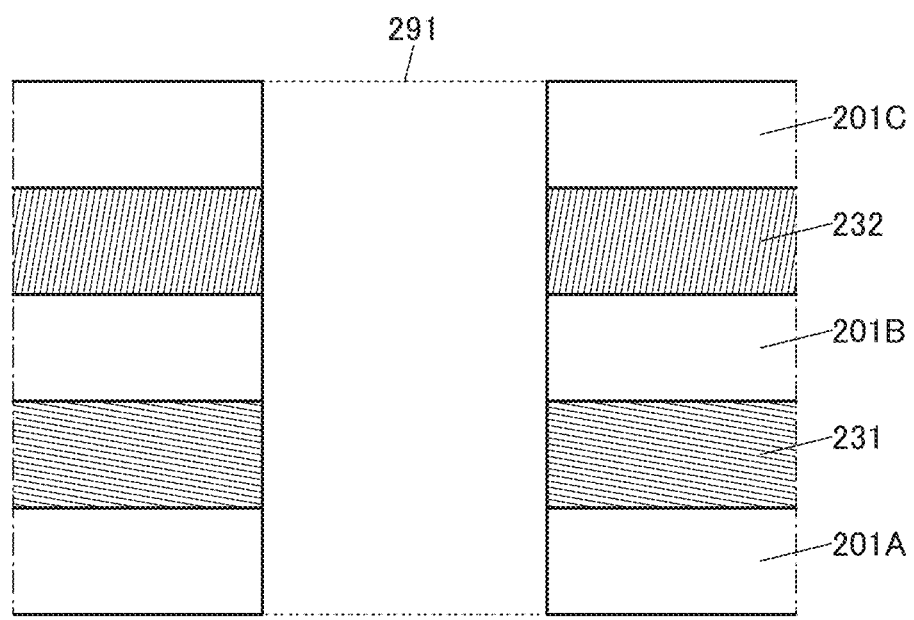

In the next step, as illustrated in FIG. 38B, an opening 291 is formed in the stack 200 shown in FIG. 38A through resist mask formation and etching treatment, for example.

The description in Manufacturing method example 1 is referred to for the resist mask formation and the etching treatment performed in the manufacturing step in FIG. 38B. Similarly, the description in Manufacturing method example 1 is also referred to for resist mask formation and etching treatment to be performed later.

Figure 39A:
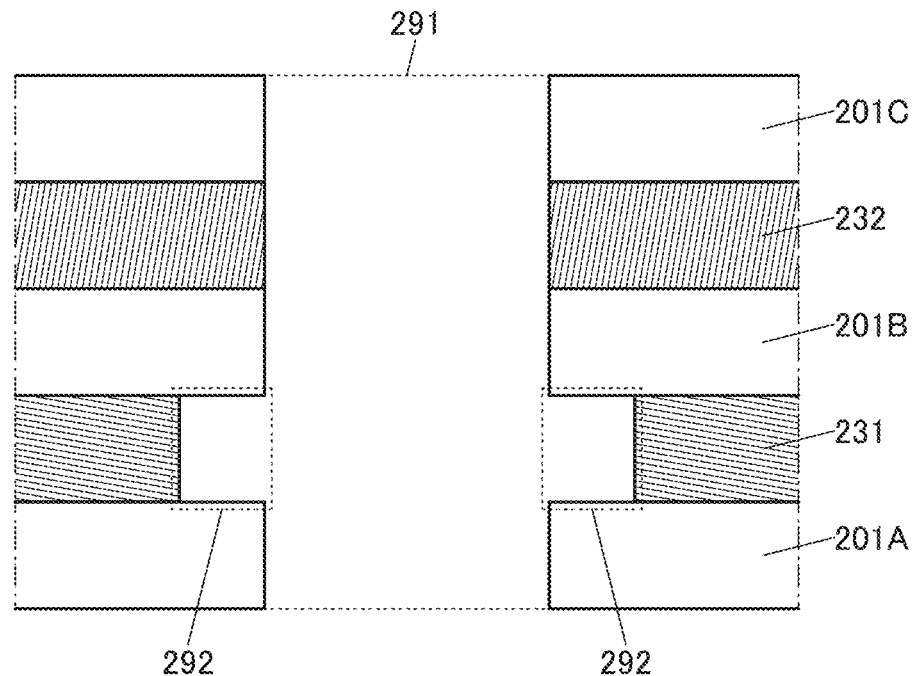
FIGS. 39A and 39B are cross-sectional views illustrating an example of manufacturing a semiconductor device.

Then, as illustrated in FIG. 39A, the conductor 231 positioned on a side surface of the opening 291 is partly removed by etching treatment or the like, and a recess portion 292 is formed on the side surface. Here, a material for the conductor 231 is selected such that the conductor 231 is selectively removed in the stack 200 (e.g., a material with a higher etching rate than the insulators 201A to 201C and the conductor 232 is used).

Figure 39B:
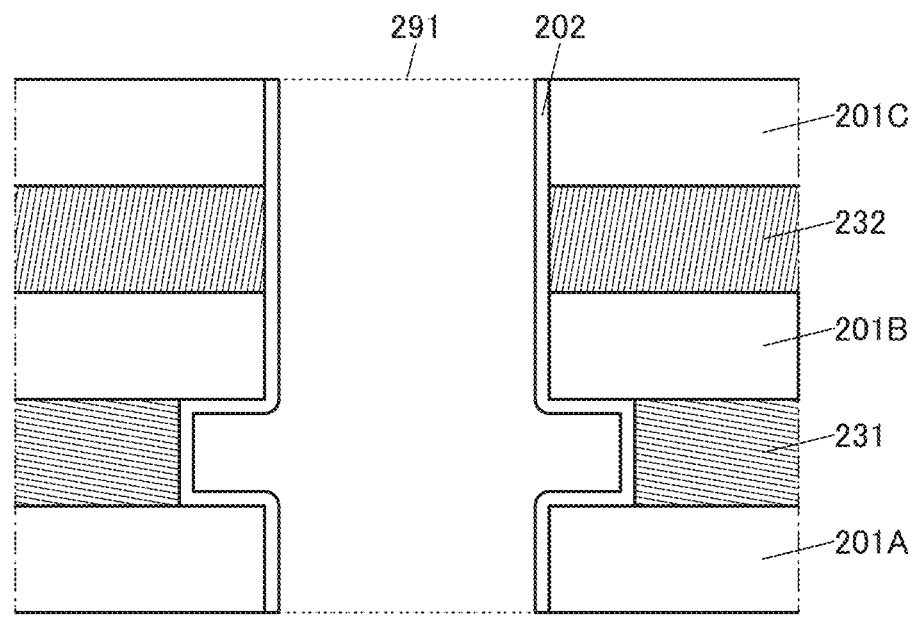

In the subsequent step, as illustrated in FIG. 39B, an insulator 202 is deposited in the recess portion 292 and on the side surface of the opening 291 shown in FIG. 39A.

The insulator 202 functions as a gate insulating film of the transistor WTr and an insulating film that is sandwiched between a pair of electrodes of the capacitor CS.

For the insulator 202, silicon oxide or silicon oxynitride can be used, for example. Alternatively, for the insulator 202, aluminum oxide, hafnium oxide, or an oxide containing aluminum and hafnium can be used, for example. The insulator 202 may be a stack including any of the above.

To form the insulator 202, a deposition method achieving high step coverage is preferably employed. As the deposition method achieving high step coverage, an ALD method is preferably used, and a CVD method (e.g., an LPCVD method or a PCVD method) may alternatively be used, for example. As another deposition method, a sputtering method can sometimes be used, for instance.

Figure 40A:
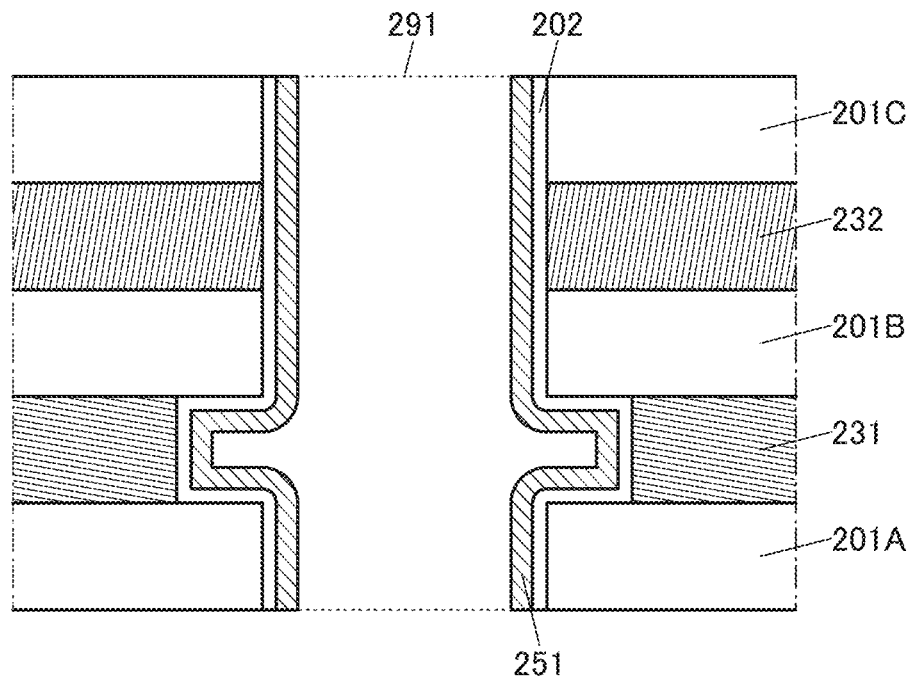
FIGS. 40A and 40B are cross-sectional views illustrating an example of manufacturing a semiconductor device.

In the next step, as illustrated in FIG. 40A, a semiconductor 251 is deposited in the recess portion and on the side surface of the opening 291 shown in FIG. 39B. That is, the semiconductor 251 is formed in contact with the insulator 202.

For the semiconductor 251, a material containing a metal oxide described in Embodiment 4 can be used, for example. Alternatively, for the semiconductor 251, a material containing silicon can be used, for instance.

The description of the method for forming the semiconductor 151 in Manufacturing method example 1 is referred to for a method for forming the semiconductor 251.

Figure 40B:
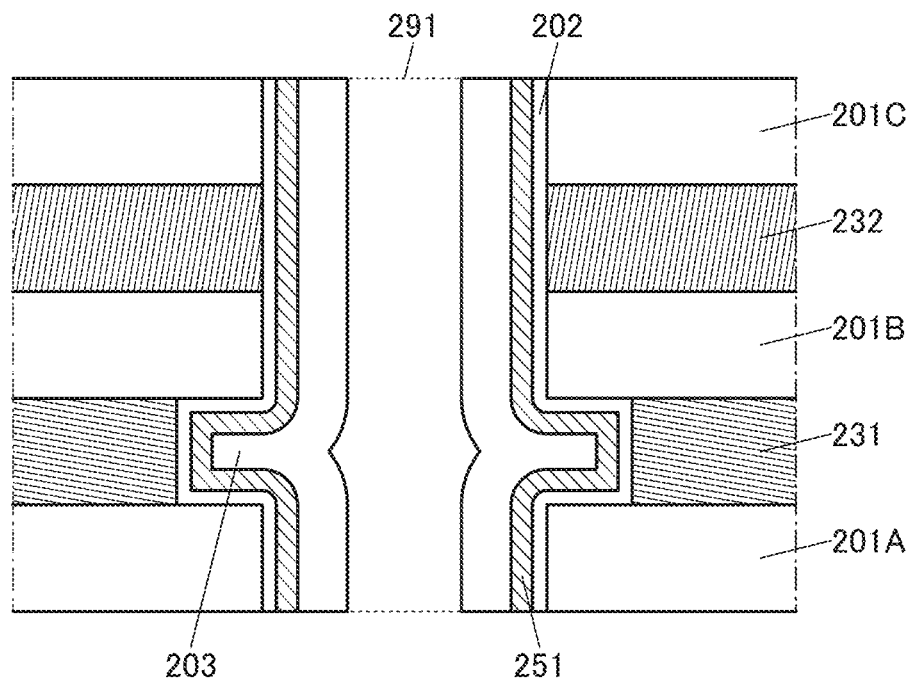

In the subsequent step, as illustrated in FIG. 40B, an insulator 203 is deposited in the recess portion and on the side surface of the opening 291 shown in FIG. 40A. That is, the insulator 203 is formed in contact with the semiconductor 251.

Preferably, a component contained in the insulator 203 is not a component that would form a compound with a component contained in the previously formed semiconductor 251 at or around the interface between the insulator 203 and the semiconductor 251. If the compound is formed, the compound is preferably an insulator or a compound that does not serve as a carrier in the semiconductor 251.

Silicon oxide can be used for the insulator 203, for example.

The description on the method for forming the insulator 202 is referred to for a method for forming the insulator 203.

Figure 41A:
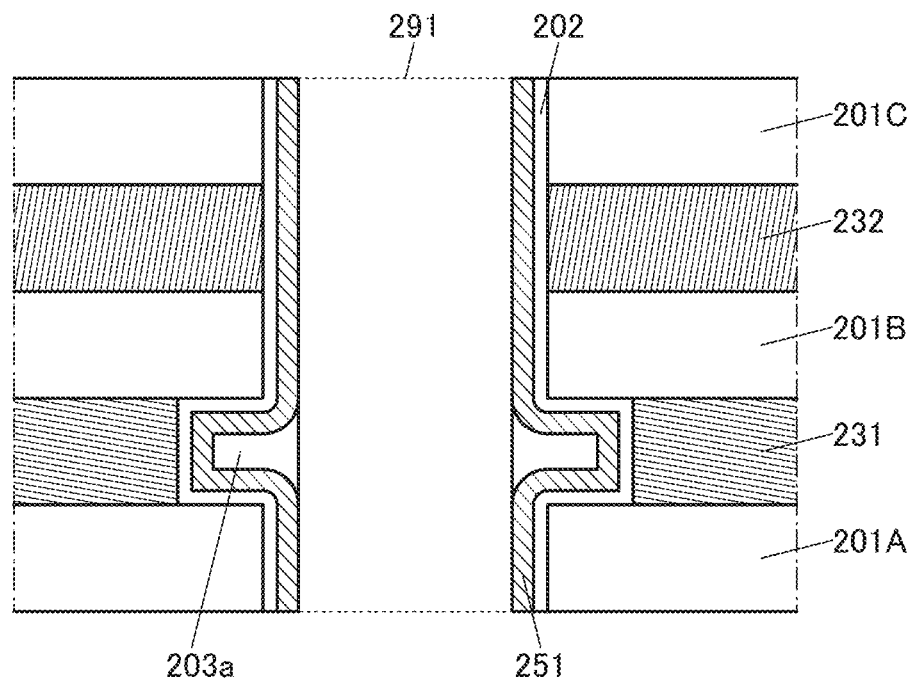
FIGS. 41A and 41B are cross-sectional views illustrating an example of manufacturing a semiconductor device.

In the subsequent step, as illustrated in FIG. 41A, part of the insulator 203 positioned in the opening 291 is removed by resist mask formation and etching treatment or the like so that only the insulator 203 in the recess portion remains. Thus, an insulator 203a is formed. Note that at this time, part of the semiconductor 251 may be removed as long as the insulator 202 is not exposed at the opening 291.

Figure 41B:
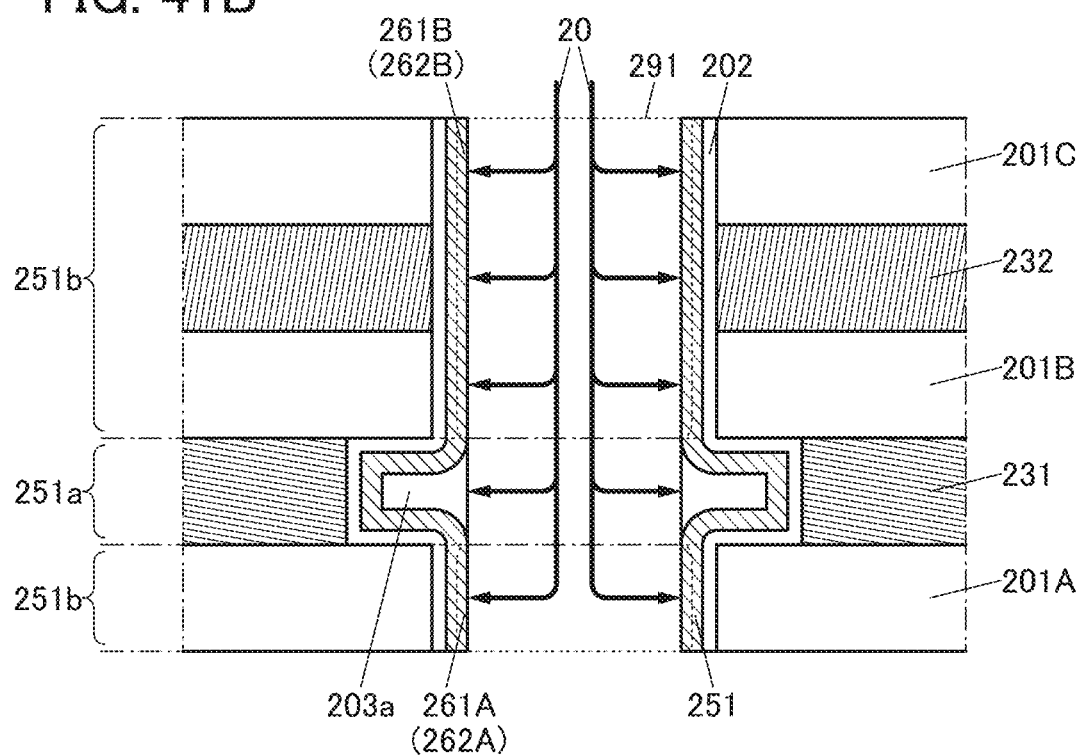

When a material containing a metal oxide is used for the semiconductor 251, treatment for supplying impurities such as hydrogen may be performed on the side surface of the opening 291. In that case, supply treatment 20 illustrated in FIG. 41B is considered as a step (treatment) for supplying impurities such as hydrogen. The supply treatment 20 in FIG. 41B is performed on the insulator 203a and a region 251b of the semiconductor 251. Note that the description for the supply treatment 11 in FIG. 13 is referred to for the treatment for supplying impurities such as hydrogen. In FIG. 41B, a compound 261A (a compound 261B) is shown as a compound that contains the component of the semiconductor 251 and the impurities supplied by the supply treatment 20. By this step, the resistance of the region 251b of the semiconductor 251 can be lowered. Note that the supply treatment 20 described here is not necessarily performed in some cases.

Meanwhile, when a material containing silicon is used for the semiconductor 251, treatment for supplying an impurity may be performed on the side surface of the opening 291. In that case, the supply treatment 20 illustrated in FIG. 41B is considered as a step (treatment) for supplying an impurity. FIG. 41B illustrates a step of performing the impurity supply treatment 20 on the region 251b of the semiconductor 251 and the insulator 203a. Note that heat treatment is preferably performed on the semiconductor device during the supply treatment 20. As the impurity, an n-type impurity (donor) such as phosphorus or arsenic can be used, for example. As another example, as the impurity, a p-type impurity (acceptor) such as boron, aluminum, or gallium can be used. Performing this step enables an impurity region 262A (an impurity region 262B) to be formed on or around a surface of the region 251b of the semiconductor 251, thereby lowering the resistance of the region 251b of the semiconductor 251. Note that the supply treatment 20 described here is not always necessary.

When a material containing one of a metal oxide and silicon is used for the semiconductor 251, impurities are not supplied to a region 251a of the semiconductor 251 because the insulator 203a functions as a mask for blocking impurities in the region 251a where the insulator 203a is formed in contact with the semiconductor 251.

Figure 42A:
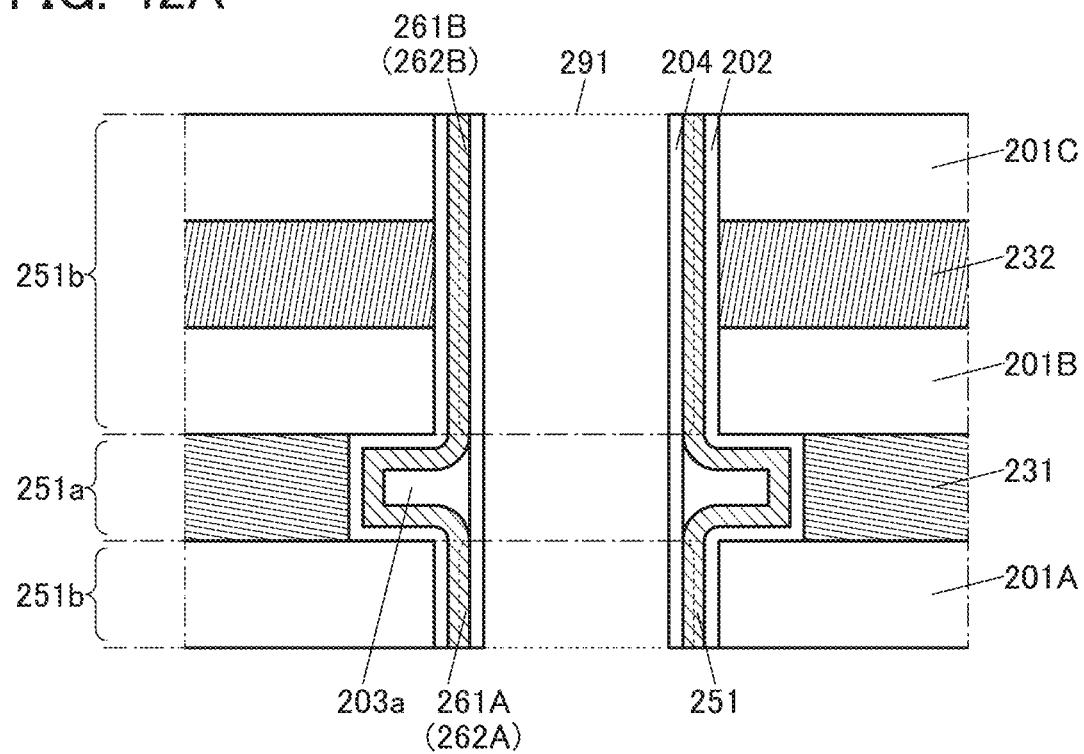
FIGS. 42A and 42B are cross-sectional views illustrating an example of manufacturing a semiconductor device.

In the subsequent step, as illustrated in FIG. 42A, an insulator 204 is deposited on the side surface of the opening 291 shown in FIG. 41B.

For the insulator 204, an insulating material having a function of inhibiting the passage of impurities such as water and hydrogen and the like is preferably used, and aluminum oxide can be used, for example. Note that a material usable for the insulator 204 is not limited to the above. For example, for the insulator 204, any of the materials usable for the insulators 101A to 101C shown in Manufacturing method example 1 can be used to form a film with a low concentration of impurities such as water and hydrogen.

The description on the method for forming the insulator 202 is referred to for a method for forming the insulator 204.

Figure 42B:
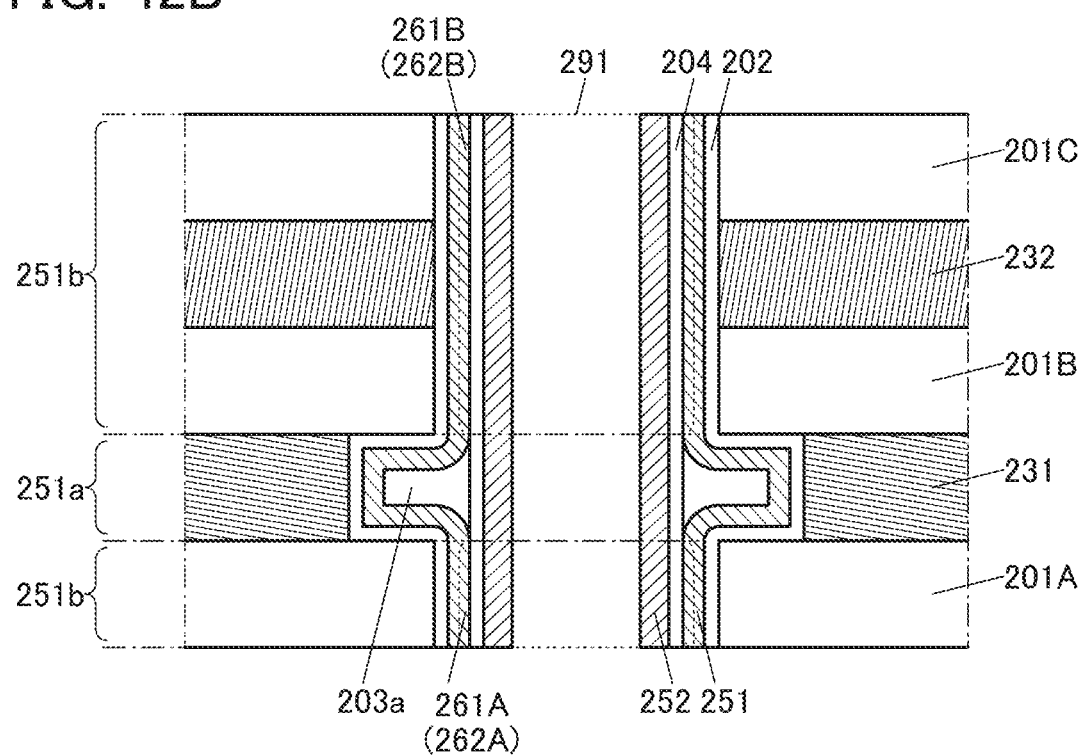

In the next step, as illustrated in FIG. 42B, a semiconductor 252 is deposited on the side surface of the opening 291 shown in FIG. 42A. That is, the semiconductor 252 is formed in contact with the insulator 204.

For the semiconductor 252, a material containing silicon can be used, for example. Alternatively, for the semiconductor 252, a semiconductor material such as a metal oxide described in Embodiment 4 can be used.

The description on the method for forming the semiconductor 251 is referred to for a method for forming the semiconductor 252.

Figure 43:
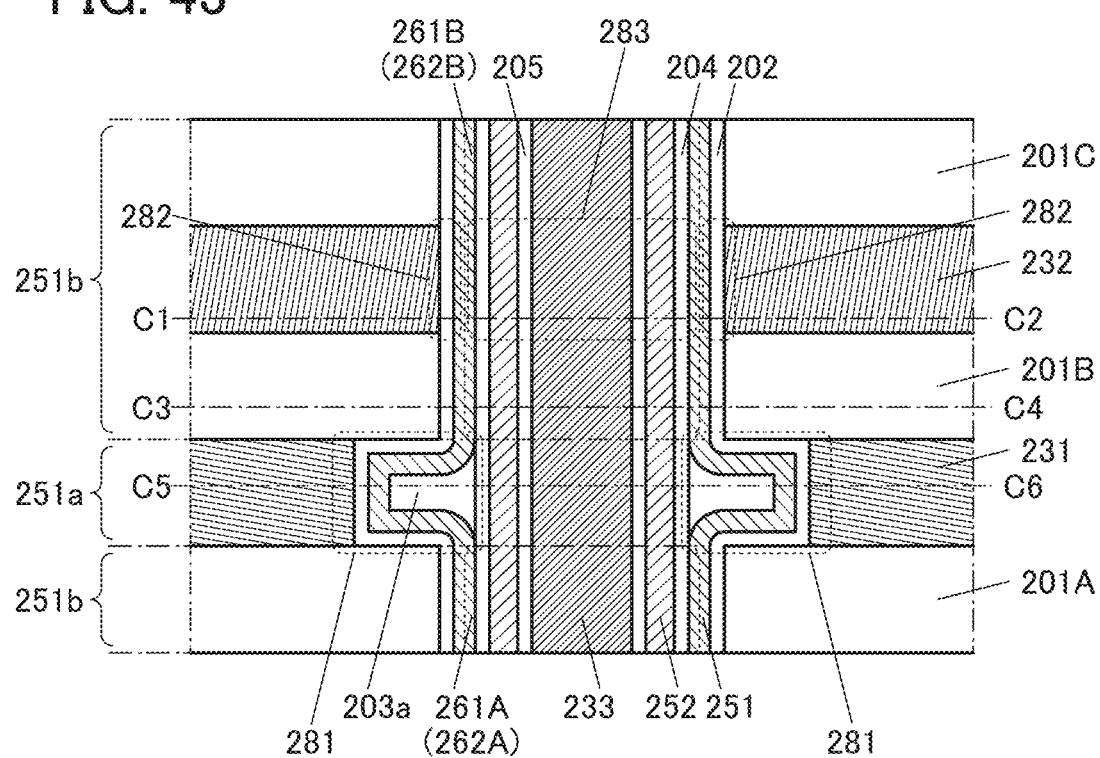
FIG. 43 is a cross-sectional view illustrating an example of manufacturing a semiconductor device.

In the next step, as illustrated in FIG. 43, an insulator 205 is deposited in contact with the semiconductor 252, and a conductor 233 is deposited to fill the remaining opening 291.

For the insulator 205, any of the materials usable for the insulator 202 can be used, for example. The insulator 205 may have a layered structure including a plurality of insulators.

The description on the method for forming the insulator 202 is referred to for a method for forming the insulator 205.

For the conductor 233, any of the materials usable for the conductors 231 and 232 can be used, for example. The conductor 233 may have a layered structure including a plurality of conductors.

To form the conductor 233, a deposition method achieving high step coverage is preferably employed. As the deposition method achieving high step coverage, an ALD method is preferably used, and a CVD method may alternatively be used, for example. As another deposition method, a sputtering method, a sol-gel method, an electrophoretic method, or a spray method can sometimes be used, for instance.

In a region 281 illustrated in FIG. 43, the transistor WTr in FIG. 32A is formed. Specifically, in the region 281, the conductor 231 functions as the gate electrode of the transistor WTr, the semiconductors 251 in the two regions 251b function as the source electrode and the drain electrode of the transistor WTr, and the semiconductor 251 in the region 251a functions as the channel formation region of the transistor WTr. When a material containing a metal oxide is used for the semiconductor 251, the transistor WTr is an OS transistor.

In a region 282 illustrated in FIG. 43, the capacitor CS in FIG. 32A is formed. Specifically, in the region 282, the conductor 232 functions as one electrode of the capacitor CS, and the semiconductor 251 included in part of the region 251b functions as the other electrode of the capacitor CS.

In a region 283 illustrated in FIG. 43, the transistor RTr in FIG. 32A is formed. Specifically, in the region 283, part of the semiconductor 251 in the region 251b functions as the gate electrode of the transistor RTr, the semiconductor 252 functions as the channel formation region of the transistor RTr, and the conductor 233 functions as the backgate electrode of the transistor RTr. When a material containing a metal oxide is used for the semiconductor 252, the transistor RTr is an OS transistor.

Through the steps from FIG. 38A to FIG. 43, the semiconductor device illustrated in FIG. 32A can be manufactured.

Figure 44A:
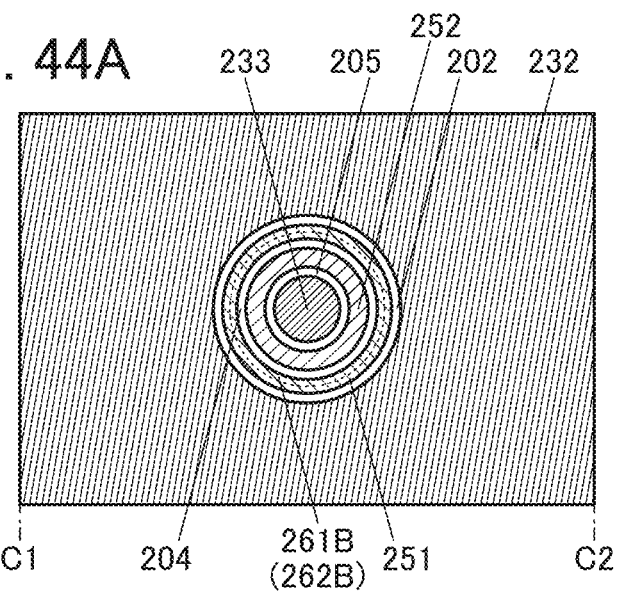
FIGS. 44A to 44C are top views illustrating an example of manufacturing a semiconductor device.
Figure 44B:
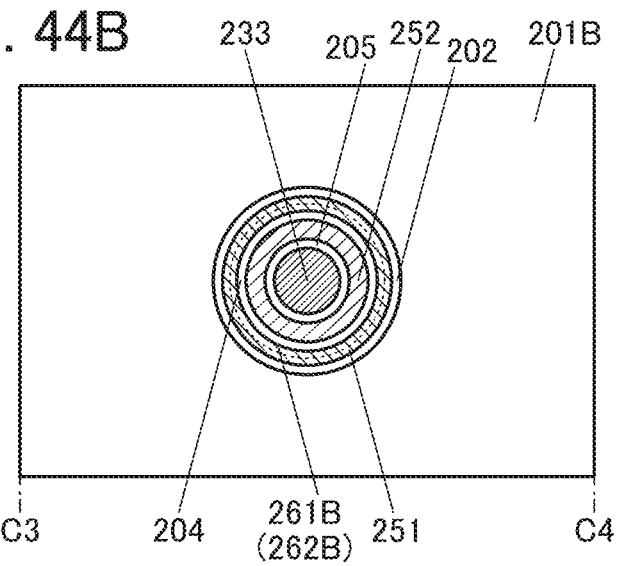
Figure 44C:
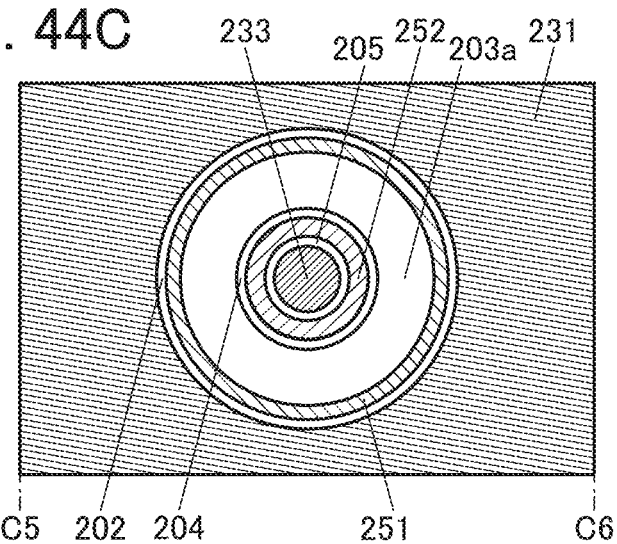

FIGS. 44A, 44B, and 44C are top views of the semiconductor device along the along the dashed-dotted lines C1-C2, C3-C4, and C5-C6 in FIG. 43.

One embodiment of the present invention is not limited to the structure example of the semiconductor device illustrated in FIG. 43. In one embodiment of the present invention, the structure of the semiconductor device in FIG. 43 can be changed as appropriate.

For example, as described above, one embodiment of the present invention can be a semiconductor device in which the transistor WTr and the transistor RTr are not provided with a backgate as illustrated in FIG. 32C. To manufacture the semiconductor device shown in FIG. 32C, after the step in FIG. 42B in the process of manufacturing the semiconductor device in FIG. 32A, the insulator 205 is deposited to fill the opening 291 (see FIG. 45A).

Alternatively, the insulator 205 may have a layered structure. A plurality of insulator materials can be used in combination, for example, as illustrated in FIG. 45B in which silicon oxide is used for an insulator 205A in contact with the semiconductor 252 and aluminum oxide, hafnium oxide, or the like is used for an insulator 205B in contact with the insulator 205A.

The description on the method for forming the insulator 202 is referred to for a method for forming each of the insulators 205A and 205B.

Figure 45A:
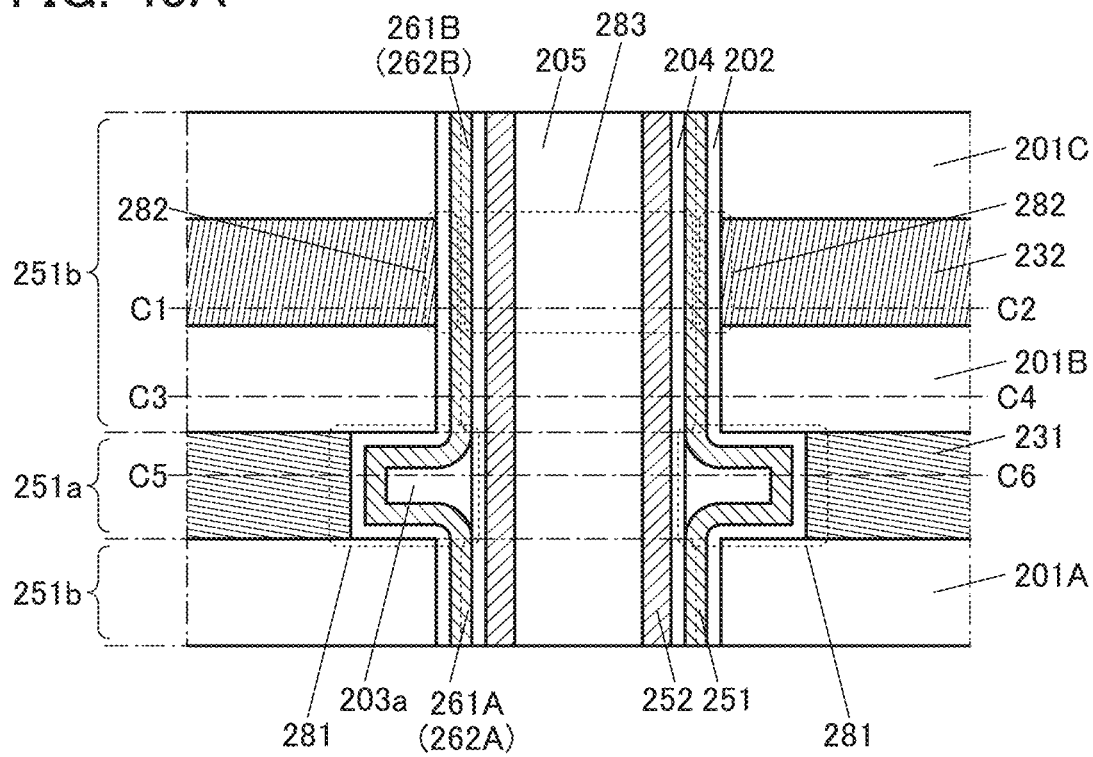
FIGS. 45A and 45B are cross-sectional views illustrating an example of manufacturing a semiconductor device.
Figure 45B:
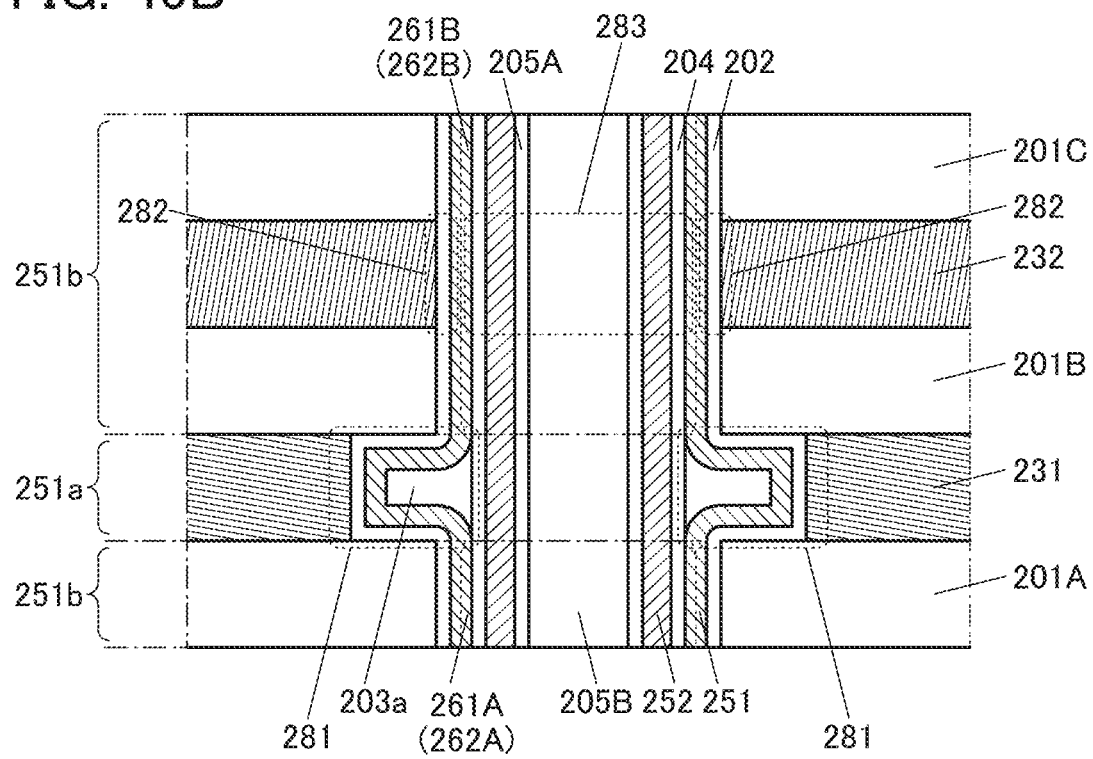

FIGS. 46A, 46B, and 46C are top views of the semiconductor device along the along the dashed-dotted lines C1-C2, C3-C4, and C5-C6 in FIG. 45A. Unlike the semiconductor device in FIG. 43, the semiconductor device in FIG. 45A has a structure without the conductor 233; hence, the top views in FIGS. 46A to 46C are different from those in FIGS. 44A to 44C in that the conductor 233 is not provided inside the insulator 205.

Figure 47A:
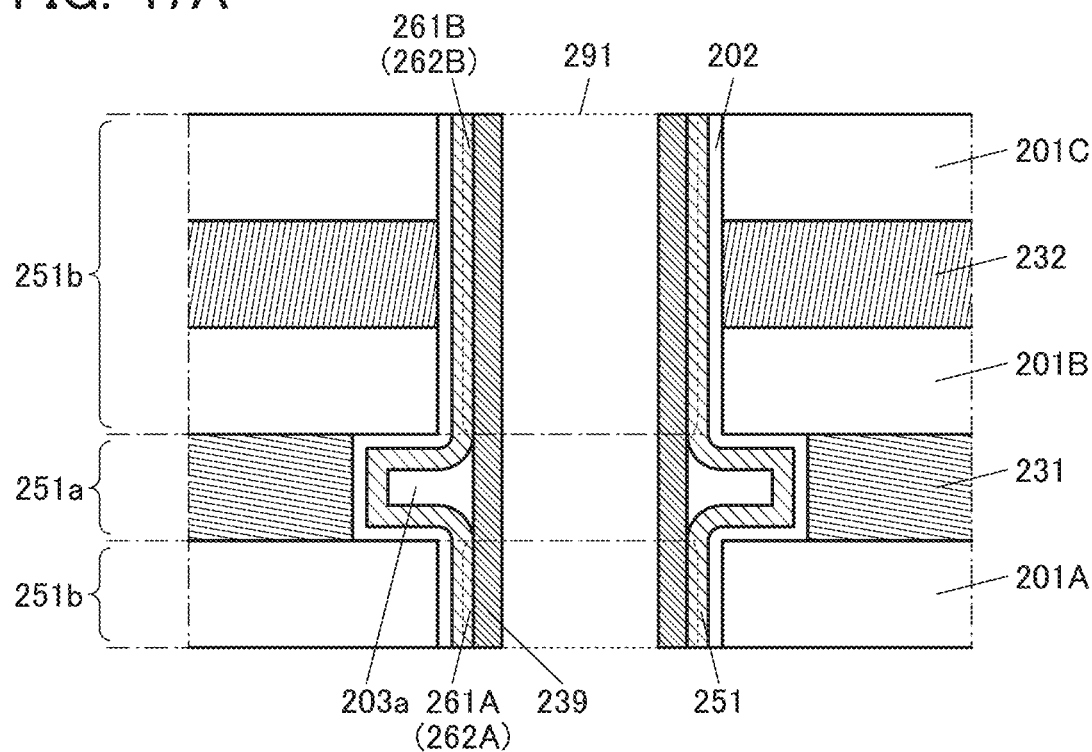
FIGS. 47A and 47B are cross-sectional views illustrating an example of manufacturing a semiconductor device.
Figure 47B:
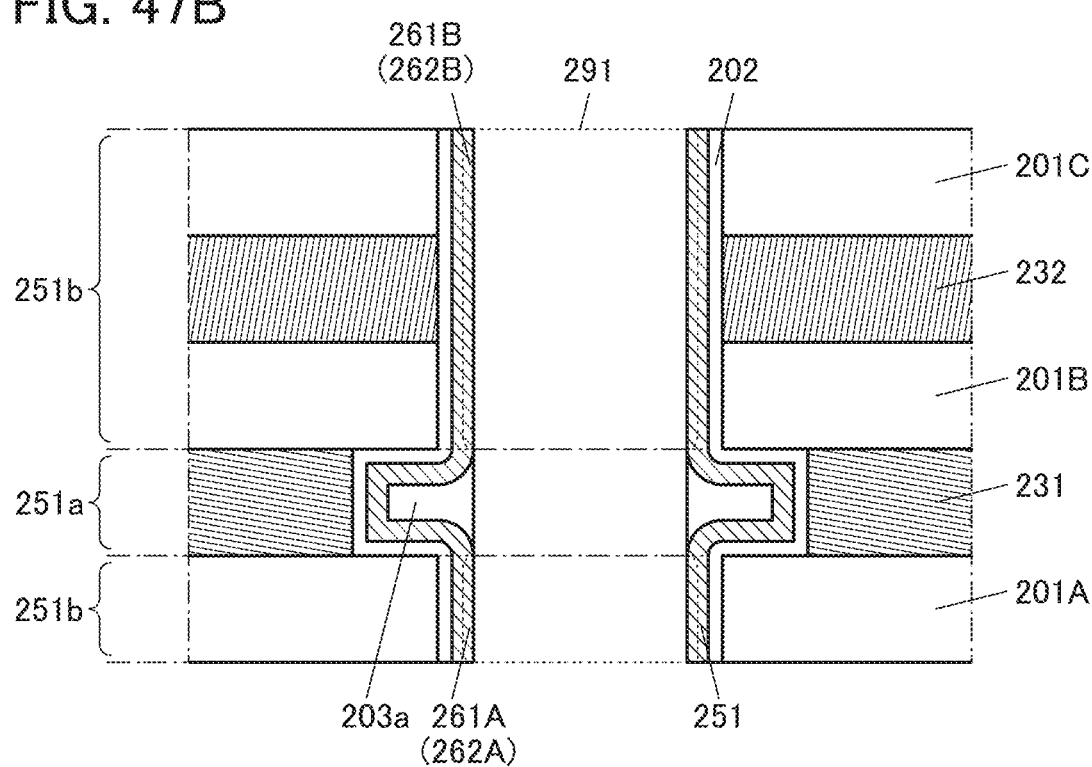

For example, part of the process for manufacturing the semiconductor device of one embodiment of the present invention may be changed. FIGS. 47A and 47B illustrate steps for forming a low-resistance region in the region 251b of the semiconductor 251 in a manner different from that in FIG. 41B.

FIG. 47A shows a step for forming a conductor 239 on the side surface of the opening 291 after the step in FIG. 41A. Specifically, the conductor 239 is formed in contact with the insulator 203a and the region 251b of the semiconductor 251. At this time, with the conductor 239 in contact with the semiconductor 251, the compound 261A (the compound 261B) or the impurity region 262A (the impurity region 262B) is formed in the region 251b of the semiconductor 251, as in the steps shown in FIGS. 19A and 19B. That is, the resistance of the region 251b of the semiconductor 251 is lowered. Note that the description for FIGS. 19A and 19B is referred to for the resistance reduction.

A material for the conductor 239 can be selected from the materials usable for the conductor 139 described using FIGS. 19A and 19B, on the basis of the material contained in the semiconductor 251.

By the above manufacturing method, the region 251b of the semiconductor 251 can be formed as a low-resistance region and the region 251a of the semiconductor 251 can be formed as a channel formation region. Note that the region 251b serving as the low-resistance region corresponds to the first terminal and/or the second terminal the transistor WTr (the gate of the transistor RTr); hence, the electric resistance between the transistors WTr, which are electrically connected in series, can be lowered by the above manufacturing method.

To form the conductor 239, a deposition method achieving high step coverage is preferably employed. As the deposition method achieving high step coverage, an ALD method is preferably used, and a CVD method may alternatively be used, for example. As another deposition method, a sputtering method, a sol-gel method, an electrophoretic method, or a spray method can sometimes be used, for instance.

In the next step, as illustrated in FIG. 47B, the conductor 239 on the side surface of the opening 291 is removed using etching treatment or the like. At this time, the interface between the conductor 239 and the insulator 203a, which overlaps the region 251a, and a region around the interface may be partly removed as well.

Subsequently, the steps from FIG. 42A to FIG. 43 are performed, whereby the semiconductor device in which the low-resistance region is formed in the region 251b of the semiconductor 251 can be manufactured through the manufacturing steps different from that shown in FIG. 41B.

Figure 48A:
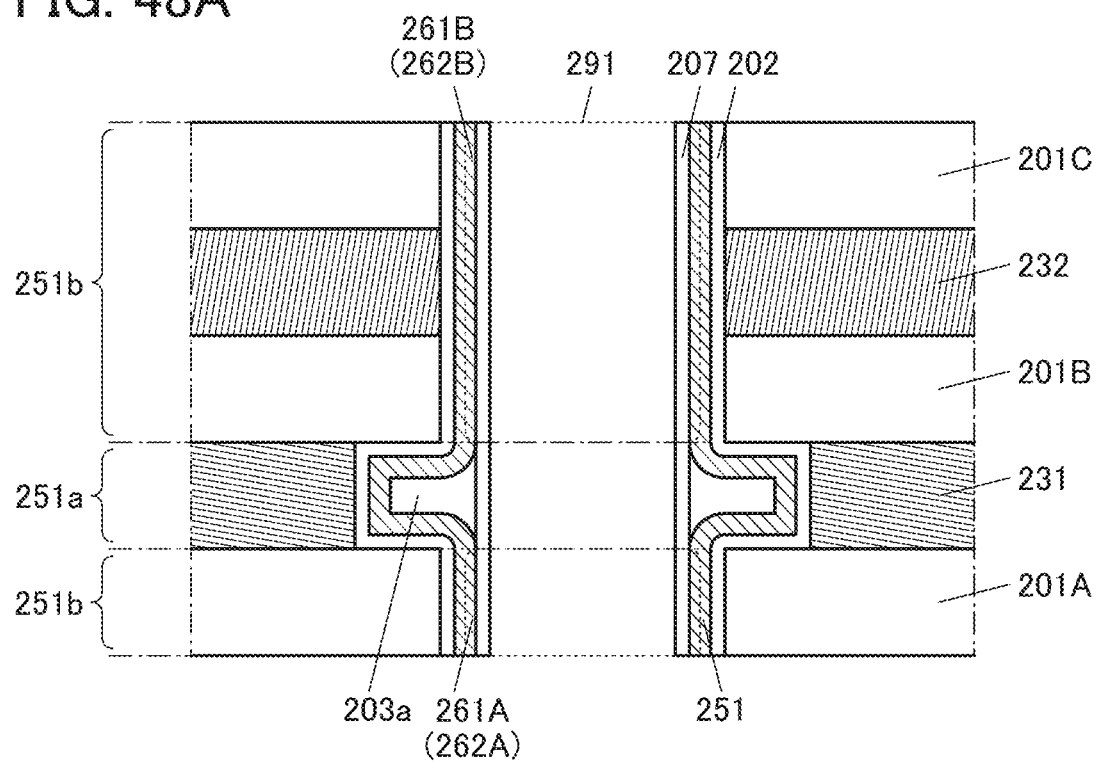
FIGS. 48A and 48B are cross-sectional views illustrating an example of manufacturing a semiconductor device.

Another method for forming the low-resistance region that is different from that shown in FIGS. 47A and 47B will be described. FIG. 48A illustrates a step for forming an insulator 207 on the side surface of the opening 291 after the step in FIG. 41A.

When the semiconductor 251 is a material containing a metal oxide, the insulator 207 preferably contains silicon nitride, for example. When the semiconductor 251 is in contact with the insulator 207, nitrogen, nitride, and other components included in the insulator 207 may diffuse into the semiconductor 251. At this time, heat treatment may or may not be performed on the stack 200. When nitrogen, nitride, and other components in the insulator 207 diffuse into the semiconductor 251, in FIG. 48A, the compound 261A (the compound 261B) may be formed in the semiconductor 251 at and around the interface with the insulator 207 by nitrogen, nitride, and other components diffused from the insulator 207. In that case, the resistance of the region 251b of the semiconductor 251 is lowered. In other words, the resistance of the source electrode or the drain electrode of the transistor WTr can sometimes be lowered.

When the semiconductor 251 is a material containing silicon, the insulator 207 preferably contains an impurity (an element or an ion) to be diffused into the semiconductor 251, for example. When an n-type impurity (donor) is used as the impurity, phosphorus or arsenic can be used, for example. When a p-type impurity (acceptor) is used as the impurity, boron, aluminum, or gallium can be used, for example.

When the semiconductor 251 is in contact with the insulator 207, an impurity (an element or an ion) contained in the insulator 207 may diffuse into the semiconductor 251. At this time, heat treatment may or may not be performed on the stack 200. That is, the impurity region may be formed in the semiconductor 251 at or around the interface with the insulator 207. Consequently, carriers are generated in the region 251b of the semiconductor 251 or in the semiconductor 251 around the interface with the insulator 207, resulting in lower resistance of the region 251b in some cases.

The description on the method for forming the insulator 202 is referred to for a method for forming the insulator 207.

Figure 48B:
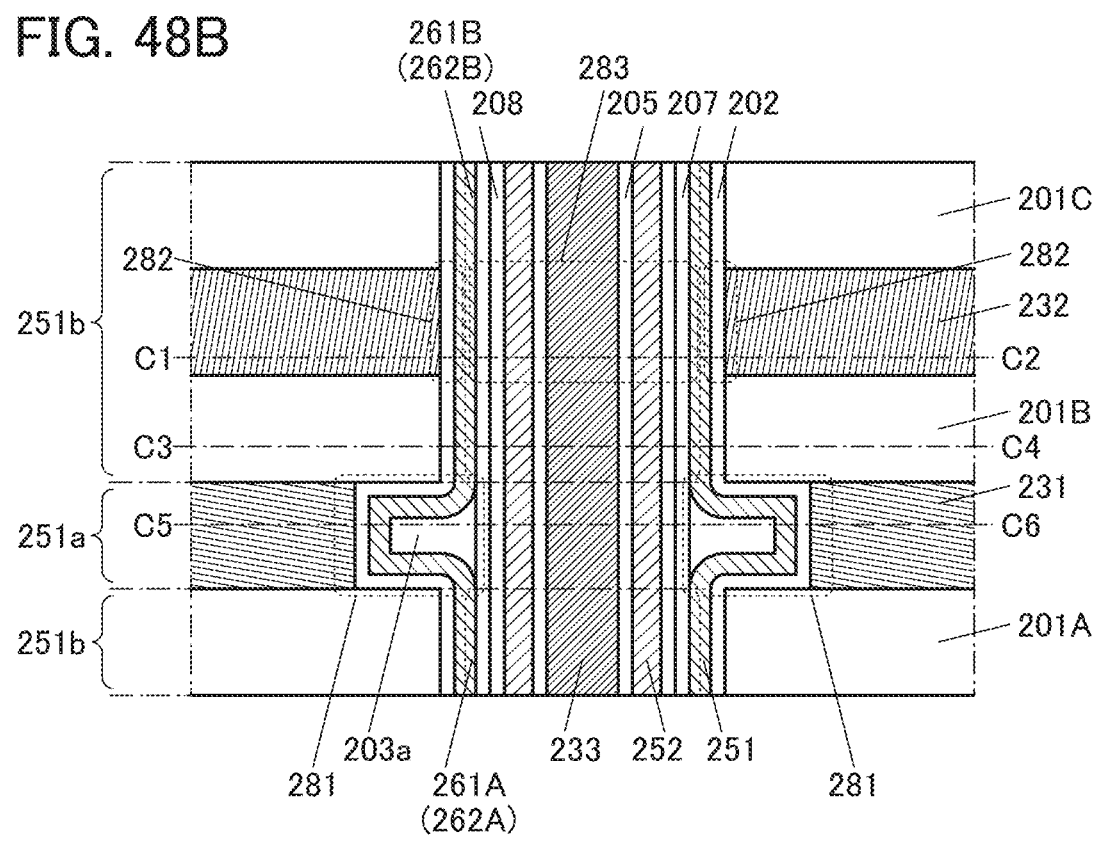

In the next step, an insulator 208 is deposited on the side surface of the opening 291, and then the same steps as in FIG. 42B and FIG. 43 are performed, whereby a semiconductor device illustrated in FIG. 48B can be fabricated.

When the semiconductor 252 contains a metal oxide, the insulator 208 can be, for example, an insulating material for preventing nitrogen, nitride, and other components of the insulator 207 from diffusing into the semiconductor 252. In this case, silicon oxide or aluminum oxide can be used for the insulator 208, for instance. Note that when the semiconductor 252 contains silicon, the insulator 208 may or may not be formed.

The description on the method for forming the insulator 202 is referred to for a method for forming the insulator 208.

Figure 49A:
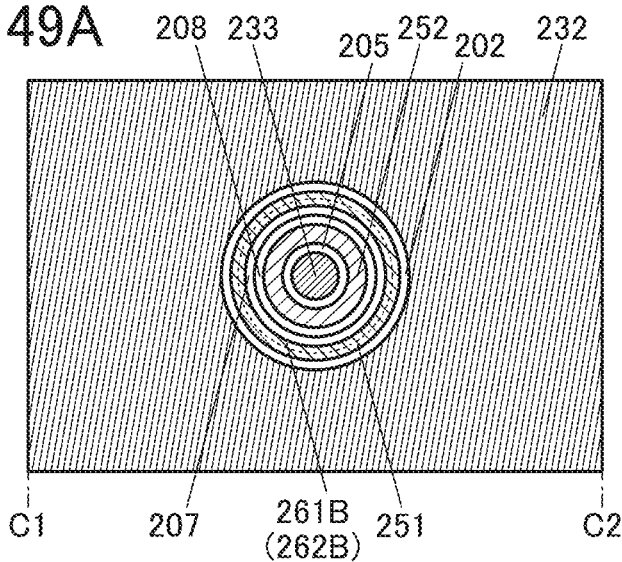
FIGS. 49A to 49C are top views illustrating an example of manufacturing a semiconductor device.
Figure 49B:
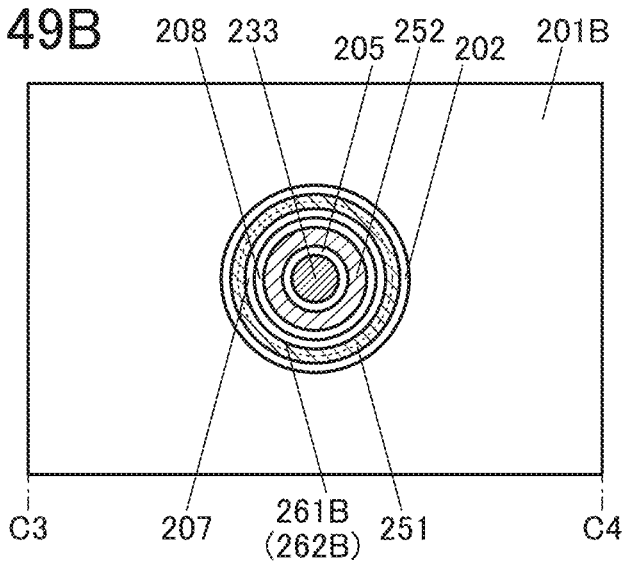
Figure 49C:
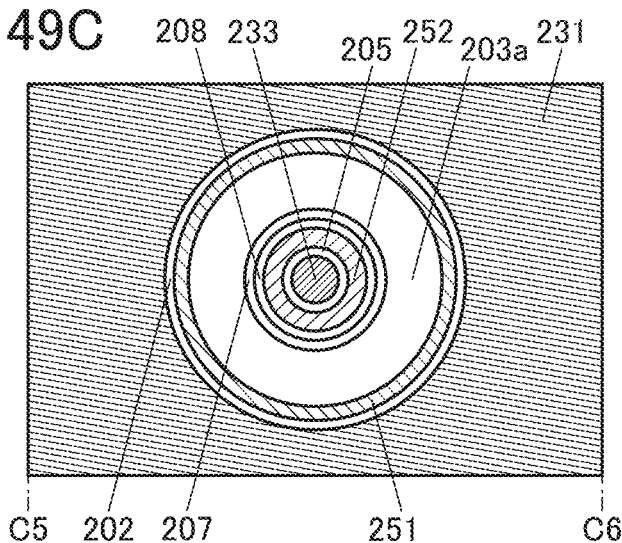

FIGS. 49A, 49B, and 49C are top views of the semiconductor device along the along the dashed-dotted lines C1-C2, C3-C4, and C5-C6 in FIG. 48B. The semiconductor device in FIG. 48B includes the insulator 207 and the insulator 208 between the semiconductor 251 and the semiconductor 252; accordingly, in the top views of FIGS. 49A to 49C, the insulator 204 in FIGS. 44A to 44C is replaced with the stack of the insulator 207 and the insulator 208.

Figure 50:
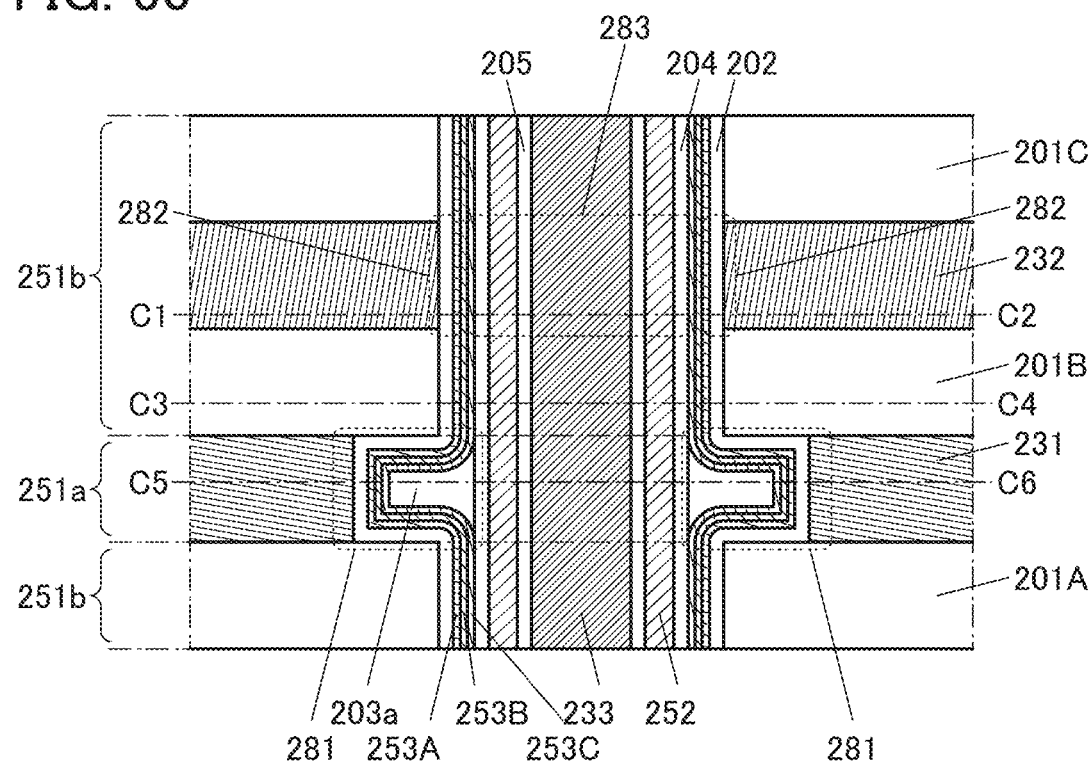
FIG. 50 is a cross-sectional view illustrating an example of manufacturing a semiconductor device.

As another example, when the semiconductor 251 is a material containing a metal oxide in one embodiment of the present invention, the semiconductor 251 can have a three-layer structure as in a semiconductor device illustrated in FIG. 50. In the semiconductor device in FIG. 50, the three-layer structure of the semiconductor 251 can be constituted such that a semiconductor 253A, a semiconductor 253B, and a semiconductor 253C are sequentially formed as the semiconductor 251 by the step shown in FIG. 40A in the process of manufacturing the semiconductor device in FIG. 32A.

Figure 51A:
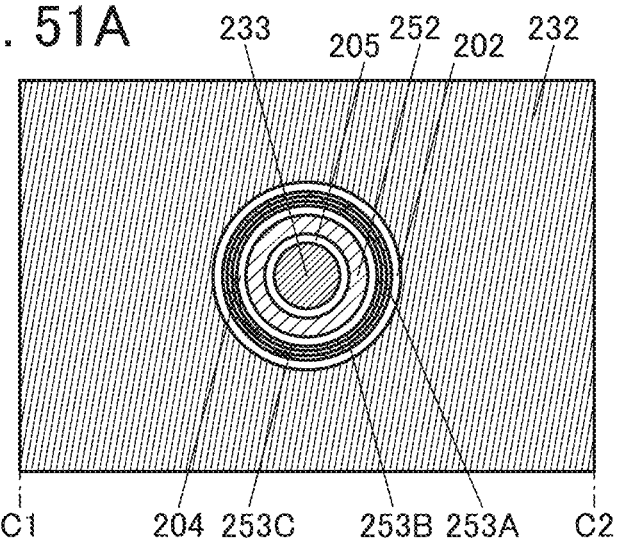
FIGS. 51A to 51C are top views illustrating an example of manufacturing a semiconductor device.
Figure 51B:
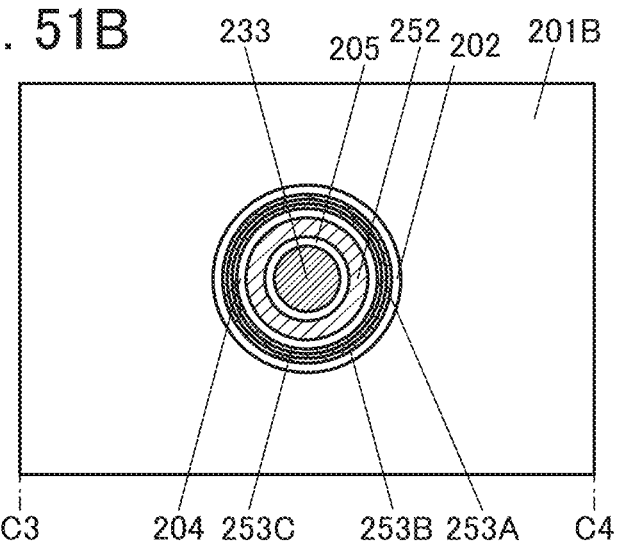
Figure 51C:
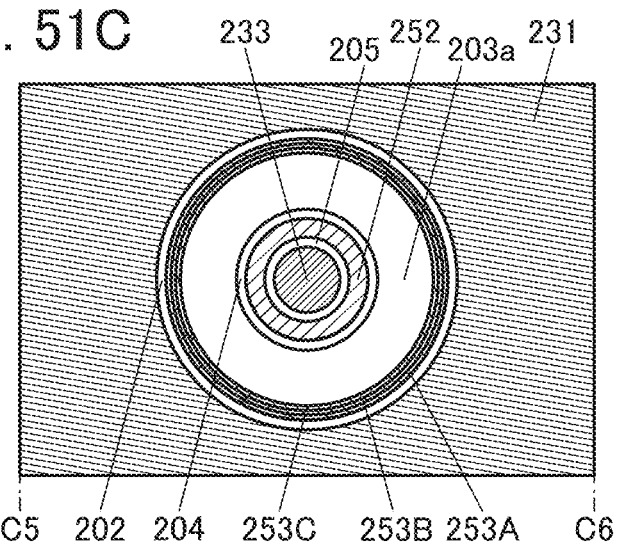

FIGS. 51A, 51B, and 51C are top views of the semiconductor device along the along the dashed-dotted lines C1-C2, C3-C4, and C5-C6 in FIG. 50. As an example, the semiconductor device in FIG. 50 employs a three-layer structure where the semiconductors 253A, 253B, and 253C are sequentially deposited in this order on the insulator 202; hence, in the top views of FIGS. 51A to 51C, the semiconductor 251 in FIGS. 44A to 44C has a three-layer structure.

Note that the description of the semiconductors 152A, 152B, and 152C in Manufacturing method example 1 is referred to for the semiconductors 253A, 253B, and 253C. Moreover, the description for FIG. 22 in Manufacturing method example 1 is referred to for the effects of the structure in FIG. 50.

As another example, in one embodiment of the present invention, the structure of the gate electrode of the transistor WTr may be changed from that in FIG. 43 in order to improve the reliability of the transistor WTr. FIGS. 52A and 52B and FIGS. 53A and 53B illustrate an example of a method for manufacturing such a semiconductor device.

Figure 52A:
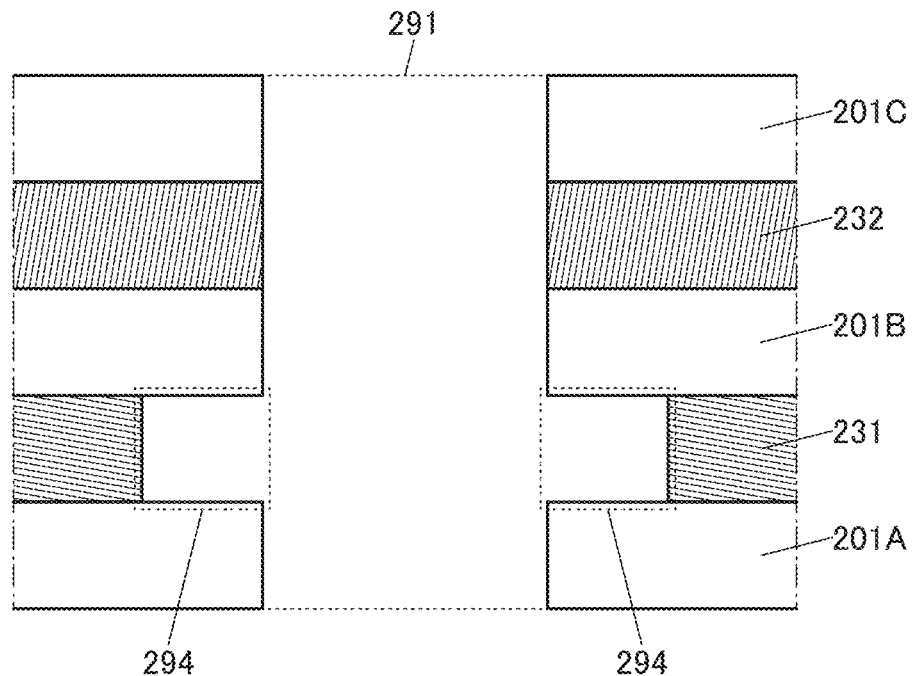
FIGS. 52A and 52B are cross-sectional views illustrating an example of manufacturing a semiconductor device.

In a step illustrated in FIG. 52A, the conductor 231 positioned on the side surface of the opening 291 is partly removed by etching treatment or the like in FIG. 39B, and a recess portion 294 is formed on the side surface. Note that the recess portion 294 may be formed deeper than the recess portion 292 shown in FIG. 39A.

Figure 52B:
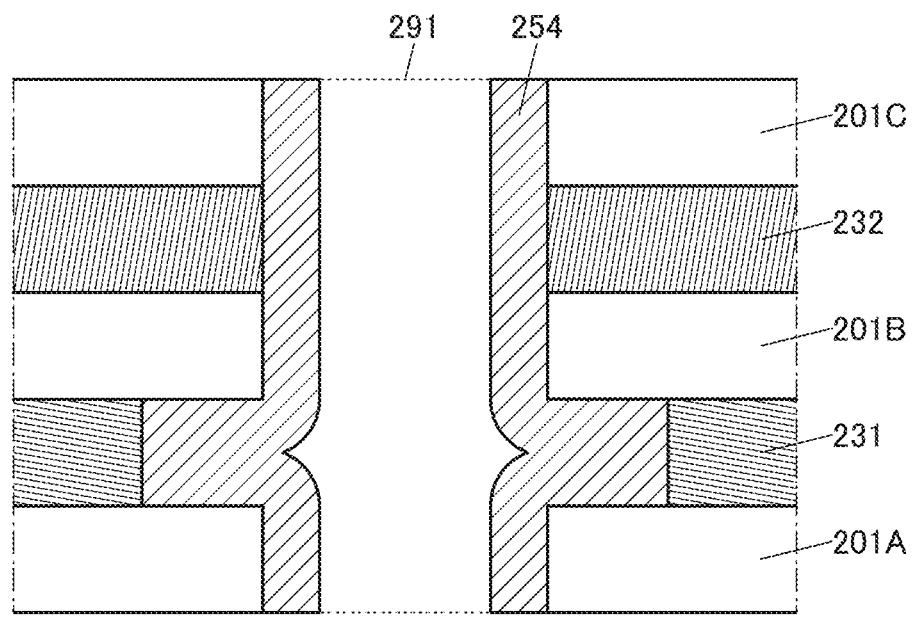

In the subsequent step in FIG. 52B, a semiconductor 254 is deposited on the side surface of the opening 291 and in the recess portion 294 in FIG. 52A.

For the semiconductor 254, any of the materials usable for the semiconductor 153 in Manufacturing method example 1 can be used, for example.

The description on the method for forming the semiconductor 251 is referred to for a method for forming the semiconductor 254.

Figure 53A:
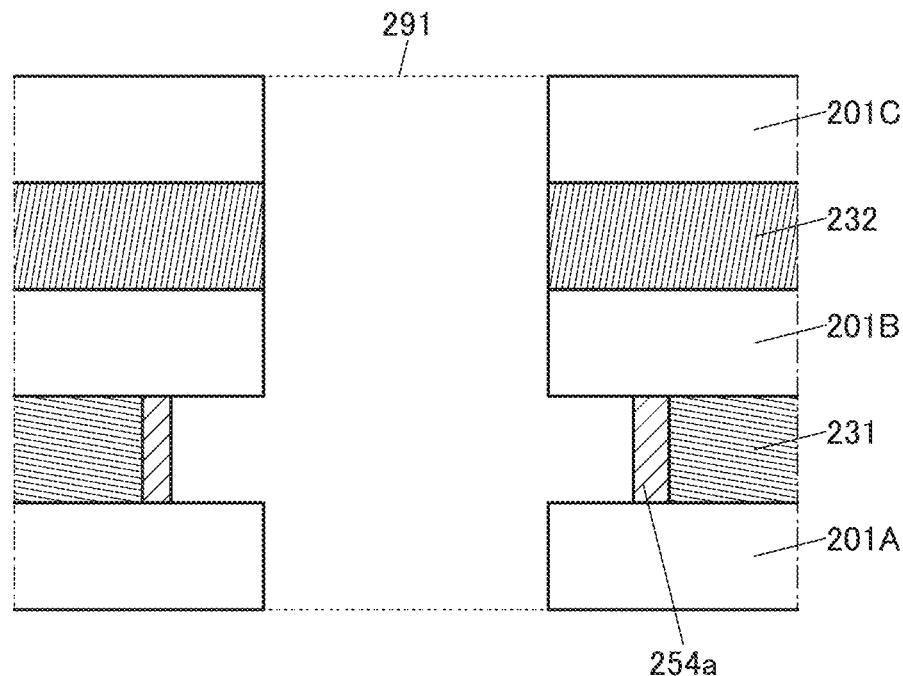
FIGS. 53A and 53B are cross-sectional views illustrating an example of manufacturing a semiconductor device.

In the next step, as illustrated in FIG. 53A, part of the remaining semiconductor 254 in the recess portion 294 and the semiconductor 254 positioned on the side surface of the opening 291 are removed by resist mask formation and etching treatment or the like so that the semiconductor 254 remains in part of the recess portion 294. Thus, a semiconductor 254a is formed.

Subsequently, steps similar to those in FIGS. 39B to 43 are performed, thereby constituting a semiconductor device illustrated in FIG. 53B. Note that the description for FIGS. 27A to 28B in Manufacturing method example 1 is referred to for the effects of the structure in FIG. 53B.

Figure 53B:
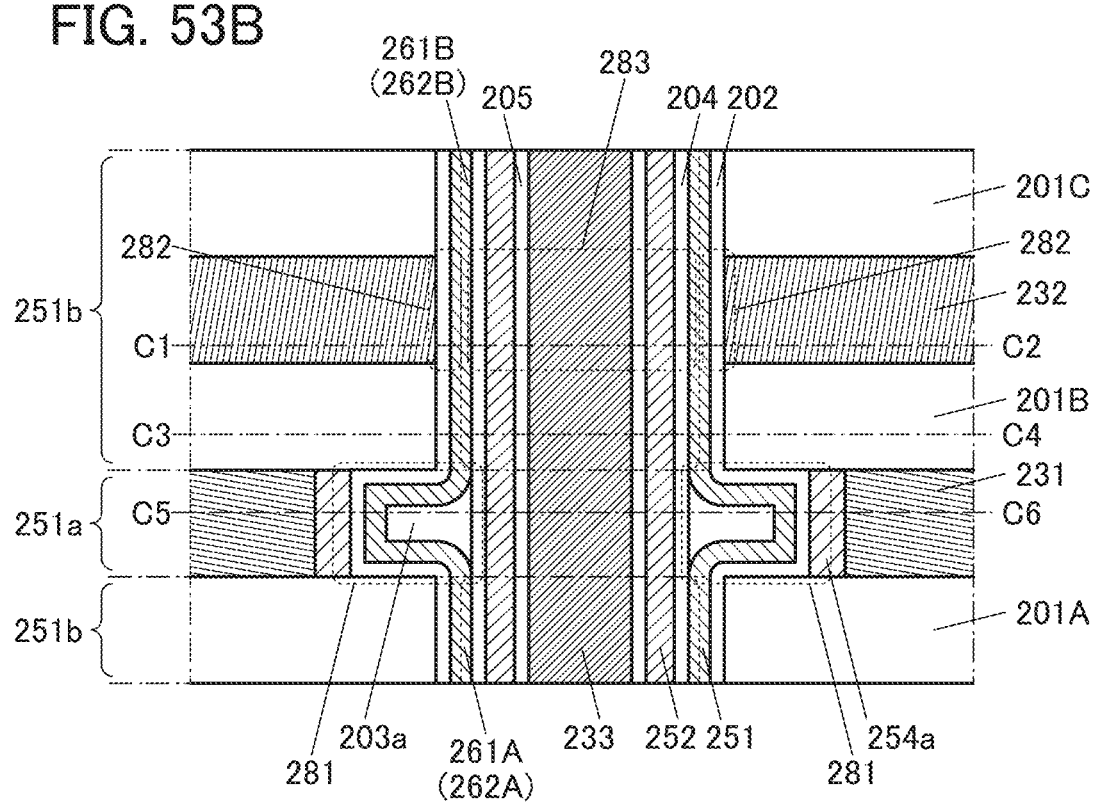
Figure 54A:
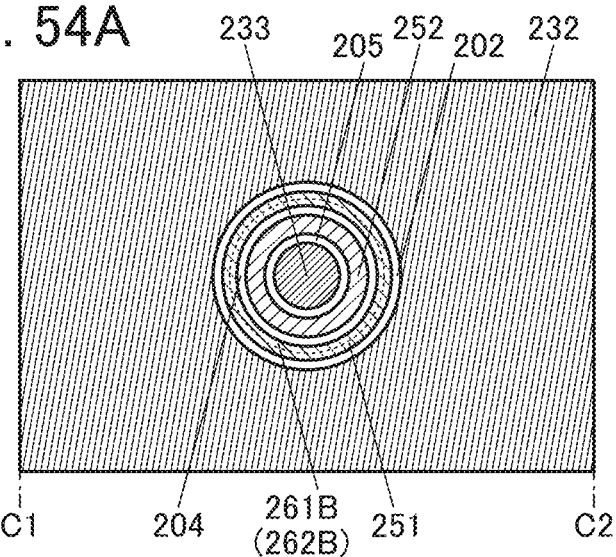
FIGS. 54A to 54C are top views illustrating an example of manufacturing a semiconductor device.
Figure 54B:
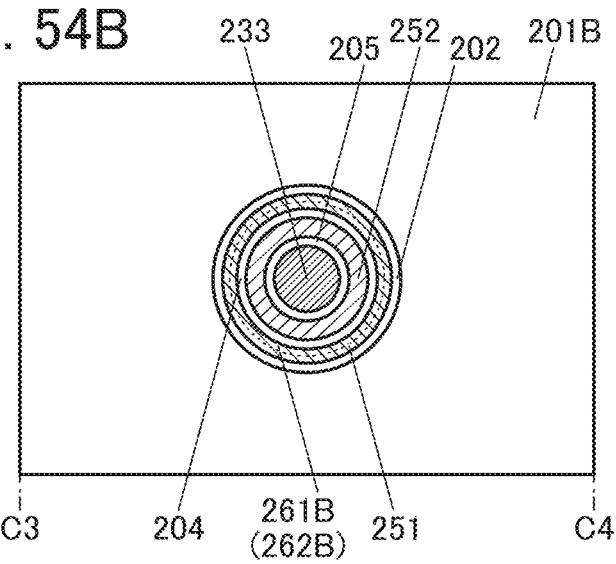
Figure 54C:
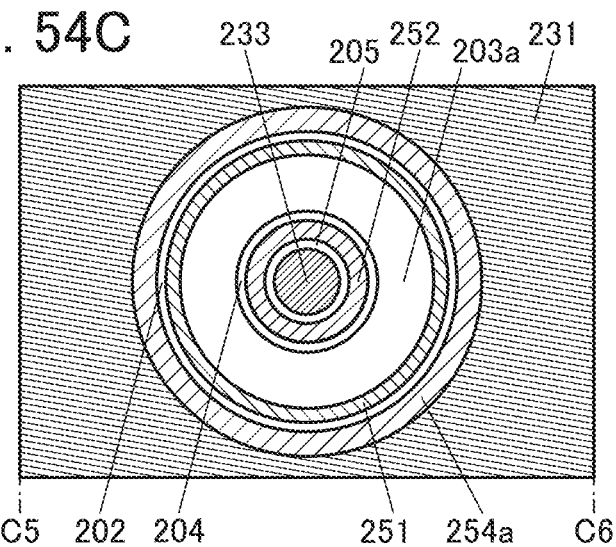

FIGS. 54A, 54B, and 54C are top views of the semiconductor device along the along the dashed-dotted lines C1-C2, C3-C4, and C5-C6 in FIG. 53B. In the semiconductor device in FIG. 53B, the semiconductor 254a is included between the conductor 231 and the insulator 202 in the region 251a, which is different from the semiconductor device in FIG. 43. Accordingly, the top view in FIG. 54C shows a structure where the semiconductor 254a is included between the conductor 231 and the insulator 202. Note that the top views in FIGS. 54A and 54B along the dashed-dotted lines C1-C2 and C3-C4 are approximately the same as those in FIGS. 44A and 44B in some cases.

According to Manufacturing method example 1 or 2 described above, a semiconductor device capable of retaining a large amount of data can be manufactured.

Figure 55:
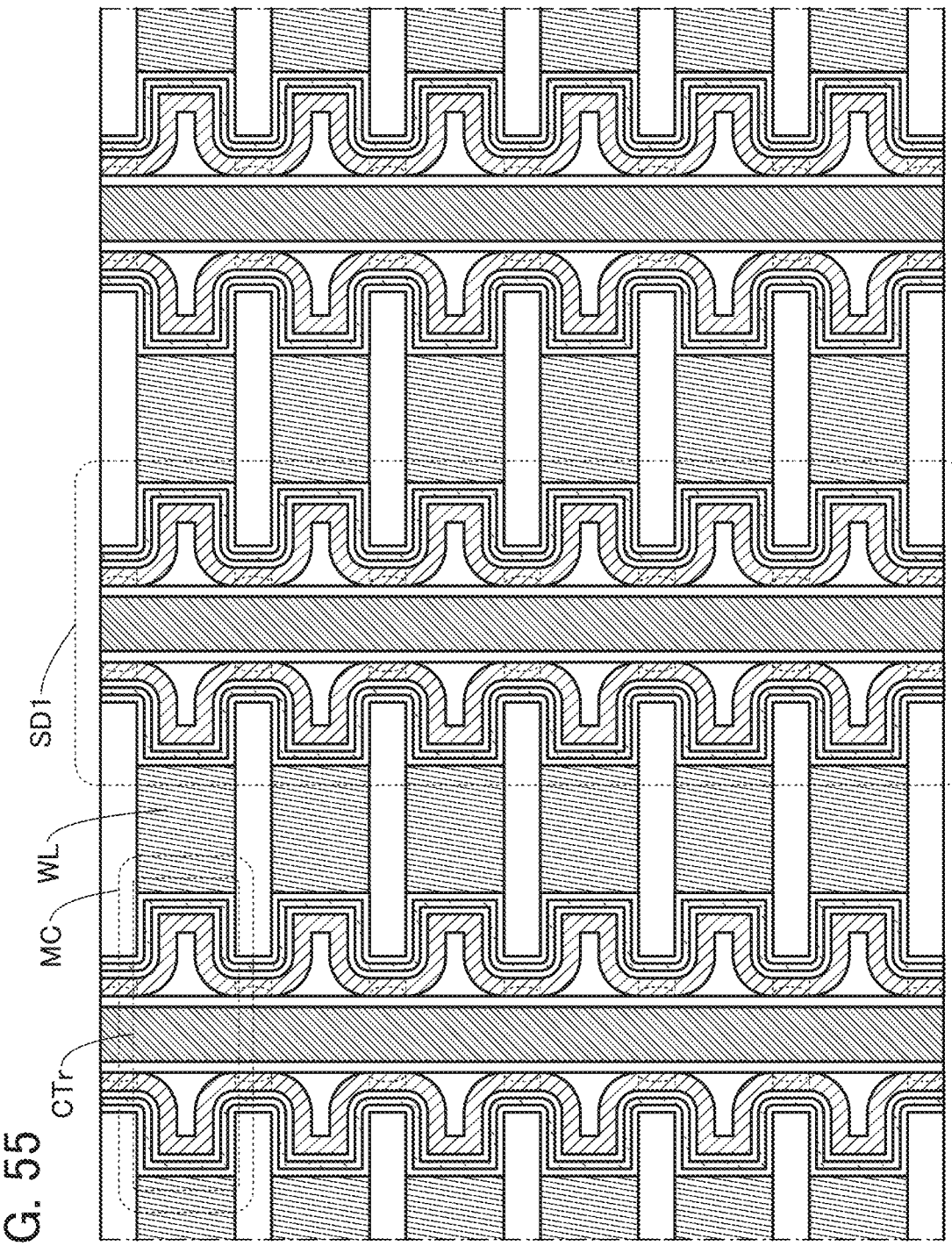
FIG. 55 is a cross-sectional view illustrating a semiconductor device.
Figure 56:
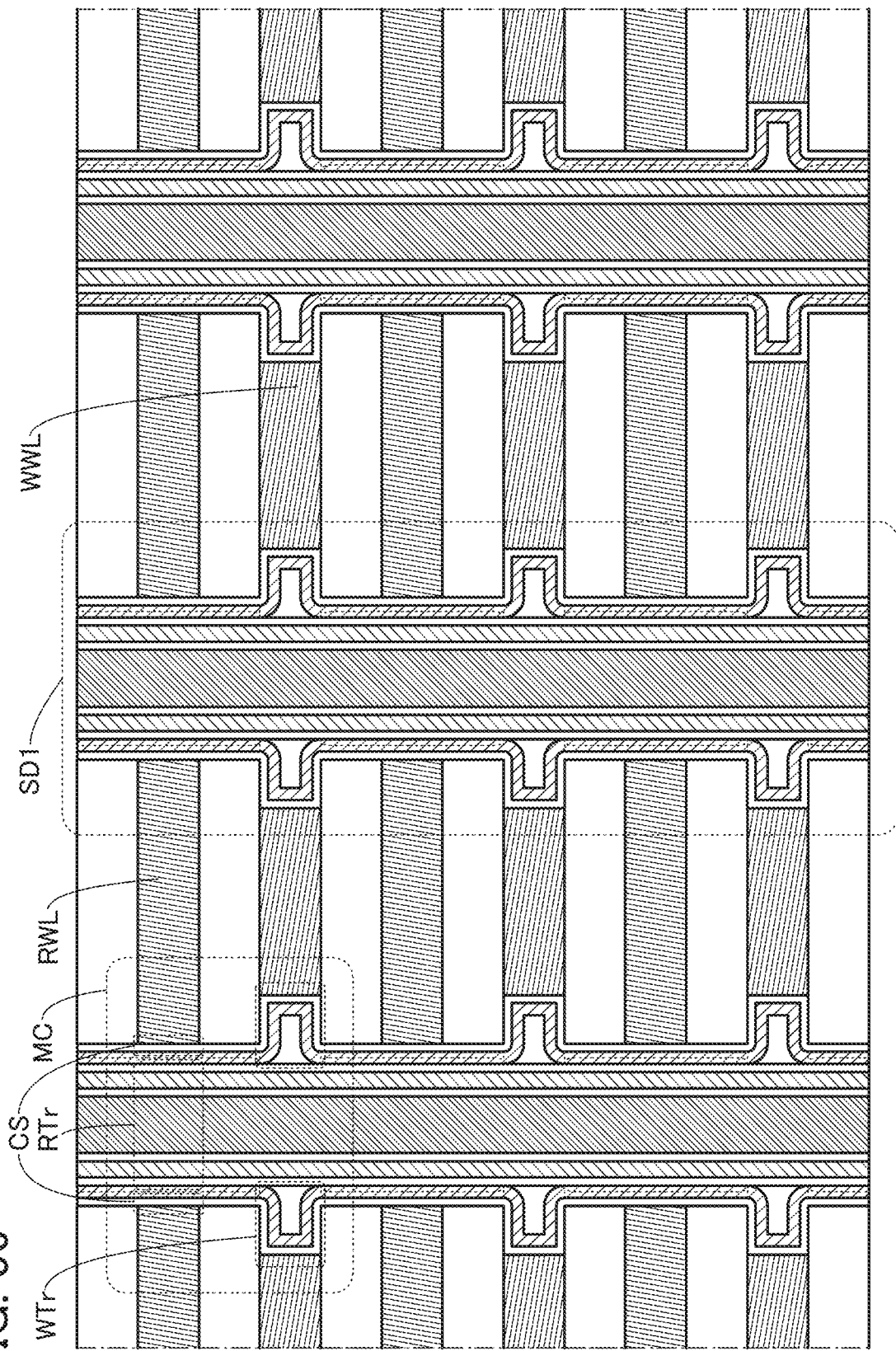
FIG. 56 is a cross-sectional view illustrating a semiconductor device.

Here, FIG. 55 illustrates a structure example in which the semiconductor device with the cross-sectional structure in FIG. 14B (with the circuit configuration in FIG. 1A) is arranged to form the cell array shown in FIG. 2. Similarly, FIG. 56 illustrates a structure example in which the semiconductor device with the cross-sectional structure in FIG. 43 (with the circuit configuration in FIG. 32A) is arranged to form the cell array. Note that the region SD1 corresponds to the memory cells MC. As illustrated in FIG. 55, an opening is provided to penetrate a structure body in which the conductors serving as the wirings WL and the insulators are stacked, and the semiconductor device is manufactured according to Manufacturing method example 1 described above, whereby the circuit configuration in FIG. 1A can be obtained. Furthermore, as illustrated in FIG. 56, an opening is provided to penetrate a structure body in which the conductors serving as the wirings RWL or the wirings WWL and the insulators are stacked, and the semiconductor device is manufactured according to Manufacturing method example 2 described above, whereby the circuit configuration in FIG. 32A can be obtained.

<Connection Examples with Peripheral Circuit>

Figure 57A:
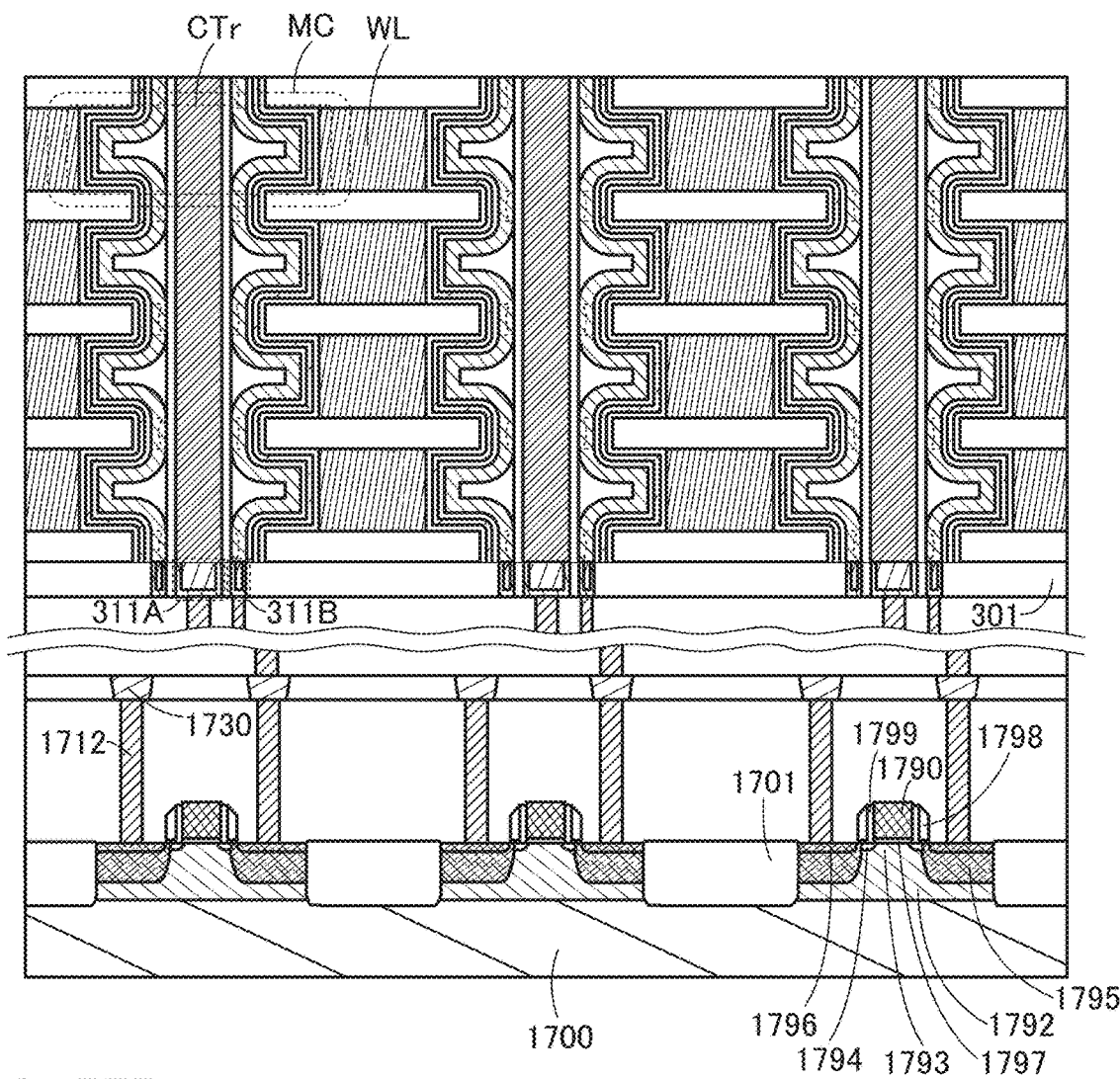
FIGS. 57A and 57B are cross-sectional views illustrating a semiconductor device.
Figure 58A:
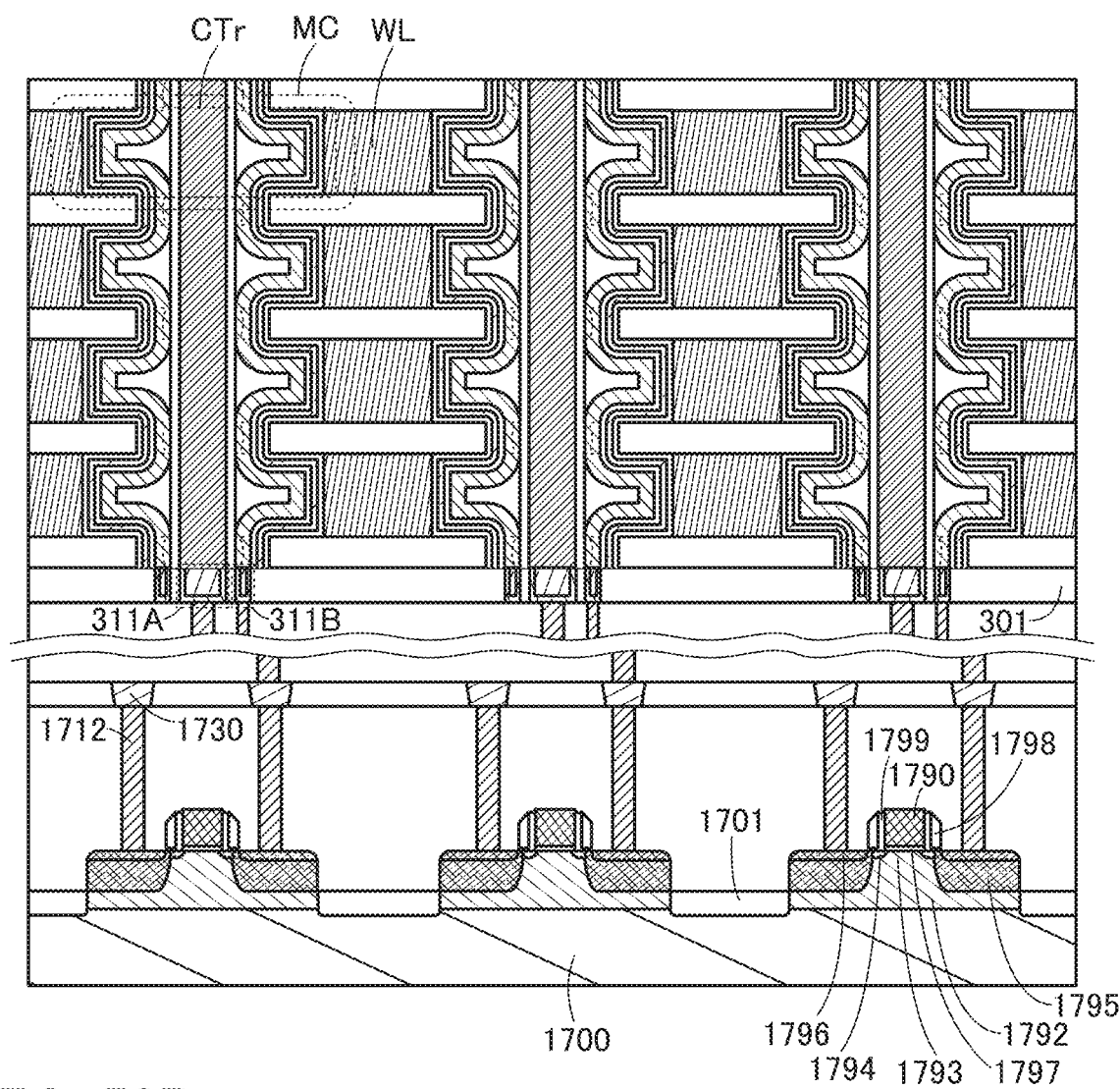
FIGS. 58A and 58B are cross-sectional views illustrating a semiconductor device.

A peripheral circuit for the memory cell array, such as a read circuit or a precharge circuit, may be provided below the semiconductor device shown in Manufacturing method example 1 or 2. In this case, Si transistors are formed on a silicon substrate or the like to configure the peripheral circuit, and then the semiconductor device of one embodiment of the present invention is formed over the peripheral circuit according to Manufacturing method example 1 or 2. FIG. 57A is a cross-sectional view in which the peripheral circuit is formed using planar Si transistors and the semiconductor device of one embodiment of the present invention is formed over the peripheral circuit. FIG. 58A is a cross-sectional view in which the peripheral circuit is formed using FIN-type Si transistors and the semiconductor device of one embodiment of the present invention is formed over the peripheral circuit. As an example, the semiconductor device illustrated in each of FIGS. 57A and 58A has the structure in FIG. 14B.

In FIG. 57A and FIG. 58A, the Si transistors configuring the peripheral circuit are formed on a substrate 1700. An element separation layer 1701 is provided between a plurality of Si transistors. Conductors 1712 are formed as a source and a drain of the Si transistor. Although not shown, a conductor 1730 extends in the channel width direction to be connected to another Si transistor or the conductor 1712.

As the substrate 1700, a single crystal semiconductor substrate or a polycrystalline semiconductor substrate of silicon or silicon carbide, a compound semiconductor substrate of silicon germanium, an SOI substrate, or the like can be used.

Alternatively, a glass substrate, a quartz substrate, a plastic substrate, a metal substrate, a flexible substrate, an attachment film, paper including a fibrous material, or a base film, for example, may be used as the substrate 1700. A semiconductor element may be formed using one substrate and then transferred to another substrate. As an example, a single crystal silicon wafer is used as the substrate 1700 in FIG. 57A and FIG. 58A.

Figure 57B:
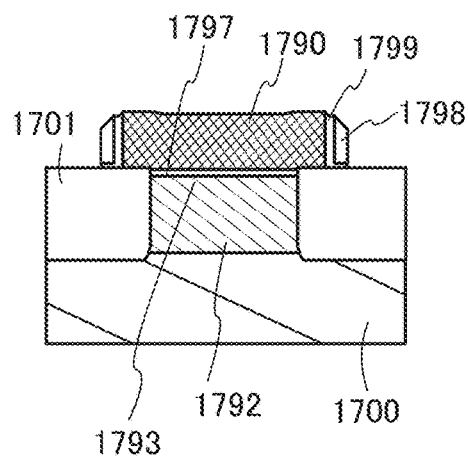

Here, the details of the Si transistors are described. FIG. 57A shows a cross section of the planar Si transistor in the channel length direction, and FIG. 57B shows its cross section in the channel width direction. The Si transistor includes a channel formation region 1793 in a well 1792, low-concentration impurity regions 1794 and high-concentration impurity regions 1795 (also collectively referred to simply as impurity regions), conductive regions 1796 in contact with the impurity regions, a gate insulating film 1797 over the channel formation region 1793, a gate electrode 1790 over the gate insulating film 1797, and sidewall insulating layers 1798 and 1799 on side surfaces of the gate electrode 1790. Note that the conductive region 1796 may be formed using metal silicide or the like.

Figure 58B:
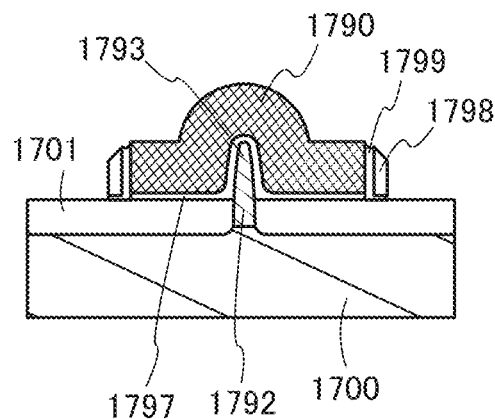

FIG. 58A shows a cross section of the FIN-type Si transistor in the channel length direction, and FIG. 58B shows its cross section in the channel width direction. In the Si transistor illustrated in FIGS. 58A and 58B, the channel formation region 1793 has a projecting portion, and the gate insulating film 1797 and the gate electrode 1790 are provided along the side and top surfaces of the channel formation region 1793. Although the projecting portion is formed by processing of part of the semiconductor substrate in this embodiment, a semiconductor layer with a projecting portion may be formed by processing of an SOI substrate.

An insulator 301 is provided above the circuit formed using the Si transistors, the conductor 1712, the conductor 1730, and the like over the substrate 1700. A conductor 311A and a conductor 311B for electrically connecting to the circuit are formed to so as be embedded in the insulator 301. When the channel formation region of the cell transistor CTr contains a metal oxide, a material with barrier properties against hydrogen and the like is preferably used for the insulator 301 and the conductors 311A and 311B, in which case diffusion of hydrogen from the Si transistor into the cell transistor CTr through at least one of the insulator 301, the conductor 311A, and the conductor 311B is suppressed.

For the insulator 301, any of the materials usable for the insulators 101A to 101C can be used.

For the conductors 311A and 311B, tantalum nitride, which has barrier properties against hydrogen, is preferably used, for example. The use of a stack including tantalum nitride and tungsten, which has high conductivity, can inhibit diffusion of hydrogen from the Si transistor while the conductors 311A and 311B maintain the conductivity as a wiring.

Note that the reference numerals in FIGS. 58A and 58B are the same as those in FIGS. 57A and 57B.

Note that the insulators, the conductors, the semiconductors, and the like disclosed in this specification and the like can be formed by a physical vapor deposition (PVD) method or a chemical vapor deposition (CVD) method. Examples of a PVD method include a sputtering method, a resistance heating evaporation method, an electron beam evaporation method, and a pulsed laser deposition (PLD) method. Examples of a CVD method include a plasma CVD method and a thermal CVD method. Examples of a thermal CVD method include a metal organic chemical vapor deposition (MOCVD) method and an atomic layer deposition (ALD) method.

Since plasma is not used for deposition, a thermal CVD method has an advantage that no defect due to plasma damage is generated.

Deposition by a thermal CVD method may be performed in such a manner that a source gas and an oxidizer are supplied to a chamber at a time, the pressure in the chamber is set to an atmospheric pressure or a reduced pressure, and the source gas and the oxidizer react with each other in the vicinity of a substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching of corresponding switching valves (also referred to as high-speed valves) such that the source gases are not mixed. For example, a first source gas is introduced, an inert gas (e.g., argon or nitrogen) or the like is introduced at the same time as or after the introduction of the first source gas, and then a second source gas is introduced. Note that in the case where the first source gas and the inert gas are introduced at a time, the inert gas serves as a carrier gas, and the inert gas may also be introduced at the same time as the introduction of the second source gas. Alternatively, the second source gas may be introduced after the first source gas is exhausted by vacuum evacuation instead of the introduction of the inert gas. The first source gas is adsorbed on a surface of a substrate to form a first thin layer, and then the second source gas is introduced to react with the first thin layer; thus, a second thin layer is stacked over the first thin layer, and a thin film is formed as a result. The sequence of the gas introduction is controlled and repeated a plurality of times until a desired thickness is obtained, whereby a thin film with excellent step coverage can be formed. The thickness of the thin film can be adjusted by the number of repetition times of the sequence of the gas introduction; therefore, an ALD method makes it possible to adjust a thickness accurately and thus is suitable for manufacturing a minute FET.

A variety of films such as the metal film, the semiconductor film, and the inorganic insulating film described thus far can be formed by a thermal CVD method such as a MOCVD method or an ALD method. For example, to form an In—Ga—Zn—O film, trimethylindium ($In(CH_3)_3$), trimethylgallium ($Ga(CH_3)_3$), and dimethylzinc ($Zn(CH_3)_2$) are used. Without limitation to the above combination, triethylgallium ($Ga(C_2H_5)_3$) can be used instead of trimethylgallium, and diethylzinc ($Zn(C_2H_5)_2$) can be used instead of dimethylzinc.

For example, when a hafnium oxide film is formed by a deposition apparatus employing ALD, two kinds of gases, i.e., ozone ($O_3$) as an oxidizer and a source gas obtained by vaporization of liquid containing a solvent and a hafnium precursor compound (hafnium alkoxide or hafnium amide such as tetrakis(dimethylamide)hafnium (TDMAH, $Hf[N(CH_3)_2]_4$)) are used. Alternatively, tetrakis(ethylmethylamide)hafnium may be used, for instance.

For example, when an aluminum oxide film is formed by a deposition apparatus employing ALD, two kinds of gases, i.e., $H_2O$ as an oxidizer and a source gas obtained by vaporization of liquid containing a solvent and an aluminum precursor compound (e.g., trimethylaluminum (TMA, $Al(CH_3)_3$)) are used. Alternatively, tris(dimethylamide)aluminum, triisobutylaluminum, aluminum tris(2,2,6,6-tetramethyl-3,5-heptanedionate), or the like may be used.

For example, when a silicon oxide film is formed by a deposition apparatus using ALD, hexachlorodisilane is adsorbed on a surface where the film is to be formed, and radicals of an oxidizing gas (e.g., $O_2$ or dinitrogen monoxide) are supplied to react with the adsorbate.

For example, when a tungsten film is formed by a deposition apparatus using ALD, a $WF_6$ gas and a $B_2H_6$ gas are sequentially introduced to form an initial tungsten film, and then a $WF_6$ gas and an $H_2$ gas are sequentially introduced to form a tungsten film. Note that a $SiH_4$ gas may be used instead of a $B_2H_6$ gas.

For example, when an oxide semiconductor film, e.g., an In—Ga—Zn—O film is formed by a deposition apparatus employing ALD, an $In(CH_3)_3$ gas and an $O_3$ gas) are sequentially introduced to form an In—O layer, a $Ga(CH_3)_3$ gas and an $O_3$ gas) are sequentially introduced to form a GaO layer, and then a $Zn(CH_3)_2$ gas and an $O_3$ gas) are sequentially introduced to form a ZnO layer. Note that the order of these layers is not limited to this example. A mixed oxide layer such as an In—Ga—O layer, an In—Zn—O layer, or a Ga—Zn—O layer may be formed with the use of these gases. Note that although an $H_2O$ gas that is obtained by bubbling water with an inert gas such as Ar may be used instead of an $O_3$ gas), it is preferable to use an $O_3$ gas), which does not contain H. Furthermore, an $In(C_2H_5)_3$ gas may be used instead of an $In(CH_3)_3$ gas. A $Ga(C_2H_5)_3$ gas may be used instead of a $Ga(CH_3)_3$ gas. Moreover, a $Zn(CH_3)_2$ gas may be used.

Note that at least two of the structure examples of the semiconductor devices described in this embodiment can be combined as appropriate.

Note that this embodiment can be combined with any of the other embodiments in this specification as appropriate.

Embodiment 2

In this embodiment, a memory device including the semiconductor device described in the foregoing embodiment will be described.

Figure 59:
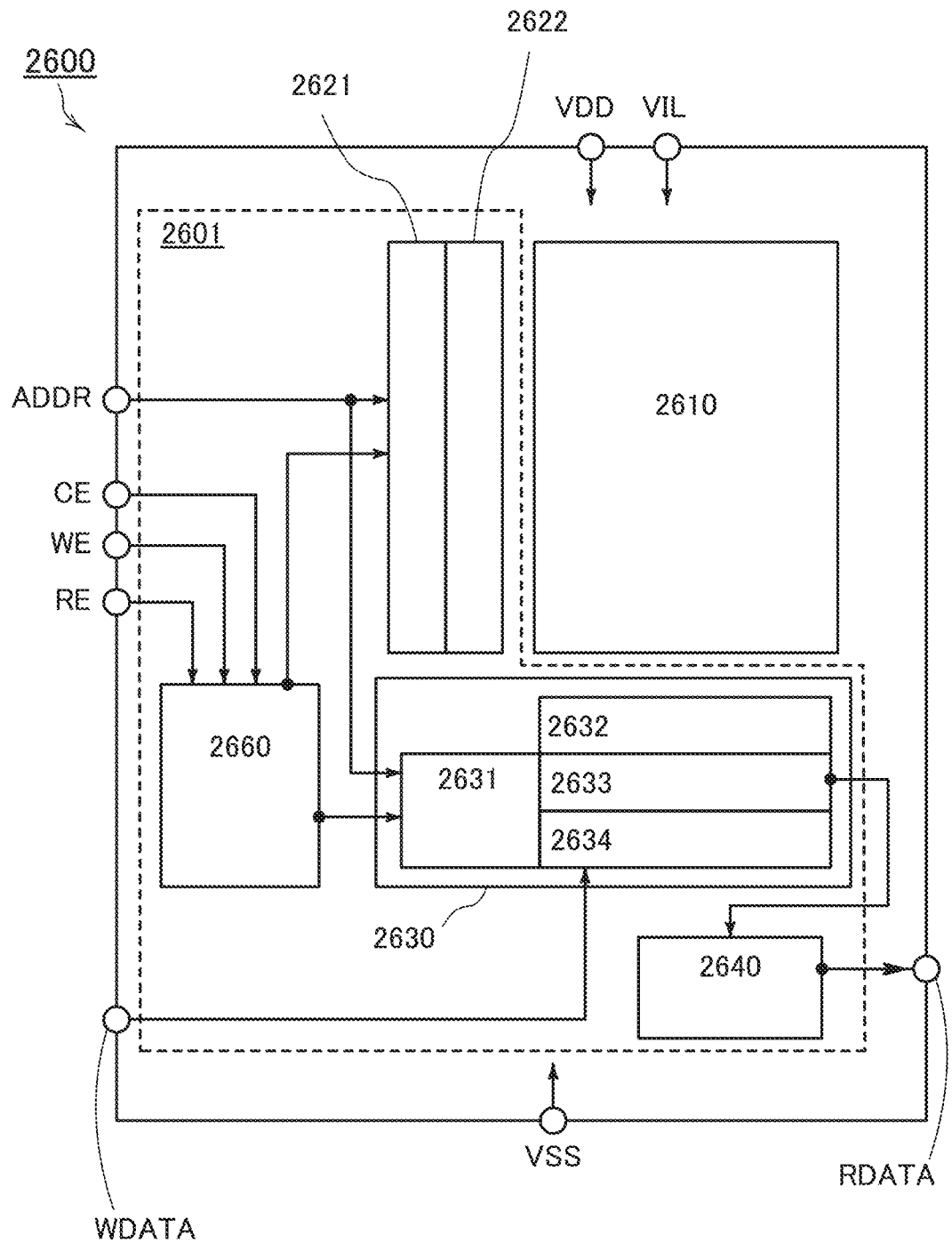
FIG. 59 is a block diagram illustrating an example of a memory device.

FIG. 59 illustrates a structure example of a memory device. A memory device 2600 includes a peripheral circuit 2601 and a memory cell array 2610. The peripheral circuit 2601 includes a row decoder 2621, a word line driver circuit 2622, a bit line driver circuit 2630, an output circuit 2640, and a control logic circuit 2660.

The semiconductor device illustrated in any of FIGS. 1A and 1B and FIGS. 32A to 32C in Embodiment 1 can be used for the memory cell array 2610.

The bit line driver circuit 2630 includes a column decoder 2631, a precharge circuit 2632, a sense amplifier 2633, and a write circuit 2634. The precharge circuit 2632 has a function of precharging the wirings SL, BL, RBL, and the like, which are described in Embodiment 1 but not shown in FIG. 59, to a predetermined potential. The sense amplifier 2633 has a function of obtaining a potential (or a current) read from the memory cell MC as a data signal and amplifying the data signal. The amplified data signal is output as a digital data signal RDATA from the memory device 2600 through the output circuit 2640.

As power supply voltages, a low power supply voltage (VSS), a high power supply voltage (VDD) for the peripheral circuit 2601, and a high power supply voltage (VIL) for the memory cell array 2610 are supplied to the memory device 2600 from the outside.

Control signals (CE, WE, RE), an address signal ADDR, and a data signal WDATA are input to the memory device 2600 from the outside. The address signal ADDR is input to the row decoder 2621 and the column decoder 2631. The data signal WDATA is input to the write circuit 2634.

The control logic circuit 2660 processes the signals (CE, WE, RE) input from the outside, and generates control signals for the row decoder 2621 and the column decoder 2631. The signal CE is a chip enable signal, the signal WE is a write enable signal, and the signal RE is a read enable signal. Signals processed by the control logic circuit 2660 are not limited to those listed above, and other control signals may be input as necessary.

Note that whether the circuits and signals described above are provided or not can be determined as appropriate when needed.

When a p-channel Si transistor and a transistor whose channel formation region contains an oxide semiconductor described in Embodiment 4 (preferably an oxide containing In, Ga, and Zn) are used in the memory device 2600, the memory device 2600 can be reduced in size. In addition, the memory device 2600 can be reduced in power consumption. Furthermore, the memory device 2600 can be increased in operating speed. Particularly when the Si transistors are only p-channel ones, the manufacturing cost can be reduced.

Note that the configuration of this embodiment is not limited to that shown in FIG. 59. The configuration may be changed as appropriate; for example, part of the peripheral circuit 2601 (e.g., the precharge circuit 2632 and/or the sense amplifier 2633) may be provided below the memory cell array 2610.

Note that this embodiment can be combined with any of the other embodiments in this specification as appropriate.

Embodiment 3

Referring to FIGS. 60A to 60E, this embodiment will show an example where the semiconductor device described in the foregoing embodiment is used as a memory device in an electronic component.

FIG. 60A shows an example in which the semiconductor device of the foregoing embodiment is used as a memory device in an electronic component. Note that an electronic component is also referred to as a semiconductor package or an IC package. For the electronic component, there are various standards and names corresponding to the direction or the shape of terminals; hence, one example of the electronic component will be described in this embodiment.

A semiconductor device including transistors, such as one described in Embodiment 1, is completed through the assembly process (post-process, or packaging and testing process) for integrating detachable components on a printed circuit board.

The post-process can be completed through steps shown in FIG. 60A. Specifically, after an element substrate obtained in the preceding process (wafer process) is completed (Step STP1), a rear surface of the substrate is ground (Step STP2). The substrate is thinned in this step to reduce warpage or the like of the substrate caused in the wafer process and to reduce the size of the component itself.

After the rear surface of the substrate is ground, a dicing step is performed to divide the substrate into a plurality of chips (Step STP3). Then, the divided chips are separately picked up to be mounted on and bonded to a lead frame in a die bonding process (Step STP4). To bond a chip and a lead frame in the die bonding process, resin bonding, tape-automated bonding, or the like is selected as appropriate depending on a product. Note that in the die bonding process, the chip may be mounted on and bonded to an interposer.

Note that in this embodiment, when an element is formed on one surface of a substrate, the other surface (a surface on which the element is not formed) is referred to as a rear surface.

Next, wiring bonding for electrically connecting a lead of the lead frame and an electrode on the chip through a metal fine line (wire) is performed (Step STP5). A silver line or a gold line can be used as the metal wire. Ball bonding or wedge bonding can be used for the wire bonding.

The wire-bonded chip is subjected to a molding step of sealing the chip with an epoxy resin or the like (Step STP6). By the molding step, the inside of the electronic component is filled with a resin, thereby reducing damage to the circuit portion and the wire embedded in the electronic component caused by external mechanical force as well as reducing deterioration of characteristics due to moisture or dust.

Next, plate processing is performed on the lead of the lead frame. Then, the lead is cut and processed into a predetermined shape (Step STP7). This plate processing prevents rust of the lead and enables more reliable soldering at the time of mounting the electronic component on a printed board in a later step.

Subsequently, printing (marking) is performed on a surface of the package (Step STP8). After a final testing step (Step STP9), the electronic component is completed (Step STP10).

Since the above electronic component can include the semiconductor device described in the foregoing embodiment, it is possible to obtain a highly reliable electronic component.

FIG. 60B is a perspective schematic diagram of a completed electronic component. FIG. 60B shows a perspective schematic diagram of a quad flat package (QFP) as an example of the electronic component. An electronic component 4700 in FIG. 60B includes a lead 4701 and a circuit portion 4703. The electronic component 4700 in FIG. 60B is mounted on a printed circuit board 4702, for example. A plurality of electronic components 4700 that are combined and electrically connected to each other over the printed board 4702 can be equipped in an electronic device. A completed circuit board 4704 is provided in an electronic device or the like.

Note that one embodiment of the present invention is not limited to the electronic component 4700 and may be the element substrate fabricated in Step STP1. In addition, the element substrate of one embodiment of the present invention includes an element substrate that has been subjected to Step STP2 where the rear surface of the substrate is ground. Furthermore, the element substrate of one embodiment of the present invention includes an element substrate that has been subjected to Step STP3 where the dicing step is performed. For example, a semiconductor wafer 4800 illustrated in FIG. 60C corresponds to such an element substrate. In the semiconductor wafer 4800, a plurality of circuit portions 4802 are formed on a top surface of a wafer 4801. A portion without the circuit portions 4802 on the top surface of the wafer 4801 is a spacing 4803, and part of the spacing 4803 serves as a region subjected to dicing.

The dicing is carried out along scribe lines SCL1 and scribe lines SCL2 (sometimes referred to as dicing lines or cutting lines) indicated by dashed-dotted lines. To perform the dicing step easily, the spacing 4803 is preferably arranged such that a plurality of scribe lines SCL1 are parallel to each other, a plurality of scribe lines SCL2 are parallel to each other, and the scribe lines SCL1 and the scribe lines SCL2 intersect each other perpendicularly.

With the dicing step, a chip 4800a shown in FIG. 60D can be cut out from the semiconductor wafer 4800. The chip 4800a includes a wafer 4801a, the circuit portion 4802, and a spacing 4803a. Note that it is preferable to make the spacing 4803a as small as possible. Here, it is preferred that the width of the spacing 4803 between adjacent circuit portions 4802 be substantially the same as the length of margin for cutting the scribe line SCL1 or the scribe line SCL2.

The shape of the element substrate of one embodiment of the present invention is not limited to the shape of the semiconductor wafer 4800 illustrated in FIG. 60C. For example, the element substrate may be a rectangular semiconductor wafer 4810 shown in FIG. 60E. The shape of the element substrate can be changed as appropriate, depending on a process for fabricating an element and an apparatus for fabricating an element.

Note that this embodiment can be combined with any of the other embodiments in this specification as appropriate.

Embodiment 4

In this embodiment, a metal oxide contained in a channel formation region of an OS transistor used in the foregoing embodiment will be described.

The metal oxide preferably contains at least indium or zinc, and particularly preferably contains both indium and zinc. In addition, the metal oxide preferably contains aluminum, gallium, yttrium, tin, or the like. Furthermore, the metal oxide may contain one or more elements selected from boron, silicon, titanium, iron, nickel, germanium, zirconium, molybdenum, lanthanum, cerium, neodymium, hafnium, tantalum, tungsten, magnesium, and the like.

Here, the case where the metal oxide is an In-M-Zn oxide containing indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

Next, preferred ranges of the atomic ratio of indium, the element M, and zinc contained in the metal oxide according to the present invention will be described with reference to FIGS. 61A to 61C. Note that the proportion of oxygen atoms is not shown in FIGS. 61A to 61C. The terms of the atomic ratio of indium, the element M, and zinc contained in the metal oxide are denoted by [In], [M], and [Zn], respectively.

Figure 61A:
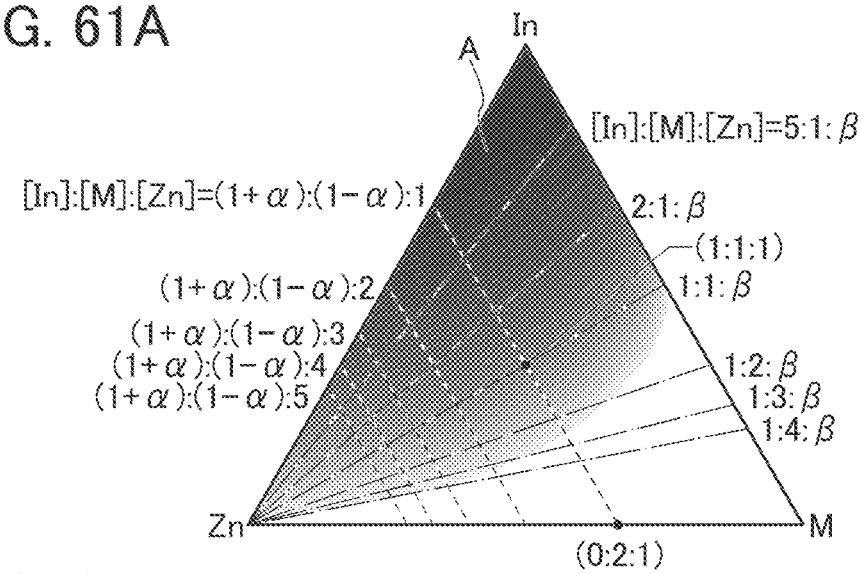
FIGS. 61A to 61C each illustrate an atomic ratio range of a metal oxide.
Figure 61B:
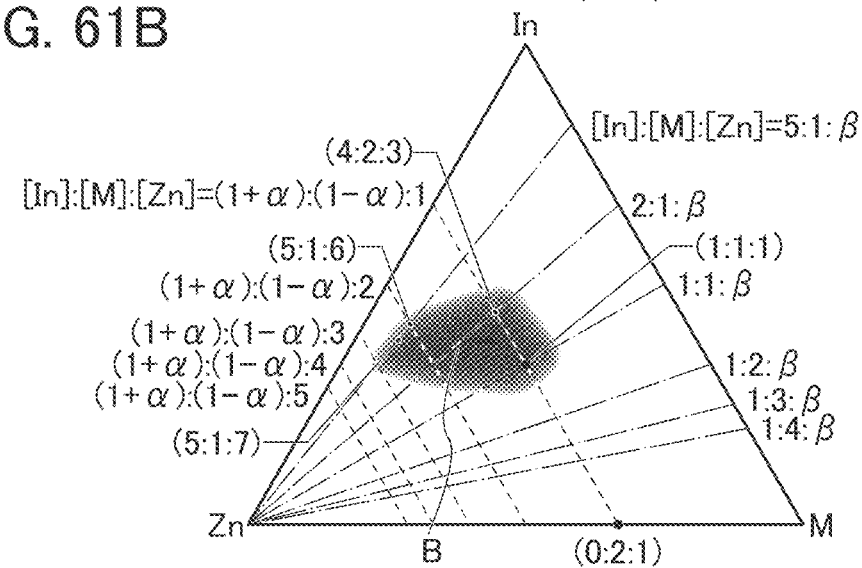
Figure 61C:
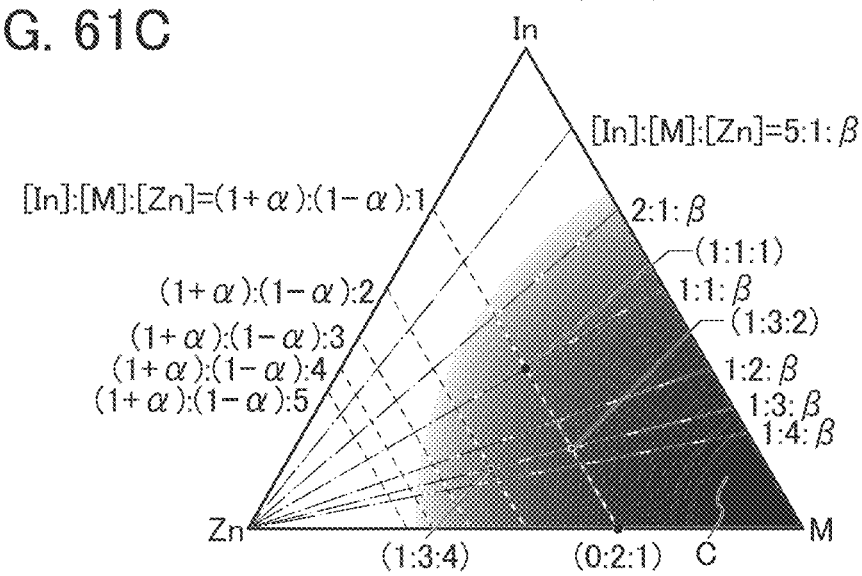

In FIGS. 61A to 61C, broken lines indicate a line where the atomic ratio [In]:[M]:[Zn] is $(1+\alpha):(1-\alpha):1$, where $-1 \leq \alpha \leq \alpha$ line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $5:1:\beta$, where $\beta \geq 0$, a line where the atomic ratio [In]:[M]:[Zn] is $2:1:\beta$ a line where the atomic ratio [In]:[M]:[Zn] is $1:1:\beta$, a line where the atomic ratio [In]:[M]:[Zn] is $1:2:\beta$, a line where the atomic ratio [In]:[M]:[Zn] is $1:3:\beta$, and a line where the atomic ratio [In]:[M]:[Zn] is $1:4:\beta$.

A metal oxide having an atomic ratio [In]:[M]:[Zn] of 0:2:1 or around 0:2:1 in FIGS. 61A to 61C tends to have a spinel crystal structure.

A plurality of phases (e.g., two phases or three phases) exist in the metal oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the metal oxide, a grain boundary might be formed between different crystal structures.

A region A in FIG. 61A shows an example of the preferred ranges of the atomic ratio of indium to the element M and zinc contained in a metal oxide.

A metal oxide with a higher content of indium can have high carrier mobility (electron mobility). Therefore, a metal oxide with a high indium content has higher carrier mobility than a metal oxide with a low indium content.

In contrast, when the indium content and the zinc content in a metal oxide become lower, the carrier mobility becomes lower. Thus, with an atomic ratio [In]:[M]:[Zn] of 0:1:0 or around 0:1:0 (e.g., a region C in FIG. 61C), insulation performance becomes better.

Accordingly, a metal oxide of one embodiment of the present invention preferably has an atomic ratio represented by the region A in FIG. 61A. With such an atomic ratio, a layered structure with high carrier mobility and a few grain boundaries is easily obtained.

A metal oxide with an atomic ratio in the region A, particularly in a region B in FIG. 61B, is excellent because it easily becomes a c-axis-aligned crystalline oxide semiconductor (CAAC-OS) and has high carrier mobility.

The CAAC-OS has c-axis alignment, its nanocrystals are connected in the a-b plane direction, and its crystal structure has distortion. Note that the distortion is a portion where the direction of a lattice arrangement changes between a region with a regular lattice arrangement and another region with a regular lattice arrangement in a region where nanocrystals are connected.

The shape of the nanocrystal is basically hexagon. However, the shape is not always a regular hexagon and is a non-regular hexagon in some cases. A pentagonal lattice arrangement, a heptagonal lattice arrangement, and the like are sometimes included in the distortion. Note that a clear grain boundary cannot be observed even in the vicinity of distortion in the CAAC-OS. That is, formation of a grain boundary is inhibited by the distortion of a lattice arrangement. This is probably because the CAAC-OS can tolerate distortion owing to a low-density arrangement of oxygen atoms in the a-b plane direction, an interatomic bond distance changed by substitution of a metal element, and the like.

The CAAC-OS is a metal oxide with high crystallinity. In the CAAC-OS, a reduction in electron mobility due to the grain boundary is less likely to occur because a clear grain boundary cannot be observed. Entry of impurities, formation of defects, or the like might decrease the crystallinity of a metal oxide. This means that the CAAC-OS is a metal oxide having small amounts of impurities and defects (e.g., oxygen vacancies). Thus, a metal oxide including the CAAC-OS is physically stable. Therefore, the metal oxide including the CAAC-OS is resistant to heat and has high reliability.

Note that the region B includes an atomic ratio [In]:[M]:[Zn] of 4:2:3 to 4:2:4.1 and in the neighborhood thereof. The neighborhood includes an atomic ratio [In]:[M]:[Zn] of 5:3:4, for example. The region B also includes an atomic ratio [In]:[M]:[Zn] of 5:1:6 and in the neighborhood thereof and an atomic ratio [In]:[M]:[Zn] of 5:1:7 and in the neighborhood thereof.

Note that the properties of a metal oxide are not uniquely determined by the atomic ratio. Even with the same atomic ratio, the properties of a metal oxide might differ depending on a formation condition. For example, when the metal oxide is formed with a sputtering apparatus, a film having an atomic ratio deviated from the atomic ratio of a target is formed. In particular, [Zn] in the film might be smaller than [Zn] in the target depending on the substrate temperature in deposition. Thus, the illustrated regions each represent an atomic ratio with which a metal oxide tends to have specific properties, and boundaries of the regions A to C are not clear.

Note that this embodiment can be combined with any of the other embodiments in this specification as appropriate.

Embodiment 5

In this embodiment, a CPU that can include the semiconductor device of the foregoing embodiment will be described.

Figure 62:
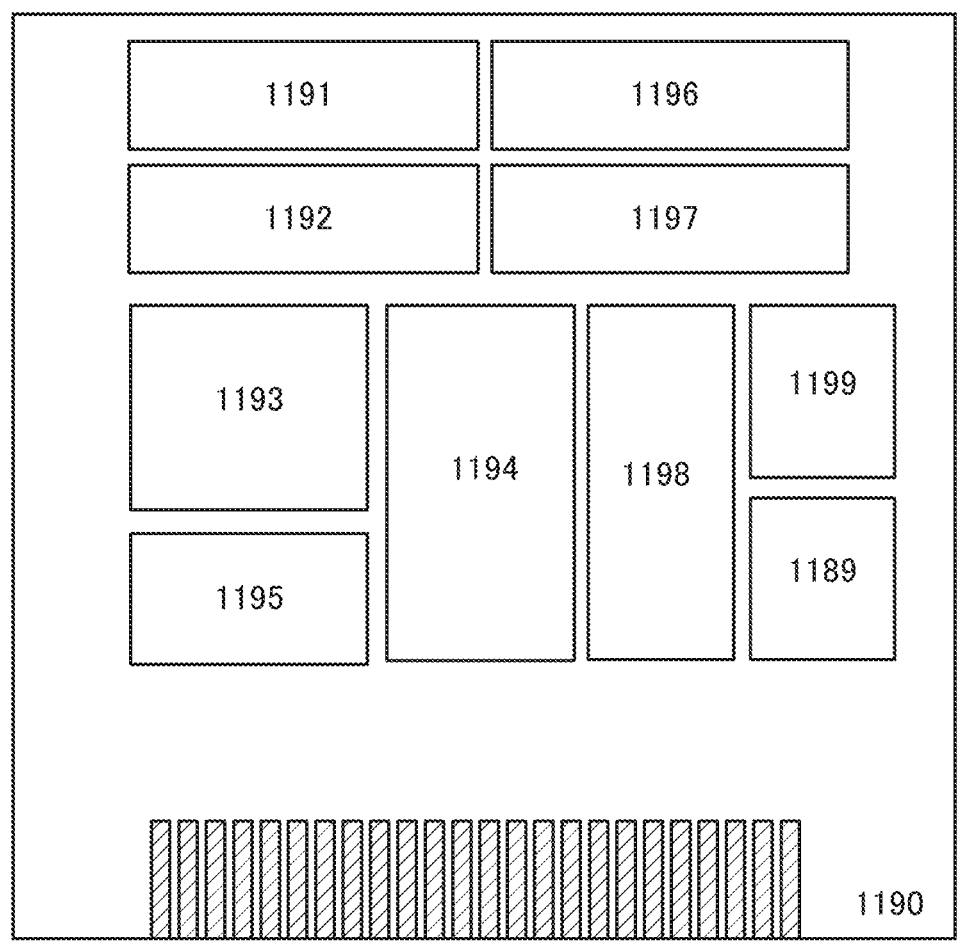
FIG. 62 is a block diagram of a CPU.

FIG. 62 is a block diagram illustrating a configuration example of a CPU including the semiconductor device described in Embodiment 1.

The CPU illustrated in FIG. 62 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (bus I/F) 1198, a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 62 is just an example with a simplified configuration, and an actual CPU has a variety of configurations depending on the application. For example, a CPU may have a GPU-like configuration where a plurality of cores each including the CPU in FIG. 62 or an arithmetic circuit operate in parallel. The number of bits that the CPU can handle with an internal arithmetic circuit or a data bus can be 8, 16, 32, or 64, for example.

An instruction that is input to the CPU through the bus interface 1198 is input to the instruction decoder 1193 and decoded therein, and then input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal on the basis of a reference clock signal, and supplies the internal clock signal to the above circuits.

In the CPU illustrated in FIG. 62, memory cells are provided in the register 1196. The transistor described in the foregoing embodiment can be used in the memory cell of the register 1196.

In the CPU in FIG. 62, the register controller 1197 selects the type of retention operation in the register 1196 in accordance with an instruction from the ALU 1191. That is, the register controller 1197 selects whether data is held by a flip-flop or by a capacitor in the memory cell included in the register 1196. When data retention by the flip-flop is selected, power supply voltage is supplied to the memory cell in the register 1196. When data retention by the capacitor is selected, the data is rewritten into the capacitor, and supply of power supply voltage to the memory cell in the register 1196 can be stopped.

Note that this embodiment can be combined with any of the other embodiments in this specification as appropriate.

Embodiment 6

The memory device of the foregoing embodiment can be used for removable memory devices such as memory cards (e.g., SD cards), universal serial bus (USB) memories, and solid state drives (SSD). In this embodiment, some structure examples of removable memory devices will be described with reference to FIGS. 63A to 63E.

Figure 63A:
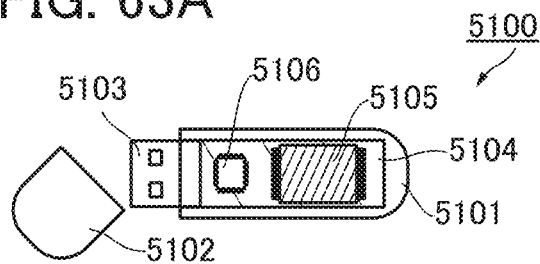
FIGS. 63A to 63E are perspective views illustrating examples of electronic devices.

FIG. 63A is a schematic diagram of a USB memory. A USB memory 5100 includes a housing 5101, a cap 5102, a USB connector 5103, and a substrate 5104. The substrate 5104 is held in the housing 5101. The substrate 5104 is provided with a memory device and a circuit for driving the memory device. For example, the substrate 5104 is provided with a memory chip 5105 and a controller chip 5106. The memory cell array 2610, the word line driver circuit 2622, the row decoder 2621, the sense amplifier 2633, the precharge circuit 2632, the column decoder 2631, and the like, which are described in Embodiment 2, are incorporated into the memory chip 5105. A processor, a work memory, an ECC circuit, and the like are specifically incorporated into the controller chip 5106. Note that the circuit configurations of the memory chip 5105 and the controller chip 5106 are not limited to those described above and can be changed as appropriate. For example, the word line driver circuit 2622, the row decoder 2621, the sense amplifier 2633, the precharge circuit 2632, and the column decoder 2631 may be incorporated into not the memory chip 5105 but the controller chip 5106. The USB connector 5103 functions as an interface for connection to an external device.

Figure 63B:
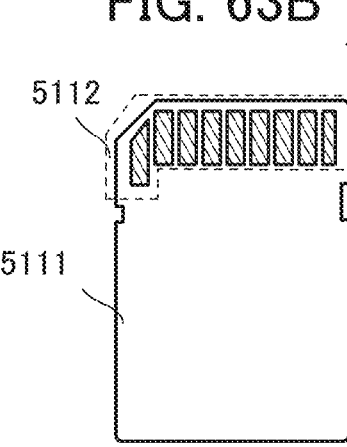
Figure 63C:
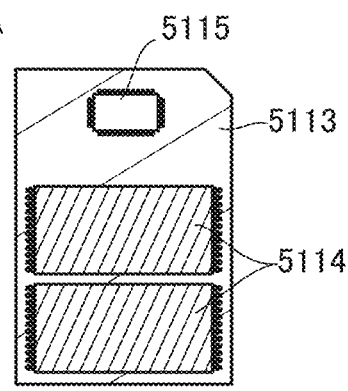

FIG. 63B is a schematic external diagram of an SD card, and FIG. 63C is a schematic diagram illustrating the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a memory device and a circuit for driving the memory device. For example, the substrate 5113 is provided with a memory chip 5114 and a controller chip 5115. The memory cell array 2610, the word line driver circuit 2622, the row decoder 2621, the sense amplifier 2633, the precharge circuit 2632, the column decoder 2631, and the like, which are described in Embodiment 2, are incorporated into the memory chip 5114. A processor, a work memory, an ECC circuit, and the like are incorporated into the controller chip 5115. Note that the circuit configurations of the memory chip 5114 and the controller chip 5115 are not limited to those described above and can be changed as appropriate. For example, the word line driver circuit 2622, the row decoder 2621, the sense amplifier 2633, the precharge circuit 2632, and the column decoder 2631 may be incorporated into not the memory chip 5114 but the controller chip 5115.

When the memory chip 5114 is also provided on the back side of the substrate 5113, the capacity of the SD card 5110 can be increased. In addition, a wireless chip with a radio communication function may be provided on the substrate 5113. This structure enables wireless communication between an external device and the SD card 5110, making it possible to write/read data to/from the memory chip 5114.

Figure 63D:
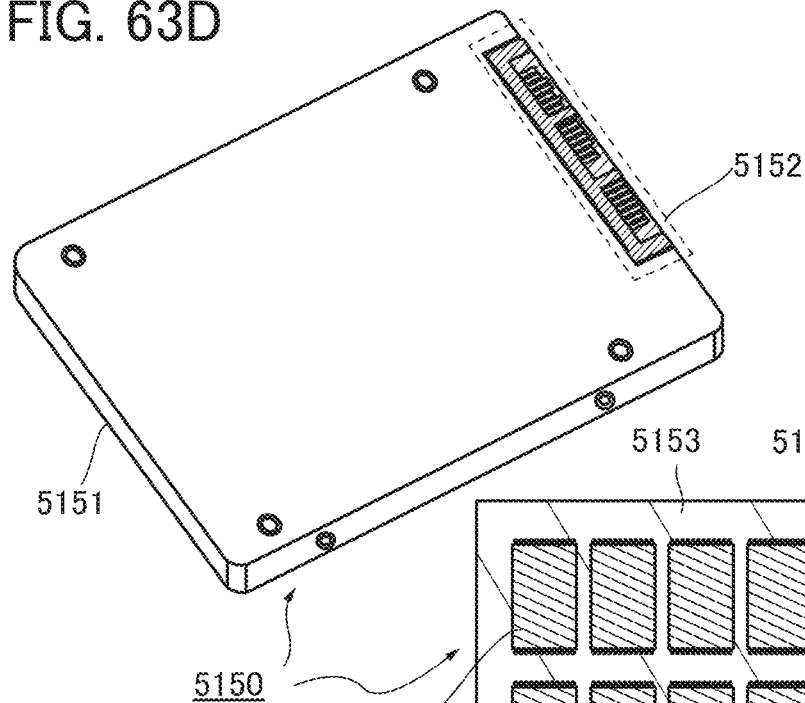
Figure 63E:
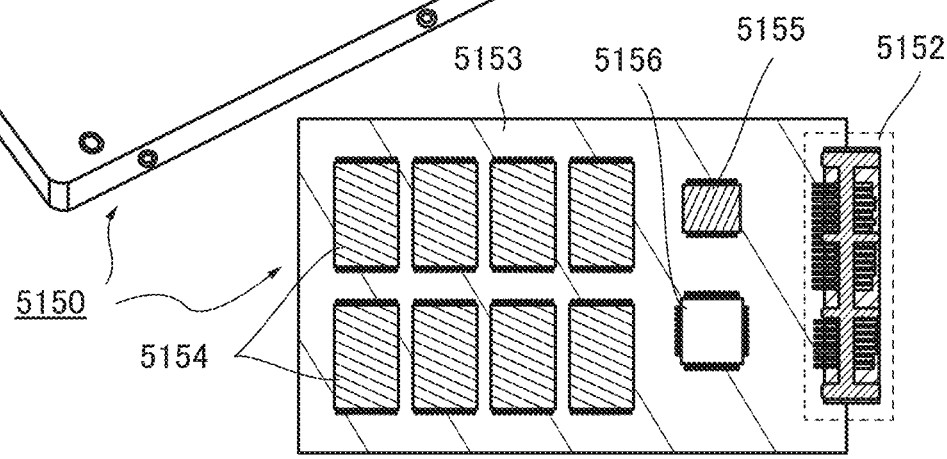

FIG. 63D is a schematic external diagram of an SSD, and FIG. 63E is a schematic diagram illustrating the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a memory device and a circuit for driving the memory device. For example, the substrate 5153 is provided with a memory chip 5154, a memory chip 5155, and a controller chip 5156. The memory cell array 2610, the word line driver circuit 2622, the row decoder 2621, the sense amplifier 2633, the precharge circuit 2632, the column decoder 2631, and the like, which are described in Embodiment 2, are incorporated into the memory chip 5154. When the memory chip 5154 is also provided on the back side of the substrate 5153, the capacity of the SSD 5150 can be increased. A work memory is incorporated into the memory chip 5155. For example, a DRAM chip can be used as the memory chip 5155. A processor, an ECC circuit, and the like are incorporated into the controller chip 5156. Note that the circuit configurations of the memory chip 5154, the memory chip 5155, and the controller chip 5115 are not limited to those described above and can be changed as appropriate. For example, a memory functioning as a work memory may also be provided in the controller chip 5156.

Note that this embodiment can be combined with any of the other embodiments in this specification as appropriate.

Embodiment 7

This embodiment will show examples of electronic devices in which the semiconductor device or the memory device of the foregoing embodiment can be used.

<Laptop Personal Computer>

Figure 64A:
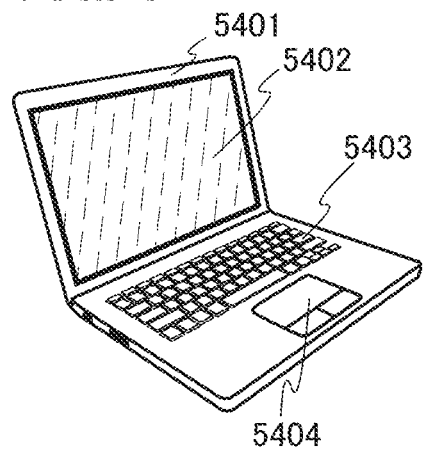
FIGS. 64A to 64F are perspective views illustrating examples of electronic devices.

The semiconductor device or the memory device of one embodiment of the present invention can be provided in a laptop personal computer. FIG. 64A illustrates a laptop personal computer including a housing 5401, a display portion 5402, a keyboard 5403, a pointing device 5404, and the like.

<Smart Watch>

Figure 64B:
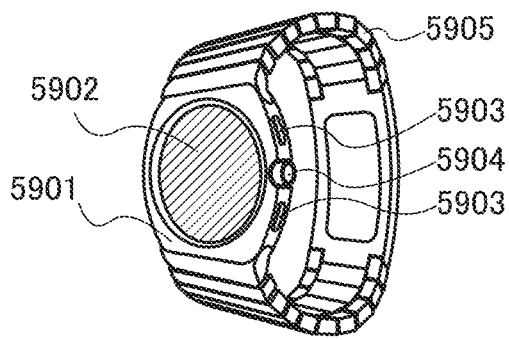

The semiconductor device or the memory device of one embodiment of the present invention can be provided in a wearable terminal. FIG. 64B illustrates a smart watch that is one of wearable terminals. The smart watch includes a housing 5901, a display portion 5902, operation buttons 5903, an operator 5904, a band 5905, and the like. A display device with a position input function may be used for the display portion 5902. The position input function can be added by provision of a touch panel in a display device. Alternatively, the position input function can be added by provision of a photoelectric conversion element called a photosensor in a pixel area of a display device. As the operation buttons 5903, any of a power switch for activating the smart watch, a button for operating an application of the smart watch, a volume control button, a switch for turning on or off the display portion 5902, and the like can be provided. Although the smart watch illustrated in FIG. 64B includes two operation buttons 5903, the number of operation buttons included in the smart watch is not limited to two. The operator 5904 functions as a crown used for setting the time on the smart watch. The operator 5904 may be used as an input interface for operating an application of the smart watch as well as the crown for time adjustment. Although the smart watch in FIG. 64B includes the operator 5904, one embodiment of the present invention is not limited thereto and does not necessarily include the operator 5904.

<Video Camera>

Figure 64C:
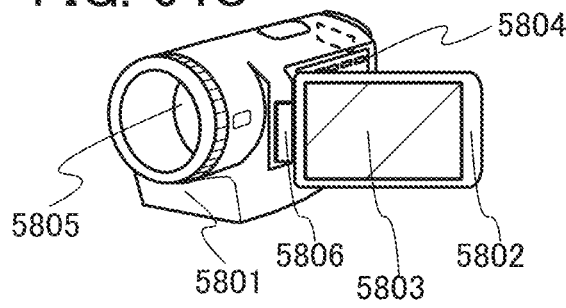

The semiconductor device or the memory device of one embodiment of the present invention can be provided in a video camera. FIG. 64C illustrates a video camera including a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

<Mobile Phone>

Figure 64D:
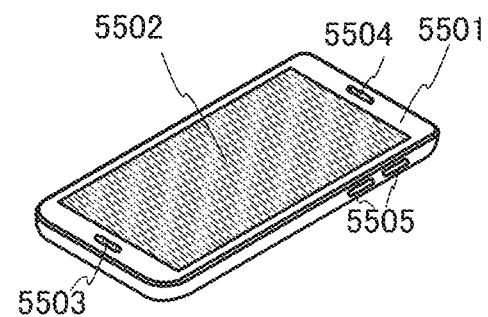

The semiconductor device or the memory device of one embodiment of the present invention can be provided in a mobile phone. FIG. 64D illustrates a mobile phone having a function of an information terminal. The mobile phone includes a housing 5501, a display portion 5502, a microphone 5503, a speaker 5504, and operation buttons 5505. A display device with a position input function may be used for the display portion 5502. The position input function can be added by provision of a touch panel in a display device. Alternatively, the position input function can be added by provision of a photoelectric conversion element called a photosensor in a pixel area of a display device. As the operation buttons 5505, any of a power switch for activating the mobile phone, a button for operating an application of the mobile phone, a volume control button, a switch for turning on or off the display portion 5502, and the like can be provided.

Although the mobile phone illustrated in FIG. 64D includes two operation buttons 5505, the number of operation buttons included in the mobile phone is not limited to two. Although not illustrated, the mobile phone in FIG. 64D may include a light-emitting device used for a flashlight or a lighting purpose.

<Television Device>

Figure 64E:
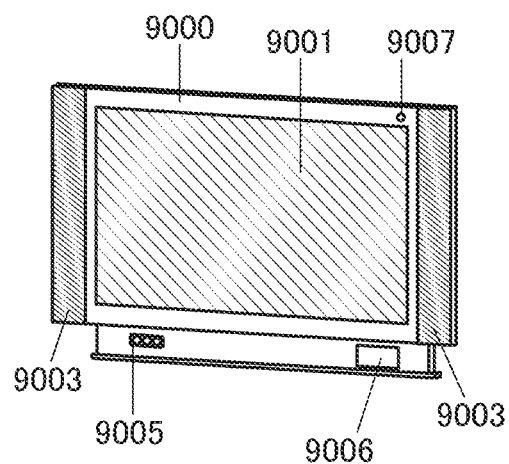

The semiconductor device or the memory device of one embodiment of the present invention can be provided in a television device. FIG. 64E is a perspective view illustrating a television device. The television device includes a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), and the like. The television device can include the display portion 9001 of 50 inches or more or 100 inches or more, for example.

<Vehicle>

The semiconductor device or the memory device of one embodiment of the present invention can also be used around a driver's seat in a car, which is a vehicle.

Figure 64F:
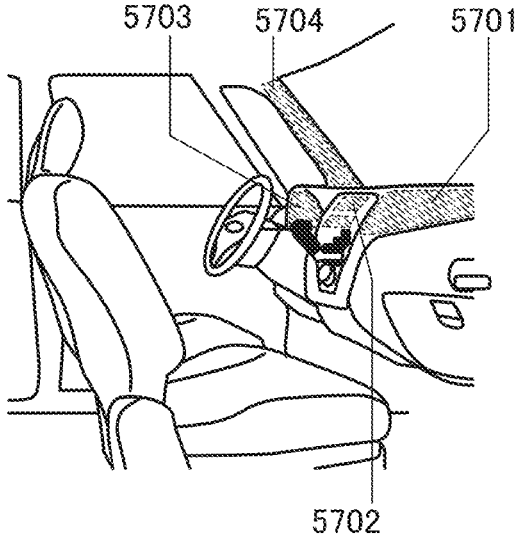

As an example, FIG. 64F illustrates a front glass and its vicinity inside a car. FIG. 64F shows a display panel 5701, a display panel 5702, and a display panel 5703 that are attached to a dashboard and a display panel 5704 that is attached to a pillar.

The display panels 5701 to 5703 can provide a variety of kinds of information such as navigation information, a speedometer, a tachometer, a mileage, a fuel meter, a gear-shift indicator, and air-condition setting. Items shown on the display panel, their layout, and the like can be changed as appropriate to suit the user's preferences, resulting in more sophisticated design. The display panels 5701 to 5703 can also be used as lighting devices.

The display panel 5704 can compensate for the view obstructed by the pillar (blind areas) by showing an image taken by an imaging unit provided for the car body. That is, displaying an image taken by the imaging unit provided on the outside of the car body leads to elimination of blind areas and enhancement of safety. Moreover, showing an image to compensate for the area that a driver cannot see makes it possible for the driver to confirm safety more easily and comfortably. The display panel 5704 can also be used as a lighting device.

The semiconductor device or the memory device of one embodiment of the present invention can be used, for example, for a frame memory that temporarily stores image data used to display images on the display panels 5701 to 5704, or a memory device that stores a program for driving a system included in the vehicle.

Although not shown, each of the electronic devices illustrated in FIGS. 64A, 64B, 64E, and 64F may include a microphone and a speaker. The electronic device with this structure can have an audio input function, for example.

Although not shown, each of the electronic devices illustrated in FIGS. 64A, 64B, 64D, 64E, and 64F may include a camera.

Although not illustrated, each of the electronic devices in FIGS. 64A to 64F may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays) in the housing. In particular, when the mobile phone in FIG. 64D is provided with a sensing device that includes a sensor for sensing inclination, such as a gyroscope sensor or an acceleration sensor, the orientation of the mobile phone (with respect to the vertical direction) can be determined to change the display on the screen of the display portion 5502 automatically in accordance with the orientation of the mobile phone.

Although not illustrated, each of the electronic devices in FIGS. 64A to 64F may include a device for obtaining biological information such as fingerprints, veins, iris, or voice prints. The electronic device with this structure can have a biometric identification function.

A flexible base may be used for the display portion of each of the electronic devices in FIGS. 64A to 64F. Specifically, the display portion may have a structure in which a transistor, a capacitor, a display element, and the like are provided over a flexible base. With such a structure, in addition to the electronic device having the housing with a flat surface as illustrated in FIGS. 64A to 64F, an electronic device having a housing with a curved surface can be achieved.

Note that this embodiment can be combined with any of the other embodiments in this specification as appropriate.

(Notes on Description of this Specification and the Like)

The following are notes on the structures in the above embodiments.

<Notes on One Embodiment of the Present Invention Described in Embodiments>

One embodiment of the present invention can be constituted by appropriately combining the structure described in an embodiment with any of the structures described in the other embodiments. In the case where a plurality of structure examples are described in one embodiment, some of the structure examples can be combined as appropriate.

Note that a content (or part thereof) described in one embodiment can be applied to, combined with, or replaced with another content (or part thereof) described in the same embodiment and/or a content (or part thereof) described in another embodiment or other embodiments.

Note that in each embodiment, a content described in the embodiment is a content described with reference to a variety of diagrams or a content described with text disclosed in this specification.

By combining a diagram (or part thereof) described in one embodiment with another part of the diagram, a different diagram (or part thereof) described in the embodiment, and/or a diagram (or part thereof) described in another embodiment or other embodiments, much more diagrams can be created.

<Notes on Ordinal Numbers>

In this specification and the like, ordinal numbers such as first, second, and third are used in order to avoid confusion among components. Thus, the terms do not limit the number or order of components. In this specification and the like, for example, a "first" component in one embodiment can be referred to as a "second" component or omitted in other embodiments or claims.

<Notes on Description for Drawings>

The embodiments are described with reference to the drawings. Note that the embodiments can be implemented in many different modes, and it will be readily appreciated by those skilled in the art that modes and details can be changed in various ways without departing from the spirit and scope of the present invention. Thus, the present invention should not be interpreted as being limited to the description of the embodiments. Note that in the structures of the invention described in Embodiments, the same portions or portions having similar functions are denoted by the same reference numerals in different drawings, and the description of such portions is not repeated.

In this specification and the like, terms for explaining arrangement (e.g., over, above, under, and below) are used for convenience to indicate a positional relation between components with reference to drawings. The positional relation between components is changed as appropriate in accordance with a direction in which the components are described. Therefore, the terms for explaining arrangement are not limited to those used in the specification and the like, and can be changed to other terms as appropriate depending on the situation. For example, the expression "an insulator over (on) a top surface of a conductor" can be replaced with the expression "an insulator on a bottom surface of a conductor" when the direction of a diagram showing these components is rotated by 180°.

The term such as "over," "above, "under," and "below" does not necessarily mean that a component is placed directly on or under and directly in contact with another component. For example, the expression "electrode B over insulating layer A" does not necessarily mean that the electrode B is on and in direct contact with the insulating layer A and can also mean the case where another component is provided between the insulating layer A and the electrode B.

In the drawings, the size, the layer thickness, or the region is determined arbitrarily for description convenience; therefore, embodiments of the present invention are not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In drawings such as perspective views, some of components might not be illustrated for clarity of the drawings.

In the drawings, the same components, components having similar functions, components formed of the same material, or components formed at the same time are sometimes denoted by the same reference numerals, and the description thereof is not repeated in some cases.

<Notes on Expressions that can be Rephrased>

In this specification and the like, the terms "one of a source and a drain" (or a first electrode or a first terminal) and "the other of the source and the drain" (or a second electrode or a second terminal) are used to describe the connection relation of a transistor. This is because the source and the drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation. In this specification and the like, two terminals except a gate are sometimes referred to as a first terminal and a second terminal or as a third terminal and a fourth terminal. In this specification and the like, a channel formation region refers to a region where a channel is formed; the formation of this region by application of a potential to the gate enables current to flow between the source and the drain.

Functions of a source and a drain are sometimes switched when a transistor of different polarity is employed or when a direction of current flow is changed in circuit operation, for example. Therefore, the terms "source" and "drain" can be used interchangeably in this specification and the like.

In this specification and the like, in the case where a transistor has two or more gates (such a structure is sometimes referred to as a dual-gate structure), these gates are referred to as a first gate and a second gate or as a front gate and a backgate in some cases. In particular, the term "front gate" can be replaced with a simple term "gate." The term "backgate" can be replaced with a simple term "gate." Note that a bottom gate is a terminal that is formed before a channel formation region in manufacture of a transistor, and a top gate is a terminal that is formed after a channel formation region in manufacture of a transistor.

In this specification and the like, the term such as "electrode" or "wiring" does not limit a function of a component. For example, an "electrode" is used as part of a "wiring" in some cases, and vice versa. Moreover, the term "electrode" or "wiring" can also mean a combination of a plurality of electrodes or wirings formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential." A ground potential does not necessarily mean 0 V. Potentials are relative values, and a potential supplied to a wiring or the like is sometimes changed depending on the reference potential.

In this specification and the like, the terms "film" and "layer" can be interchanged with each other depending on the case or circumstances. For example, in some cases, the term "conductive film" can be used instead of "conductive layer," and the term "insulating layer" can be used instead of "insulating film." Moreover, such terms can be replaced with a word not including the term "film" or "layer" depending on the case or circumstances. For example, in some cases, the term "conductor" can be used instead of "conductive layer" or "conductive film," and the term "insulator" can be used instead of "insulating layer" or "insulating film."

In this specification and the like, the terms "wiring," "signal line," "power supply line," and the like can be replaced with each other depending on the case or circumstances. For example, in some cases, the term "signal line" or "power supply line" can be used instead of "wiring," and vice versa. In some cases, the term "signal line" can be used instead of "power supply line," and vice versa. As another example, the term "signal" can be used instead of "potential" that is supplied to a wiring and vice versa, depending on the case or circumstances.

<Notes on Definitions of Terms>

The following are definitions of the terms mentioned in the above embodiments.

«Impurities in Semiconductor»

Impurities in a semiconductor refer to, for example, elements other than the main components of a semiconductor layer. For instance, an element with a concentration of lower than 0.1 atomic % is an impurity. If impurities are contained in a semiconductor, the density of states (DOS) may be formed in the semiconductor, the carrier mobility may be decreased, or the crystallinity may be decreased, for example. When the semiconductor is an oxide semiconductor, examples of impurities that change characteristics of the semiconductor include Group 1 elements, Group 2 elements, Group 13 elements, Group 14 elements, Group 15 elements, and transition metals other than the main components of the semiconductor. Specific examples are hydrogen (included also in water), lithium, sodium, silicon, boron, phosphorus, carbon, and nitrogen. When the semiconductor is an oxide semiconductor, oxygen vacancies may be formed by entry of impurities such as hydrogen, for instance. When the semiconductor is silicon, examples of impurities that change the characteristics of the semiconductor include oxygen, Group 1 elements except hydrogen, Group 2 elements, Group 13 elements, and Group 15 elements.

<<Switch>>

In this specification and the like, a switch is conducting or not conducting (is turned on or off) to determine whether current flows therethrough or not. Alternatively, a switch has a function of selecting and changing a current path.

For example, an electrical switch or a mechanical switch can be used. That is, a switch is not limited to a certain element and can be any element capable of controlling current.

Examples of an electrical switch include a transistor (e.g., a bipolar transistor and a MOS transistor), a diode (e.g., a PN diode, a PIN diode, a Schottky diode, a metal-insulator-metal (MIM) diode, a metal-insulator-semiconductor (MIS) diode, and a diode-connected transistor), and a logic circuit in which such elements are combined.

In the case of using a transistor as a switch, the on state of the transistor refers to a state in which a source electrode and a drain electrode of the transistor are regarded as being electrically short-circuited. The off state of the transistor refers to a state in which the source electrode and the drain electrode of the transistor are regarded as being electrically disconnected. In the case where a transistor operates just as a switch, there is no particular limitation on the polarity (conductivity type) of the transistor.

An example of a mechanical switch is a switch using a microelectromechanical systems (MEMS) technology, such as a digital micromirror device (DMD). Such a switch includes an electrode that can be moved mechanically, and its conduction and non-conduction is controlled with movement of the electrode.

<<Connection>>

In this specification and the like, the description "X and Y are connected" means that X and Y are electrically connected, X and Y are functionally connected, and X and Y are directly connected. Accordingly, without being limited to a predetermined connection relation (e.g., a connection relation shown in drawings and texts), another connection relation is regarded as being included in the drawings and the texts.

Here, X and Y each denote an object (e.g., a device, an element, a circuit, a wiring, an electrode, a terminal, a conductive film, or a layer).

For example, in the case where X and Y are electrically connected, at least element that enables electrical connection between X and Y (e.g., a switch, a transistor, a capacitor, an inductor, a resistor, a diode, a display element, a light-emitting element, or a load) can be connected between X and Y. Note that a switch is controlled to be turned on or off. That is, a switch is conducting or not conducting (is turned on or off) to determine whether current flows therethrough or not.

For example, in the case where X and Y are functionally connected, at least one circuit that enables functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit capable of increasing signal amplitude, the amount of current, or the like, an operational amplifier, a differential amplifier circuit, a source follower circuit, or a buffer circuit; a signal generator circuit; a memory circuit; and/or a control circuit) can be connected between X and Y. For instance, even if another circuit is provided between X and Y, X and Y are regarded as being functionally connected when a signal output from X is transmitted to Y.

Note that an explicit description "X and Y are electrically connected" means that X and Y are electrically connected (i.e., X and Y are connected with another element or circuit provided therebetween), X and Y are functionally connected (i.e., X and Y are functionally connected with another circuit provided therebetween), and X and Y are directly connected (i.e., X and Y are connected without another element or circuit provided therebetween). That is, the term "electrically connected" is substantially the same as the term "connected."

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to the above examples, a source (or a first terminal or the like) and a drain (or a second terminal or the like) of a transistor can be distinguished from each other to specify the technical scope. Note that the above expressions are examples, and there is no limitation on the expressions. Here, X, Y, Z1, and Z2 each denote an object (e.g., a device, an element, a circuit, a wiring, an electrode, a terminal, a conductive film, or a layer).

Even when a circuit diagram shows that independent components are electrically connected to each other, one component sometimes has functions of a plurality of components. For example, when part of a wiring also functions as an electrode, one conductive film functions as the wiring and the electrode. Thus, the term "electrical connection" in this specification also means such a case where one conductive film has functions of a plurality of components.

<<Parallel and Perpendicular>>

In this specification, the term "parallel" indicates that the angle formed between two straight lines ranges from −10° to 10°, and accordingly also includes the case where the angle ranges from −5° to 5°. The term "substantially parallel" indicates that the angle formed between two straight lines ranges from −30° to 30°. The term "perpendicular" indicates that the angle formed between two straight lines ranges from 80° to 100°, and accordingly also includes the case where the angle ranges from 85° to 95°. The term "substantially perpendicular" indicates that the angle formed between two straight lines ranges from 60° to 120°.

This application is based on Japanese Patent Application Serial No. 2017-141515 filed with Japan Patent Office on Jul. 21, 2017, the entire contents of which are hereby incorporated by reference.

What is claimed is:

1. A semiconductor device comprising:
a first insulator, a second insulator, a third insulator, a fourth insulator, a fifth insulator, a sixth insulator, a seventh insulator, a conductor, and a semiconductor, wherein:
the conductor is positioned on a first top surface of the first insulator and on a first bottom surface of the second insulator,
the third insulator is positioned in a region comprising a side surface of the first insulator, a second top surface of the first insulator, a side surface of the conductor, a second bottom surface of the second insulator, and a side surface of the second insulator,
the fourth insulator is in contact with the third insulator,
the fifth insulator is in contact with the fourth insulator,
the semiconductor is in contact with the fifth insulator,
the sixth insulator is in contact with the semiconductor in a region overlapping the conductor with the third insulator, the fourth insulator, and the fifth insulator positioned between the semiconductor and the conductor, and
the seventh insulator is positioned in a region comprising:
the semiconductor in a region overlapping the first insulator and in a region overlapping the second insulator; and
the sixth insulator.

2. The semiconductor device according to claim 1, wherein the fourth insulator is configured to accumulate charge, and
wherein by supply of a potential to the conductor, charge included in the semiconductor is accumulated in the fourth insulator.

3. The semiconductor device according to claim 1, further comprising a second conductor in contact with the seventh insulator.

4. The semiconductor device according to claim 1,
wherein the semiconductor comprises a low-resistance region at and around an interface with the seventh insulator, and
wherein the semiconductor comprises a channel formation region in a region overlapping the conductor.

5. The semiconductor device according to claim 4,
wherein the semiconductor comprises a metal oxide,
wherein the low-resistance region comprises a conductive compound, and
wherein the conductive compound comprises a component identical to a component included in the metal oxide and a component identical to a component included in the seventh insulator.

6. The semiconductor device according to claim 4,
wherein the semiconductor comprises a metal oxide,
wherein the low-resistance region comprises a conductive compound, and
wherein the conductive compound comprises a component identical to a component included in the metal oxide, and a metal element.

7. A semiconductor wafer comprising:
a plurality of the semiconductor devices according to claim 1; and
a region to be subjected to dicing.

8. A memory device comprising:
the semiconductor device according to claim 1; and
a peripheral circuit.

9. An electronic device comprising:
the memory device according to claim 8; and
a housing.

10. A semiconductor device comprising:
a first insulator, a second insulator, a third insulator, a fourth insulator, a fifth insulator, a sixth insulator, a seventh insulator, a conductor, and a semiconductor, wherein:
the conductor is positioned on a first top surface of the first insulator and on a first bottom surface of the second insulator,
the third insulator is positioned in a region comprising a second top surface of the first insulator, a side surface of the conductor, and a second bottom surface of the second insulator,
the fourth insulator is in contact with the third insulator in a region comprising a region overlapping the conductor, a region overlapping the second top surface of the first insulator, and a region overlapping the second bottom surface of the second insulator, the fifth insulator is positioned in a region overlapping the side surface of the conductor, a region overlapping a side surface of the first insulator, and a region overlapping a side surface of the second insulator, the semiconductor is in contact with the fifth insulator, the sixth insulator is in contact with the semiconductor in a region overlapping the conductor with the third insulator, the fourth insulator, and the fifth insulator positioned between the semiconductor and the conductor, and the seventh insulator is positioned in a region comprising:
the semiconductor in a region overlapping the first insulator and in a region overlapping the second insulator; and
the sixth insulator.

11. The semiconductor device according to claim 10, wherein the fourth insulator is configured to accumulate charge, and wherein by supply of a potential to the conductor, charge included in the semiconductor is accumulated in the fourth insulator.

12. The semiconductor device according to claim 10, further comprising a second conductor in contact with the seventh insulator.

13. The semiconductor device according to claim 10, wherein the semiconductor comprises a low-resistance region at and around an interface with the seventh insulator, and wherein the semiconductor comprises a channel formation region in a region overlapping the conductor.

14. The semiconductor device according to claim 13, wherein the semiconductor comprises a metal oxide, wherein the low-resistance region comprises a conductive compound, and wherein the conductive compound comprises a component identical to a component included in the metal oxide and a component identical to a component included in the seventh insulator.

15. The semiconductor device according to claim 13, wherein the semiconductor comprises a metal oxide, wherein the low-resistance region comprises a conductive compound, and wherein the conductive compound comprises a component identical to a component included in the metal oxide, and a metal element.

16. A semiconductor wafer comprising:
a plurality of the semiconductor devices according to claim 10; and
a region to be subjected to dicing.

17. A memory device comprising:
the semiconductor device according to claim 10; and
a peripheral circuit.

18. An electronic device comprising:
the memory device according to claim 17; and
a housing.

19. A semiconductor device comprising:
a first insulator, a second insulator, a third insulator, a fourth insulator, a fifth insulator, a sixth insulator, a seventh insulator, a conductor, a first semiconductor, and a second semiconductor,
wherein:
the conductor is positioned on a first top surface of the first insulator and on a first bottom surface of the second insulator,
the second semiconductor is positioned on a side surface of the conductor, the third insulator is positioned in a region comprising a second top surface of the first insulator, a side surface of the second semiconductor, and a second bottom surface of the second insulator, the fourth insulator is in contact with the third insulator in a region comprising a region overlapping the conductor, a region overlapping the second top surface of the first insulator, and a region overlapping the second bottom surface of the second insulator, the fifth insulator is positioned in a region overlapping the side surface of the conductor, a region overlapping the second top surface of the first insulator, and a region overlapping the second bottom surface of the second insulator, the first semiconductor is positioned in a region overlapping the side surface of the conductor, a region overlapping a side surface of the first insulator, and a region overlapping a side surface of the second insulator, the sixth insulator is in contact with the first semiconductor in a region overlapping the conductor with the second semiconductor, the third insulator, the fourth insulator, and the fifth insulator positioned between the first semiconductor and the conductor, and the seventh insulator is positioned in a region comprising:
the first semiconductor in a region overlapping the first insulator and in a region overlapping the second insulator; and
the sixth insulator.

20. The semiconductor device according to claim 19, wherein the fourth insulator is configured to accumulate charge, and wherein by supply of a potential to the conductor, charge included in the first semiconductor is accumulated in the fourth insulator.

21. The semiconductor device according to claim 19, further comprising a second conductor in contact with the seventh insulator.

22. The semiconductor device according to claim 19, wherein the first semiconductor comprises a low-resistance region at and around an interface with the seventh insulator, and wherein the first semiconductor comprises a channel formation region in a region overlapping the conductor.

23. The semiconductor device according to claim 22, wherein the first semiconductor comprises a metal oxide, wherein the low-resistance region comprises a conductive compound, and wherein the conductive compound comprises a component identical to a component included in the metal oxide and a component identical to a component included in the seventh insulator.

24. The semiconductor device according to claim 22, wherein the first semiconductor comprises a metal oxide, wherein the low-resistance region comprises a conductive compound, and wherein the conductive compound comprises a component identical to a component included in the metal oxide, and a metal element.

25. A semiconductor wafer comprising:
a plurality of the semiconductor devices according to claim 19; and
a region to be subjected to dicing.

26. A memory device comprising:
the semiconductor device according to claim 19; and
a peripheral circuit.

27. An electronic device comprising:
the memory device according to claim 26; and
a housing.

28. A semiconductor device comprising:
a first insulator, a second insulator, a third insulator, a fifth insulator, a sixth insulator, a seventh insulator, a first conductor, a second conductor, and a semiconductor,
wherein:
the first conductor is positioned on a first top surface of the first insulator and on a first bottom surface of the second insulator,
the third insulator is positioned in a region comprising a second top surface of the first insulator, a side surface of the first conductor, and a second bottom surface of the second insulator,
the second conductor is in contact with the third insulator in a region overlapping the first conductor,
the fifth insulator is positioned in a region comprising:
the third insulator in a region overlapping the second top surface of the first insulator and in a region overlapping the second bottom surface of the second insulator; and
the second conductor,
the semiconductor is positioned in a region overlapping the side surface of the first conductor, a region overlapping a side surface of the first insulator, and a region overlapping a side surface of the second insulator,
the sixth insulator is in contact with the semiconductor in a region overlapping the first conductor with the third insulator, the second conductor, and the fifth insulator positioned between the semiconductor and the first conductor, and
the seventh insulator is positioned in a region comprising:
the semiconductor in a region overlapping the first insulator and in a region overlapping the second insulator; and
the sixth insulator.

29. The semiconductor device according to claim 28,
wherein the second conductor is configured to accumulate charge, and
wherein by supply of a potential to the first conductor, charge included in the semiconductor is accumulated in the second conductor.

30. The semiconductor device according to claim 28, further comprising a third conductor in contact with the seventh insulator.

31. The semiconductor device according to claim 28,
wherein the semiconductor comprises a low-resistance region at and around an interface with the seventh insulator, and
wherein the semiconductor comprises a channel formation region in a region overlapping the first conductor.

32. The semiconductor device according to claim 31,
wherein the semiconductor comprises a metal oxide,
wherein the low-resistance region comprises a conductive compound, and
wherein the conductive compound comprises a component identical to a component included in the metal oxide and a component identical to a component included in the seventh insulator.

33. The semiconductor device according to claim 31,
wherein the semiconductor comprises a metal oxide,
wherein the low-resistance region comprises a conductive compound, and
wherein the conductive compound comprises a component identical to a component included in the metal oxide, and a metal element.

34. A semiconductor wafer comprising:
a plurality of the semiconductor devices according to claim 28; and
a region to be subjected to dicing.

35. A memory device comprising:
the semiconductor device according to claim 28; and
a peripheral circuit.

36. An electronic device comprising:
the memory device according to claim 35; and
a housing.

* * * * *